US009612535B2

(12) United States Patent
Hirano et al.

(10) Patent No.: US 9,612,535 B2
(45) Date of Patent: Apr. 4, 2017

(54) PATTERN FORMING METHOD, ELECTRON BEAM- OR EXTREME ULTRAVIOLET-SENSITIVE RESIN COMPOSITION, RESIST FILM USING THE SAME, METHOD OF MANUFACTURING ELECTRONIC DEVICE, AND ELECTRONIC DEVICE

(71) Applicant: FUJIFILM Corporation, Tokyo (JP)

(72) Inventors: Shuji Hirano, Shizuoka (JP); Hiroo Takizawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/838,326

(22) Filed: Aug. 27, 2015

(65) Prior Publication Data

US 2015/0370170 A1 Dec. 24, 2015

Related U.S. Application Data

(63) Continuation of application No. PCT/JP2014/051019, filed on Jan. 20, 2014.

(30) Foreign Application Priority Data

Feb. 28, 2013 (JP) ................................ 2013-039705

(51) Int. Cl.

| | |
|---|---|
| ***G03F 7/20*** | (2006.01) |
| ***G03F 7/32*** | (2006.01) |
| ***G03F 7/039*** | (2006.01) |
| ***G03F 7/038*** | (2006.01) |
| ***G03F 7/004*** | (2006.01) |
| ***G03F 7/075*** | (2006.01) |
| ***G03F 7/11*** | (2006.01) |
| ***C08F 12/24*** | (2006.01) |
| *C08F 20/30* | (2006.01) |
| *C08F 20/58* | (2006.01) |

(52) U.S. Cl.

CPC ............ *G03F 7/2059* (2013.01); *C08F 12/24* (2013.01); *G03F 7/0045* (2013.01); *G03F 7/0046* (2013.01); *G03F 7/038* (2013.01); *G03F 7/0392* (2013.01); *G03F 7/0397* (2013.01); *G03F 7/0758* (2013.01); *G03F 7/11* (2013.01); *G03F 7/2004* (2013.01); *G03F 7/2041* (2013.01); *G03F 7/325* (2013.01); *C08F 20/30* (2013.01); *C08F 20/58* (2013.01)

(58) Field of Classification Search

None

See application file for complete search history.

(56) References Cited

U.S. PATENT DOCUMENTS

| | | | |
|---|---|---|---|
| 2009/0269696 A1* | 10/2009 | Ohsawa | C08F 220/18 430/270.1 |
| 2011/0236826 A1 | 9/2011 | Hatakeyama et al. | |
| 2011/0294069 A1 | 12/2011 | Bae et al. | |
| 2012/0276481 A1 | 11/2012 | Shimizu et al. | |
| 2012/0315581 A1 | 12/2012 | Hatakeyama et al. | |
| 2013/0040096 A1 | 2/2013 | Iwato et al. | |
| 2014/0087310 A1 | 3/2014 | Kato et al. | |

FOREIGN PATENT DOCUMENTS

| | | |
|---|---|---|
| JP | 2011221513 | 11/2011 |
| JP | 2011-248019 | 12/2011 |
| JP | 2012-032782 | 2/2012 |
| JP | 2012181289 | 9/2012 |
| JP | 2012208431 | 10/2012 |
| JP | 2012-230328 | 11/2012 |
| JP | 2013-011855 | 1/2013 |
| JP | 2013-020238 | 1/2013 |
| KR | 20110107299 | 9/2011 |
| TW | 201303495 | 1/2013 |
| WO | 2012/165604 | 12/2012 |

OTHER PUBLICATIONS

"International Search Report of PCT/JP2014/051019 (Form PCT/ISA/210)", mailed on Apr. 15, 2014, with English translation thereof, pp. 1-5.

"International Preliminary Report on Patentability; this report contains the following items :Form PCT/IB/373, PCT/ISA237(cover sheet), PCT/ISA237(Box No. I),PCT/ISA237(Box No. V),", mailed on Sep. 1, 2015, which is English translation of "Written Opinion of the International Searching Authority", p. 1-p. 7.

"Office Action of Japanese Counterpart Application," issued on Sep. 1, 2015, with English translation thereof, p. 1-p. 10.

"Office Action of Japan Counterpart Application," issued on Mar. 29, 2016, with Machine translation thereof, p. 1-p. 7.

"Office Action of Japan Counterpart Application" with machine English translation, issued on Sep. 27, 2016, p. 1-p. 5.

"Office Action of Korea Counterpart Application" with English translation thereof, issued on Dec. 1, 2016, p. 1-p. 14, in which the listed reference was cited.

"Office Action of Taiwan Counterpart Application" with English translation thereof, issued on Dec. 21, 2016, p. 1- p. 10, in which the listed reference was cited.

* cited by examiner

*Primary Examiner* — Sin Lee

(74) *Attorney, Agent, or Firm* — Jianq Chyun IP Office

(57) ABSTRACT

According to one aspect of the present invention, there is provided a pattern forming method comprising, in this order:

(1) forming a film by using an electron beam- or extreme ultraviolet-sensitive resin composition containing, in a specific amount, a resin (Aa) having a specific atom or substituent;

(2) exposing the film by using an electron beam or extreme ultraviolet ray; and (3) forming a negative pattern by performing development using a developer including an organic solvent after the exposure.

14 Claims, No Drawings

PATTERN FORMING METHOD, ELECTRON BEAM- OR EXTREME ULTRAVIOLET-SENSITIVE RESIN COMPOSITION, RESIST FILM USING THE SAME, METHOD OF MANUFACTURING ELECTRONIC DEVICE, AND ELECTRONIC DEVICE

CROSS REFERENCE TO RELATED APPLICATION(S)

This is a continuation of International Application No. PCT/JP2014/051019 filed on Jan. 20, 2014, and claims priority from Japanese Patent Application No. 2013-039705 filed on Feb. 28, 2013, the entire disclosures of which are incorporated herein by reference.

BACKGROUND

1. Technical Field

The present invention relates to a pattern forming method using a developer comprising an organic solvent, which is suitably used for a super-microlithography process such as a manufacturing process of super LSI or a high dose of microchip, or other photofabrication processes, an electron beam- or extreme ultraviolet-sensitive resin composition, a resist film using the same, a method of manufacturing an electronic device, and an electronic device. More specifically, the present invention relates to a pattern forming method using a developer comprising an organic solvent which can be suitably used for fine processing of a semiconductor device using an electron beam or EUV light (wavelength: near 13 nm), an electron beam- or extreme ultraviolet-sensitive resin composition, a resist film using the same, a method of manufacturing an electronic device, and an electronic device.

2. Background Art

Conventionally, in the manufacturing process of an electronic device such as IC or LSI, fine processing by lithography using a photoresist composition has been carried out. Recently, according to high integration of integrated circuits, ultrafine pattern formation of a sub-micron region or a quarter-micron region has been required. Thus, the exposure wavelength seems to have a tendency of shorter wavelength from g-line to i-line, or even further to the excimer KrF laser light. Further, in the present, lithography using electron beam or X-rays, or the EUV light in addition to excimer laser light has also been developed.

This electron beam or X-ray, or EUV light lithography is established itself as pattern forming technology of the next generation or the next after next generation, so that a resist composition having high-sensitivity and high-resolution is required.

In particular, high sensitivity may be a very important task for shortening the wafer processing time, but in order to pursue a high sensitivity, through lowering the resolution shown by pattern shape or limiting resolution line width, the development of the resist composition that meets these characteristics at the same time has been strongly required.

It is very important how high sensitivity, high resolution, and good pattern shape are achieved at the same time in the trade-off relationship.

As for an actinic ray-sensitive or radiation-sensitive resin composition, in general, there are a "positive-type" resin composition forming a pattern by using sparingly soluble or insoluble resins in an alkali developer and by solubilizing the exposure part with respect to an alkali developer through the exposure of the radiation and a "negative" resin composition forming a pattern by using soluble resins in an alkali developer and by sparingly solubilizing or insolubilizing the exposure part with respect to an alkali developer through the exposure of the radiation.

As for the actinic ray-sensitive or radiation-sensitive resin composition suitable for a lithographic process using these electron beam, X rays, or EUV light, the chemically amplified positive-type resist composition using primarily an acid catalyzed reaction is reviewed from the viewpoint of high sensitivity, and the chemically amplified positive-type resist composition consisting of, as a main component, an acid generating agent and a phenolic resin (Hereinafter, referred to phenolic acid-decomposable resin) having properties of being insoluble or sparingly soluble in an alkali developer and soluble in an alkali developer by the action of an acid is effectively used.

Meanwhile, a process of forming a pattern having a variety of shapes such as lines, trenches, holes, and the like may be requested in the manufacture of a semiconductor device and the like. In order to meet the demands of forming the pattern having a variety of shapes, the development of the negative actinic ray-sensitive or radiation-sensitive resin composition as well as the positive-type one is also carried out (for example, see Japanese Patent Application Laid-Open No. 2012-230328 or Japanese Patent Application Laid-Open No. 2012-032782).

However, in the ultrafine region (e.g., the area in which the line width or the space width is in the order of several tens nm), the actinic ray-sensitive or radiation-sensitive resin composition which realizes a good pattern shape has not been described in the above-mentioned literature, and there is still room for further improvement.

Furthermore, because a lithographic process using electron beam, X-ray, or EUV light is performed under high vacuum, the degradation products decomposed by a low molecular weight component produced by the acid generated during exposure or by the generated acid may be volatilized as a low molecular weight volatile components. Thus, it is desired to solve the problem of the out gas polluting the environment in an exposure machine.

An object of the present invention is to solve the problems of performance enhancement for the fine processing of a semiconductor device using electron beam or extreme ultraviolet rays (EUV light), and in particular to provide a pattern forming method having good pattern shape and high outgas performance, an electron beam- or extreme ultraviolet-sensitive resin composition, a resist film using the same, a method of manufacturing electronic device, and an electronic device in forming a pattern having the line width or the space width of the ultrafine region (e.g., in the order of several tens nm).

SUMMARY

The present invention has the following configuration.

[1] A pattern forming method including, in this order:

(1) forming a film by using an electron beam- or extreme ultraviolet-sensitive resin composition containing a resin (Aa) having at least one group selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aryl group substituted with at least one alkyl group having 3 or more carbon atoms, and an aryl group substituted with at least one cycloalkyl group having 5 or more carbon atoms, and a resin (Ab) whose polarity is changed by the action of an acid;

(2) exposing the film by using an electron beam or extreme ultraviolet ray; and (3) forming a negative pattern by performing development using a developer including an organic solvent after the exposure, wherein a content of the resin (Aa) is 31 to 90% by mass based on a total solid content in the electron beam- or extreme ultraviolet-sensitive resin composition.

[2] The pattern forming method according to [1], wherein the content of the resin (Aa) is 35 to 75% by mass based on the total solid content in the electron beam- or extreme ultraviolet-sensitive resin composition.

[3] The pattern forming method according to [2], wherein the content of the resin (Aa) is 40 to 60% by mass based on the total solid content in the electron beam- or extreme ultraviolet-sensitive resin composition.

[4] The pattern forming method according to any one of [1] to [3], wherein the resin (Aa) is a resin localized on a surface of the film by the forming the film to form a protective film.

[5] The pattern forming method according to any one of [1] to [4], wherein the resin (Aa) is a resin having a repeating unit represent by Formula (aa2-1):

(aa2-1)

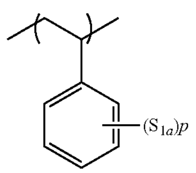

wherein in Formula (aa2-1), $S_{1a}$ represents a substituent, and when a plurality of $S_{1a}$ is present, each $S_{1a}$ may be same or different, and p represents an integer of 0 to 5.

[6] The pattern forming method according to any one of [1] to [5], wherein the resin (Aa) has an acid-stable repeating unit, and the at least one group selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aryl group substituted with at least one alkyl group having 3 or more carbon atoms, and an aryl group substituted with at least one cycloalkyl group having 5 or more carbon atoms is included in the acid-stable repeating unit.

7. The pattern forming method according to any one of [1] to [6], wherein the resin (Ab) has a repeating unit represent by Formula (A):

(A)

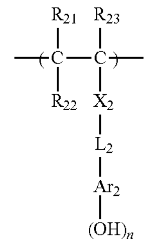

wherein in Formula (A), each of $R_{21}$, $R_{22}$ and $R_{23}$ independently represents a hydrogen atom, an alkyl group, a halogen atom, a cyano group or an alkoxycarbonyl group, provided that $R_{22}$ and $A_{r2}$ may be combined with each other to form a ring, and in that case, $R_{22}$ represents a single bond or an alkylene group, $X_2$ represents a single bond, —COO— or —$CONR_{30}$—, and $R_{30}$ represents a hydrogen atom or an alkyl group, $L_2$ represents a single bond or an alkylene group, $A_{r2}$ represents a (n+1)-valent aromatic ring group and a (n+2)-valent aromatic ring group when combining with $R_{22}$ to form a ring, and n represents an integer of 1 to 4.

[8] The pattern forming method according to any one of [1] to [7], wherein the resin (Ab) includes a repeating unit represented by Formula (A1) or a repeating unit represented by Formula (A2):

(A1)

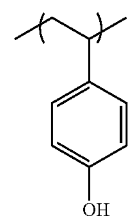

(A2)

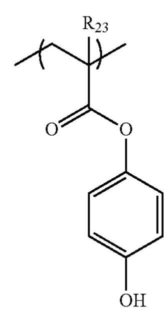

wherein in Formula (A2), $R_{23}$ is the same as $R_{23}$ in Formula (A).

[9] The pattern forming method according to any one of [1] to [8], wherein the electron beam- or extreme ultraviolet-sensitive resin composition further includes a compound capable of generating an acid upon irradiation with an electron beam or extreme ultraviolet ray.

[10] The pattern forming method according to any one of [1] to [9], wherein the resin (Ab) includes a repeating unit (B) having a structural moiety capable of generating an acid upon irradiation with an electron beam or extreme ultraviolet ray.

[11] An electron beam- or extreme ultraviolet-sensitive resin composition, comprising:

a resin (Aa) having at least one group selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aryl group substituted with at least one alkyl group having 3 or more carbon atoms, and an aryl group substituted with at least one cycloalkyl group having 5 or more carbon atoms, and a resin (Ab) whose polarity is changed by the action of an acid, wherein a content of the resin (Aa) is 31 to 90% by mass based on a total solid content in the electron beam- or extreme ultraviolet-sensitive resin composition.

[12] A resist film formed from the electron beam- or extreme ultraviolet-sensitive resin composition according to [11].

[13] A method of manufacturing an electronic device including the method according to any one of [1] to [10].

[14] An electronic device manufactured by the method according to [13].

According to the present invention, it is possible is to provide a pattern forming method which has good pattern shape and high outgas performance in the ultrafine region (e.g., the area in which the line width or the space width is in the order of several tens nm), an electron beam- or extreme ultraviolet-sensitive resin composition, a resist film using the same, a method of manufacturing electronic device, and an electronic device.

DETAILED DESCRIPTION OF EXEMPLARY EMBODIMENTS

Hereinafter, embodiments of the present invention will be described in detail. In the notation of a group (an atomic group) in the present specification, the representation which does not describe the substitution or the unsubstitution includes a representation having a substituent along with a representation having no substituent. For example, "an alkyl group" includes not only an alkyl group having no substituent (an unsubstituted alkyl group) but also an alkyl group having a substituent (a substituted alkyl group).

Further, the term "light" in the present invention refers to an actinic ray or radiation.

In addition, unless otherwise specifically indicated, the term "exposure" in the present specification includes not only the exposure performed using ultraviolet rays (EUV light), but also drawing performed by an electron beam.

[Pattern Forming Method]

First, the pattern forming method of the present invention will be described.

The pattern forming method of the present invention includes:

(1) a process of forming a film by using an electron beam- or extreme ultraviolet-sensitive resin composition containing a resin (Aa) having at least one group selected from the group consisting of a fluorine atom, a group having a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aryl group substituted with at least one alkyl group having 3 or more carbon atoms, and an aryl group substituted with at least one cycloalkyl group having 5 or more carbon atoms, and a resin (Ab) whose polarity is changed by the action of an acid;

(2) a process for exposing the film by using an electron beam- or extreme ultraviolet ray; and (3) a process for forming a negative pattern by performing development using a developer including an organic solvent after the exposure in order, wherein the content of the resin (Aa) is 31 to 90% by mass based on the solid content in the electron beam- or extreme ultraviolet-sensitive resin composition.

According to the pattern forming method of the present invention, in an ultrafine region (e.g., an area in which the line width or the space width is in the order of several tens nm), it is possible is to provide a pattern forming method satisfying good pattern shape and high outgas performance at the same time, an electron beam- or extreme ultraviolet-sensitive resin composition, a resist film using the same, a method of manufacturing electronic device, and an electronic device. The reason is not clear, but it is estimated as follows.

First, the electron beam- or extreme ultraviolet-sensitive resin composition of the present invention contains resin (Aa), and thus the content of the resin (Aa) is 31 to 90% by mass based on the total solid content in the electron beam- or extreme ultraviolet-sensitive resin composition.

Here, since the resin(Aa) has high hydrophobicity and has a property of being localized on the surface of the film when forming the resist film of the electron beam- or extreme ultraviolet-sensitive resin composition, in a case where the content of the resin(Aa) is maintained in the above-described range, the upper layer of the resist film is covered with the film of a sufficient amount of the resin (Aa), and thus, it is considered that the low-molecular components in the resist film generated by the acid at the time of exposure is volatilized, so that the problem of the out gas polluting the environment in the exposure machine may be reduced.

Further, since the upper layer of the resist film is covered with the film of sufficient amount of the resin (Aa), it is possible to suppress the outband light generated at the time of exposure, and as a result it is considered to form a good pattern.

Meanwhile, if the content to the total solid content of the electron beam- or extreme ultraviolet-sensitive resin composition of the resin (Aa) is less than 31% by mass, a sufficient amount of the resin (Aa) cannot be localized on the surface of the resist film and has a tendency to hardly reduce the outgas sufficiently.

In addition, if the content to the total solid content of the electron beam- or extreme ultraviolet-sensitive resin composition of the resin (Aa) is more than 90% by mass, the ratio of the resin that decomposes by the action of an acid in the resist film is relatively decreased, and, as a result, has a tendency that pattern formation is difficult.

(1) Film Formation

The resist film of the present invention is a film formed by the above-described electron beam- or extreme ultraviolet-sensitive resin composition.

More specifically, the formation of the resist film can be carried out by dissolving each of the components to be described later of the electron beam- or extreme ultraviolet-sensitive resin composition in a solvent and by applying them on a support (substrate) after filtering them with a filter, if necessary. It is preferred that the filter may be a filter made of polytetrafluoroethylene, polyethylene, or nylon having the pore size of 0.5 μm or less, more preferably 0.2 μm or less, and still more preferably 0.1 μm or less.

The composition may be applied on the substrates such as those used in the manufacturing process of integrated circuit devices (e.g., silicon, silicon dioxide coating) by a suitable coating method such as a spin-coating and the like, and then dried to form a photosensitive film. It is preferred that heating (pre-baking) is carried out in the drying step.

The film thickness is not particularly limited, but is preferably adjusted in the range of 10 to 500 nm, more preferably in the range of 10 to 200 nm, and still more preferably in the range of 10 to 100 nm. When the electron beam- or extreme ultraviolet-sensitive resin composition is applied by a spinner, the rotation speed is normally 500 to 3,000 rpm, preferably 800 to 2,000 rpm, and more preferably 1,000 to 1,500 rpm.

The temperature of heating (pre-baking) is preferably 60 to 200° C., more preferably 80 to 150° C., and still more preferably 90 to 140° C.

The heating (pre-baking) time is not particularly limited, but is preferably 30 to 300 seconds, more preferably 30 to 180 seconds, and still more preferably 30 to 90 seconds.

The heating may be performed by using a means equipped with a typical exposure developing device or may be performed by using a hot plate or the like.

If necessary, a commercially available inorganic or organic antireflection film may be used. In addition, the antireflection film may also be coated on the lower layer of electron beam- or extreme ultraviolet-sensitive resin composition. As an antireflection film, any of an inorganic film type such as titanium, a titanium dioxide, a titanium nitride, a chromium oxide, a carbon and silicon, and an organic film type consisting of light absorbent and polymer material may be used. Further, as an organic antireflection film, a commercially available organic antireflection film such as DUV30 Series or DUV-40 series produced in Brewer Science Inc., AR-2, AR-3, or AR-5 produced in Shipley Inc. and the like.

(2) Exposure

The exposure can be carried out by electron beam or extreme ultraviolet rays.

(3) Baking

It is preferred that the baking (heating) process is carried out after the exposure process and before the developing process.

The temperature of heating is preferably 60 to 150° C., more preferably 80 to 150° C., and still more preferably 90 to 140° C.

The heating time is not particularly limited, but is preferably 30 to 300 seconds, more preferably 30 to 180 seconds, and still more preferably 30 to 90 seconds.

The heating may be performed by using a means equipped with a typical exposure developing device or may be performed by using a hot plate or the like.

By means of baking the reaction in the exposed portion is accelerated, and thus the sensitivity or a pattern profile is improved. In addition, it is also preferred that a heating process (post bake) is included after the rinse process. The heating temperature and the heating time are as described above. A developer and a rinse liquid residual between patterns and inside the patterns are removed by means of baking pattern.

(4) Development

In the present invention, development is performed using a developer containing an organic solvent.

Developer

Vapor pressure (in a case of a mixed solvent, the vapor pressure as a whole) of a developer is preferably 5 kPa or less, more preferably 3 kPa or less, and particularly preferably 2 kPa or less, at 20° C. By adjusting the vapor pressure of an organic solvent to 5 kPa or less, evaporation of the developer on a substrate or in a development cup is suppressed so that temperature uniformity in the wafer plane is enhanced, and as a result, the dimensional uniformity in the wafer plane is improved.

As an organic solvent used in the developer, various organic solvents are widely used, but for example, a solvent such as an ester-based solvent, a ketone-based solvent, an alcohol-based solvent, an amide-based solvent, an ether-based solvent, and a hydrocarbon-based solvent may be used.

In the present invention, an ester-based solvent means a solvent having an ester group in the molecule, a ketone-based solvent means a solvent having a ketone group in the molecule, an alcohol-based solvent means a solvent having an alcoholic hydroxyl group in the molecule, an amide-based solvent means a solvent an amide group in the molecule, and an ether-based solvent means a solvent an ether bond in the molecule. Among them, there exists a solvent having a plurality of kinds of the above-described functional groups in one molecule, but in that case, it is assumed to correspond to any solvent kind containing the functional group the solvent that has. For example, diethylene glycol monomethyl ether is assumed to correspond to any of an alcohol-based solvent and an ether-based solvent among the above-described classification. In addition, a hydrocarbon-based solvent means a hydrocarbon solvent which does not have a substituent.

In particular, a developer containing at least one solvent selected from a ketone-based solvent, an ester-based solvent, an alcohol-based solvent and an ether-based solvent is preferred.

Examples of the ester-based solvent may include methyl acetate, ethyl acetate, butyl acetate, pentyl acetate, isopropyl acetate, amyl acetate, isoamyl acetate, methoxyethyl acetate, ethoxyethyl acetate, propylene glycolmonoethyl ether acetate (PGMEA (alias; 1-methoxy-2-acetoxy-propane)), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, ethylene glycol monophenyl ether acetate, diethylene glycol monobutyl ether acetate, ethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxymethyl propionate, 2-hydroxyethyl propionate, methyl 3-methoxy propionate, ethyl 3-methoxy propionate, ethyl-3-ethoxy propionate, propyl-3-methoxy propionate, and the like.

Examples of the ketone-based solvent may include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, γ-butyrolactone and the like.

Examples of the alcohol-based solvent may include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol, a glycol-based solvent such as ethylene glycol, diethylene glycol and triethylene glycol, and a glycol ether-based solvent containing a hydroxyl group such as ethylene glycol monomethyl ether, propylene glycol monomethyl ether (PGME, alias: 1-methoxy-2-propanol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, propylene glycol monophenyl ether and the like. Among these, a glycol ether-based solvent is preferably used.

Examples of the ether-based solvent may include, in addition to the glycol ether-based solvents containing a hydroxyl group, glycol ether-based solvents containing no hydroxyl group such as propylene glycol dimethyl ether, propylene glycol diethyl ether, diethylene glycol dimethyl ether and diethylene glycol diethyl ether, and an aromatic ether-based solvent such as anisole and phenetol, dioxane, tetrahydropyran, tetrahydropyran, perfluoro-2-butyltetrahydrofuran, perfluoro tetrahydrofuran, 1,4-dioxane and the like. Preferably, the glycol ether-based solvent or the aromatic ether-based solvent such as anisole may be used.

Examples of the amide-based solvent may include N-methyl-2-pyrrolidone, N,N-dimethylacetamide, N,N-dimethylformamide, hexamethylphosphoric triamide, 1,3-dimethyl-2-imidazolidinone and the like.

Examples of the hydrocarbon-based solvent may include an aliphatic hydrocarbon-based solvent such as pentane, hexane, octane, decane, 2,2,4-trimethyl pentane, 2,2,3-trimethyl hexane, perfluoro hexane, heptane and perfluoro heptane, and an aromatic hydrocarbon-based solvent such as toluene, xylene, ethyl benzene, propyl benzene, 1-methyl propyl benzene, 2-methyl propyl benzene, dimethyl benzene, diethyl benzene, methyl ethyl benzene, trimethyl benzene, ethyl dimethyl benzene and dipropyl benzene. Among these, aromatic hydrocarbon-based solvent is preferred.

A plurality of the aforementioned solvents may be mixed, or the solvents may be used in mixture with a solvent other than those described above or with water. However, in order to sufficiently exhibit the effects of the present invention, the water content ratio of the entire developer is preferably less than 10% by mass, and it is more preferred that the developer contains substantially no moisture.

The concentration of the organic solvents (total in a case of mixing a plurality thereof) in the developer is preferably 50% by mass or more, more preferably 70% by mass or more, and still more preferably 90% by mass or more. It is particularly preferred that the solvent is substantially composed of only an organic solvent. A case of being substantially composed of only an organic solvent includes a case of containing trace amount of a surfactant, an antioxidant, a stabilizer, a defoaming agent, or the like.

It is preferred that the solvent described above is a solvent containing at least one or more selected from a group consisting of butyl acetate, pentyl acetate, isopentyl acetate, propylene glycol monomethyl ether acetate, 2-heptanone, and anisole.

Examples of the organic solvent used as an organic developer may suitably be an ester-based solvent.

As for the ester-based solvent, a solvent represented by Formula (S1) to be described later or a solvent represented by Formula (S2) to be described later is more preferably used, a solvent represented by Formula (S1) is still more preferably used, alkyl acetate is particularly preferably used, and butyl acetate, pentyl acetate, or isopentyl acetate is most preferably used.

$$R—C(=O)—O—R' \qquad \text{Formula (S1)}$$

In Formula (S1), each of R and R' independently represents a hydrogen atom, an alkyl group, a cycloalkyl group, an alkoxyl group, an alkoxycarbonyl group, a carboxyl group, a hydroxyl group, a cyano group or a halogen atom. R and R' may combine with each other to form a ring.

As for R and R', the alkyl group, the carbon number of the alkoxyl group, and the alkoxycarbonyl group is preferably in a range of 1 to 15 and the carbon number of the cycloalkyl group is preferably 3 to 15.

R and R' is preferably a hydrogen atom or an alkyl group, and as for R and R', an alkyl group, a cycloalkyl group, an alkoxyl group, an alkoxycarbonyl group, and the ring formed by combining R and R' with each other may be substituted by a hydroxyl group, a group including a carbonyl group (e.g., an acyl group, an aldehyde group, alkoxycarbonyl and the like), a cyano group and the like.

Examples of the solvent represented by Formula (S1) may include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxymethyl propionate, 2-hydroxyethyl propionate and the like.

Among these, it is preferred that R and R' are unsubstituted alkyl groups.

Examples of the solvent represented by Formula (S1) may include preferably alkyl acetate, and more preferably butyl acetate, pentyl acetate or isopentyl acetate.

The solvent represented by Formula (S1) may be used in combination of one or more of other organic solvents. As the combined solvent in this case, any solvent may not be particularly limited as long as the solvent can be mixed without separating from the solvent represented by Formula (S1), and the solvents represented by Formula (S1) may be also used in combination with each other, and the solvent represented by Formula (S1) may be used in mixture with other solvent selected from an ester-based solvent, a ketone-based solvent, an alcohol-based solvent, an amide-based solvent, an ether-based solvent and a hydrocarbon-based solvent. One or more of solvents may be used in combination with each other, but one solvent is preferred in the stable performance. When using a combination of a mixture of at least one of solvents, the mixing ratio of the solvent represented by Formula (S1) to the combined solvent is usually 20:80 to 99:1 by mass, preferably 50:50 to 97:3 by mass, more preferably 60:40 to 95:5 by mass, and most preferably 60:40 to 90:10 by mass.

$$R''—C(=O)—O—R'''—O—R'''' \qquad \text{Formula (S2)}$$

In Formula (S2), each of R" and R''' independently represents a hydrogen atom, an alkyl group, a cycloalkyl group, an alkoxyl group, an alkoxycarbonyl group, a carboxyl group, a hydroxyl group, a cyano group or a halogen atom. R" and R''' may combine with each other to form a ring.

R" and R''' may preferably be a hydrogen atom and an alkyl group. As for R" and R''', the carbon number of the alkyl group, the alkoxyl group, and the alkoxycarbonyl group is preferably in the range of 1 to 15 and the carbon number of the cycloalkyl group is preferably 3 to 15.

R''' represents an alkylene group or a cycloalkyl group. R''' is preferably an alkylene group. As for R''', the carbon number of the alkylene group is preferably in the range of 1 to 10. As for R''', the carbon number of the cycloalkyl group is preferably 3 to 10.

An alkyl group, a cycloalkyl group, an alkoxyl group, or an alkoxycarbonyl group as for R" and R'''', an alkylene group, or a cycloalkylene group as for R''', and a ring formed by combining R" and R''' with each other may be substituted by a hydroxyl group, a group containing a carbonyl group (e.g., an acyl group, an aldehyde group, alkoxycarbonyl and the like), a cyano group and the like.

The alkylene group as R''' in Formula (S2) may have an ether bond in the alkylene chain.

Examples of the solvent represented by Formula (S2) may include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, ethylene glycol monophenyl ether acetate, diethylene glycol monobutyl ether acetate, diethylene glycol monoethyl ether acetate, propylene glycol monomethyl ether acetate, propylene glycol monopropyl ether acetate, methyl 3-methoxy propionate, ethyl-3-methoxy propionate, ethyl 3-ethoxypropionate, propyl-3-methoxy propionate, methoxy ethyl acetate, ethoxy ethyl acetate, 2-methoxy butyl acetate, 3-methoxy butyl acetate, 4-methoxy butyl acetate, 3-methyl-3-methoxy butyl acetate, 3-ethyl-3-methoxy butyl acetate, 2-ethoxy butyl acetate, 4-ethoxy butyl acetate, 4-propoxy butyl acetate, 2-methoxypentyl acetate, 3-methoxypentyl acetate, 4-methoxypentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate and the like, and propylene glycol monomethyl ether acetate is preferred.

Among these, R" and R'''' are an unsubstituted alkyl group, R''' is preferably an unsubstituted alkylene group, R" and R'''' are more preferably any one of a methyl group or an ethyl group, and R" and R'''' are still more preferably a methyl group.

The solvent represented by Formula (S2) may be used in combination of one or more of other organic solvents. As the combined solvent in this case, any solvent may not be particularly limited as long as the solvent can be mixed without separating from the solvent represented by Formula (S2), and the solvents represented by Formula (S2) may be also used in combination with each other, and the solvent represented by Formula (S2) may be used in mixture with other solvent selected from an ester-based solvent, a ketone-based solvent, an alcohol-based solvent, an amide-based solvent, an ether-based solvent and a hydrocarbon-based solvent. One or more of solvents may be used in combination with each other, but one solvent is preferred in acquiring the stable performance. When using a combination of a mixture of at least one of solvents, the mixing ratio of the solvent represented by Formula (S2) to the combined solvent is usually 20:80 to 99:1 by mass, preferably 50:50 to 97:3 by mass, more preferably 60:40 to 95:5 by mass, and most preferably 60:40 to 90:10 by mass.

Further, examples of the organic solvent used as a developer may include an ether-based solvent.

Examples of the available ether-based solvent may include the above-described ether-based solvent, preferably an ether-based solvent containing one or more aromatic rings, more preferably a solvent represented by the following Formula (S3), and most preferably anisole.

[Chem. 4]

(S3)

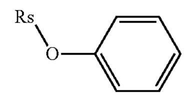

In Formula (S3), $R_S$ represents an alkyl group. An alkyl group having 1 to 4 carbon atoms is preferred, and a methyl group or an ethyl group is more preferred, and a methyl group is most preferred.

The developer used in the present invention may contain a basic compound. Specific and preferred examples of the basic compound contained in the developer used in the present invention may include compounds exemplified as a basic compound capable of containing the electron beam- or extreme ultraviolet-sensitive resin composition to be described later.

In the present invention, the water content ratio of the developer is usually 10% by mass or less, preferably 5% by mass or less, and more preferably 1% by mass or less, and most preferably not containing water.

Surfactant

A developer containing an organic solvent may contain an appropriate amount of a surfactant, if necessary.

As a surfactant, the same surfactant as the one used in the electron beam- or extreme ultraviolet-sensitive resin composition to be described later may be used.

The amount of the surfactant used is usually 0.001 to 5% by mass, preferably 0.005 to 2% by mass, and more preferably 0.01 to 0.5% by mass, based on the total amount of the developer.

Development Method

As for the developing method, it is possible to apply, for example, a method of dipping a substrate in a bath filled with a developer for a predetermined time (a dipping method), a method of raising a developer on a substrate surface sufficiently by the effect of a surface tension and keeping the substrate still for a predetermined time, thereby performing development (a puddle method), a method of spraying a developer on a substrate surface (a spray method), a method of continuously ejecting a developer on a substrate spinning at a constant speed while scanning a developer ejecting nozzle at a constant rate (a dynamic dispense method) and the like.

In addition, after the process of performing development, a process of stopping the development while replacing the solvent with another solvent may be performed.

The developing time is not limited as long as it is sufficient to dissolve the resin of the unexposed part, and is generally 10 to 300 seconds, and preferably 20 to 120 seconds.

The temperature of the developer is preferably 0° C. to 50° C., and more preferably 15° C. to 35° C.

By the above-described development, the resin (Aa) to be described later is unevenly distributed on the surface of the resist film, and thus the formed protective film may be removed and the film thickness of the resist film will be reduced.

The film thickness after the above-described process (1), that is, film manufacturing process is preferably 1.3 times or more, and more preferably 1.6 times or more 2.5 times or less than the film thickness of the resist film after the development.

(5) Rinse

The pattern forming method of the present invention may include a process (5) of performing rinse using a rinse liquid containing an organic solvent, after the development process (4), but from the viewpoint of throughput, the amount of the rinse liquid used and the like, it is preferred that the rinse process is not included.

Rinse Liquid

Vapor pressure (in a case of a mixed solvent, the vapor pressure as a whole) of the rinse liquid used after the development is preferably 0.05 kPa to 5 kPa, more preferably 0.1 kPa to 5 kPa, and most preferably 0.12 kPa to 3 kPa, at 20° C. By setting the vapor pressure of the rinse liquid to 0.05 kPa to 5 kPa, the temperature uniformity in the wafer plane is enhanced, and furthermore, swelling caused by permeation of the rinse liquid is suppressed, and as a result, the dimensional uniformity in the wafer plane is improved.

As the above-described rinse liquid, a variety of organic solvents may be used, but it is preferred to use a rinse liquid containing water or at least one kind of organic solvent selected from a hydrocarbon-based solvent, a ketone-based solvent, an ester-based solvent, an alcohol-based solvent, an amide-based solvent and an ether-based solvent.

More preferably, after the development, a rinse process is performed using a rinse liquid containing at least one kind of organic solvent selected from a ketone-based solvent, an ester-based solvent, an alcohol-based solvent, an amide-based solvent or a hydrocarbon-based solvent. Still more preferably, after the development, a rinse process is performed using a rinse liquid containing an alcohol-based solvent or a hydrocarbon-based solvent.

Particularly preferably, a rinse liquid containing at least one or more selected from the group consisting of a monohydric alcohol and a hydrocarbon-based solvent can be used.

Here, examples of the monohydric alcohol used in the rinse process after the development may include a straight, branched, and cyclic monohydric alcohol, specifically, 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dichil-2-heksal, 6-methyl-2-heptanol, 7-methyl-2-octanol, 8-methyl-2-nonal, 9-methyl-2-decanol and the like, preferably, 1-hexanol, 2-hexanol, 1-pentanol, 3-methyl-1-butanol, 3-methyl-2-pentanol, 3-methyl-3-pentanol, 4-methyl-2-pentanol, 4-methyl-3-pentanol, and most preferably, 1-hexanol or 4-methyl-2-pentanol.

Examples of the hydrocarbon-based solvent may include an aromatic hydrocarbon-based solvent such as toluene and xylene and an aliphatic hydrocarbon-based solvent such as octane and decane.

The rinse liquid may more preferably contain at least one selected from a group consisting of 1-hexanol, 4-methyl-2-penanol, decane and the like.

A plurality of the components may be used in mixture with each other or in mixture with an organic solvent other than the above-described component. The above-described solvent may be mixed with water, but the water content ratio in the rinse liquid is usually 60% by mass or less, preferably 30% by mass or less, more preferably 10% by mass or less, and most preferably 5% by mass or less. By setting the water content ratio to 60% by mass or less, good rinse, good rinse characteristics may be obtained.

In the rinse liquid, an appropriate amount of surfactant may be contained and used.

As a surfactant, it is possible to use the same surfactant as that used in the electron beam- or extreme ultraviolet-sensitive resin composition to be described later, and the used amount thereof is usually 0.001 to 5% by mass, preferably 0.005 to 2% by mass, and more preferably 0.01 to 0.5% by mass, based on the total amount of the rinse liquid.

Rinse Process

In the rinse process, the developed wafer is rinse treated by using the rinse liquid containing the above-described an organic solvent.

The method of rinse treatment is not particularly limited, but it is possible to apply, for example, a method of continuously ejecting rinse liquid on a substrate spinning at a constant speed (spin coating method), a method of dipping a substrate in a bath filled with rinse liquid for a predetermined time (dipping method), a method of spraying rinse liquid on a substrate surface (spraying method) and the like, and among them, it is preferred that the rinse treatment is performed by the spin coating method and after the rinse, the substrate is spun at a rotational speed of 2,000 rpm to 4,000 rpm to remove the rinse liquid from the substrate.

The rinse time is not particularly limited, but generally 10 to 300 seconds, preferably 10 to 180 seconds, and most preferably 20 to 120 seconds.

The temperature of a rinse liquid preferably 0° C. to 50° C., and more preferably 15° C. to 35° C.

Further, after the development treatment or rinse treatment, a treatment of removing the developer or rinse liquid adhering on the pattern by a supercritical fluid may be performed.

In addition, after the development treatment or rinse treatment or the treatment by the supercritical fluid, the heating treatment can be performed to remove the solvent residual in the pattern. The heating temperature is not particularly limited as long as a good resist pattern is obtained, and it is usually 40° C. to 160° C. The heating temperature is preferably 50° C. to 150° C., and more preferably 50° C. to 110° C. The heating time is not particularly limited as long as a good resist pattern is obtained, but generally 15 to 300 seconds, and preferably 15 to 180 seconds.

The pattern forming method of the present invention may further contain a process of forming a resist pattern (alkali development process) by using an aqueous alkali solution. Accordingly, finer pattern may be formed.

In the present invention, a portion in which exposure strength is weak is removed by an organic solvent developing process, but a portion in which exposure strength is strong is also removed by performing further an alkali development process (4). By multiple development processes which performs the development processes multiple times, a pattern may be formed without dissolving an area of intermediate exposure strength alone, so that a pattern which is finer than a usual pattern may be formed (the same mechanism as disclosed in [0077] of Japanese Patent Application Laid-Open No. 2008-292975).

The alkali development can be performed any of before and after the development process (4) which uses a developer containing an organic solvent, but it is more preferred that the alkali developing process is performed before the organic solvent development process (4).

Since the film is not directly contacted the liquid for liquid immersion between the film formed using the composition of the present invention and the liquid for liquid immersion. a film (hereinafter, also referred to as “a topcoat”) that is sparingly soluble in a liquid for liquid immersion may be formed. Examples of the function required for the topcoat include coating suitability to the upper layer portion of the resist and poor solubility in the liquid for liquid immersion. It is preferred that the topcoat may be uniformly coated onto the upper layer of the composition film without being mixed with the composition film.

Specific examples of the topcoat may include a hydrocarbon polymer, an acrylic acid ester polymer, polymethacrylic acid, polyacrylic acid, polyvinyl ether, a silicone-containing polymer, a fluorine-containing polymer and the like. From the viewpoint that the optical lens is contaminated in a case where the impurities are eluted from the topcoat to the liquid for liquid immersion, it is preferred that the amounts of residual monomer components of the polymer included in the topcoat are small.

When the topcoat is peeled off, a developer may be used, or a peeling agent may separately be used. As the peeling agent, a solvent that rarely penetrates the film is preferred. From the viewpoint that the peeling process may be performed simultaneously with the developing treatment process of the film, it is preferred that the topcoat may be peeled off by an alkali developer containing an organic solvent.

In a case where there is no difference in the refractive index between the topcoat and the liquid for liquid immersion, the resolution may be enhanced. When water is used as the liquid for liquid immersion, it is preferred that the topcoat is close the refractive index of the liquid for liquid immersion. From the viewpoint of causing a refractive index close to the liquid for liquid immersion, it is preferred to have a fluorine atom in the topcoat. Furthermore, from the viewpoint of transparency and refractive index, the topcoat is preferably a thin film.

It is preferred that the topcoat is not mixed with the film, nor with the liquid for liquid immersion. From this viewpoint, when the liquid for liquid immersion is water, it is preferred that the solvent used for the topcoat is sparingly soluble in the solvent used for the composition of the present invention and is also a water-insoluble medium. Further, when the liquid for liquid immersion is an organic solvent, the topcoat may be water-soluble or water-insoluble.

Hereinafter, an electron beam- or extreme ultraviolet-sensitive resin composition that may be used in the present invention will be described.

The electron beam- or extreme ultraviolet-sensitive resin composition according to the present invention is used in a negative development (development in which when a resist film is exposed, the solubility thereof in the developer is decreased, and thus the exposed portion remains as a pattern and the unexposed portion is removed). That is, the electron beam- or extreme ultraviolet-sensitive resin composition according to the present invention may be used as an electron beam- or extreme ultraviolet-sensitive resin composition for organic solvent development, which is used for development using a developer including an organic solvent. Here, the term for organic solvent development refers to a use that is used in a process of developing a film using a developer including at least an organic solvent.

As such, the present invention relates to the electron beam- or extreme ultraviolet-sensitive resin composition used in the pattern forming method of the present invention described above.

The electron beam- or extreme ultraviolet-sensitive resin composition of the present invention is typically a resist composition, and negative resist composition (i.e., the resist composition for developing an organic solvent) is particularly desirable because it can acquire high effect. Further, the composition of the present invention is typically a chemically amplified resist composition.

Hereinafter, each component of the electron beam- or extreme ultraviolet-sensitive resin composition of the present invention will be described in detail.

[1] Resin (Aa)

The electron beam- or extreme ultraviolet-sensitive resin composition of the present invention contains a resin (Aa). The resin (Aa) has at least one group (Hereinafter, referred to a “group (aa)”) selected from the group consisting of a group having a fluorine atom, a fluorine atom, a group having a silicon atom, an alkyl group having 6 or more carbon atoms, a cycloalkyl group having 6 or more carbon atoms, an aryl group having 9 or more carbon atoms, an aralkyl group having 10 or more carbon atoms, an aryl group substituted with at least one alkyl group having 3 or more carbon atoms, and an aryl group substituted with at least one cycloalkyl group having 5 or more carbon atoms.

The resin (Aa) may have a group (aa) in the main chain or in the side chain of the resin, and the resin (Aa) may preferably have the repeating unit having the group (aa).

The resin (Aa) may preferably have the repeating unit stable against an acid, the resin (Aa) and more preferably have the group (aa) in the repeating unit stable against the acid. In other words, when the resin (Aa) has the repeating unit having an acid-decomposable group which may be possessed by a resin (Ab) to be described later, it is more preferred that the group (aa) is not present in the repeating unit having an acid-decomposable group.

The resin (Aa) is preferably a resin that is possible to form a protective layer unevenly distributed on the film surface (that is, a resin that forms a protective film unevenly distributed on the film surface by manufacturing the film (in other words, the results of the film production)) by adding to the electron beam- or extreme ultraviolet-sensitive resin composition of the present invention. About determination whether or not a protective layer is formed, for example, when the contact angle is increased by the surface static contact angle (contact angle by pure water) of the film in which the resin (Aa) is not added compared to the surface static contact angle of the film in which the resin (Aa) is added, it can be considered that a protective layer is formed.

The resin (Aa) is a group having a fluorine atom, and preferably an alkyl group having a fluorine atom, a cycloalkyl group having a fluorine atom, or an aryl group having a fluorine atom.

The alkyl group having a fluorine atom (having preferably 1 to 10 carbon atoms, more preferably 1 to 4 carbon atoms) is a straight or branched alkyl group in which at least one hydrogen atom is substituted with a fluorine atom, and may have another substituent.

The cycloalkyl group having a fluorine atom is a monocyclic or polycyclic cycloalkyl group in which at least one hydrogen atom is substituted with a fluorine atom, and may have another substituent.

The aryl group having a fluorine atom may be a group in which at least one hydrogen atom of an aryl group such as a phenyl group and a naphthyl group is substituted with a fluorine atom, and may have another substituent.

From the viewpoint of sensitivity, the resin (Aa) may preferably have a fluorine atom or a group having a fluorine atom. Since the resin (Aa) has a fluorine atom or a group having a fluorine atom, and the absorption coefficient on the extreme ultraviolet rays of the resin (Aa) is improved, and also the resin (Aa) has a property that it is unevenly distributed on the surface of the resist film, it is possible to absorb efficiently the energy of the extreme ultraviolet rays on the film surface that the extreme ultraviolet rays is strongly irradiated at the time of exposure, and as a result, it is considered that the sensitivity will be enhanced.

Preferred examples of the alkyl group having a fluorine atom, the cycloalkyl group having a fluorine atom or the aryl group having a fluorine atom may include groups represented by the following Formulas (F2) to (F4), but the present invention is not limited thereto.

[Chem. 5]

(F2)

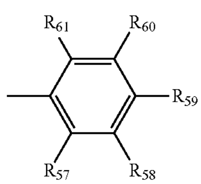

(F3)

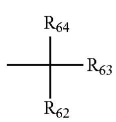

(F4)

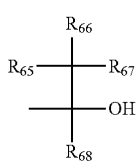

In Formulas (F2) to (F4),

Each of $R_{57}$ to $R_{68}$ independently represents a hydrogen atom, a fluorine atom or a straight or branched alkyl group (preferably a straight or branched alkyl group having 1 to 4 carbon atoms), or an aryl group (preferably having 6 to 14 carbon atoms). However, each of at least one of $R_{57}$ to $R_{61}$, at least one of $R_{62}$ to $R_{64}$ and at least one of $R_{65}$ to $R_{68}$ independently represents a fluorine atom or an alkyl group (preferably having 1 to 4 carbon atoms) in which at least one hydrogen atom is substituted with a fluorine atom. All of $R_{57}$ to $R_{61}$ and $R_{65}$ to $R_{67}$ is preferably a fluorine atom. $R_{62}$, $R_{63}$ and $R_{68}$ are preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may combine with each other to form a ring.

Specific examples of the group represented by Formula (F2) may include a p-fluorophenyl group, a pentafluorophenyl group, a 3,5-di(trifluoromethyl)phenyl group and the like.

Specific examples of the group represented by Formula (F3) may include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. A hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred, and a hexafluoroisopropyl group and a heptafluoroisopropyl group are more preferred.

Specific examples of the group represented by Formula (F4) may include $-C(CF_3)_2OH$, $-C(C_2F_5)_2OH$, $-C(CF_3)(CH_3)OH$, $-CH(CF_3)OH$ and the like, and $-C(CF_3)_2OH$ is preferred.

The resin (Aa) may preferably be a resin having an alkylsilyl structure (preferably a trialkylsilyl group) or a cyclic siloxane structure as a group having a silicon atom.

Specific examples of the alkylsilyl structure or the cyclic siloxane structure may include groups represented by the following Formulas (CS-1) to (CS-3) and the like, but the present invention is not limited thereto.

[Chem. 6]

(CS-1)

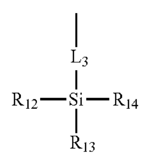

(CS-2)

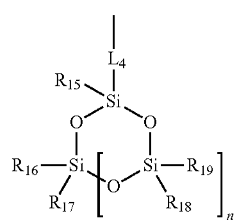

(CS-3)

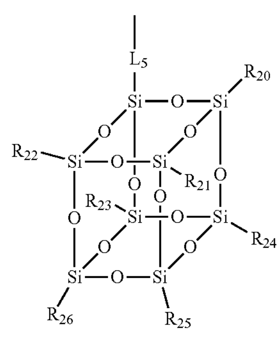

In Formulas (CS-1) to (CS-3),

Each of $R_{12}$ to $R_{26}$ independently represents a straight or branched alkyl group (preferably having 1 to 20 carbon atoms) or a cycloalkyl group (preferably having 3 to 20 carbon atoms).

Each of $L_3$ to $L_5$ represents a single bond or a divalent linking group. Examples of the divalent linking group may include a sole group selected from the group consisting of an alkylene group, a cycloalkylene group, a phenylene group, an ether group, a thioether group, a carbonyl group, an ester group, an amide group, a urethane group and an ureylene group, or a combination of two or more thereof.

n represents an integer of 1 to 5. n is preferably an integer of 2 to 4.

A group represented by Formula (F2) to (F4) and Formula (CS-1) to (CS-3) may be preferably contained in an acrylate or a methacrylate repeating unit.

Examples of the alkyl group having 6 or more carbon atoms may include preferably a group having 6 to 20 carbon atoms, more preferably a group having 6 to 15 carbon atoms, and specifically, a hexyl group, a 2-ethylhexyl group, an octyl group, a decanyl group and the like. The alkyl group may also have a substituent. In addition, examples of the preferred substituent may include an alkyl group, a halogen atom, an alkoxy group, a cycloalkyl group, a hydroxyl group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, a heterocyclic moiety such as pyrrolidone residue and the like, and preferably a substituent having 12 or less carbon atoms.

Examples of the cycloalkyl group having 6 or more carbon atoms may include preferably a group having 6 to 20 carbon atoms, more preferably a group having 6 to 15 carbon atoms, and specifically, a cyclohexyl group, a norbornyl group, an adamantyl group and the like. The cycloalkyl group having 6 or more carbon atoms may also have a substituent, and examples of such a substituent include a group such as a preferred substituent which may be possessed by the alkyl group having 6 or more carbon atoms.

Examples of the aryl group having 9 or more carbon atoms may include preferably a group having 9 to 20 carbon atoms, more preferably a group having 10 to 20 carbon atoms, and specifically, a naphthyl group, an anthracenyl group and the like. The aryl group having 9 or more carbon atoms may also have a substituent, and examples of such a substituent may include a group such as a preferred substituent which may be possessed by the alkyl group having 6 or more carbon atoms.

Examples of the aralkyl group having 10 or more carbon atoms include preferably a group having 10 to 20 carbon atoms, more preferably a group having 11 to 20 carbon atoms. These groups may also have a substituent, and examples of such a substituent may include a group such as a preferred substituent which may be possessed by the alkyl group having 6 or more carbon atoms.

An alkyl group having 3 or more carbon atoms in the aryl group substituted with at least one alkyl group having 3 or more carbon atoms include preferably a group having 3 to 20 carbon atoms, more preferably a group having 5 to 20 carbon atoms, and specifically, a propyl group, an isopropyl group, an n-butyl group, an isobutyl group, a t-butyl group, a pentyl group, a hexyl group and the like. These groups may also have a substituent, and examples of such a substituent include a group such as a preferred substituent which may be possessed by the alkyl group having 6 or more carbon atoms.

An aryl group in an aryl group substituted with at least one alkyl group having 3 or more carbon atoms include preferably a group having the number of 6 to 20 carbon atoms, more preferably a group having 8 to 20 carbon atoms, and specifically, a phenyl group, a naphthyl group, an anthracenyl group and the like. These groups may also have a substituent, and examples of such a substituent include a group such as a preferred substituent which may be possessed by an alkyl group having 6 or more carbon atoms.

A cycloalkyl group having 5 or more carbon atoms in the aryl group substituted with at least one cycloalkyl group having 5 or more carbon atoms include preferably a cycloalkyl group having 5 to 20 carbon atoms, more preferably a group having 5 to 10 carbon atoms, and specifically, a cyclopentyl group, a cyclohexyl group, a norbonyl group, an adamantyl group and the like. These groups may also have a substituent, and examples of such a substituent may include a group such as a preferred substituent which may be possessed by the alkyl group having 6 or more carbon atoms.

Specific examples of the aryl group in the aryl group substituted with at least one cycloalkyl group having 5 or more carbon atoms are to the same as the aryl group in the aryl group substituted with at least one alkyl group having 3 or more carbon atoms. These groups may also have a substituent, and examples of such a substituent may include a group such as a preferred substituent which may be possessed by the alkyl group having 6 or more carbon atoms.

The electron beam- or extreme ultraviolet-sensitive resin composition of the present invention may preferably have a repeating unit having an aryl group from the view point of realizing high resolution and good pattern shapes.

As the resin (Aa) which the electron beam- or extreme ultraviolet-sensitive resin composition of the present invention may contain has the repeating unit having the above-described aryl group, and since it is possible to absorb or reflect outband light produced at the time of exposure, it is possible to suppress the occurrence of an excessive acid generated by the above-described outband light at the time of exposure. As a result, especially in the pattern formation by EUV exposure, the realization of high resolution and good pattern shape is considered to become possible.

Specific examples and preferred range of an aryl group in which the repeating unit having an aryl group have similarity to an aryl group in an aryl group substituted with at least one cycloalkyl group having 5 or more carbon atoms.

The electron beam- or extreme ultraviolet-sensitive resin composition of the present invention may preferably have a repeating unit (Aa2) represented by the following Formula (aa2-1).

[Chem. 7]

(aa2-1)

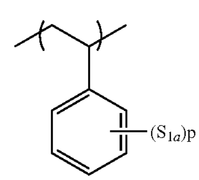

In Formula (aa2-1), $S_{1a}$ represents a substituent, and when a plurality of $S_{1a}$ is present, each $S_{1a}$ may be same or different.

P represents an integer of 0 to 5.

$S_{1a}$ represents a substituent. Examples of the substituent represented by $S_{1a}$ may include an alkyl group, a cycloalkyl group, an alkoxy group, an acyl group, an acyloxy group, a halogen atom, a cyano group, a group having a silicon atom, an aryl group, an aryloxy group, an aralkyl group, an aralkyloxy group, a hydroxyl group, a nitro group, a sulfonylamino group, an alkylthio group, an arylthio group, an aralkylthio group, and the like.

The substituent represented by $S_{1a}$ may also be a group in which the above-descried group is combined to a divalent linking group, and examples of the divalent linking group may include a substituted or an unsubstituted alkylene group, a substituted or an unsubstituted cycloalkylene group, —O—, or a divalent linking group that a plurality of the groups is combined.

Examples of the alkyl group represented by $S_{1a}$ may include preferably an alkyl group having 1 to 20 carbon atoms, and specifically, a methyl group, an ethyl group, a propyl group, an isopropyl group, an n-butyl group, an isobutyl group, a t-butyl group, a pentyl group, a hexyl group and the like. An alkyl group may also have a substituent. Preferred examples of the substituent which may be further possessed may include a halogen atom, an alkoxy group, a cycloalkyl group, a hydroxyl group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, a heterocyclic moiety such as a pyrrolidone residue, and preferably, a substituent having 12 or less carbon atoms.

Examples of the cycloalkyl group represented by $S_{1a}$ may include a cycloalkyl group having 3 to 10 carbon atoms, specifically, a cyclobutyl group, a cyclopentyl group, cyclohexyl group, a norbonyl group, an adamantyl group and the like. A cycloalkyl group may also have a substituent. Preferred examples of the further substituent may include an alkyl group such as a substituent which may be possessed by the alkyl group as $S_{1a}$ as described above.

The alkoxy group represented by $S_{1a}$ is preferably, for example, an alkoxy group having 1 to 10 carbon atoms, and specific examples thereof may include a methoxy group, an ethoxy group, a propoxy group, a butoxy group and the like. The alkoxy group may also have a substituent, and examples of such a substituent may include a group such as the preferred substituent which may be possessed by the alkyl group as $S_{1a}$ as described above.

The acyl group represented by $S_{1a}$ is preferably, for example, a group having 2 to 10 carbon atoms, and specific examples thereof may include an acetyl group, a propionyl group, a butyryl group, an isobutyryl group and the like. The acyl group may also have a substituent, and examples of such a substituent may include a group such as the preferred substituent which may be possessed by the alkyl group as $S_{1a}$ as described above.

The acyloxy group represented by $S_{1a}$ is preferably, for example, a group having 2 to 10 carbon atoms. Examples of the acyloxy group may include specific examples of the above-described acyl group, and the substituents which may be possessed are also the same.

The aryl group represented by $S_{1a}$ is preferably, for example, a group having 6 to 10 carbon atoms, and specific examples thereof may include a phenyl group, a xylyl group, a toluyl group, a cumenyl group, a naphthyl group, an anthracenyl group and the like. The aryl group may also have a substituent, and examples of such a substituent may include a group such as the preferred substituent which may be possessed by the alkyl group or a cycloalkyl group as $S_{1a}$ as described above.

Examples of the aryloxy group and an arylthio group represented by $S_{1a}$ may include a group having 2 to 10 carbon atoms. Examples of the aryl group in the aryloxy group and the arylthio group may include specific examples of the above-described aryl group, and the substituents which may be possessed are also the same.

The aralkyl group represented by $S_{1a}$ is preferably, for example, a group having 7 to 15 carbon atoms, and specific examples thereof may include a benzyl group and the like. These groups may also have a substituent, and examples of such a substituent may include a group such as the preferred substituent which may be possessed by the alkyl group or a cycloalkyl group as $S_{1a}$ as described above.

The aralkyloxy group and an aralkylthio group represented by $S_{1a}$ is preferably, for example, a group having 7 to 15 carbon atoms. Examples of the aralkyl group in the aralkyloxy group and the aralkylthio group may include specific examples of the above-described aryl group, and the substituents which may be possessed are also the same.

The alkylthio group represented by $S_{1a}$ is preferably, for example, a group having 1 to 10 carbon atoms. Examples of the alkyl group in the alkylthio group may include specific examples of the above-described alkyl group, and the substituents which may be possessed are also the same.

The halogen atom represented by $S_{1a}$ is a fluorine atom, a chlorine atom, a bromine atom, an iodine atom, more preferably a fluorine atom and a chlorine atom, and most preferably a fluorine atom.

An organic group having a silicon atom represented by $S_{1a}$ is a group containing at least one carbon atom, and may have a hetero atom such as an oxygen atom, a nitrogen atom, a sulfur atom, a silicone atom, a halogen atom (e.g., a fluorine atom, a chlorine atom, a bromine atom and the like). The organic group is preferably a group having 1 to 30 carbon atoms.

A group having a silicon atom is preferably, in one embodiment, a group represented by the following Formula (S).

[Chem. 8]

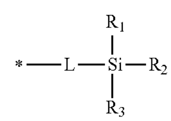

(S)

In the formula,

Each of $R_1$, $R_2$ and $R_3$ independently represents a hydrogen atom, an alkyl group, an alkenyl group, a cycloalkyl group, an alkoxy group, an aryl group, an aralkyl group, or a halogen atom.

L represents a single bond or a divalent linking group.

An alkyl group as $R_1$, $R_2$ and $R_3$ is preferably, for example, an alkyl group having 1 to 20 carbon atoms, and may have a substituent.

An alkenyl group as $R_1$, $R_2$ and $R_3$ is preferably, for example, an alkenyl group having 2 to 20 carbon atoms, and may have a substituent.

A cycloalkyl group as $R_1$, $R_2$ and $R_3$ is preferably, for example, a cycloalkyl group having 3 to 20 carbon atoms, and may have a substituent.

An alkoxy group as $R_1$, $R_2$ and $R_3$ is preferably, for example, an alkoxy group having 1 to 10 carbon atoms, and may have a substituent.

An aryl group as $R_1$, $R_2$ and $R_3$ is preferably, for example, an aryl group having 6 to 10 carbon atoms, and may have a substituent.

An aralkyl group as $R_1$, $R_2$ and $R_3$ is preferably, for example, an aralkyl group having 7 to 15 carbon atoms, and may have a substituent.

Examples of the divalent linking group represented by L may include a substituted or unsubstituted alkylene group, —O—, —S—, —(C=O)—, or a divalent linking group formed by combining a plurality thereof.

$S_{1a}$ is preferably, in one embodiment, an alkyl group which may have a substituent, a halogen atom or a group having a silicon atom, more preferably an alkyl group, an alkyl group substituted with a halogen atom, or a group having a silicon atom, and still more preferably an alkyl group represented by the following Formula (S-1).

[Chem. 9]

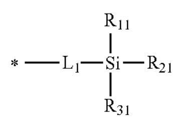

(S-1)

In the formula,

Each of $R_{11}$, $R_{21}$ and $R_{31}$ independently represents an alkyl group.

$L_1$ represents a single bond or a divalent linking group.

The alkyl group as $R_{11}$, $R_{21}$ and $R_{31}$ is the same as the alkyl group as $R_1$, $R_2$ and $R_3$ in Formula (S), and the divalent linking group as $L_1$ is the same as the divalent linking group as L in Formula (S).

p represents, as described above, an integer of 0 to 5. p is preferably an integer of 1 to 5.

The content of the repeating unit (Aa2) in the resin (Aa) is preferably 1 to 99 mol %, more preferably 1 to 70 mol %, still more preferably 1 to 50 mol %, and particularly preferably 1 to 30 mol % based on the total repeating unit in the resin (Aa).

The resin (Aa) may preferably have a repeating unit having a partial structure represented by the following Formula (KA-1).

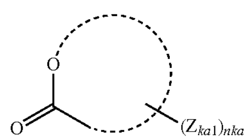

(KA-1)

In Formula (KA-1),

When nka is 2 or more, each $Z_{ka1}$ independently represents an alkyl group, a cycloalkyl group, an ether group, a hydroxyl group, an amide group, an aryl group, a lactone ring group, or an electron-withdrawing group. When nka is 2 or more, a plurality of $Z_{ka1}$ may combine with each other to form a ring. Examples of the ring may include a cycloalkyl ring, and a cyclic ether ring and a heterocyclic ring such as a lactone ring.

nka represents an integer of 0 to 10. nka is preferably 0 to 8, more preferably 0 to 5, still more preferably 1 to 4, and particularly preferably 1 to 3.

Further, the structure represented by Formula (KA-1) may be a partial structure existed in the main chain, and side chain, and the end of the resin, and exists as at least monovalent substituent except for at least one hydrogen atom contained in the structure.

$Z_{ka1}$ is preferably an alkyl group, a cycloalkyl group, an ether group, a hydroxyl group or an electron-withdrawing group, and still more preferably an alkyl group, a cycloalkyl group or an electron-withdrawing group. Further, the ether group is preferably an alkyl ether group or a cycloalkyl ether group.

The alkyl group as $Z_{ka1}$ may be straight or branched. The alkyl group may have further a substituent.

The alkyl group as $Z_{ka1}$ is preferably a group having 1 to 4 such as a methyl group, an ethyl group, an n-propyl group, an i-propyl group, an n-butyl group, an i-butyl group, a t-butyl group and the like.

The cycloalkyl group as $Z_{ka1}$ may be monocyclic or polycyclic type. In the latter case, a cycloalkyl group may be bridged. That is, in this case, a cycloalkyl group may have a bridge structure. In addition, some of carbon atoms of the cycloalkyl group may be substituted by a hetero atom such as an oxygen atom.

The monocyclic cycloalkyl group is preferably a group having 3 to 8, and examples thereof may include a cyclopropyl group, a cyclobutyl group, a cyclopentyl group, a cyclohexyl group and a cyclooctyl group.

Examples of the polycyclic cycloalkyl group may include a group having the bicyclo, tricyclo or tetracyclo structure having 5 or more. This polycyclic cycloalkyl group may have 6 to 20 carbon atoms, and examples thereof include for example, an adamantyl group, a norbonyl group, an isobornyl group, a camphanyl group, a dicyclopentyl group, an α-pinel group, a tricyclodecanyl group, a tetracyclododecyl group and an androstanyl group.

These structures may have further a substituent. Examples of the substituent may include an alkyl group, a halogen atom, a hydroxyl group, an alkoxy group, a carboxyl group and an alkoxycarboxyl group.

The alkyl group as a substituent is preferably a lower alkyl group such as a methyl group, an ethyl group, a propyl group, an isopropyl group and a butyl group, and more preferably a methyl group, an ethyl group, a propyl group and an isopropyl group.

Examples of the alkoxy group as a substituent may include preferably a group having 1 to 4 carbon atoms such as a methoxy group, an ethoxy group, a propoxy group, a butoxy group and the like.

The alkyl group and the alkoxy group as their substituents may further have a substituent. Examples of the further substituent may include a hydroxyl group, a halogen atom and an alkoxy group (having preferably 1 to 4 carbon atoms).

Examples of the aryl group of $Z_{ka1}$ may include a phenyl group and a naphthyl group.

Examples of the substituent which may be further possessed by the alkyl group, the cycloalkyl group and the aryl group of $Z_{ka1}$ may include a hydroxyl group; a halogen atom; a nitro group; a cyano group; the above-described alkyl group; an alkoxy group such as a methoxy group, an ethoxy group, a hydroxyethoxy group, a propoxy group, a hydroxypropoxy group, an n-butoxy group, an isobutoxy group, a sec-butoxy group and a t-butoxy group; an alkoxycarboxyl group such as a methoxycarbonyl group and an ethoxycarbonyl group; an aralkyl group such as a benzyl group, a phenetyl group and a cumyl group; an aralkyloxy group; an acyl group such as a formyl group, an acetyl group, a butyryl group, a benzoyl group, a cyanamyl group and a valeryl group; a butyryloxy group; an alkenyl group; an alkenyloxy group such as a vinyloxy group, a propenyloxy group, an aryloxy group and a butenyloxy group; the above-described aryl group; an aryloxy group such as a phenoxy group; and an aryloxycarbonyl group such as a benzoyloxy group.

Examples of the electron-withdrawing group of $Z_{ka1}$ may include a halogen atom, a cyano group, an oxy group, a carbonyl group, a carbonyloxy group, an oxycarbonyl group, a nitrile group, a nitro group, a sulfonyl group, a sulfinyl group, a halo(cyclo) alkyl group represented by —$C(R_{f1})(R_{f2})$—$R_{f3}$, a haloaryl group, and their combination. Further, "a halo(cyclo)alkyl group" means a (cyclo) alkyl group in which at least one hydrogen atom is substituted by a halogen atom.

Examples of the halogen atom of $Z_{ka1}$ may include a fluorine atom, a chlorine atom, a bromine atom and an iodine atom. Among these, a fluorine atom is particularly preferred.

In the halo(cyclo)alkyl group represented by —$C(R_{f1})(R_{f2})$—$R_{f3}$, $R_{f1}$ represents a halogen atom, a perhaloalkyl group, a perhalocycloalkyl group, or a perhaloaryl group. The $R_{f1}$ is more preferably a fluorine atom, a perfluoro alkyl group or a perfluorocycloalkyl group, and still more preferably, a fluorine atom or a trifluoromethyl group.

In the halo(cyclo)alkyl group represented by —$C(R_{f1})(R_{f2})$—$R_{f3}$, each of $R_{f2}$ and $R_{f3}$ independently represents a hydrogen atom, a halogen atom or an organic group. Examples of the organic group may include an alkyl group, a cycloalkyl group and an alkoxy group. These groups may further have a substituent such as a halogen atom.

At least two groups of $R_{f1}$ to $R_{f3}$ may combine with each other to form a ring. Examples of this ring may include a cycloalkyl ring, a halocycloalkyl ring, an aryl ring, and a haloaryl ring.

Examples of the alkyl group and a haloalkyl group of $R_{f1}$ to $R_{f3}$ may include the above-explained alkyl group as for $Z_{ka1}$ and a group in which at least some of hydrogen atoms in these alkyl groups are substituted by a halogen atom.

Examples of the halocycloalkyl group and the haloaryl group may include a group in which at least some of hydrogen atoms in the previously explained cycloalkyl group and the aryl group as for $Z_{ka1}$ are substituted by a halogen atom. More preferred examples of the halocycloalkyl group and the haloaryl group include a fluorocycloalkyl group represented by —$C_{(n)}F_{(2n-2)}H$, and a perfluoroaryl group and the like. Here, the range of the carbon number n is not particularly limited, but n is preferably an integer of 5 to 13, and n is particularly preferably 6.

$R_{f2}$ is the same group as $R_{f1}$, or more preferably, combines with $R_{f3}$ to form a ring.

The above-described electron-withdrawing group is particularly a halogen atom, a halo(cyclo) alkyl group or a haloaryl group.

In the above-described electron-withdrawing group, some of fluorine atoms may be substituted by an electron-withdrawing group other than a fluorine atom.

Further, when an electron-withdrawing group is at least divalent group, a bonding hand of the remaining may be used in combination with any atom or a substituent. In this case, the above-described partial structure may be bonded to the main chain of the hydrophobic resin through an additional substituent.

Among groups represented by Formula (KA-1), the ones represented by the following Formula (KY-1) are also preferred.

(KY-1)

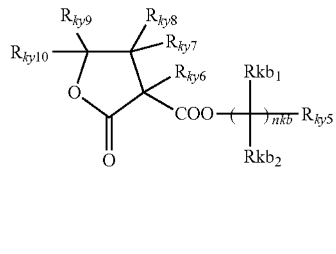

In Formula (KY-1),

Each of $R_{ky6}$ to $R_{ky10}$ independently represents a hydrogen atom, a halogen atom, an alkyl group, a cycloalkyl group, carbonyl group, carbonyloxy group, an oxycarbonyl group, an ether group, a hydroxyl group, a cyano group, an amide group, or an aryl group. At least two groups of $R_{ky6}$ to $R_{ky10}$ may combine with each other to form a ring.

$R_{ky5}$ represents an electron-withdrawing group. Examples of the electron-withdrawing group may include the same as $Z_{ka1}$ in Formula (KA-1). The electron-withdrawing group is preferably a halogen atom, a halo(cyclo)alkyl group represented by $C(R_{f1})(R_{f2})$—$R_{f3}$, or a haloaryl group, and their specific examples are the same as the specific examples in Formula (KA-1).

nkb represents 0 or 1.

Each of $R_{kb1}$ and $R_{kb2}$ independently represents a hydrogen atom, an alkyl group, a cycloalkyl group, an aryl group, or an electron-withdrawing group. Specific examples of the atomic group may include the same as $Z_{ka1}$ in Formula (KA-1).

The structure represented by Formula (KY-1) is more preferably the structure represented by the following Formula (KY-1-1).

(KY-1-1)

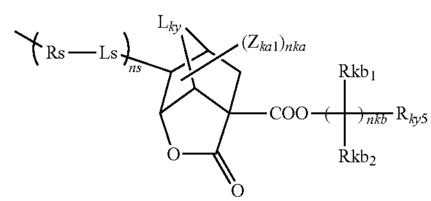

In Formula (KY-1-1), each of $Z_{ka1}$ and nka has the same meaning with the ones in Formula (KA-1). Each of $R_{ky5}$, $R_{kb1}$, $R_{kb2}$ and nkb has the same meaning with the ones in Formula (KY-1).

$L_{ky}$ represents an alkylene group, an oxygen atom or a sulfur atom. Examples of the alkylene group of $L_{ky}$ may include a methylene group and an ethylene group. $L_{ky}$ is preferably an oxygen atom or a methylene group, and more preferably a methylene group.

Each Rs independently represents an alkylene group or a cycloalkylene group. When ns is 2 or more, a plurality of Rs's may be same or different. Ls represents a single bond, an ether bond, an ester bond, an amide bond, a urethane bond or an urea bond, and when a plurality of bonds exist, they may be same or different.

ns is a repeating number of the linking group represented by —(Rs-Ls)- and represents an integer of 0 to 5.

The content of the repeating unit having a partial structure represented by Formula (KA-1) is preferably 1 to 40 mol %, more preferably 3 to 30 mol %, and still more preferably 5 to 15 mol % based on the total repeating unit in the resin (Aa).

(Aa-1)

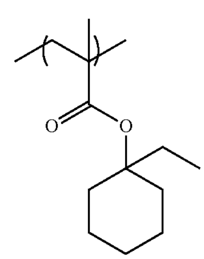

-continued
(Aa-2)
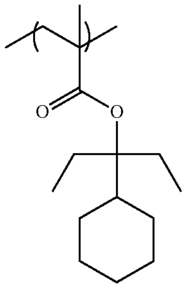
(Aa-3)
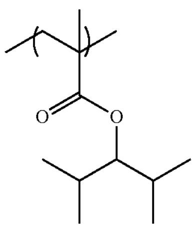
(Aa-4)
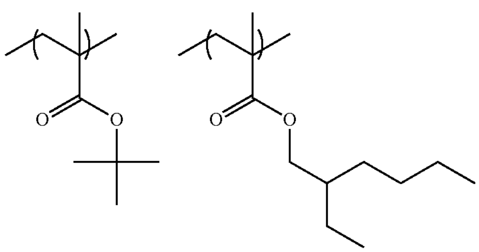
(Aa-5)
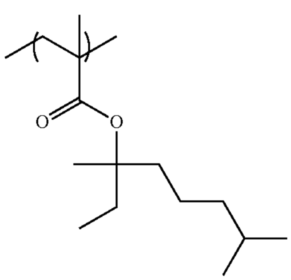
(Aa-6)
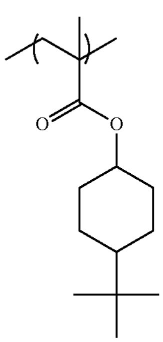
-continued
(Aa-7)
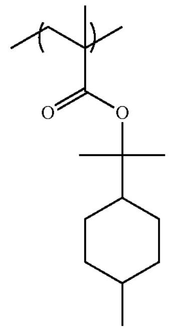
(Aa-8)
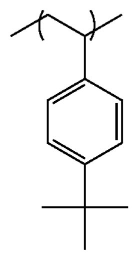
(Aa-9)
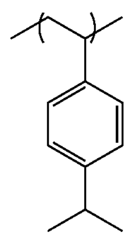
(Aa-10)
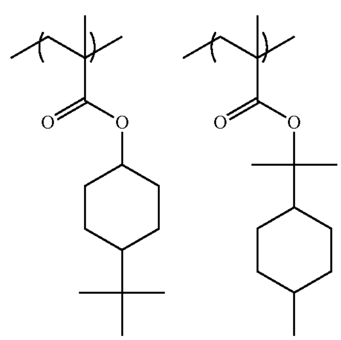
(Aa-11)
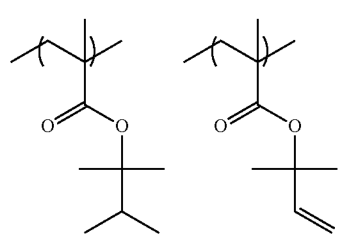

-continued
(Aa-12)
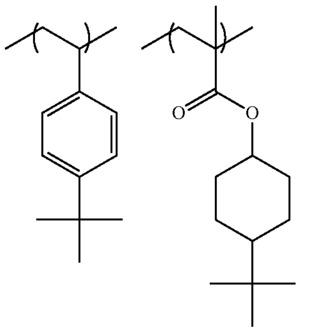
(Aa-13)
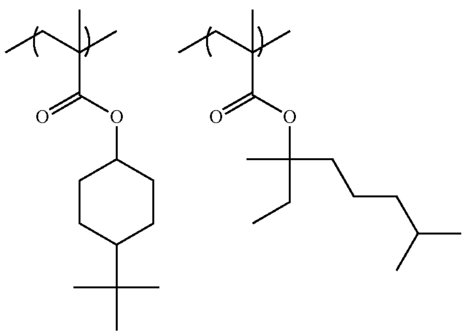
(Aa-14)
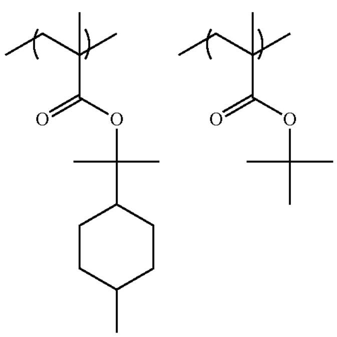
(Aa-15)
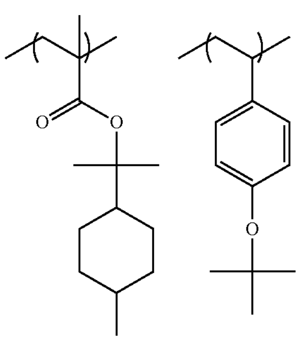
(Aa-16)
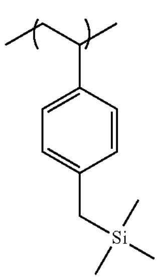
-continued
(Aa-17)
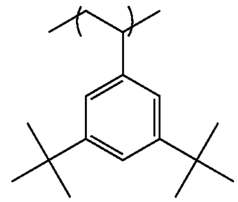
(Aa-18)
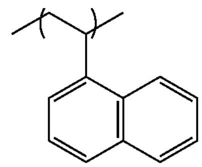
(Aa-19)
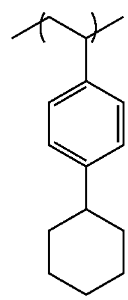
(Aa-20)
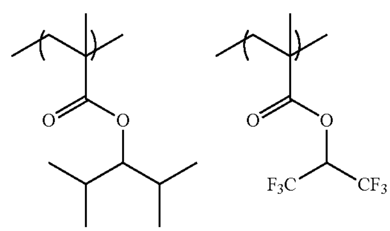
(Aa-21)
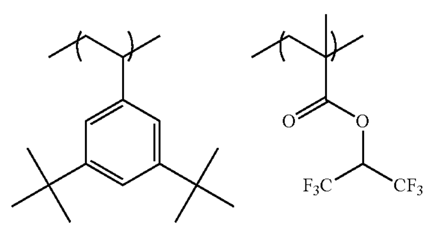
(Aa-22)
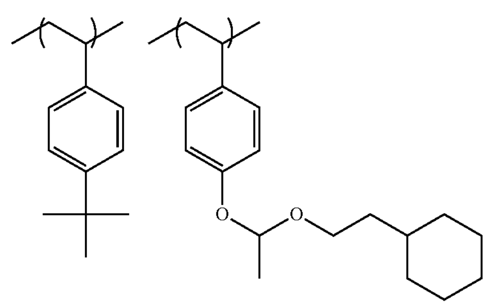

-continued
(Aa-23)
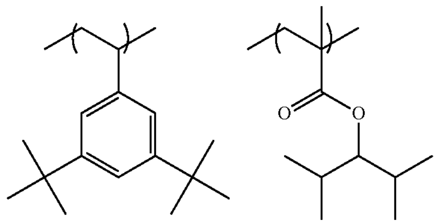
(Aa-24)
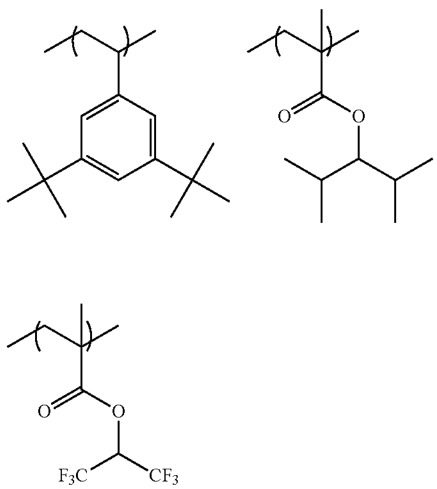
(Aa-25)
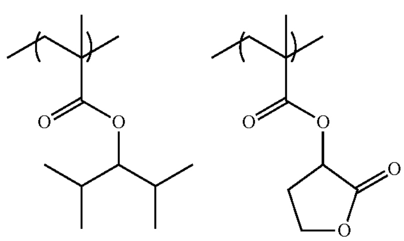
(Aa-26)
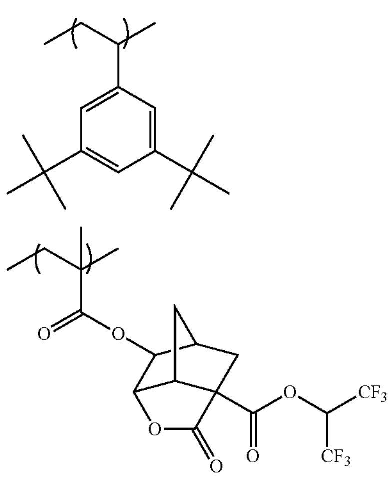
-continued
(Aa-27)
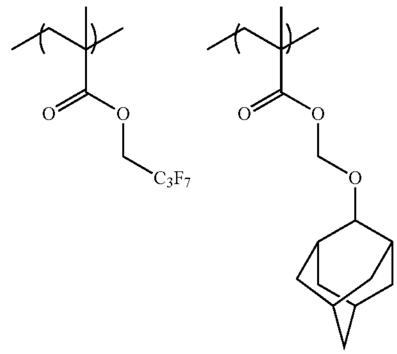
(Aa-28)
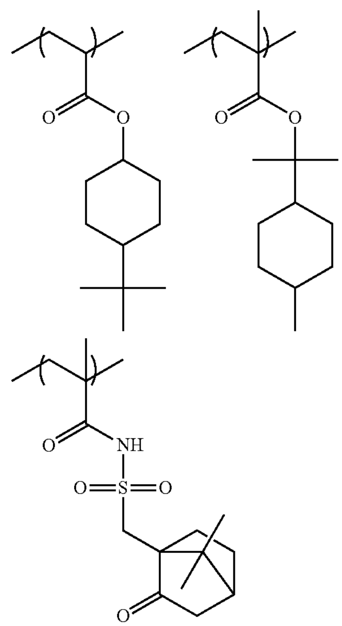
(Aa-29)
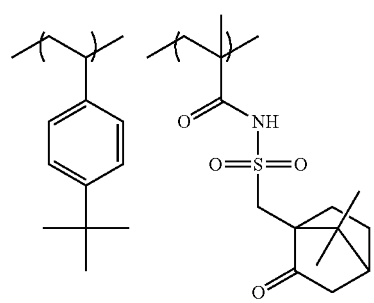
(Aa-30)
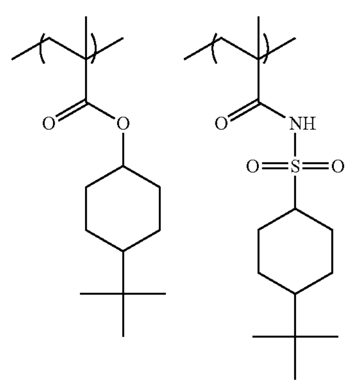

-continued
(Aa-31)
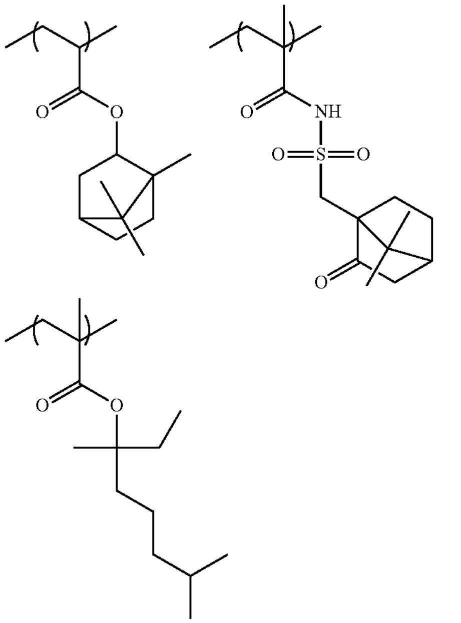
(Aa-32)
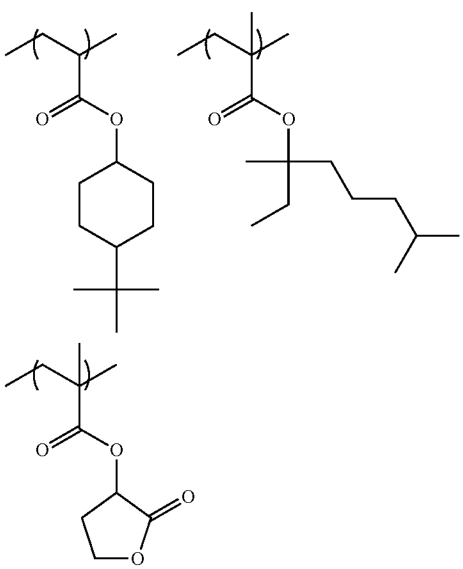
(Aa-33)
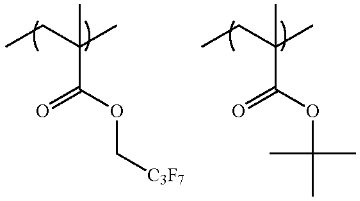
(Aa-34)
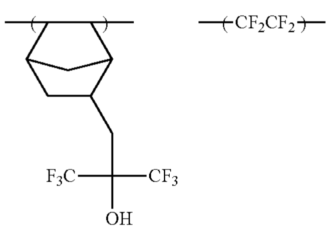
-continued
(Aa-35)
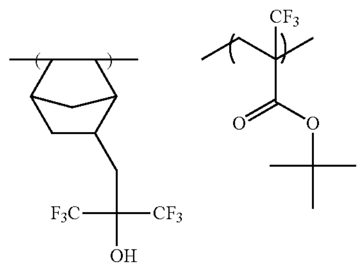
(Aa-36)
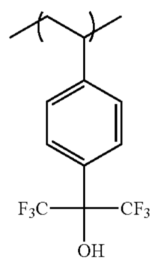
(Aa-37)
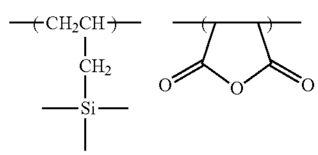
(Aa-38)
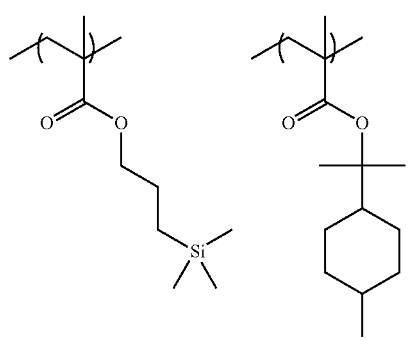
(Aa-39)
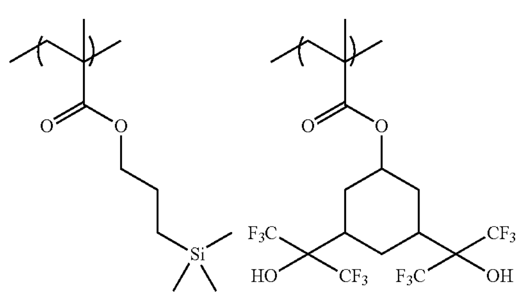

-continued
(Aa-40)
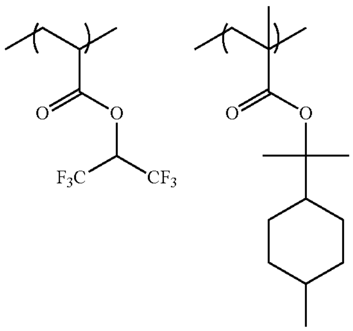
(Aa-41)
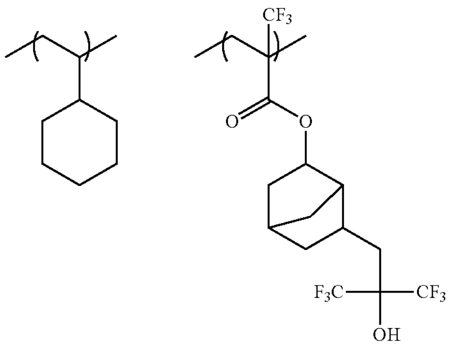
(Aa-42)
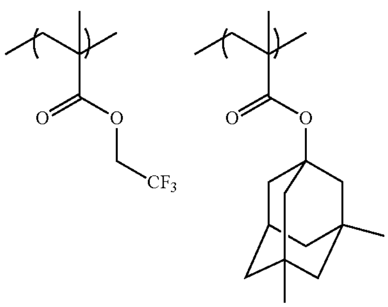
(Aa-43)
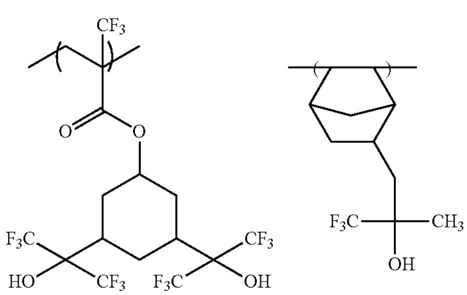
(Aa-44)
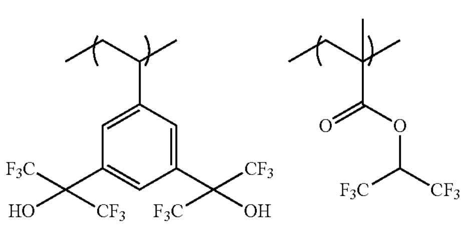
-continued
(Aa-45)
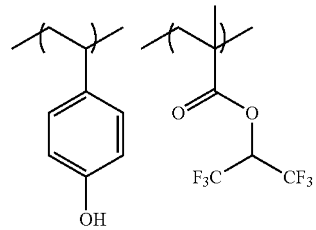
(Aa-46)
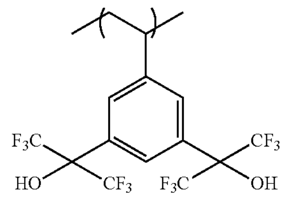
(Aa-47)
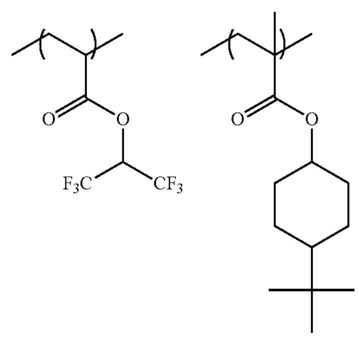
(Aa-48)
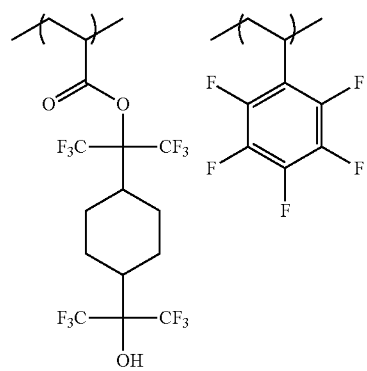
(Aa-49)
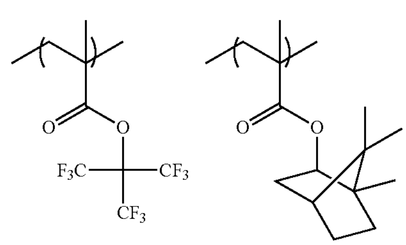

-continued
(Aa-50)
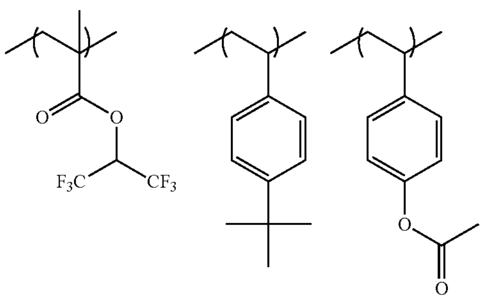
(Aa-51)
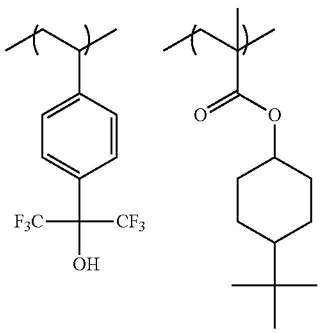
(Aa-52)
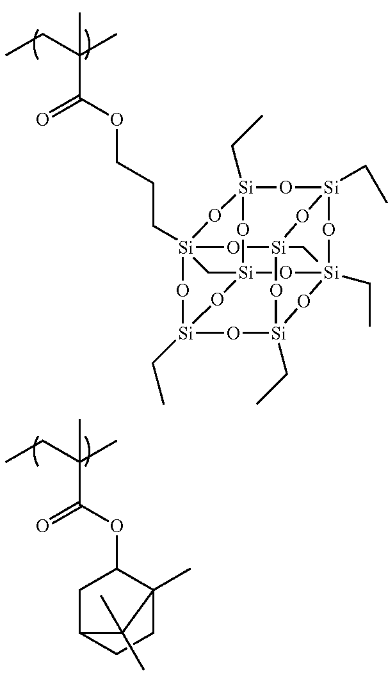
(Aa-53)
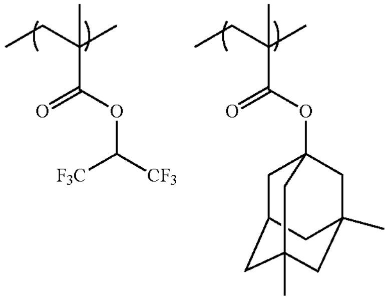
-continued
(Aa-54)
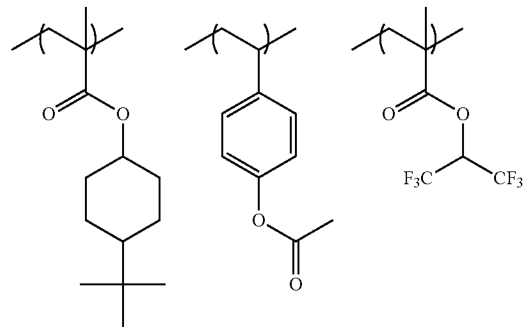
(Aa-55)
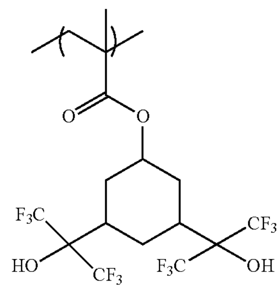
(Aa-56)
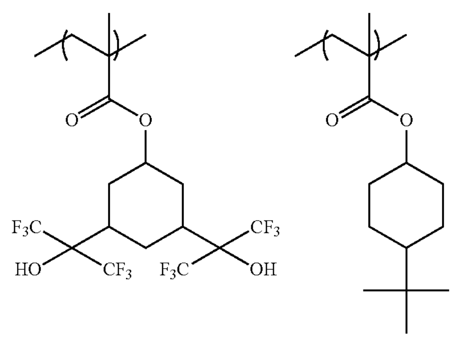
(Aa-57)
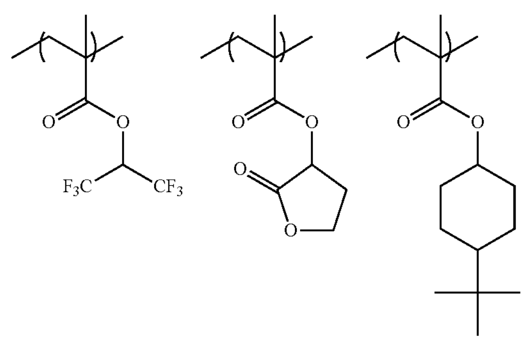
(Aa-58)
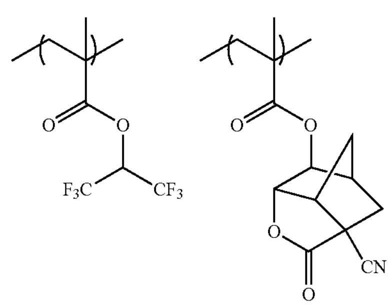

-continued
(Aa-59)
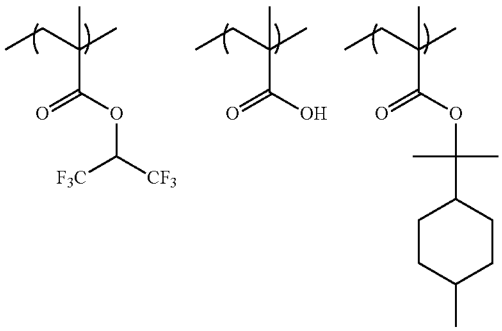
(Aa-60)
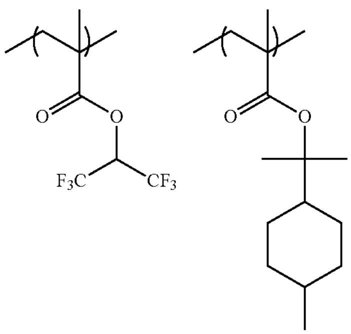
(Aa-61)
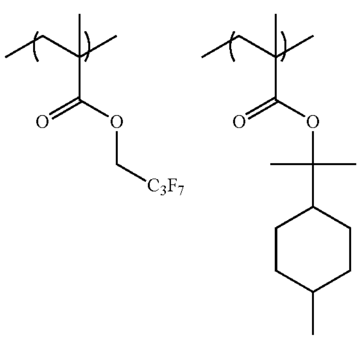
(Aa-62)
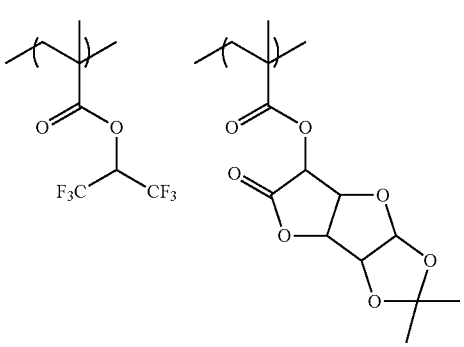
-continued
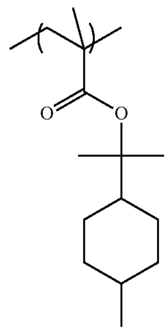
(Aa-63)
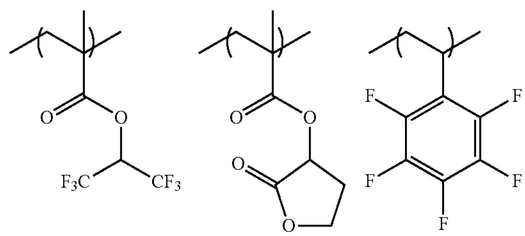
(Aa-64)
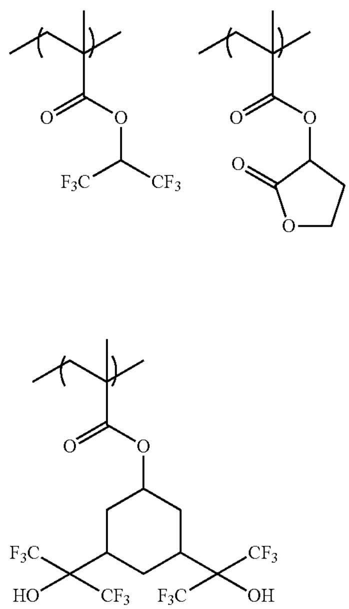
(Aa-65)
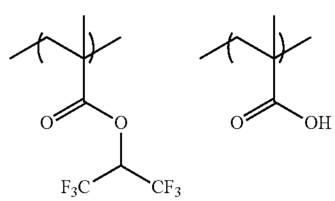

-continued
(Aa-66)
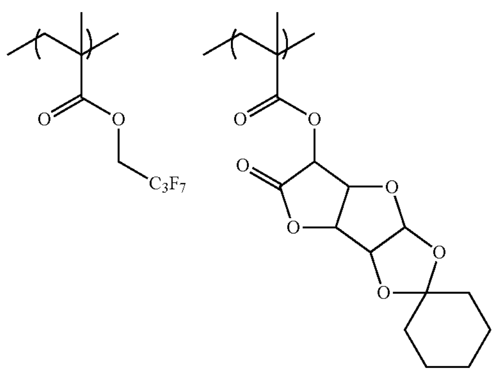
(Aa-67)
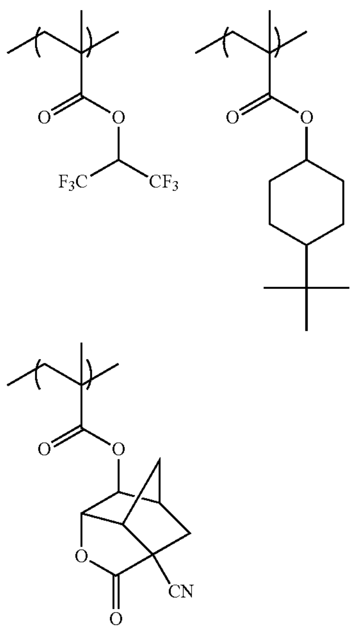
(Aa-68)
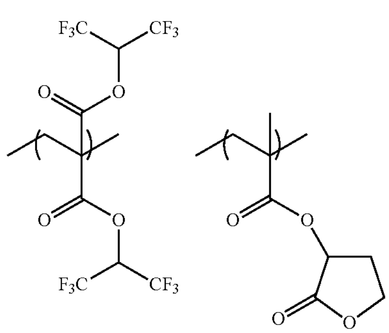
(Aa-69)
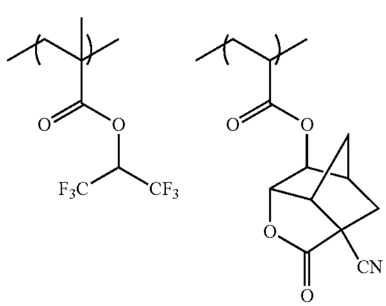
-continued
(Aa-70)
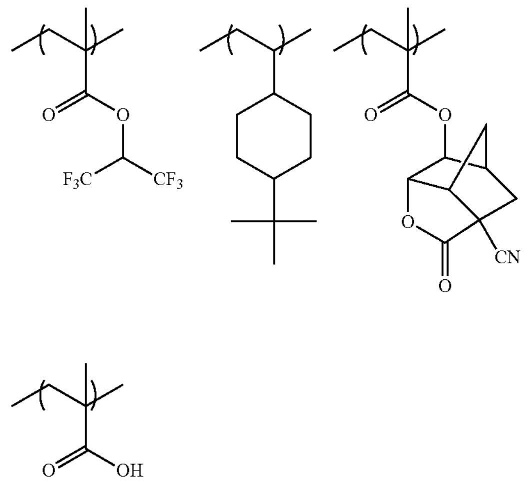
(Aa-71)
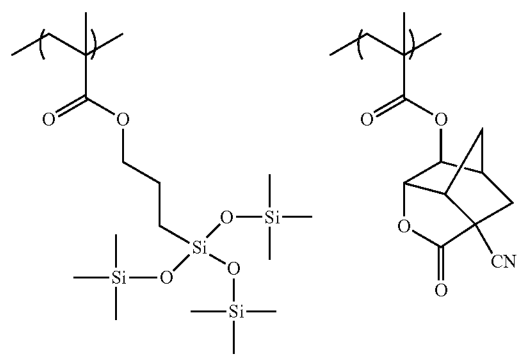
(Aa-72)
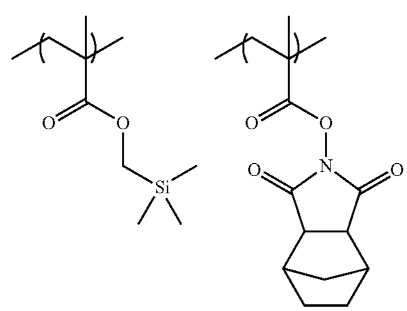
(Aa-73)
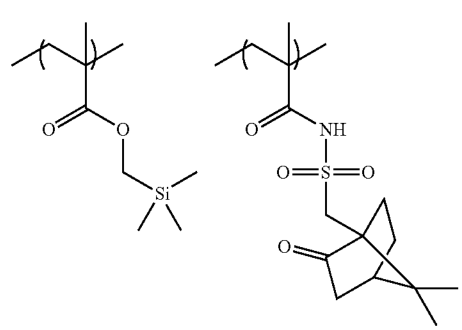

-continued
(Aa-74)
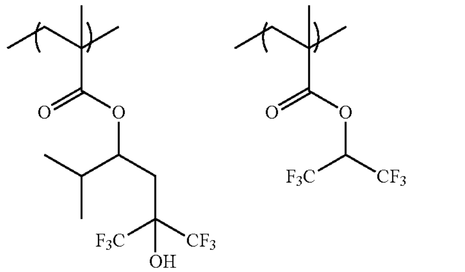
(Aa-75)
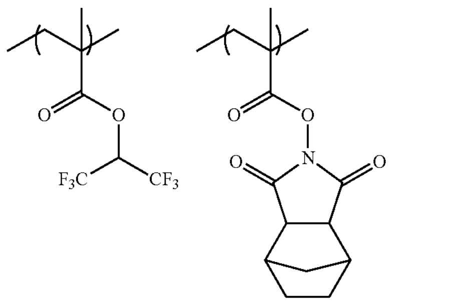
(Aa-76)
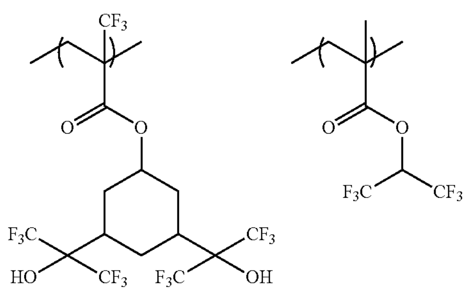
(Aa-77)
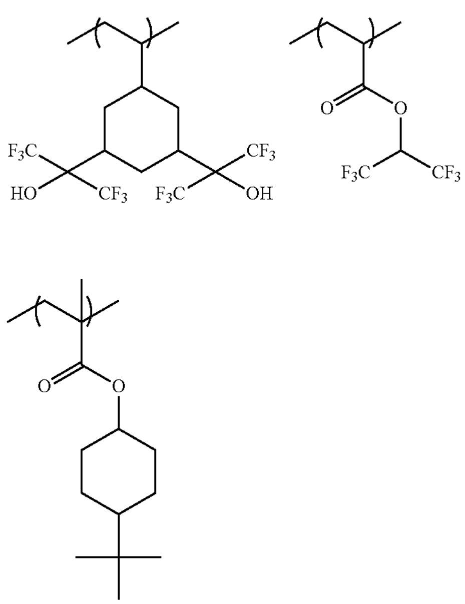
-continued
(Aa-78)
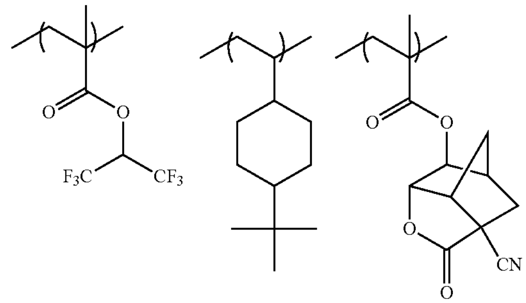
(Aa-79)
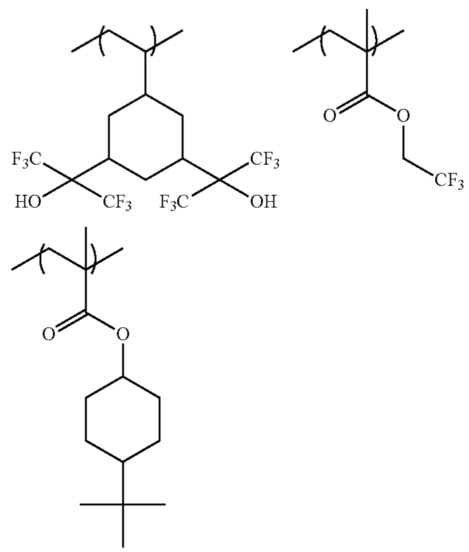
(Aa-80)
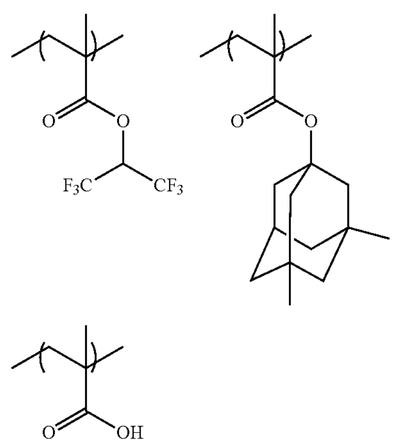
(Aa-81)
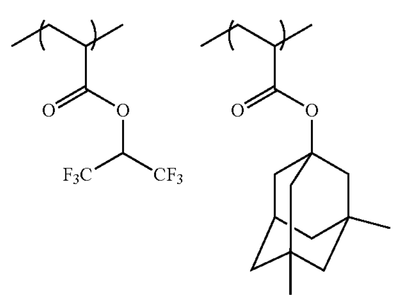

-continued
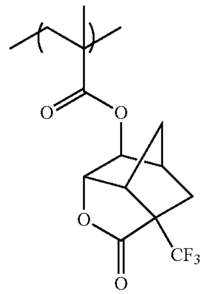
(Aa-82)
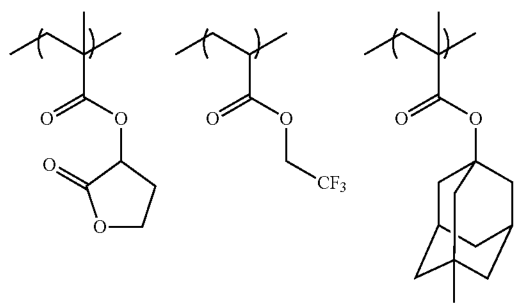
(Aa-83)
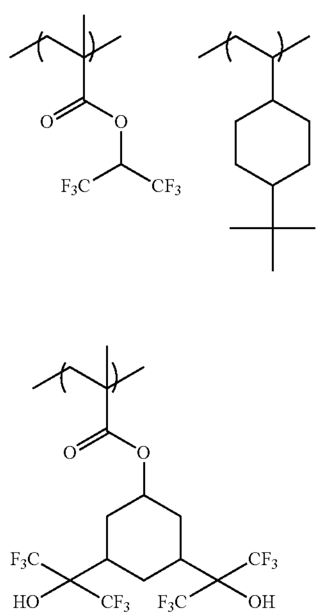
(Aa-84)
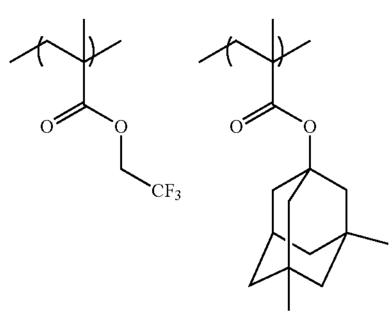
-continued
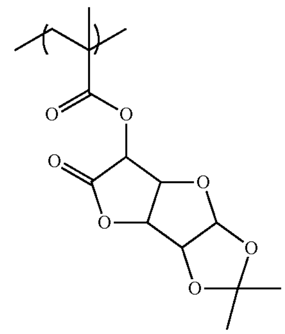
(Aa-85)
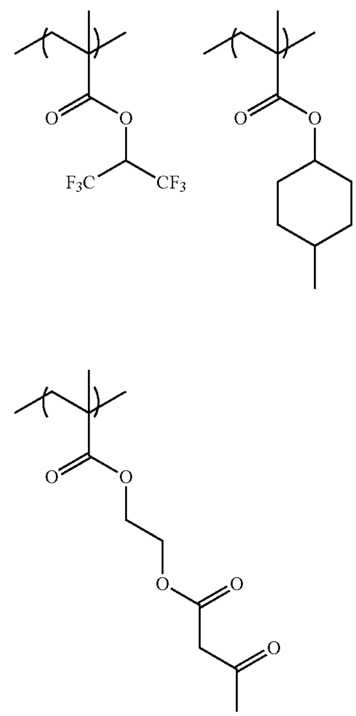
(Aa-86)
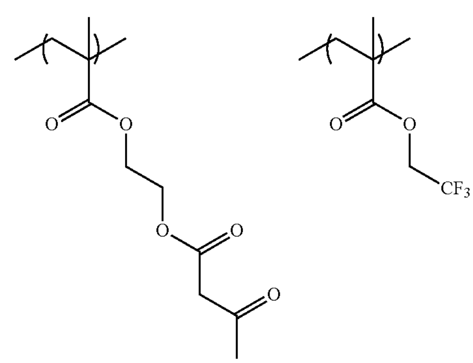
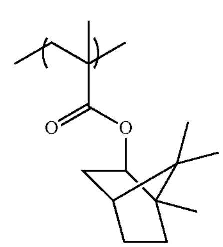

-continued
(Aa-87)
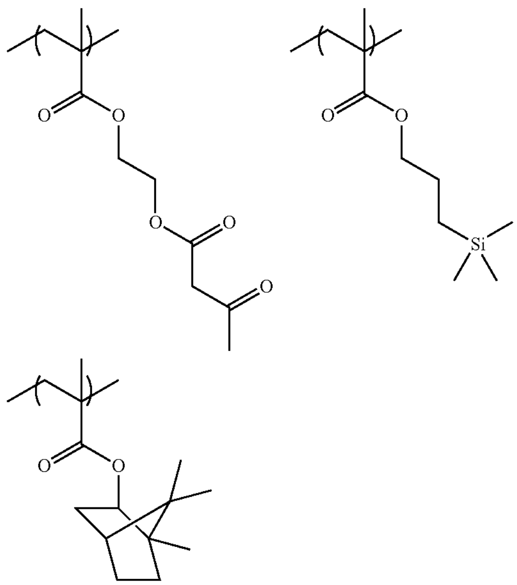
(Aa-88)
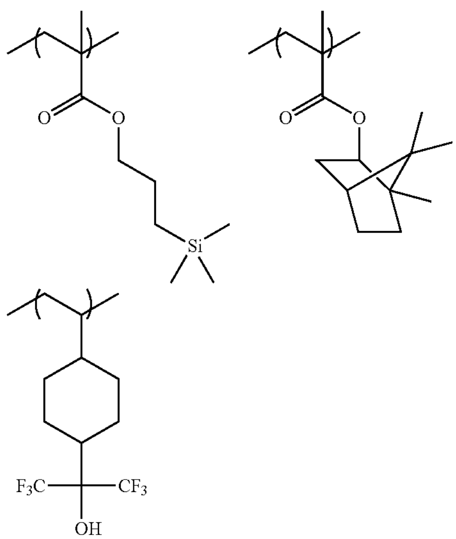
(Aa-89)
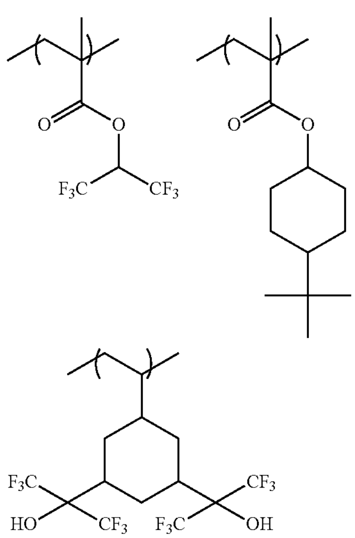
-continued
(Aa-90)
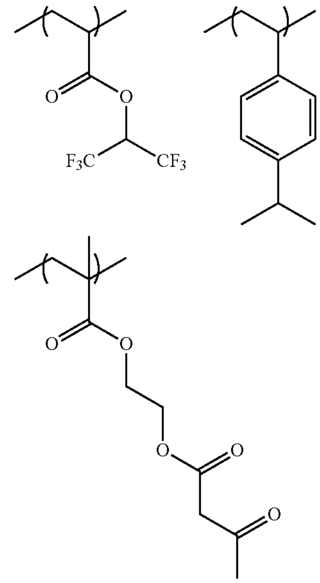
(Aa-91)
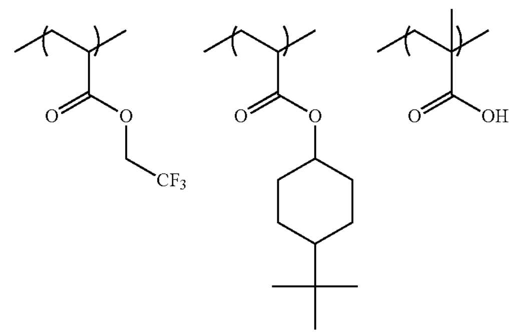
(Aa-92)
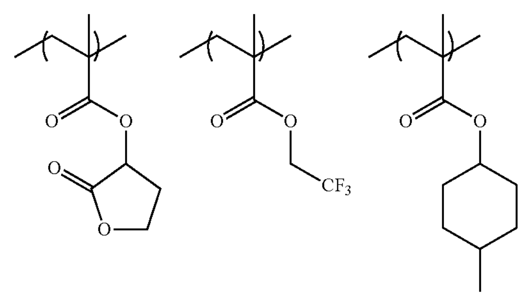
(Aa-93)
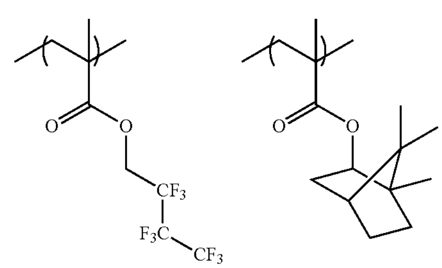

-continued
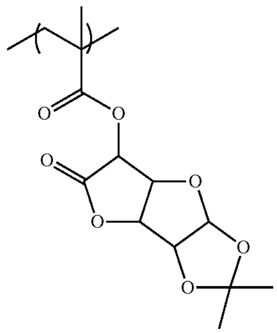
(Aa-94)
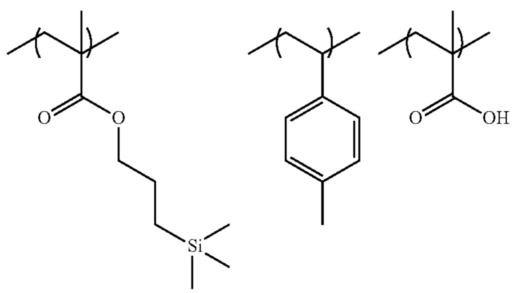
(Aa-95)
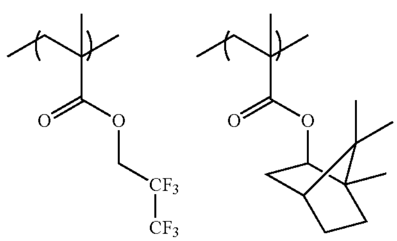
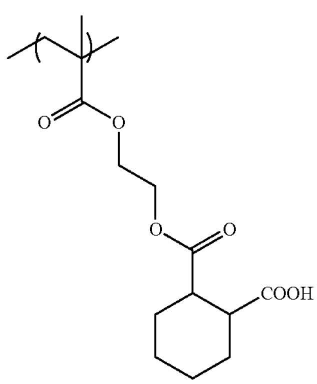
(Aa-96)
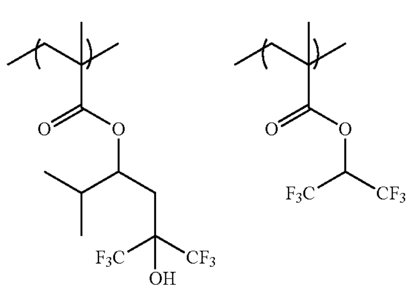
-continued
(Aa-97)
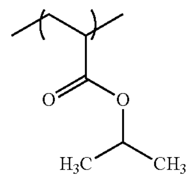
(Aa-98)
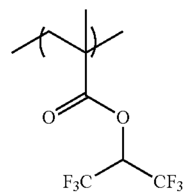
(Aa-99)
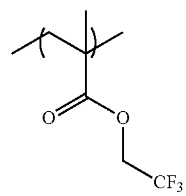
(Aa-100)
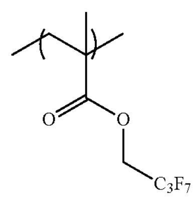
(Aa-101)
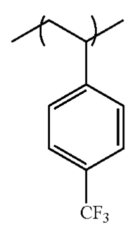
(Aa-102)
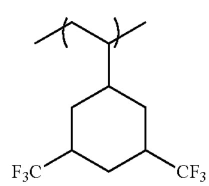
(Aa-103)
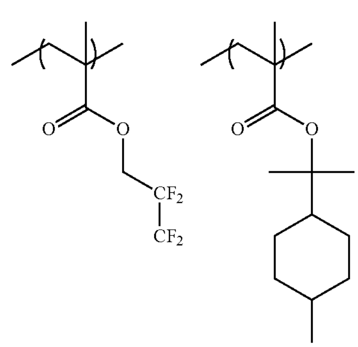

-continued
(Aa-104)
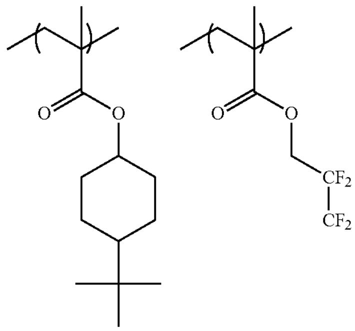
(Aa-105)
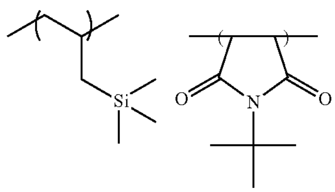
(Aa-106)
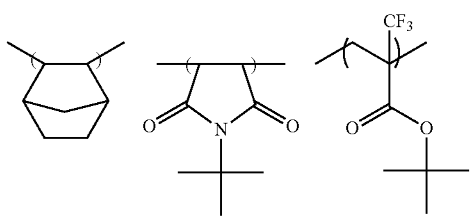
(Aa-107)
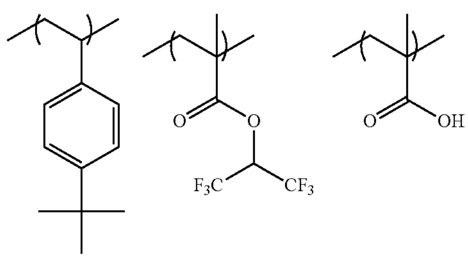
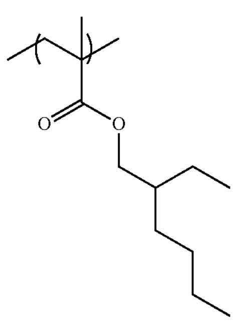
(Aa-108)
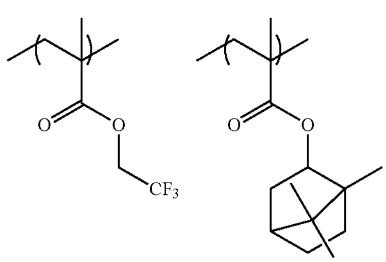
-continued
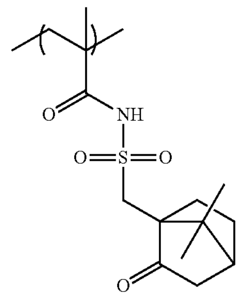
(Aa-109)
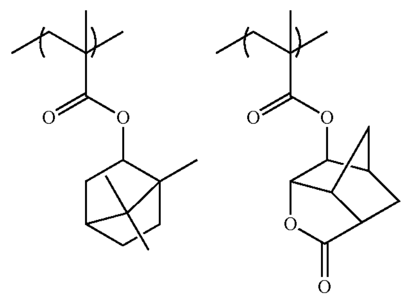
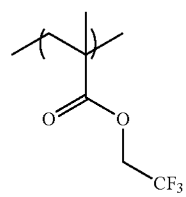
(Aa-110)
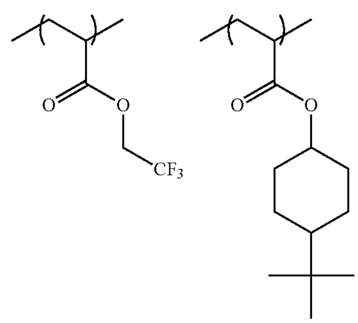
(Aa-111)
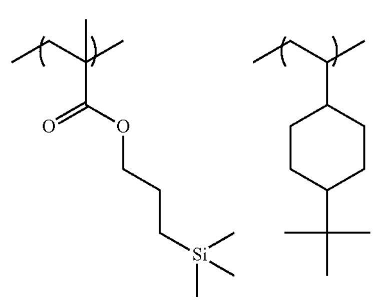

-continued
(Aa-112)
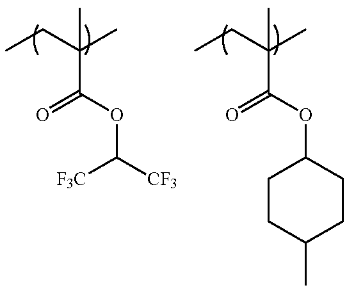
(Aa-113)
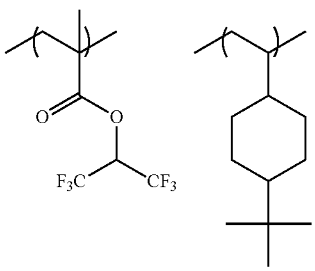
(Aa-114)
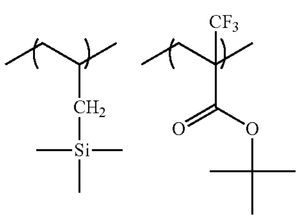
(Aa-115)
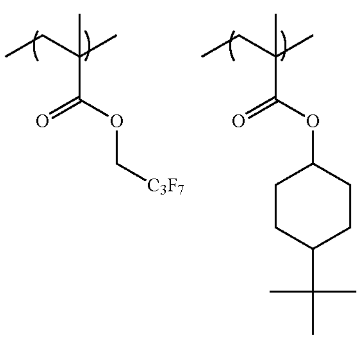
(Aa-116)
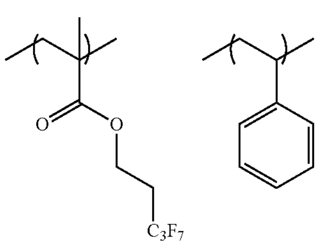
(Aa-117)
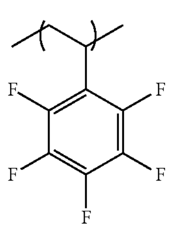
-continued
(Aa-118)
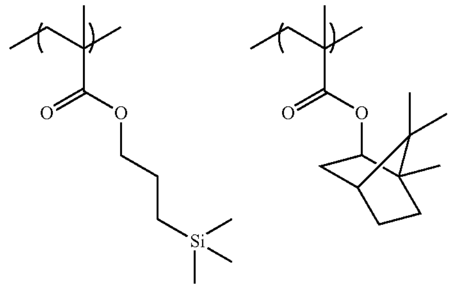
(Aa-119)
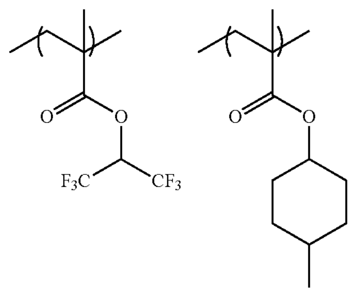
(Aa-120)
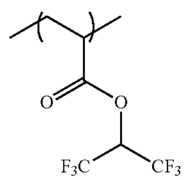
(Aa-121)
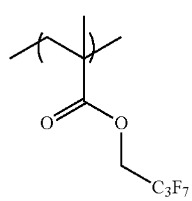
(Aa-122)
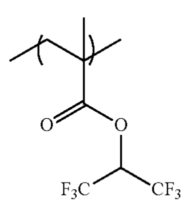
(Aa-123)
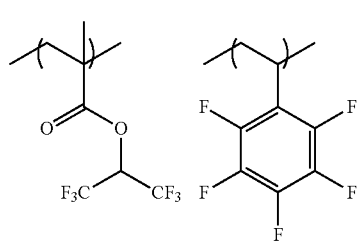

-continued
(Aa-124)
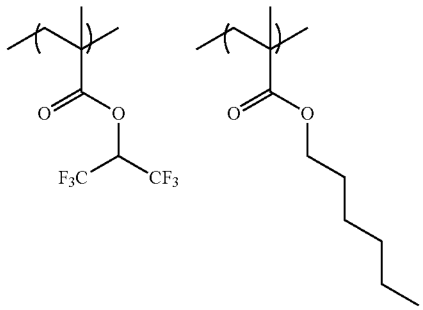
(Aa-125)
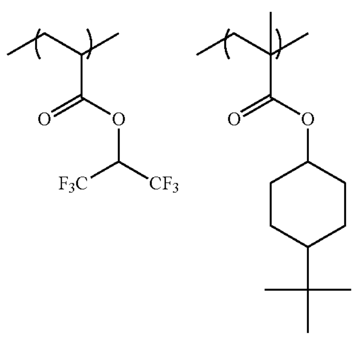
(Aa-126)
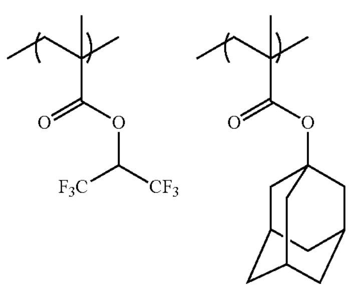
(Aa-127)
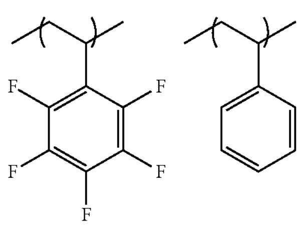
(Aa-128)
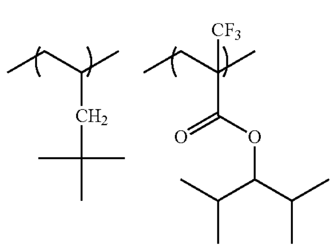
-continued
(Aa-129)
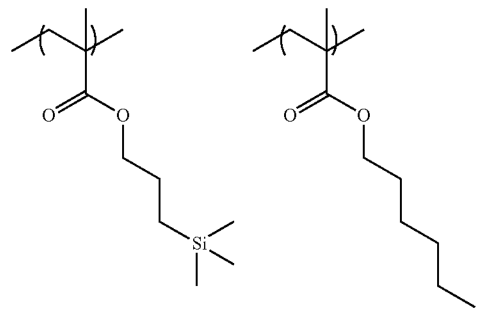
(Aa-130)
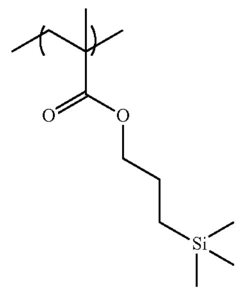
(Aa-131)
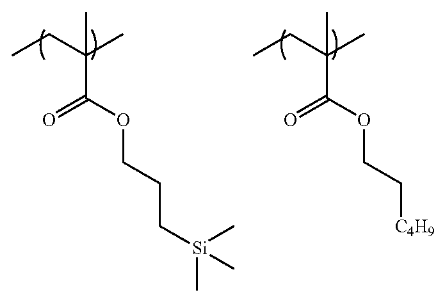
(Aa-132)
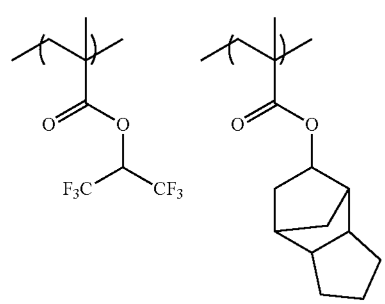
(Aa-133)
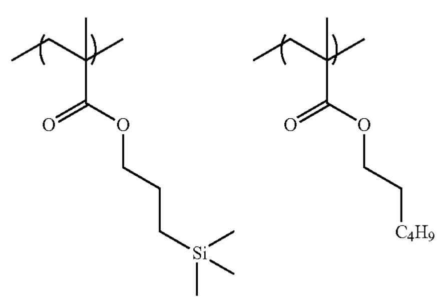

-continued
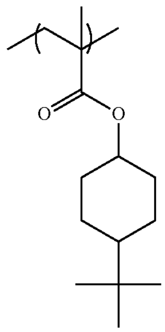
(Aa-134)
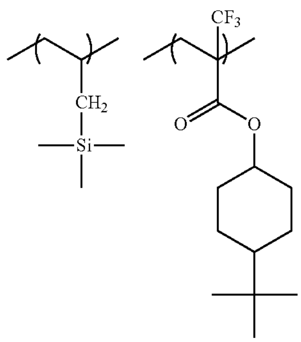
(Aa-135)
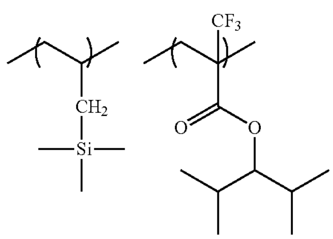
(Aa-136)
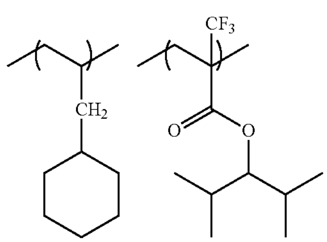
(Aa-137)
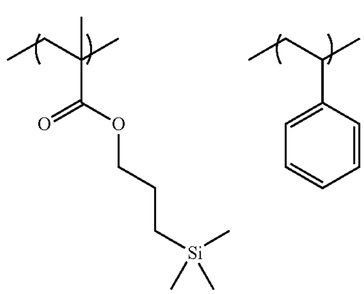
-continued
(Aa-138)
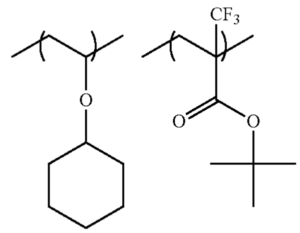
(Aa-139)
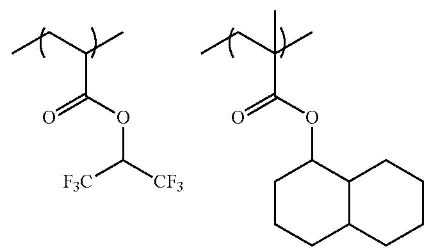
(Aa-140)
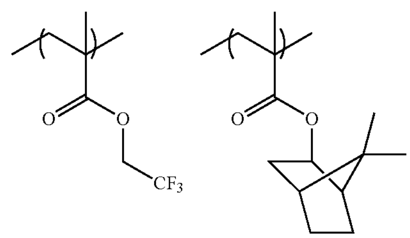
(Aa-141)
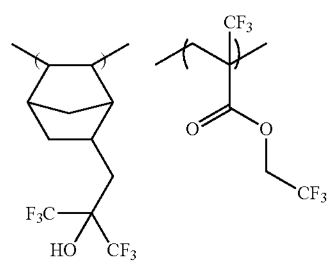
(Aa-142)
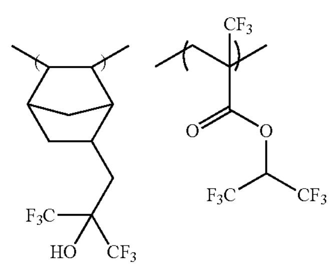
(Aa-143)
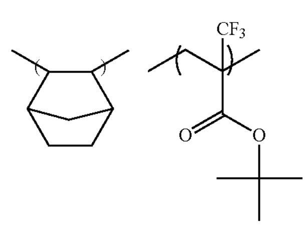

-continued
(Aa-144)
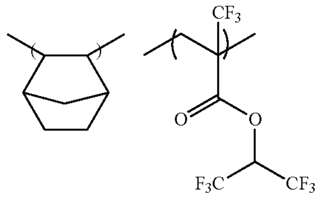
(Aa-145)
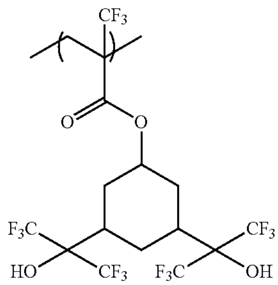
(Aa-146)
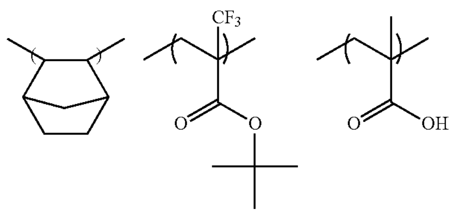
(Aa-147)
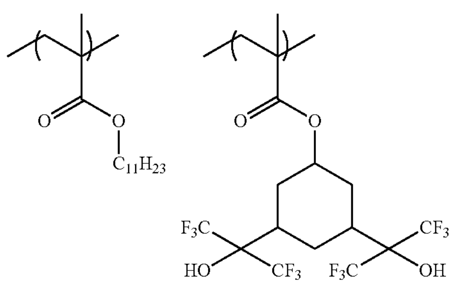
(Aa-148)
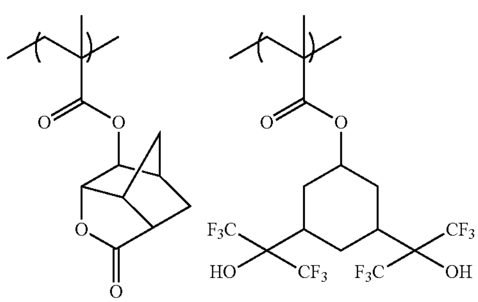
(Aa-149)
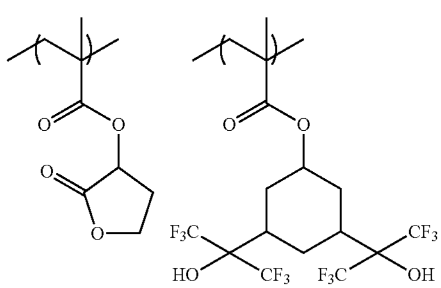
-continued
(Aa-150)
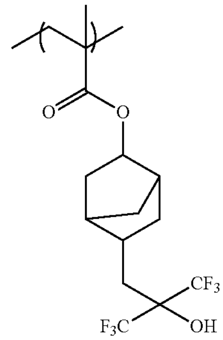
(Aa-151)
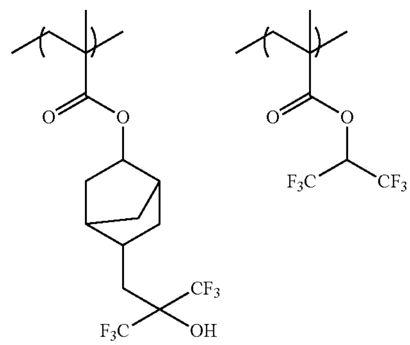
(Aa-152)
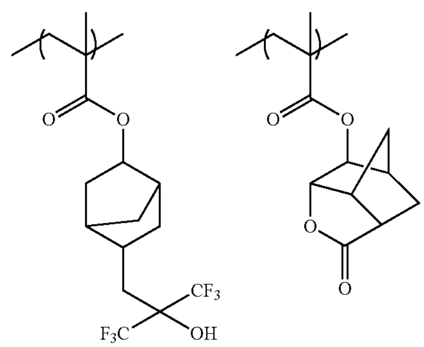
(Aa-153)
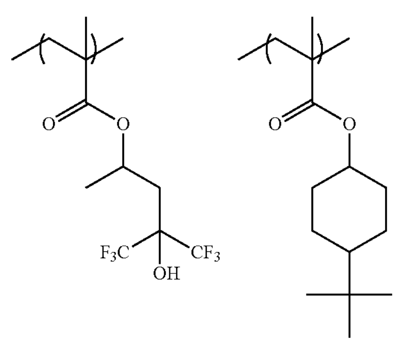

-continued
(Aa-154)
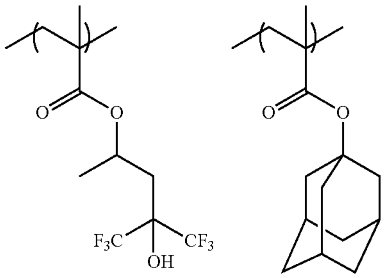
(Aa-155)
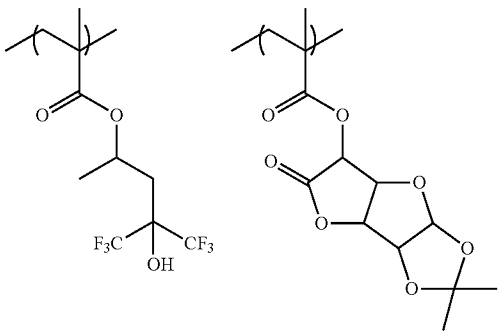
(Aa-156)
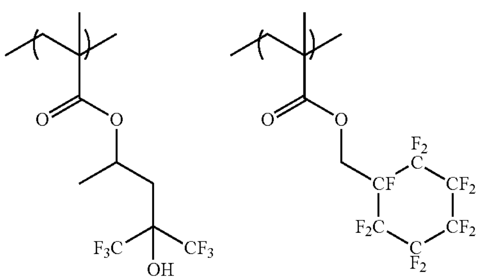
(Aa-157)
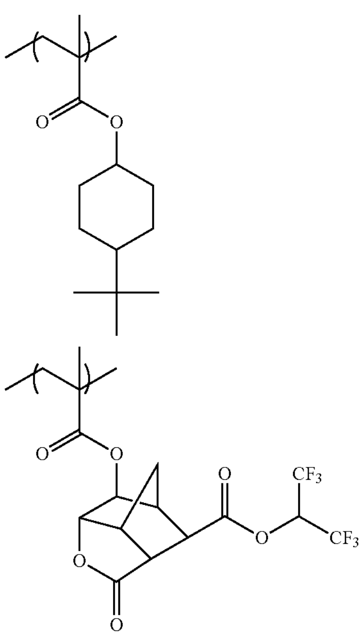
-continued
(Aa-158)
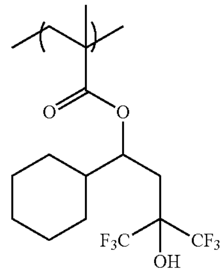
(Aa-159)
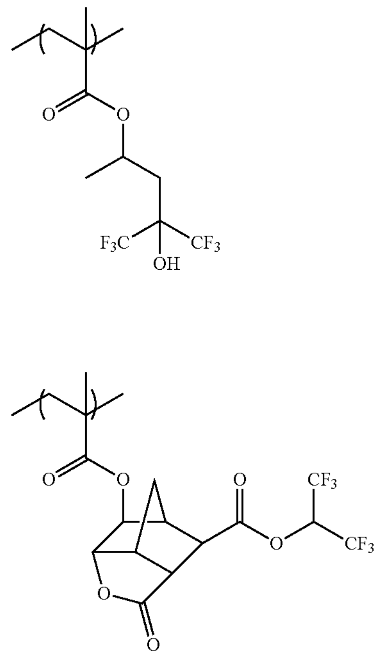
(Aa-160)
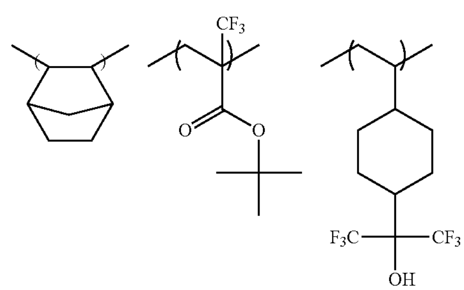
(Aa-161)
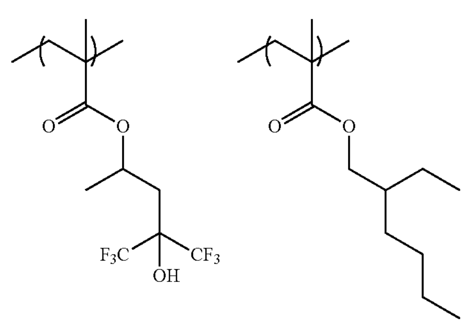

-continued (Aa-162)

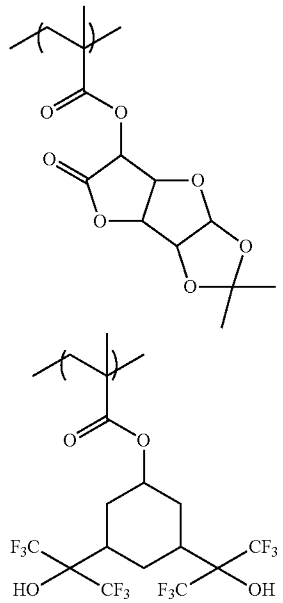

(Aa-163)

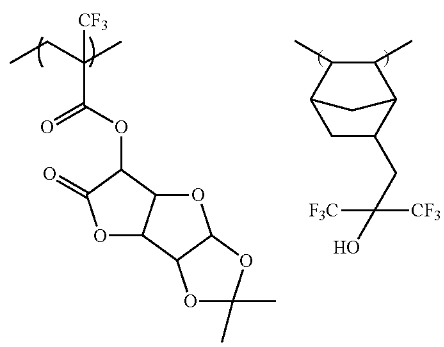

The content of resin (Aa) to the total solid content in the electron beam- or extreme ultraviolet-sensitive resin composition of the present invention is, as described above, 31 to 90% by mass, preferably 35 to 75% by mass, more preferably 40 to 60% by mass. When the content of the resin (Aa) is in the above-described range, it seems possible to suppress the outgas more, while maintaining the content of the resin (Ab) to be described later in the range without imparting an adverse effect on the lithographic performance.

[2] Resin (Ab) whose polarity is changed by the action of an acid

The composition related to the present invention contains Resin (Ab) whose polarity is changed by the action of an acid.

Resin (Ab) is a resin whose polarity is changed by the action of an acid, and specifically, a resin whose solubility in an alkali developer will be increased or whose solubility in a developer containing an organic solvent will be decreased by the action of an acid.

In Formulas (AIIa) to (AIIc), $R_{1c}$ represents a hydrogen atom, a methyl group, a trifluoromethyl group or a hydroxymethyl group.

Further, from the viewpoint of uneven distribution on the film surface of the resin (Aa), resin (Ab) is preferably a group which does not substantially have the repeating unit having the above-described group (aa), more specifically, among the full repeating units of resin (Ab), the content of the repeating unit having the above-described group (aa) is preferably 1 mol % or less, more preferably 0.5 mol %, and is ideally 0 mol %, that is, containing no repeating unit having the above-described group (aa).

Resin (Ab) is preferably insoluble or sparingly soluble in an alkali developer.

Resin (Ab) may preferably have the repeating unit having an acid-decomposable group.

Examples of the acid-decomposable group may include a group in which a hydrogen atom of an alkali-soluble group, such as a carboxyl group, a phenolic hydroxyl group, a sulfonic acid group, or a thiol group, is be protected by a group capable of leaving by the action of an acid.

Examples of the group capable of leaving by the action of an acid may include $—C(R_{36})(R_{37})(R_{38})$, $—C(R_{36})(R_{37})(OR_{39})$, $—C(=O)—O—C(R36)(R_{37})(R_{38})$, $—C(R_{01})(R_{02})(OR_{39})$, $—C(R_{01})(R_{02})—C(=O)—O—C(R_{36})(R_{37})(R_{38})$ and the like.

In the formulas, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring. Each of $R_{01}$ to $R_{02}$ independently represents a hydrogen atom, an alkyl group, a cycloalkyl group, an aryl group, an aralkyl group or a kenyl group.

The resin (Ab) may preferably have, in another embodiment, at least one repeating unit represented by the following Formula (A1) and (A2).

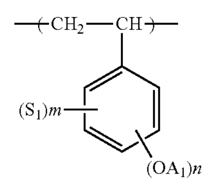

(A1)

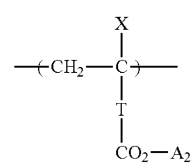

(A2)

In Formula (A1), n represents an integer of 1 to 5, and m represents an integer of 0 to 4 satisfying the relationship, 1≤m+n≤5.

$S_1$ represents a substituent (except a hydrogen atom), and in a case where m is 2 or more, a plurality of $S_1$ may be same or different.

$A_1$ represents a hydrogen atom or a group capable of leaving by the action of an acid, provided that at least one $A_1$ represents a group capable of leaving by the action of an acid. In a case of n≥2, a plurality of $A_1$'s may be same or different.

In Formula (A2), X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group.

$A_2$ represents a group capable of leaving by the action of an acid.

T represents a single bond or a divalent linking group.

First, the repeating unit represented by Formula (A1) will be described in detail.

n represents an integer of 1 to 5 as described above, preferably 1 or 2, and particularly preferably 1.

M represents an integer of 0 to 4 which satisfies the relationship, 1≤m+n≤5 as described above, preferably 0 to 2, still more preferably 0 or 1, and particularly preferably 0.

$S_1$ represents a substituent (except a hydrogen atom) as described above. Examples of the substituent may include the same as the substituent explained as for $S_1$ in Formula (A) below.

$A_1$ represents a hydrogen atom or a group capable of leaving by the action of an acid as described above, at least one $A_1$ is a group capable of leaving by the action of an acid.

Examples of the group capable of leaving by the action of an acid may include a tertiary alkyl group such as a t-butyl group and a t-amyl group, a t-butoxycarbonyl group, a t-butoxycarbonyl methyl group, and an acetal group represented by Formula —$C(L_1)(L_2)$-O—$Z_2$.

Hereinafter, an acetal group represented by Formula —$C(L_1)(L_2)$-O—$Z_2$ will be described. In the formula, each of $L_1$ and $L_2$ independently represents a hydrogen atom, an alkyl group, a cycloalkyl group or an aralkyl group. $Z_2$ represents an alkyl group, a cycloalkyl group or an aralkyl group. Further, $Z_2$ and $L_1$ may combine with each other to form a 5-membered or 6-membered ring.

An alkyl group may be a straight alkyl group or a branched alkyl group.

A straight alkyl group may have preferably 1 to 30 carbon atoms, and more preferably 1 to 20 carbon atoms. Examples of such a straight alkyl group may include a methyl group, an ethyl group, an n-propyl group, an n-butyl group, a sec-butyl group, a t-butyl group, an n-pentyl group, an n-hexyl group, an n-heptyl group, an n-octyl group, an n-nornyl group and an n-decanyl group.

A branched alkyl group may have preferably 3 to 30 carbon atoms, and more preferably 3 to 20 carbon atoms. Examples of such a branched alkyl group may include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i nornyl group and a t-decanoyl group.

Such an alkyl group may have a substituent. Example of a substituent may include a hydroxyl group; a halogen atom such as a fluorine, a chlorine, a bromine and an iodine atom; a nitro group; a cyano group; an amide group; a sulfonamide group; an alkyl group such as a methyl group, an ethyl group, a propyl group, an isopropyl group, an n-butyl group, a sec-butyl group, a hexyl group, a 2-ethylhexyl group, an octyl group and a dodecyl group; an alkoxy group such as a methoxy group, an ethoxy group, a hydroxyethoxy group, a propoxy group, a hydroxypropoxy group and a butoxy group; an alkoxycarboxyl group such as a methoxycarbonyl group and an ethoxycarbonyl group; an acyl group such as a formyl group, an acetyl group and a benzoyl group; an acyloxy group such as an acetoxy group and a butyryloxy group; and a carboxyl group.

As an alkyl group, an ethyl group, an isopropyl group, an isobutyl group, a cyclohexylethyl group, a phenylmethyl group or a phenylethyl group is particularly preferred.

A cycloalkyl group may be monocyclic or polycyclic type. In the latter case, a cycloalkyl group may be bridged type. That is, in this case, a cycloalkyl group may have a bridge structure. In addition, some of the carbon atom of a cycloalkyl group may be substituted by a hetero atom such as an oxygen atom.

A monocyclic cycloalkyl group is preferably a group having 3 to 8 carbon atoms. Examples of such a cycloalkyl group may include a cyclopropyl group, a cyclopentyl group, a cyclohexyl group, a cyclobutyl group and a cyclooctyl group.

Examples of the polycyclic cycloalkyl group may include a group having a bicyclo, tricyclo or tetracyclo structure. A polycyclic cycloalkyl group is preferably a group having 6 to 20 carbon atoms. Example of such a cycloalkyl group may include an adamantyl group, a norbornyl group, a camphanyl group, a dicyclopentyl group, an α-pinel group, a tricyclodecanyl group, a tetracyclododecyl group and an androstanyl group.

Examples of the aralkyl group in $L_1$, $L_2$ and $Z_2$ may include a group having 7 to 15 carbon atoms such as a benzyl group and a phenetyl group.

Such an aralkyl group may have further a substituent. Examples of the substituent include preferably, an alkoxy group, a hydroxyl group, a halogen atom, a nitro group, an acyl group, an acylamino group, a sulfonylamino group, an alkylthio group, an arylthio group and an aralkylthio group. Examples of the aralkyl group having a substituent may include an alkoxy benzyl group, a hydroxybenzyl group and a phenylthiophenetyl group. Further, the substituent which may be possessed by the aralkyl group preferably has 12 or less carbon atoms.

Examples of the five-membered or six-membered ring which $Z_2$ and $L_1$ may combine each other to form may include a tetrahydrofuran ring and a tetrahydrofuran ring. Among these, a tetrahydrofuran ring is particularly preferred.

$Z_2$ is preferably a straight or branched alkyl group. Accordingly, the effect of the present invention becomes still more noticeable.

Hereinafter, specific examples of the repeating unit represented by Formula (A1) will be described, but are not limited thereto.

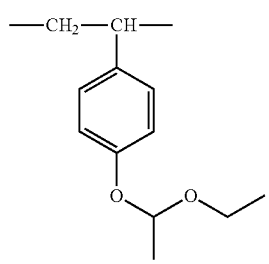

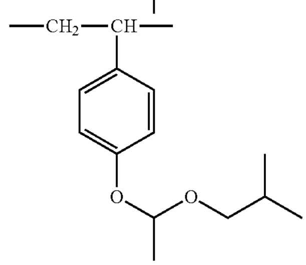

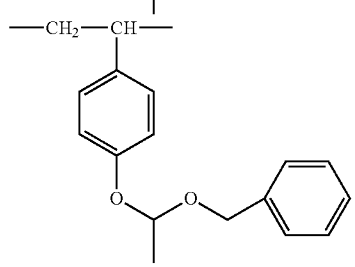

-continued
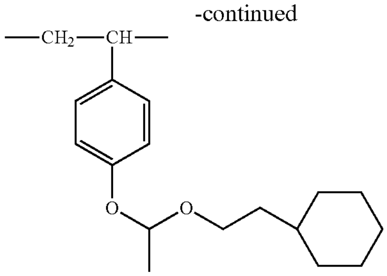
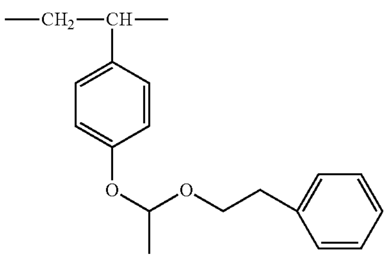
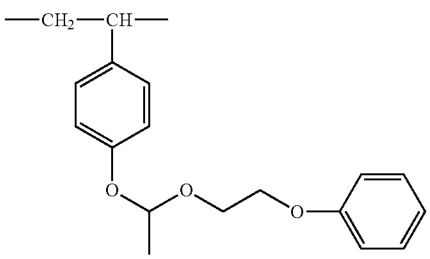
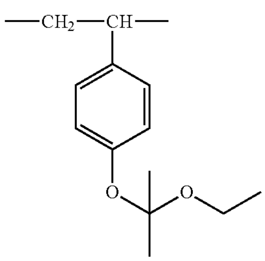
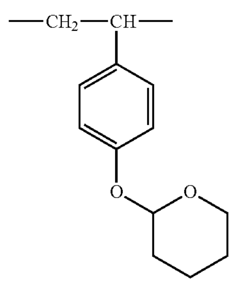
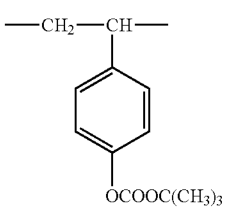
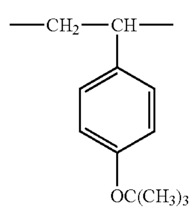
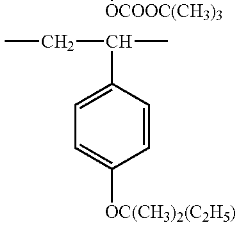
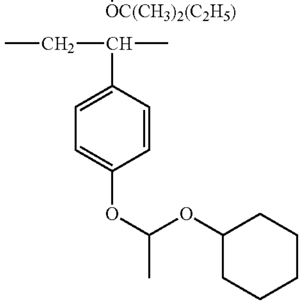
-continued
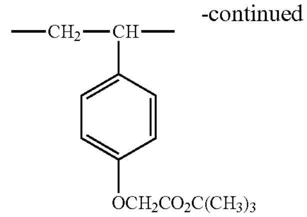
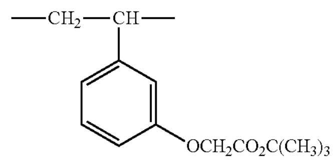
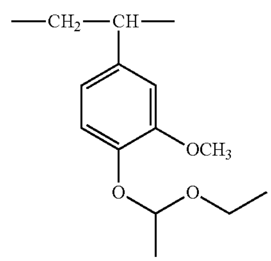
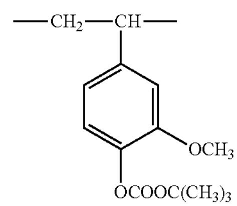
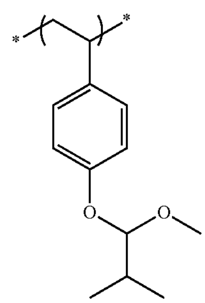
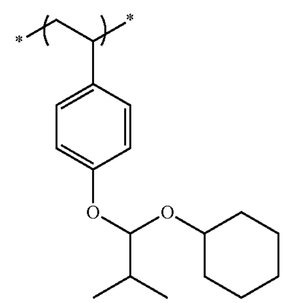
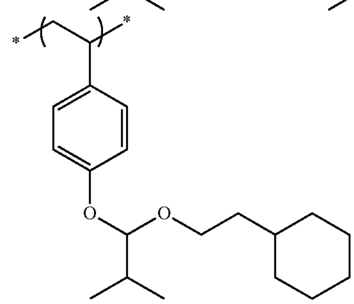
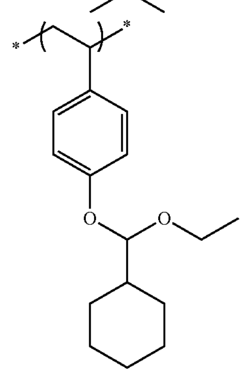
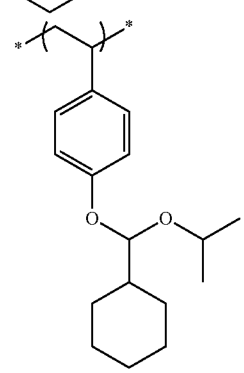

-continued
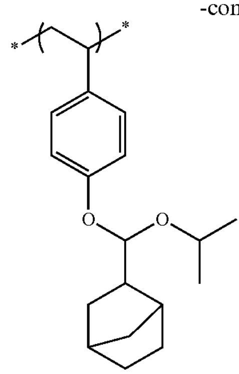
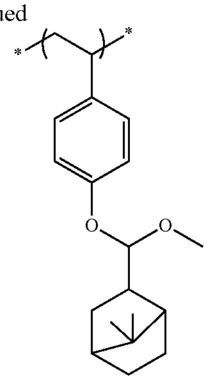
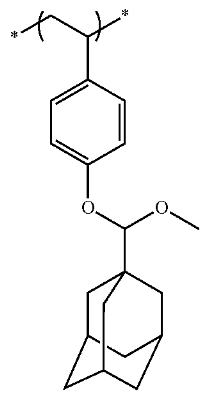
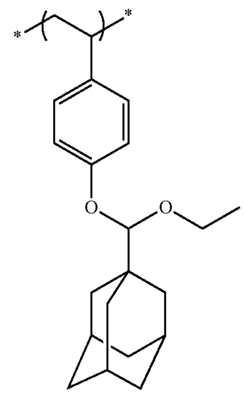
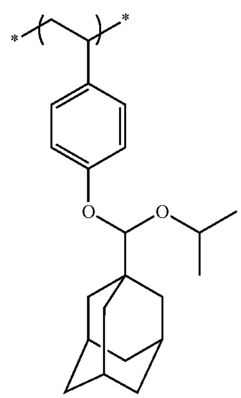
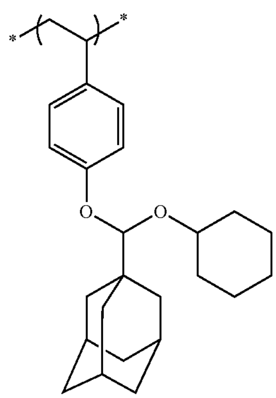
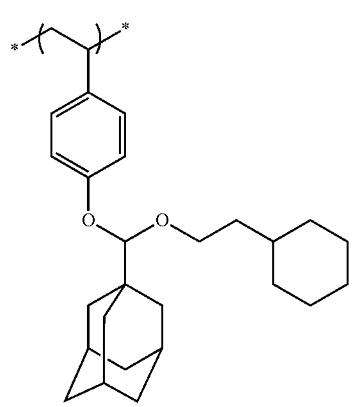
-continued
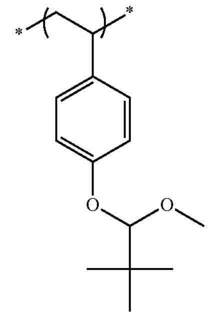
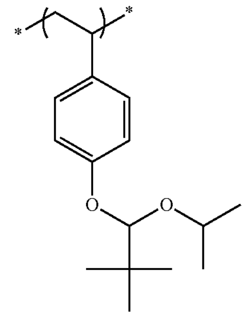
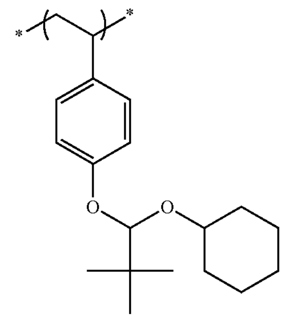
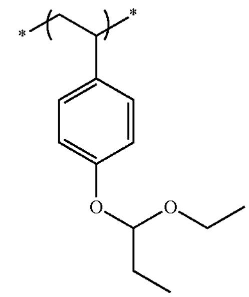
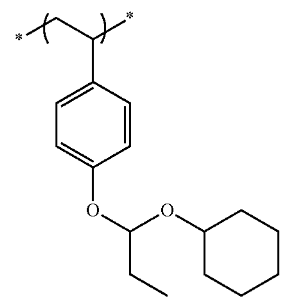
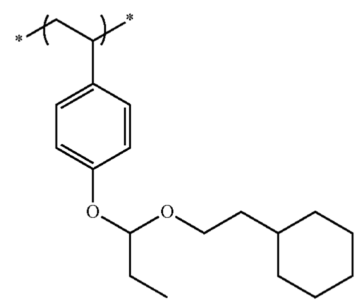
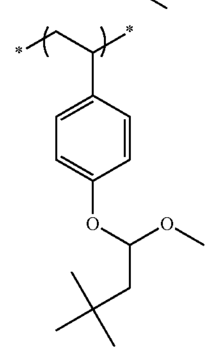
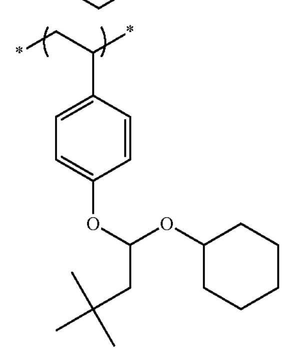

-continued

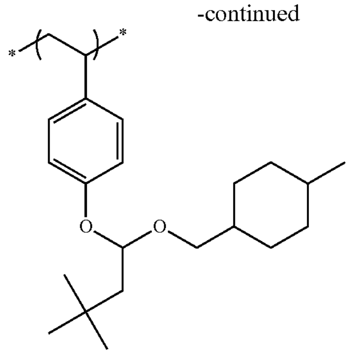

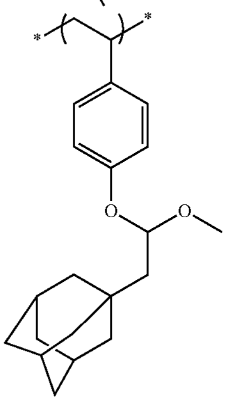

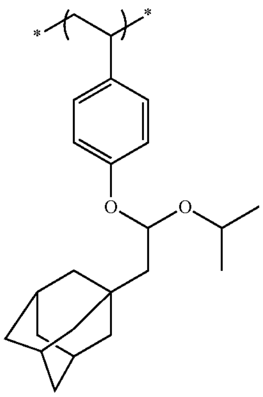

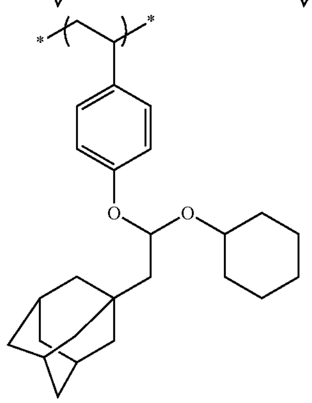

Next, the repeating unit represented by Formula (A2) will be explained.

X represents, as described above, a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group.

The alkyl group as X may have a substituent, and any one of a straight alkyl group and a branched alkyl group may be preferred. The straight alkyl group has preferably 1 to 30 carbon atoms, and more preferably 1 to 20 carbon atoms, and examples thereof may include a methyl group, an ethyl group, an n-propyl group, an n-butyl group, a sec-butyl group, a t-butyl group, an n-pentyl group, an n-hexyl group, an n-heptyl group, an n-octyl group, an n-nornyl group, an n-decanyl group and the like. The branched alkyl group has preferably 3 to 30 carbon atoms, and more preferably 3 to 20 carbon atoms, and examples thereof may include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nornyl group, a t-decanoyl group and the like.

The alkoxy group as X may have a substituent, and it is for example an alkoxy group having 1 to 8 carbon atoms, and examples thereof include, for example a methoxy group, an ethoxy group, a propoxy group, a butoxy group, a pentyloxy group, a hexyloxy group, a cyclohexyloxy group and the like.

Examples of the halogen atom as X may include a fluorine atom, a chlorine atom, a bromine atom and an iodine atom, and preferably a fluorine atom.

The acyl group as X may have a substituent, and examples of the acyl group having 2 to 8 carbon atoms may include specifically, a formyl group, an acetyl group, a propanoyl group, a butanoyl group, a pivaloyl group, a benzoyl group and the like.

The acyloxy group as X may have a substituent, is preferably an acyloxy group having 2 to 8 carbon atoms, and examples thereof may include an acetoxy group, a propionyl oxy group, a butyl oxy group, a valeryl oxy group, a pivaloyl oxy group, a hexanoyl oxy group, an octanoyl oxy group, a benzoyloxy group and the like.

The cycloalkyl group as X may have a substituent, and the group may be either monocyclic type, a polycyclic type, or a bridged type. For example, the cycloalkyl group may have a bridge structure. A monocyclic type group is preferably a cycloalkyl group having 3 to 8 carbon atoms, examples thereof may include a cyclopropyl group, a cyclopentyl group, cyclohexyl group, cyclobutyl group, a cyclooctyl group and the like. Examples of the polycyclic type group may include a group having 5 or more carbon atoms such as a bicyclo, a tricyclo, a tetracyclo structure, a cycloalkyl group having 6 to 20 carbon atoms is preferred, examples thereof may include an adamantyl group, a norbornyl group, an isobornyl group, a camphanyl group, a dicyclopentyl group, α-pinel group, a tricyclodecanyl group, a tetracyclododecyl group, an androstanyl group, and the like. Further, some of carbon atoms in a cycloalkyl group may be substituted by a hetero atom such as an oxygen atom.

The aryl group as X may have a substituent, and preferably has 6 to 14 carbon atoms, and examples thereof may include a phenyl group, a xylyl group, a toluyl group, a cumenyl group, a naphthyl group, an anthracenyl group and the like.

The alkyloxycarbonyl group as X may have a substituent, and preferably has 2 to 8 carbon atoms, and examples thereof may include a methoxycarbonyl group, an ethoxycarbonyl group, and a propoxycarbonyl group.

The alkylcarbonyloxy group as X may have a substituent, and preferably has 2 to 8 carbon atoms, and examples thereof may include a methylcarbonyloxy group, and an ethylcarbonyloxy group.

The aralkyl group as X may have a substituent, and is preferably an aralkyl group having 7 to 16 carbon atoms, and examples thereof may include a benzyl group.

Examples of the substituent which may be possessed by the alkyl group, the alkoxy group, the acyl group, the cycloalkyl group, the aryl group, the alkyloxycarbonyl group, the alkylcarbonyloxy group, and the aralkyl group as X may include a hydroxyl group, a fluorine atom, a chlorine atom, a bromine atom, an oxo atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

$A_2$ represents a group capable of leaving by the action of an acid as described above. That is, the repeating unit represented by Formula (A2) may have a group represented by "—$COOA_2$" as an acid-decomposable group. Examples of $A_2$ are, for example, the same as the examples described as for $A_1$ in Formula (A1).

$A_2$ is preferably a hydrocarbon group (preferably having 20 or less carbon atoms, still more preferably 4 to 12 carbon atoms), a t-butyl group, a t-amyl group, a hydrocarbon group (for example, an alicyclic group itself, and a group whose alkyl group is substituted with an alicyclic group) having an alicyclic structure is more preferred.

$A_2$ is preferably a tertiary alkyl group or a tertiary cycloalkyl group.

An alicyclic structure may be a monocyclic or a polycyclic type. Specific examples thereof may include a monocyclo, bicyclo, tricyclo, tetracyclo structure and the like having 5 or more carbon atoms. The carbon number is preferably 6 to 30, and the carbon number is particularly preferably 7 to 25. A hydrocarbon group having the alicyclic structure may have a substituent.

In the present invention, preferred examples of the above-described alicyclic structure may include, as a notation of a monovalent alicyclic group, an adamantyl group, a noradamantyl group, a decalin moiety, a tricyclodecanyl group, a tetracyclododecanyl group, a norbornyl group, a cedrol group, a cyclohexyl group, a cycloheptyl group, a cyclooctyl group, a cyclodecanyl group, a cyclododecanyl group. More preferred are an adamantyl group, a decalin moiety, a norbornyl group, a cedrol group, a cyclohexyl group, a cycloheptyl group, a cyclooctyl group, a cyclodecanyl group, a cyclododecanyl group.

Examples of the divalent linking group of T may include an alkylene group, —COO-Rt- group, —O-Rt- group and the like. In the formula, Rt represents an alkylene group or a cycloalkylene group.

T is preferably a single bond or —COO-Rt- group. Rt may be preferably an alkylene group having 1 to 5 carbon atoms, and —$CH_2$— group and —$(CH_2)_3$— group are more preferred.

Further, the repeating unit represented by Formula (A2) may preferably be, in another aspect, the repeating unit represented by Formula (A3) shown below.

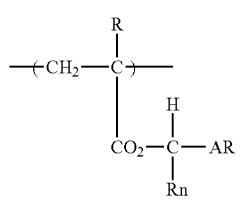
(A3)

In Formula (A3),

AR represents an aryl group.

Rn represents an alkyl group, a cycloalkyl group or an aryl group. Rn and AR may combine with each other to form a non-aromatic ring.

R represents a hydrogen atom, an alkyl group, a cycloalkyl group, a halogen atom, a cyano group or an alkyloxycarbonyl group.

The repeating unit represented by Formula (A3) will be described in detail.

AR represents an aryl group as described above. Examples of the aryl group of AR include preferably a group having 6 to 20 carbon atoms such as a phenyl group, a naphthyl group, an anthryl group, or a fluorene group, and more preferably a group having 6 to 15 carbon atoms.

When AR is a naphthyl group, an anthryl group or a fluorene group, the combination position of AR and a carbon atom which Rn combines with is not particularly limited. For example, when AR is a naphthyl group, such a carbon atom may be combined to the α-position or the β-position of the naphthyl group. Otherwise, when AR is an anthryl group, such a carbon atom may be combined to the 1-position, the 2-position, or the 9 position of an anthryl group.

An aryl group as AR may have 1 or more substituents. Specific example of a substituent may include a straight or branched alkyl group having 1 to 20 carbon atoms such as a methyl group, an ethyl group, a propyl group, an isopropyl group, n-butyl group, an isobutyl group, a t-butyl group, a pentyl group, a hexyl group, an octyl group and a dodecyl group, an alkoxy group including these alkyl group parts, a cycloalkyl group such as a cyclopentyl group and cyclohexyl group, cycloalkoxy group including these cycloalkyl group parts, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic moiety such as pyrrolidone residue. As such a substituent, a straight or branched alkyl group having 1 to 5 carbon atoms, and an alkoxy group including these alkyl group parts are preferred, a paramethyl group or a paramethoxy group is more preferred.

When the aryl group as AR has a plurality of substituents, at least two of a plurality of substituents may combine with each other to form a ring. The ring is preferably a 5- to 8-membered ring, and more preferably a 5- or 6-membered ring. Further, the ring may be a heterocyclic ring including a hetero atom such as an oxygen atom, a nitrogen atom, a sulfur atom and the like as ring members.

Moreover, this ring may have a substituent. Examples of such a substituent are the same as those described later about a further substituent which may be possessed by Rn.

In addition, the repeating unit represented by Formula (A3) may preferably have two or more aromatic rings from the viewpoint of roughness performance. The number of the aromatic ring that the repeating unit has is preferably 5 or less, and more preferably 3 or less.

Further, in the repeating unit represented by Formula (A3), AR may preferably have 2 or more aromatic rings, and AR may more preferably have a naphthyl group or a biphenyl group from the viewpoint of roughness performance. The number of the aromatic ring that AR has is preferably 5 or less, and more preferably 3 or less.

Rn represents, as described above, an alkyl group, a cycloalkyl group or an aryl group.

An alkyl group of Rn may be a straight alkyl group, or may be a branched alkyl group. Examples of the alkyl group may include preferably a group having 1 to 20 carbon atoms such as a methyl group, an ethyl group, a propyl group, an isopropyl group, an n-butyl group, an isobutyl group, a t-butyl group, a pentyl group, a hexyl group, a cyclohexyl group, an octyl group and a dodecyl group. The alkyl group of Rn is preferably a group having 1 to 5 carbon atoms, and a group having more preferably 1 to 3 carbon atoms.

Examples of the cycloalkyl group Rn may include a group having 3 to 15 carbon atoms such as a cyclopentyl group and cyclohexyl group.

Examples of the aryl group as Rn may include a group having 6 to 14 carbon atoms such as a phenyl group, a xylyl group, a toluyl group, a cumenyl group, a naphthyl group and an anthryl group.

Each of an alkyl group, a cycloalkyl group and an aryl group as Rn may have further a substituent. Examples of the substituent may include an alkoxy group, a hydroxyl group, a halogen atom, a nitro group, an acyl group, an acyloxy group, an acylamino group, a sulfonylamino group, a dialkyl amino group, an alkylthio group, an arylthio group, an aralkylthio group, a thiophenecarbonyloxy group, a thiophenemethylcarbonyloxy group, a heterocyclic moiety such as pyrrolidone residue. Among these, an alkoxy group, a hydroxyl group, a halogen atom, a nitro group, an acyl group, an acyloxy group, an acylamino group and a sulfonylamino group are particularly preferred.

R represents, as described above, a hydrogen atom, an alkyl group, a cycloalkyl group, a halogen atom, a cyano group or an alkyloxycarbonyl group.

Examples of the alkyl group and the cycloalkyl group of R are the same as the groups as described as for Rn. Each of the alkyl group and the cycloalkyl group may have a substituent. Examples of such a substituent are the same as the groups as described as for Rn.

If R is an alkyl group or a cycloalkyl group having a substituent, examples of the particularly preferable R may include a trifluoromethyl group, an alkyloxycarbonyl methyl group, an alkylcarbonyloxymethyl group, a hydroxymethyl group, and an alkoxy methyl group.

Examples of the halogen atom of R may include a fluorine atom, a chlorine atom, a bromine atom and an iodine atom. Among these, a fluorine atom is particularly preferred.

As the alkyl group moiety contained in an alkyloxycarbonyl group of R, for example, a configuration exemplified as an alkyl group of the above R may be employed.

Rn and AR may preferably combine with each other to form a non-aromatic ring, and accordingly, may particularly improve roughness performance thereof.

A non-aromatic ring that Rn and AR may combine with each other to form is preferably a 5- to 8-membered ring, and more preferably a 5- to 6-membered ring.

The non-aromatic ring may be an aliphatic ring, and may be a heterocyclic ring including a heteroatom such as an oxygen atom, a nitrogen atom, a sulfur atom and the like as ring members.

The non-aromatic ring may have a substituent. Examples of such a substituent are the same as those described above about a further substituent which may be possessed by Rn.

Hereinafter, specific examples of the monomer corresponding to the repeating unit represented by Formula (A2), and specific examples of the corresponding repeating unit will be described, but are not limited thereto.

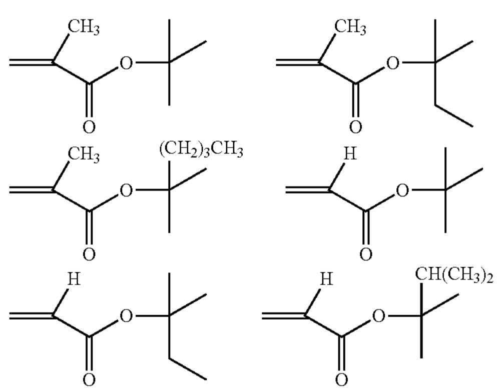

-continued

1

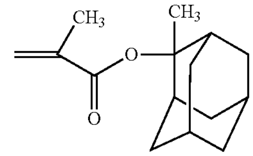

2

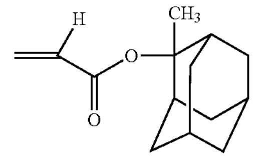

3

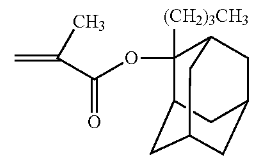

4

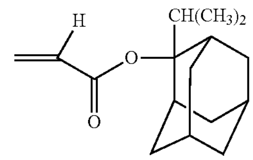

5

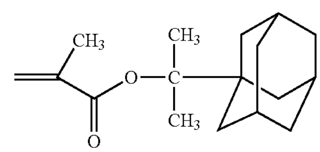

6

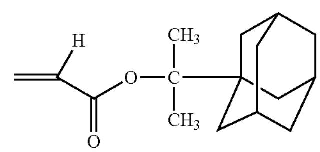

7

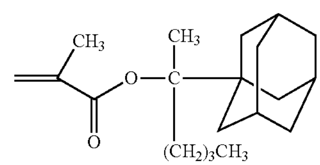

8

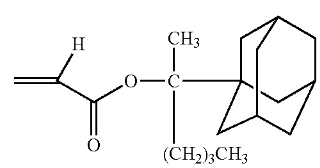

9

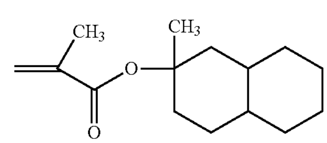

10

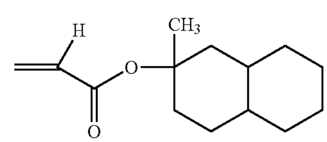

11
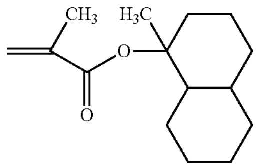
12
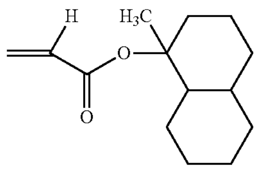
13
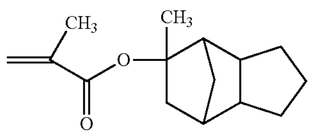
14
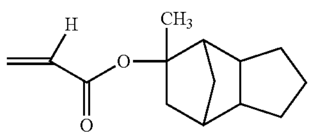
15
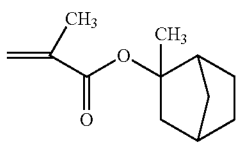
16
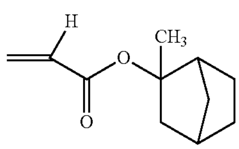
17
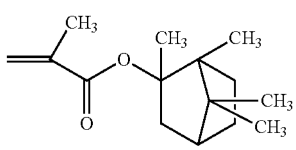
18
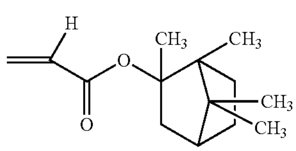
19
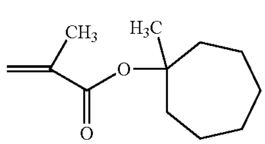
20
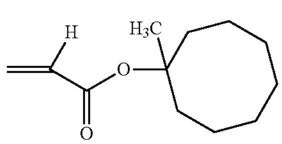
21
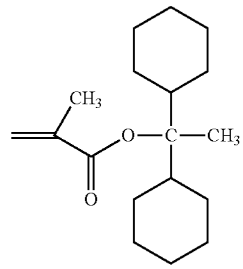
22
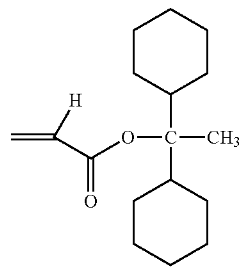
23
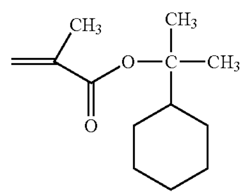
24
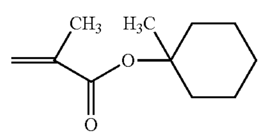
25
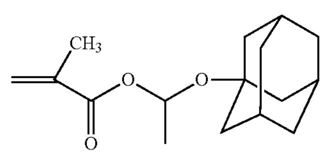
26
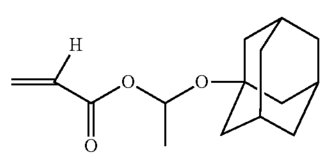
27
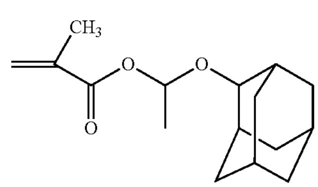
28
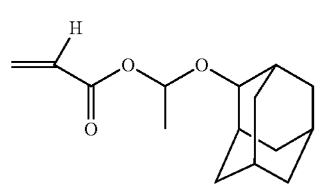

-continued
29
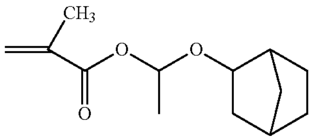
30
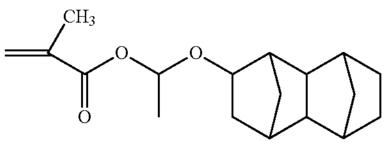
31
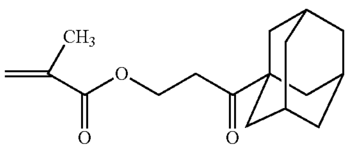
32
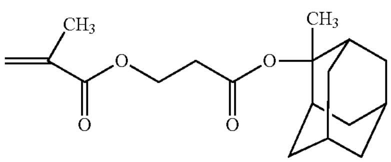
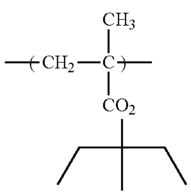
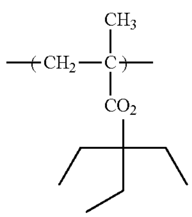
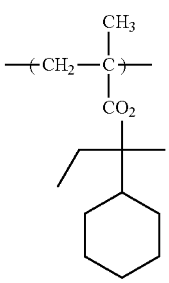
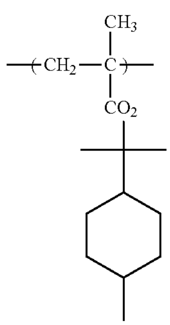
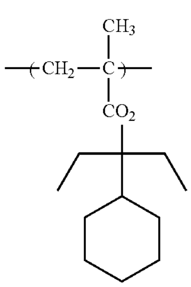
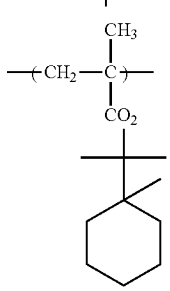
-continued
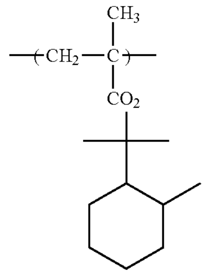
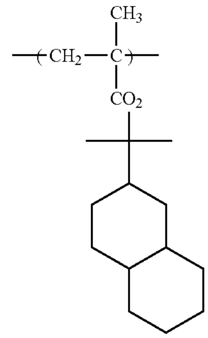
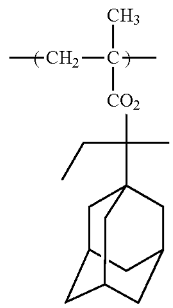
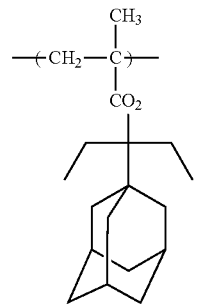
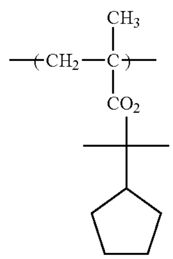
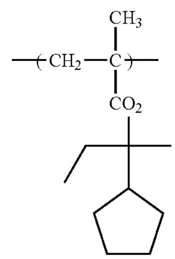
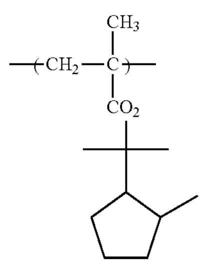
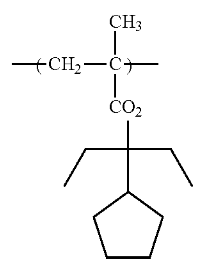
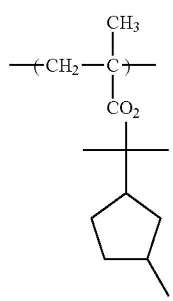
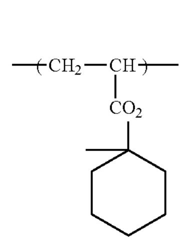
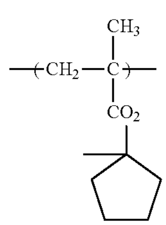
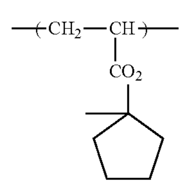

-continued
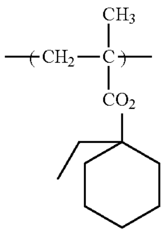
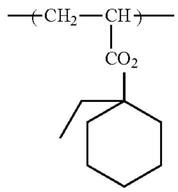
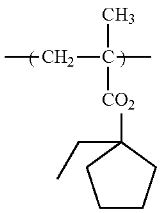
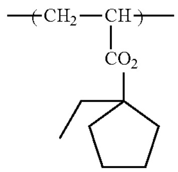
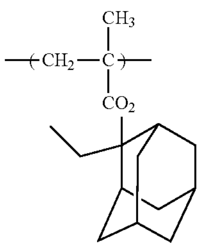
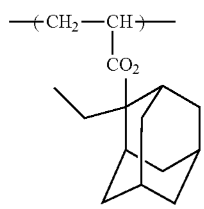
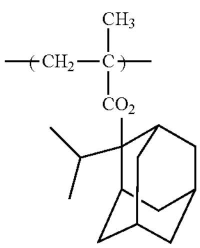
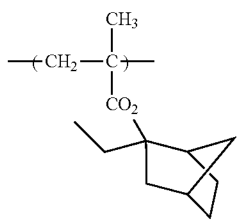
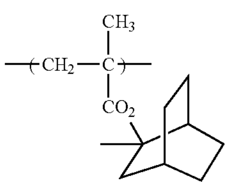
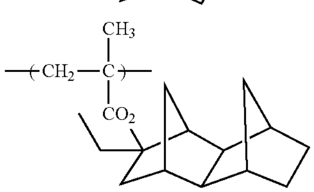
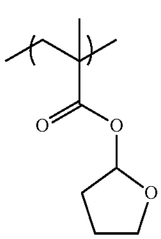
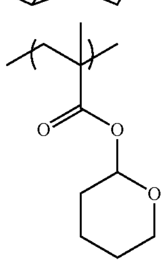
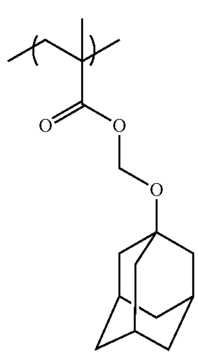
-continued
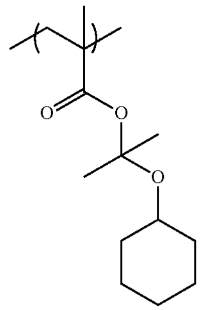
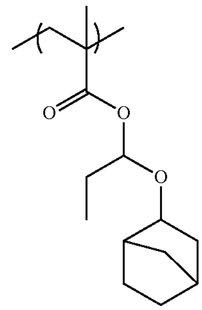
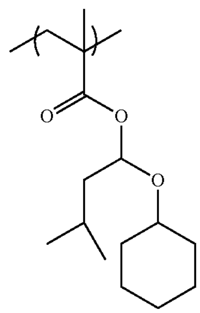
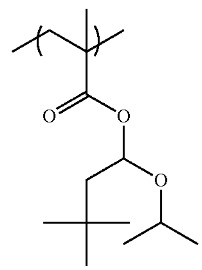
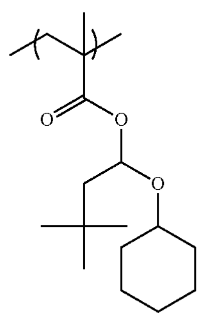
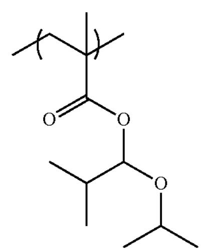
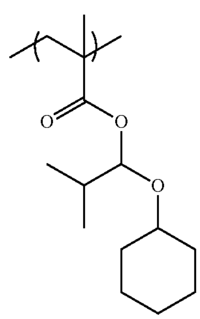
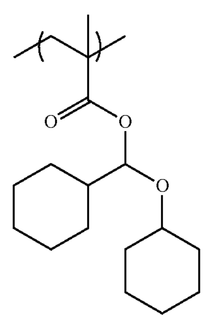
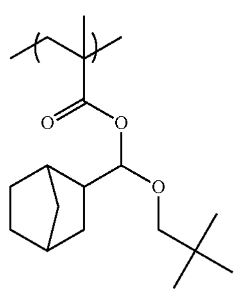
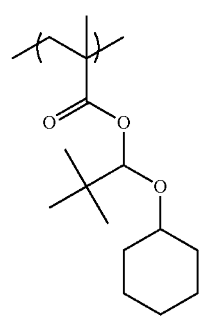

-continued
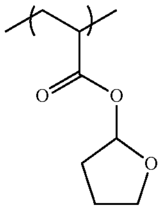
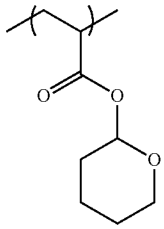
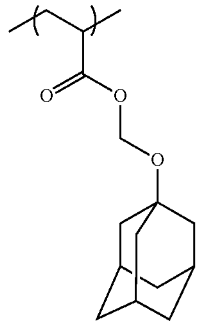
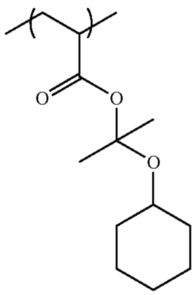
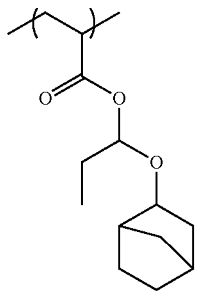
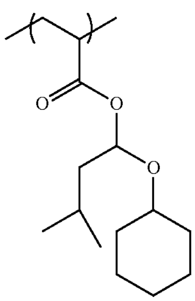
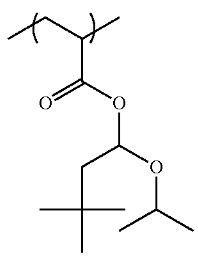
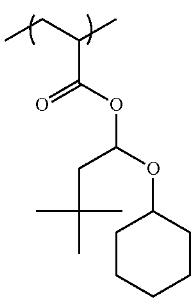
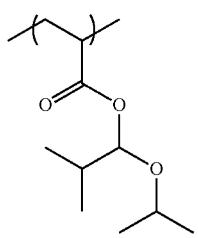
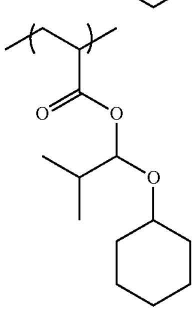
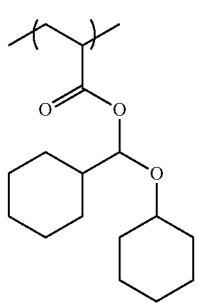
-continued
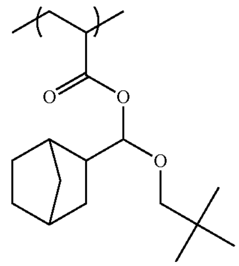
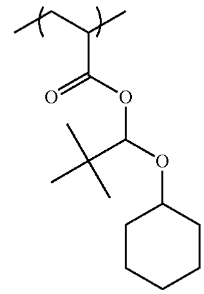
Hereinafter, specific examples of the structure of the repeating unit represented by Formula (A3) will be described, but is not limited thereto.
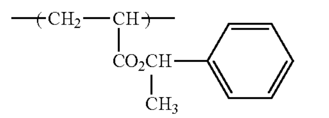
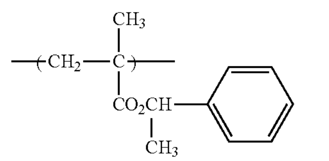
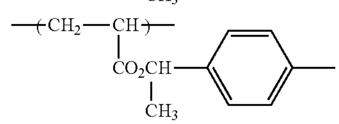
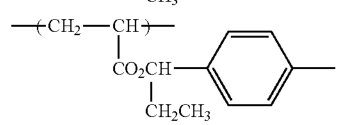
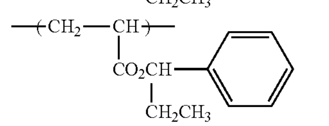
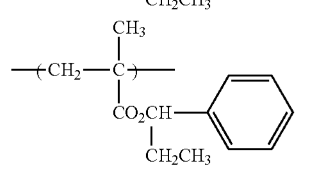
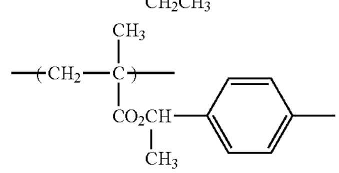
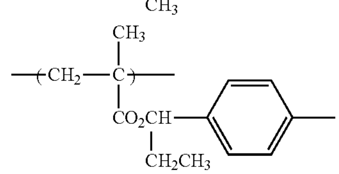
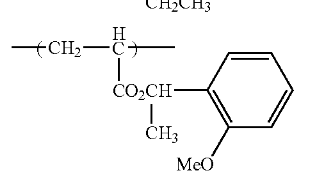

-continued
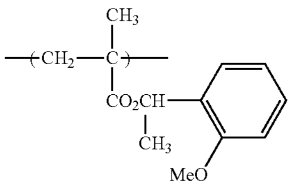
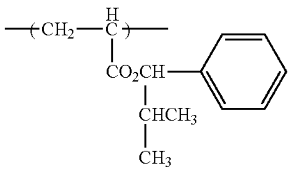
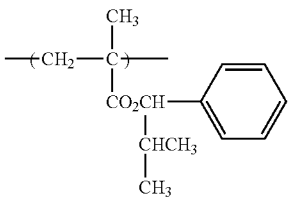
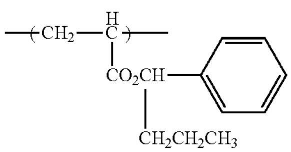
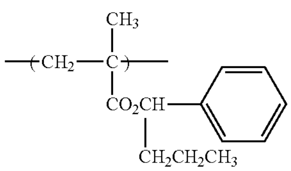
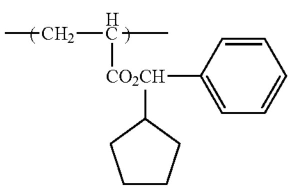
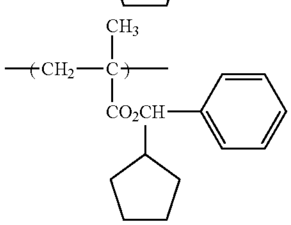
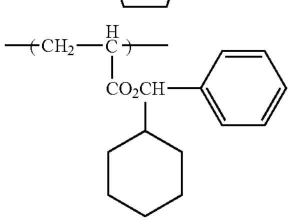
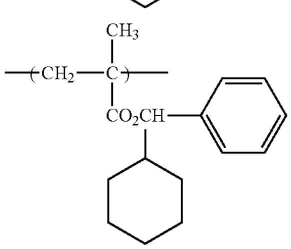
-continued
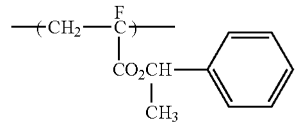
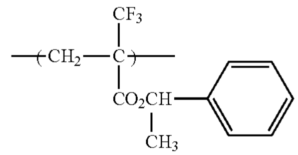
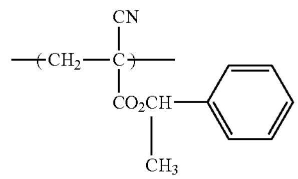
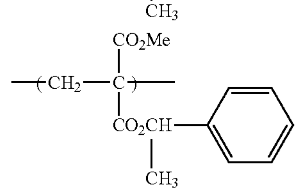
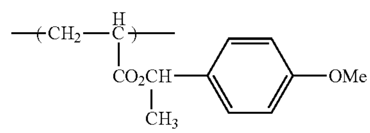
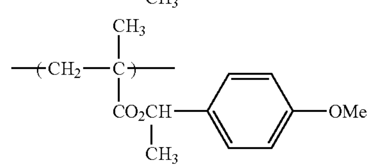
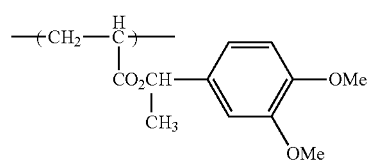
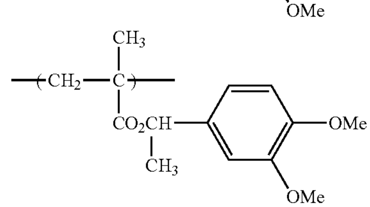
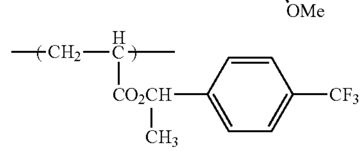
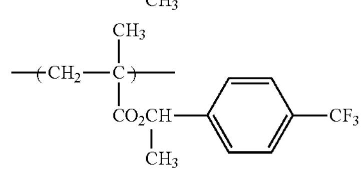
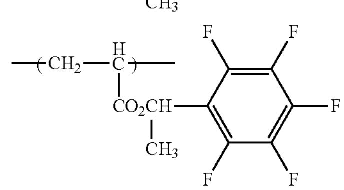

-continued
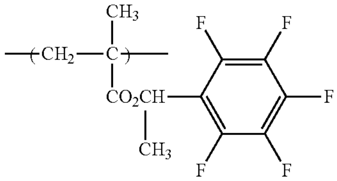
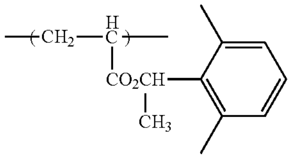
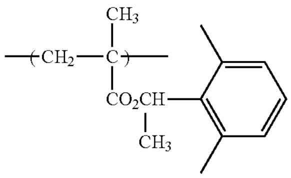
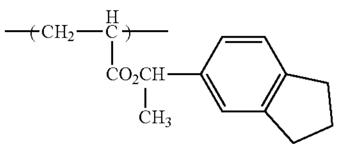
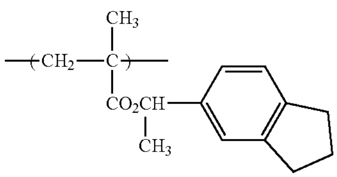
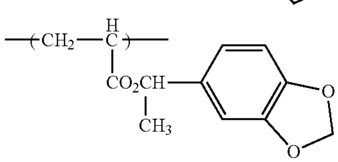
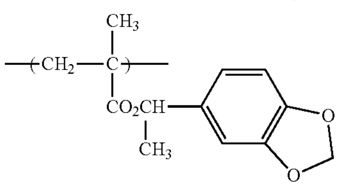
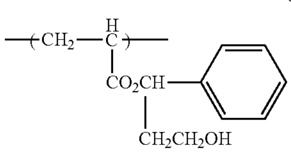
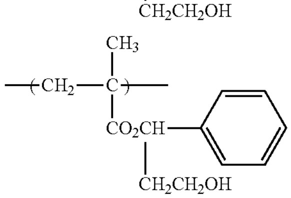
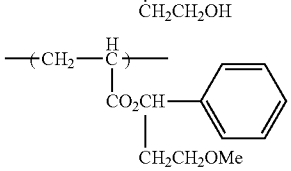
-continued
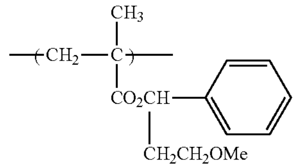
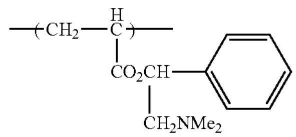
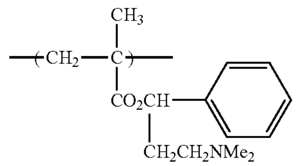
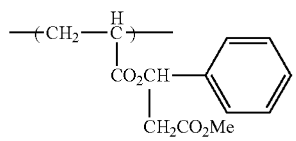
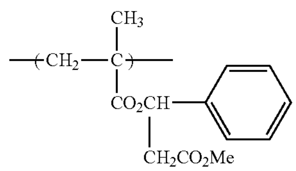
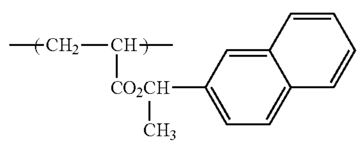
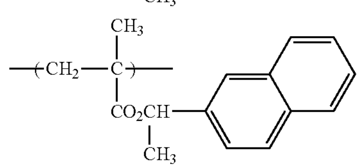
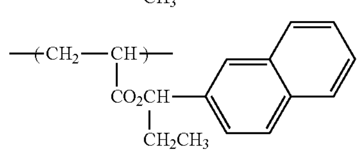
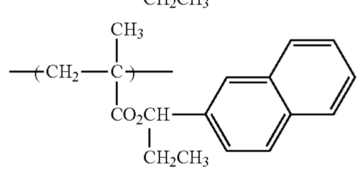
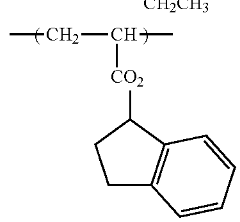
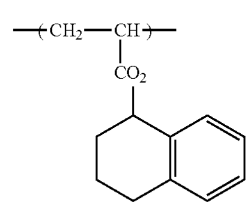

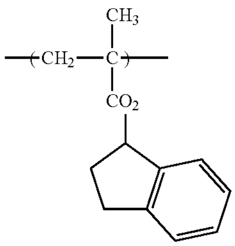
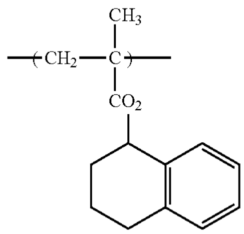
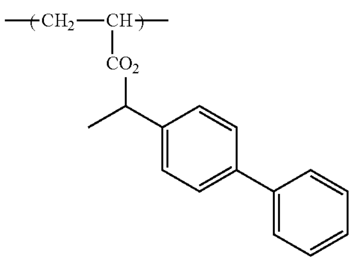
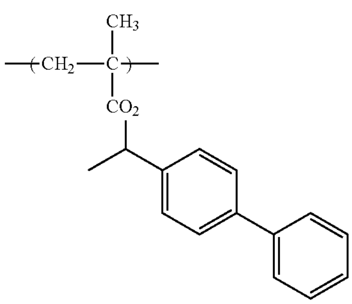
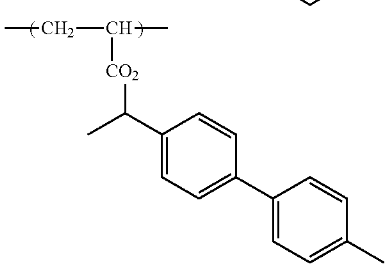
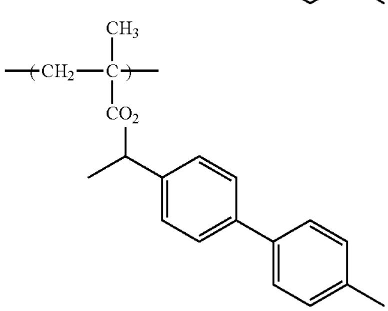
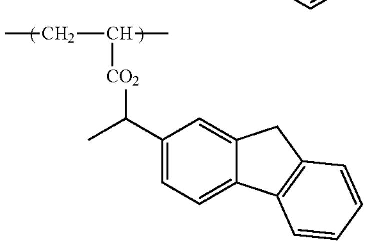
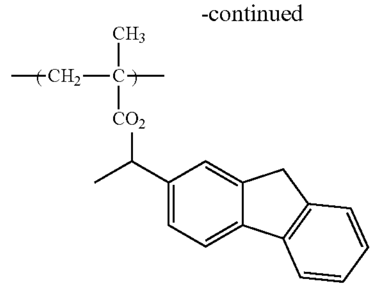
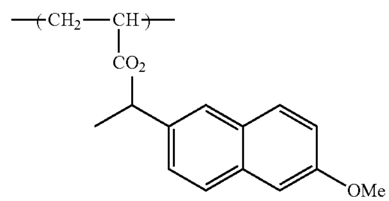
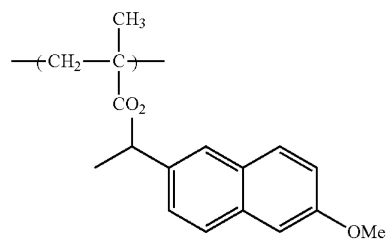
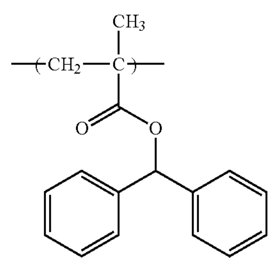
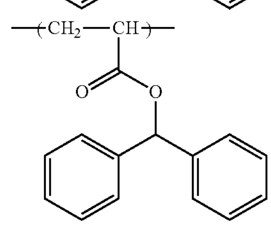
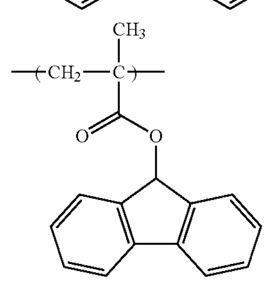
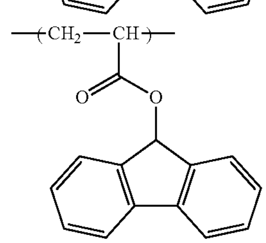

-continued
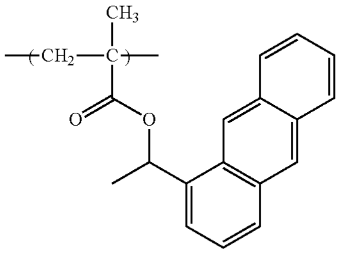
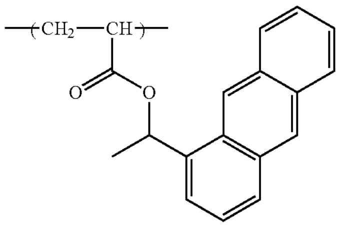
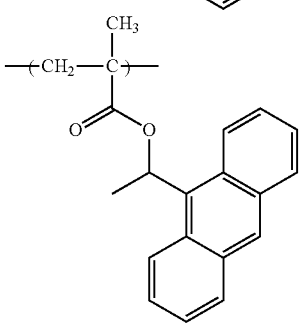
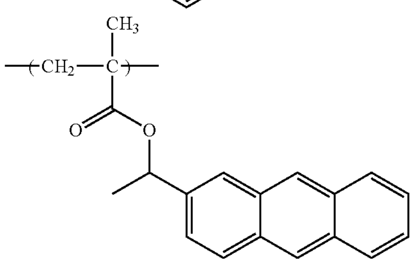
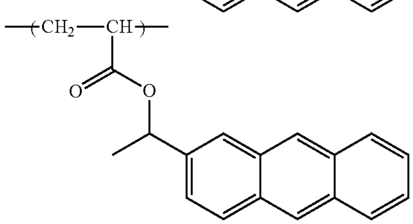
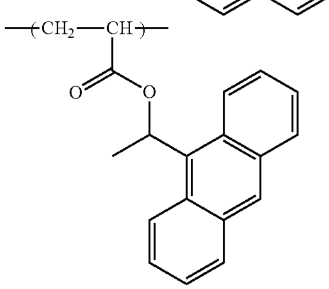
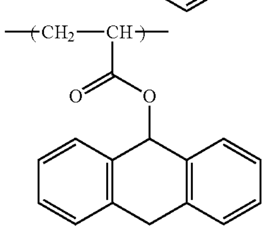
-continued
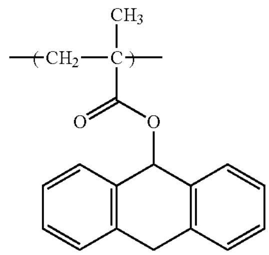
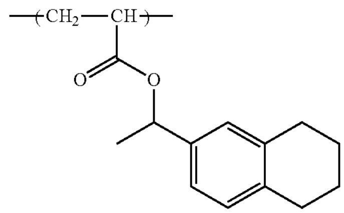
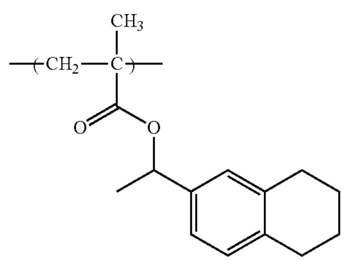
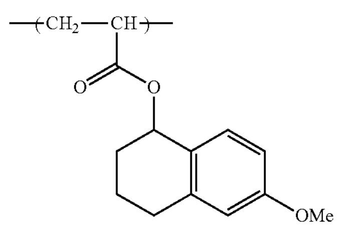
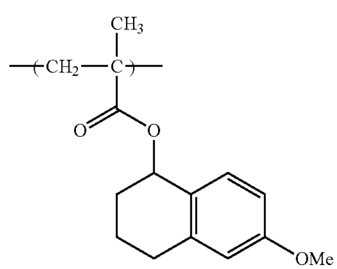
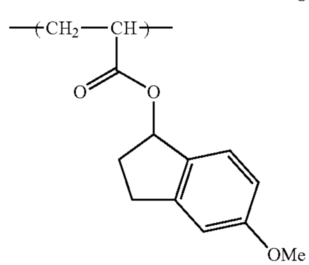

-continued
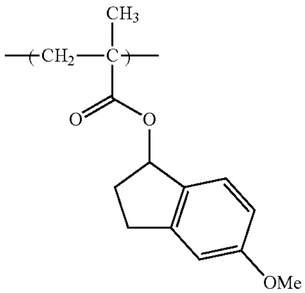
Among them, the repeating unit shown below is more preferred.
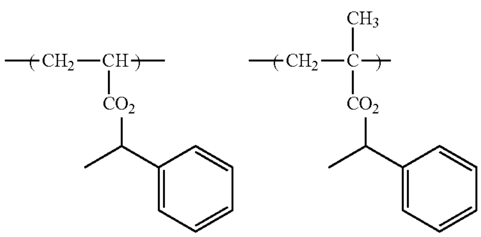
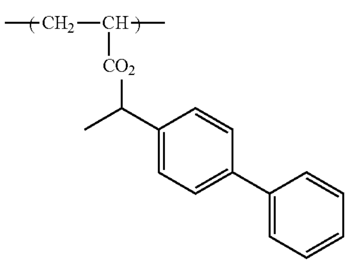
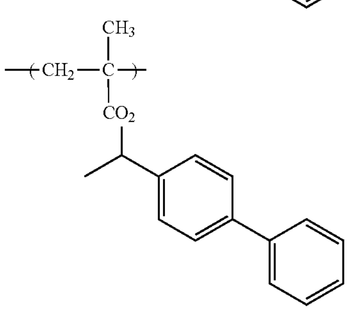
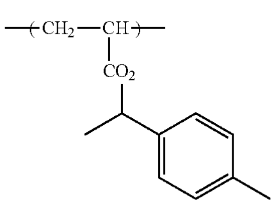
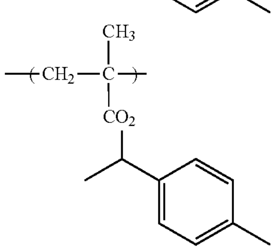
-continued
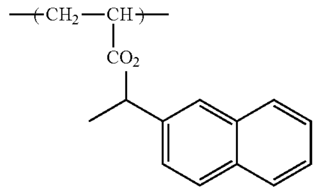
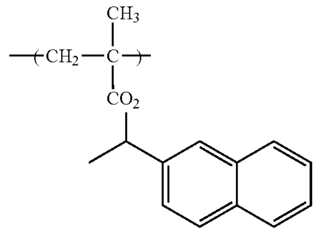
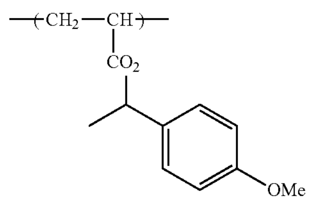
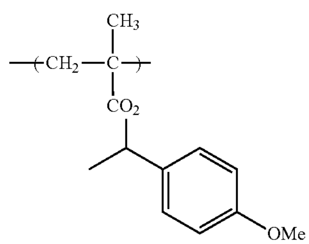
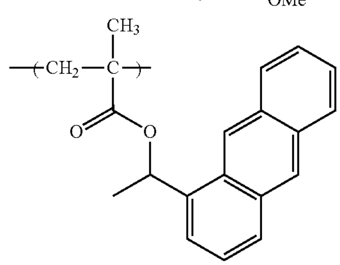
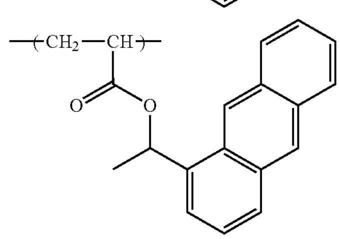
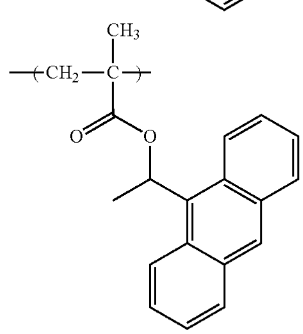

-continued

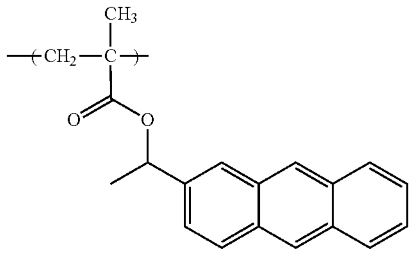

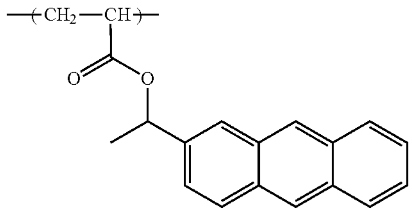

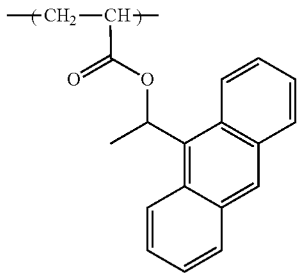

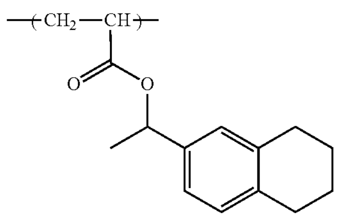

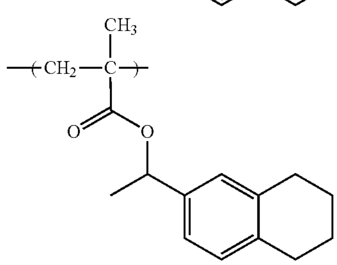

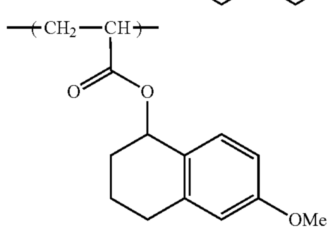

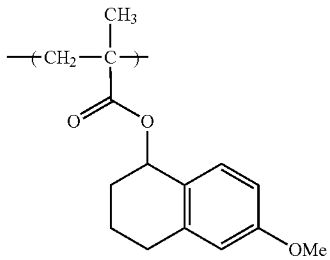

The repeating unit represented by Formula (A2) is preferably, in one embodiment, the repeating unit such as a t-butylmethacrylate or an ethylcyclopentylmethacrylate.

A monomer corresponding to the repeating unit represented by Formula (A2) may be synthesized by esterifying a (meth)acrylic acid chloride and an alcohol compound in a solvent such as THF, acetone, or methylene chloride under the presence of a basic catalyst such as triethylamine, pyridine, or DBU.

Further, a commercially available monomer may be used.

The resin (Ab) may also include the repeating unit represented by the following Formula (A5).

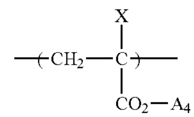

(A5)

In Formula (A5),

X represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group, and is the same as X in Formula (A2b).

$A_4$ represents a hydrocarbon group not capable of leaving by the action of an acid.

Examples of the hydrocarbon group not capable of leaving by the action of an acid of $A_4$ in Formula (A5) may include, other than the above-described acid-decomposable group, a hydrocarbon group, for example, an alkyl group (having preferably 1 to 15 carbon atoms) not capable of leaving by the action of an acid, a cycloalkyl group (having preferably 3 to 15 carbon atoms) not capable of leaving by the action of an acid, an aryl group (having preferably 6 to 15 carbon atoms) not capable of leaving by the action of an acid and the like.

A hydrocarbon group not capable of leaving by the action of an acid of A4 may also be substituted by a hydroxyl group, an alkyl group, a cycloalkyl group, an aryl group and the like.

Resin (Ab) may preferably have the repeating unit represented by Formula (A6).

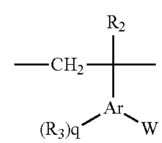

(A6)

In Formula (A6), $R_2$ represents a hydrogen atom, a methyl group, a cyano group, a halogen atom or a perfluoro group having 1 to 4 carbon atoms.

$R_3$ represents a hydrogen atom, an alkyl group, a cycloalkyl group, a halogen atom, an aryl group, an alkoxy group or an acyl group.

q represents an integer of 0 to 4.

Ar represents q+2-valent aromatic ring.

W represents a group not capable of decomposing by the action of an acid or a hydrogen atom.

Examples of the aromatic ring represented by Ar may include preferably benzene ring, a naphthalene ring, an anthracene ring, and benzene ring is more preferred.

W represents a group not capable of decomposing by the action of an acid (also known as an acid-stable group), but includes a group other than the above-described the acid-decomposable group, and specific examples thereof include a halogen atom, an alkyl group, a cycloalkyl group, an alkenyl group, an aryl group, an acyl group, an alkylamide group, an arylamide methyl group, an arylamide group and the like. An acid-stable group is preferably an acyl group, an alkylamide group, and still more preferably an acyl group, an alkylcarbonyloxy group, an alkyloxy group, a cycloalkyloxy group, and an aryloxy group.

In an acid-stable group of W, an alkyl group is preferably a group having 1 to 4 carbon atoms such as a methyl group, an ethyl group, a propyl group, n-butyl group, a sec-butyl group, and a t-butyl group, a cycloalkyl group is preferably a group having 3 to 10 carbon atoms such as a cyclopropyl group, cyclobutyl group, cyclohexyl group, and an adamantyl group, an alkenyl group is preferably a group having 2 to 4 carbon atoms such as a vinyl group, a propenyl group, an allyl group, and a butenyl group, and an alkenyl group is preferably a group having 2 to 4 carbon atoms such as a vinyl group, a propenyl group, an allyl group, and a butenyl group, and an aryl group is preferably a group having 6 to 14 carbon atoms such as a phenyl group, a xylyl group, a toluyl group, a cumenyl group, a naphthyl group, and an anthracenyl group. W may present at any position of the benzene ring, but preferably at meta-position or para-position, and particularly preferably ay para-position of the styrene backbone.

Hereinafter, specific examples of the repeating unit represented by Formula (A6) will be shown, but the present invention is not limited thereto.

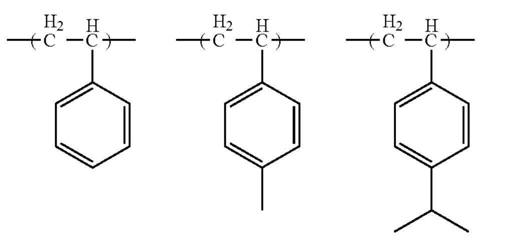

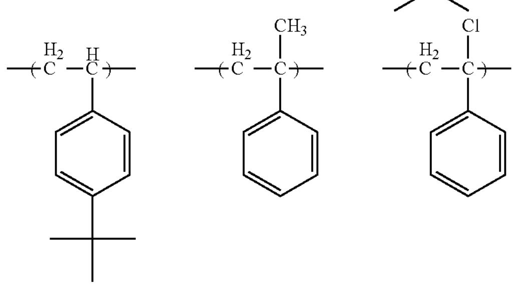

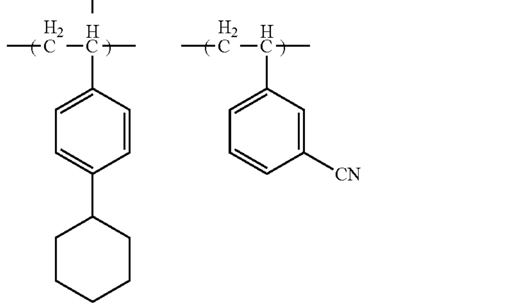

-continued

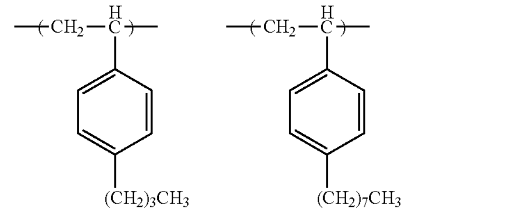

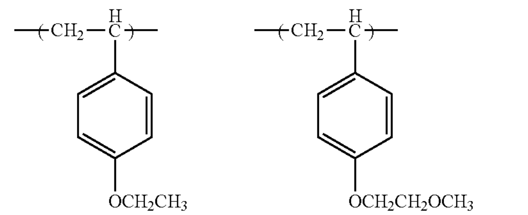

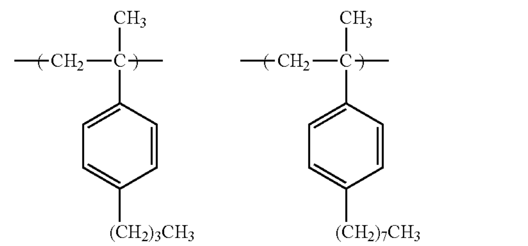

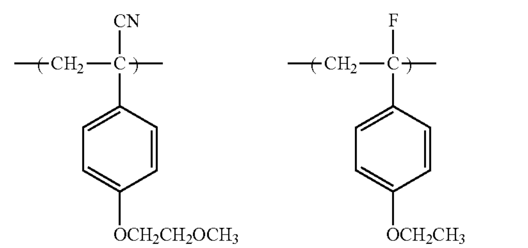

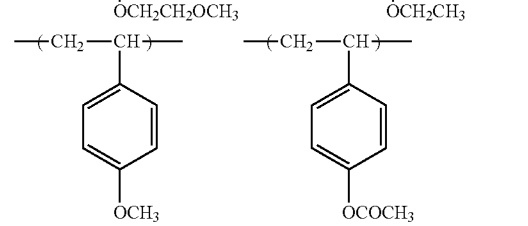

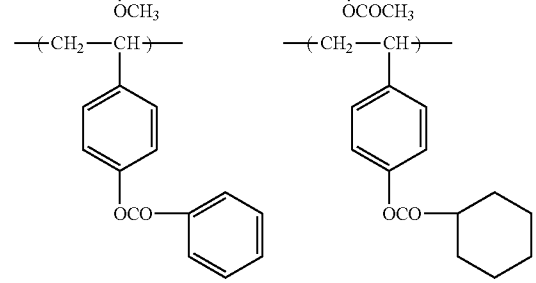

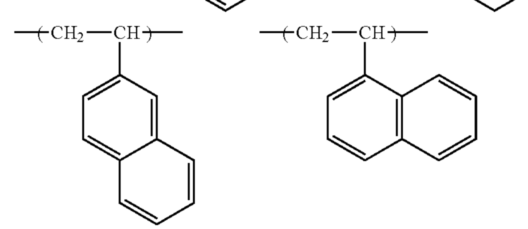

-continued

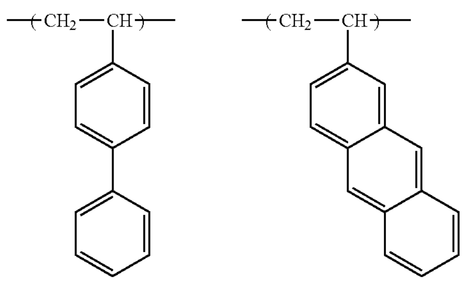

The resin (Ab) may preferably have the repeating unit consisting of the (meth) acrylate derivative not decomposable by an acid. Hereinafter, specific examples thereof will be shown, but the present invention is not limited thereto.

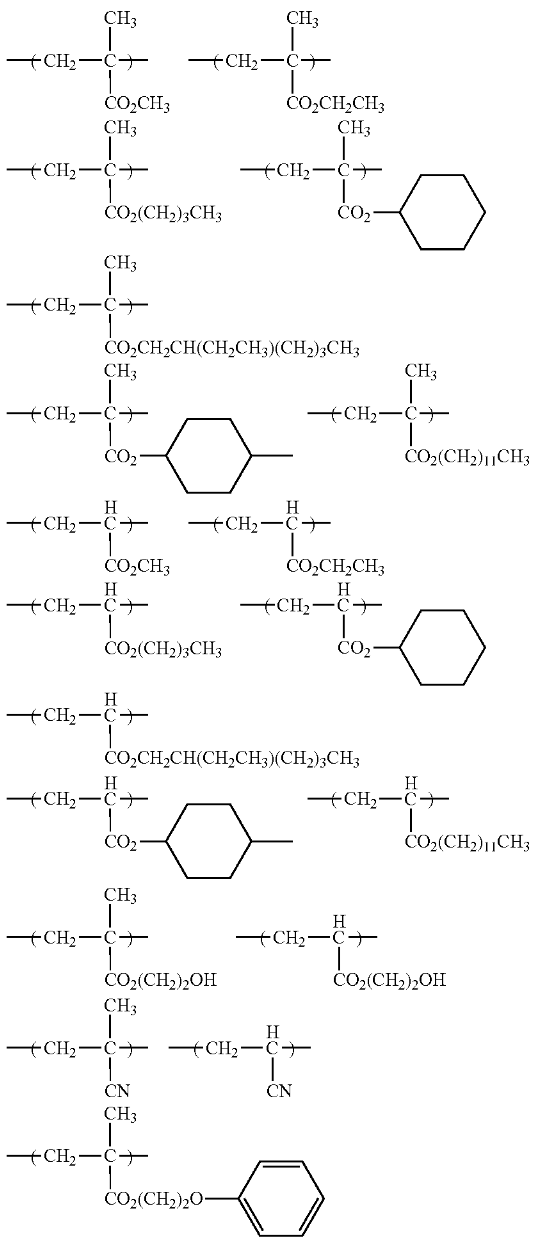

-continued

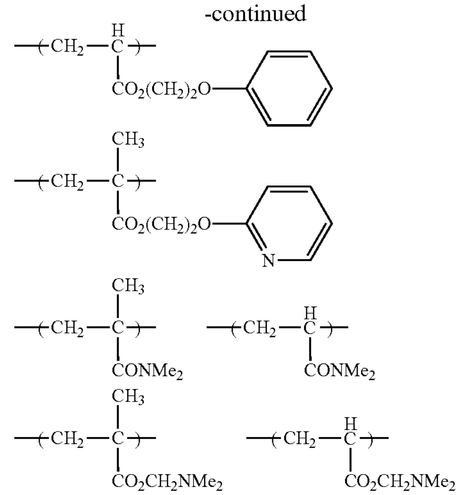

The content of the repeating unit having the acid-decomposable group in the resin (Ab) is preferably 5 to 95 mol %, more preferably 10 to 60 mol %, and particularly preferably 15 to 50 mol % based on the total repeating unit.

The content of the repeating unit represented by Formula (A1) in the resin (Ab) is preferably 0 to 90 mol %, more preferably 10 to 70 mol %, and particularly preferably 20 to 50 mol % based on the total repeating unit.

The content of the repeating unit represented by Formula (A2) in the resin (Ab) is preferably 0 to 90 mol %, more preferably 5 to 75 mol %, and particularly preferably 10 to 60 mol % based on the total repeating unit.

The content of the repeating unit represented by Formula (A3) in the resin (Ab) is preferably 0 to 90 mol %, more preferably 5 to 75 mol %, and particularly preferably 10 to 60 mol % based on the total repeating unit.

The content of the repeating unit represented by Formula (A5) in the resin (Ab) is preferably 0 to 50 mol %, more preferably 0 to 40 mol %, and particularly preferably 0 to 30 mol % based on the total repeating unit.

The resin (Ab) may also have the repeating unit represented by Formula (A6), and thus is preferred from the viewpoint of enhancing the film quality and inhibiting the film decrease of the non-exposure parts. The content of the repeating unit represented by Formula (A5) is preferably 0 to 50 mol %, more preferably 0 to 40 mol %, and particularly preferably 0 to 30 mol % based on the total repeating unit.

Further, in the resin (Ab), in order to maintain good developability in an alkali developer, appropriate other polymerizable monomers may be copolymerized to introduce an alkali-soluble groups such as a phenolic hydroxyl group and a carboxyl group, and in order to improve the film quality, other hydrophobic polymerizable monomers such as a alkyl acrylate or alkyl methacrylate may be copolymerized.

A monomer corresponding to the repeating unit represented by Formula (A2) may be synthesized by esterifying a (meth)acrylic acid chloride and an alcohol compound in a solvent such as THF, acetone, or methylene chloride under the presence of a basic catalyst such as triethylamine, pyridine or DBU. Further, a commercially available monomer may be used.

A monomer corresponding to the repeating unit represented by Formula (A1) may be synthesized by acetalizing a hydroxyl substituted styrene monomer and a vinylether compound in a solvent such as THF or methylene chloride under the presence of an acidic catalyst such as a p-toluene sulfonic acid, a p-toluene sulfonic acid pyridine salt, or by t-Boc protecting them by using t-butyl bicarbonate under the presence of a basic catalyst such as triethylamine, pyridine, or DBU. Further, a commercially available monomer may be used.

The resin (Ab) may preferably have the repeating unit represented by the following Formula (A).

(A)

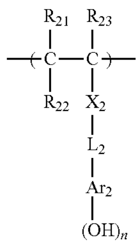

In the formula,

Each of $R_{21}$, $R_{22}$ and $R_{23}$ independently represents a hydrogen atom, an alkyl group, a halogen atom, a cyano group or an alkoxycarbonyl group. However, $R_{22}$ and $A_{r2}$ may be combined with each other to form a ring, and in that case $R_{22}$ represents a single bond or an alkylene group.

$X_2$ represents a single bond, —COO— or —$CONR_{30}$—; and $R_{30}$ represents a hydrogen atom or an alkyl group.

$L_2$ represents a single bond or an alkylene group.

$A_{r2}$ represents a (n+1)-valent aromatic ring group and a (n+2)-valent aromatic ring group in which it combines with $R_{22}$ to form a ring.

n represents an integer of 1 or 2.

Examples of the alkyl group of $R_{21}$, $R_{22}$ and $R_{23}$ in Formula (A) may include preferably an alkyl group having 20 or less carbon atoms, still more preferably 8 or less carbon atoms, and particularly preferably an alkyl group having 3 or less carbon atoms that may have a substituent such as a methyl group, an ethyl group, a propyl group, an isopropyl group, a n-butyl group, a sec-butyl group, a hexyl group, a 2-ethylhexyl group, an octyl group, a dodecyl group and the like.

An alkyl group contained in the alkoxycarboxyl group is preferably the same as the alkyl group in the above-described R' and $L_1$.

The cycloalkyl group may be a monocyclic group or a polycyclic group. Examples thereof may include preferably a monocyclic cycloalkyl group having 3 to 8 carbon atoms that may have a substituent such as a cyclopropyl group, a cyclopentyl group, and a cyclohexyl group.

Examples of the halogen atom may include a fluorine atom, a chlorine atom, a bromine atom and an iodine atom, and a fluorine atom is particularly preferred.

The preferred examples of the substituent in each of the above-described group may include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarboxyl group, a cyano group, a nitro group and the like, and the substituent has preferably 8 or less carbon atoms.

$Ar_2$ represents (n+1)-valent aromatic ring. When n is 1, a divalent aromatic ring may have a substituent, the preferred examples thereof include an arylene group having 6 to 18 carbon atoms, for example, a phenylene group, a tolylene group, a naphthylene group, an anthracenylene group and the like, or an aromatic ring containing a heterocyclic ring, for example, a thiophene, a furan, a pyrrole, a benzothiophene, a benzofuran, a benzopyrrole, a triazine, an imidazole, a benzoimidazole, a triazole, a thiadiazole, a thiazole and the like.

When n is an integer of 2 or more, specific examples of the (n+1)-valent aromatic ring group suitably include a group in which (n−1) arbitrary hydrogen atoms are removed from the above-described specific examples of the divalent aromatic ring group.

A (n+1)-valent aromatic ring may also have a substituent.

In —$CONR_{30}$— ($R_{30}$ represents a hydrogen atom or an alkyl group) represented by $X_2$, an alkyl group of $R_{30}$ is the same as the alkyl group of $R_{21}$ to $R_{23}$.

As $X_2$, a single bond, —COO—, or —CONH— is preferred, and a single bond or —COO— is more preferred.

Examples of the alkylene group in $L_2$ may include preferably a group having 1 to 8 carbon atoms that may have a substituent such as a methylene group, an ethylene group, a propylene group, a butylene group, a hexylene group, an octylene group and the like.

As for $Ar_2$, an aromatic ring group having 6 to 18 carbon atoms that may have a substituent is more preferred, and benzene ring group, a naphthalene ring group, and a biphenylene ring group are particularly preferred.

The repeating unit may preferably have a hydroxystyrene structure. That is, $Ar_2$ is preferably benzene ring group.

Hereinafter, specific examples of the repeating unit represented by Formula (A) will be described, but the present invention is not limited thereto. In the formulas, a represents 1 or 2.

(B-1)

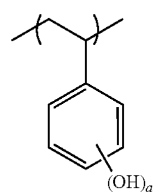

(B-2)

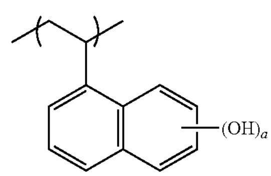

(B-3)

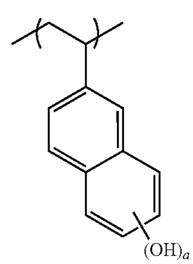

(B-4)

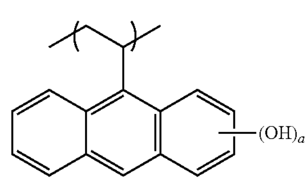

-continued
(B-5)
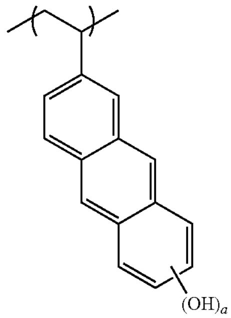
(B-6)
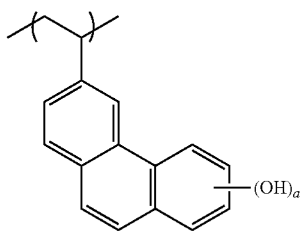
(B-7)
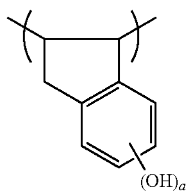
(B-8)
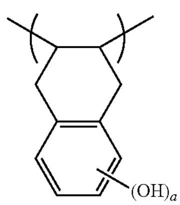
(B-9)
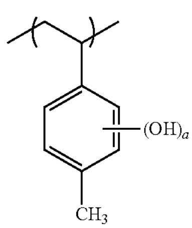
(B-10)
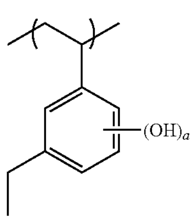
(B-11)
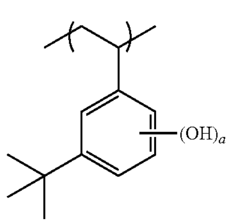
-continued
(B-12)
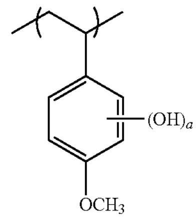
(B-13)
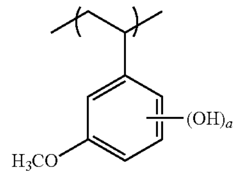
(B-14)
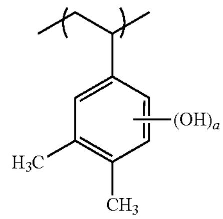
(B-15)
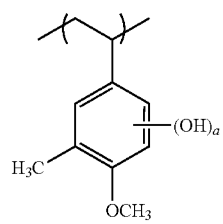
(B-16)
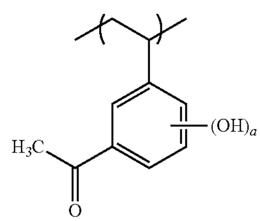
(B-17)
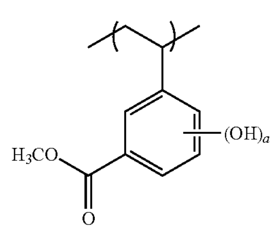
(B-18)
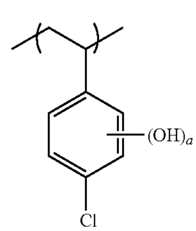

-continued
(B-19)
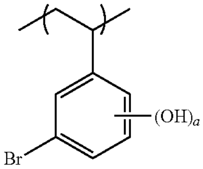
(B-20)
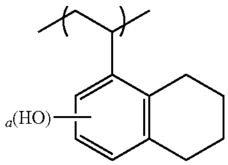
(B-21)
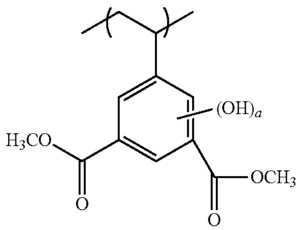
(B-22)
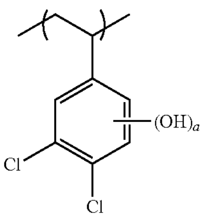
(B-23)
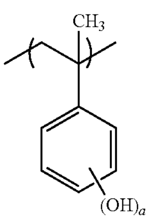
(B-24)
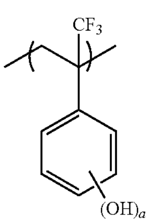
(B-25)
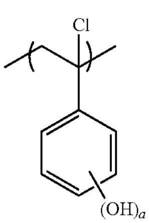
-continued
(B-26)
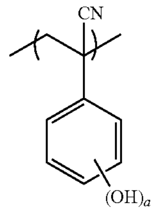
(B-27)
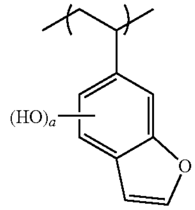
(B-28)
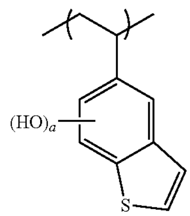
(B-29)
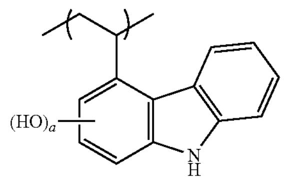
(B-30)
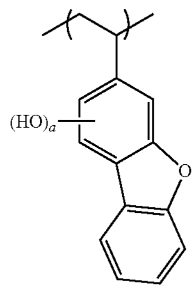
(B-31)
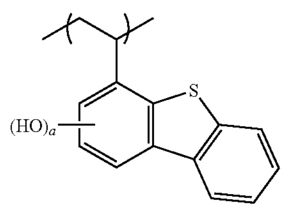
(B-32)
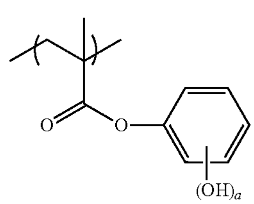

-continued (B-33)

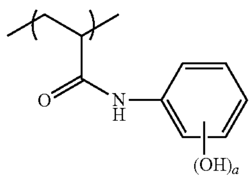

(B-34)

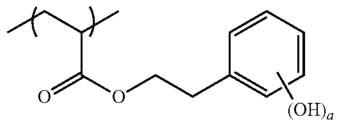

(B-35)

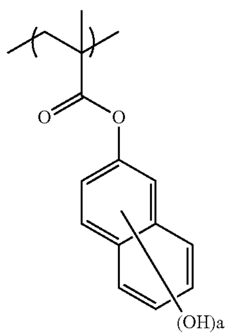

(B-36)

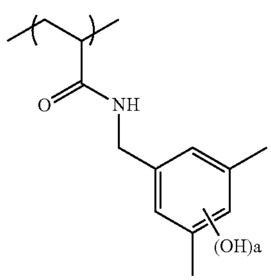

(B-37)

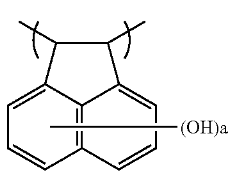

(B-38)

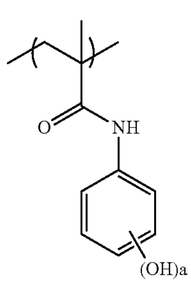

The repeating unit represented by Formula (A) is preferably the repeating unit represented by the following Formula (A1) or (A2), and more preferably the repeating unit represented by Formula (A1).

(A1)

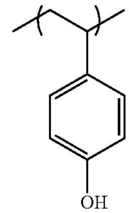

(A2)

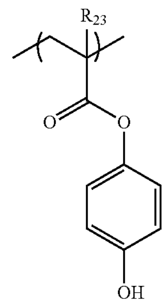

In Formula (A2), $R_{23}$ has the same meaning as $R_{23}$ in Formula (A).

The resin (P) may contain two kinds or more of the repeating units represented by Formula (A).

The resin (Ab) may include, in one embodiment, the repeating unit (B) having the structure that decomposes to generate an acid upon irradiation with electron beam or extreme ultraviolet rays (Hereinafter, referred to "the acid generating repeating unit (B)" or "the repeating unit (B)").

This structural moiety may be, for example, a structural moiety which decomposes upon irradiation with an actinic ray or radiation to generate an acid anion in the repeating unit (B), and a structural moiety which releases an acid anion to generate a cation structure in the repeating unit (B).

In addition, this structural moiety is preferably, for example, an ionic structural moiety having a sulfonium salt structure or an iodonium salt structure.

This structural moiety may be, for example, the same structural moiety as the structural moiety represented by A in Formulas (B1), (B2) and (B3) to be described later.

The repeating unit (B) is, in one embodiment, preferably at least one selected from the group consisting of the repeating unit represented by the following Formulas (B1), (B2) and (B3). Among these, the repeating unit represented by the following Formula (B1) or (B3) is more preferred, and the repeating unit represented by the following Formula (B1) is particularly preferred.

(B1)

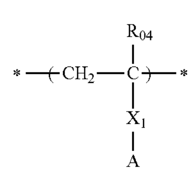

(B2)

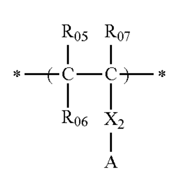

-continued (B3)

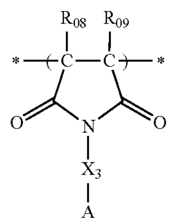

In Formulas (B1), (B2) and (B3),

A represents a structural moiety which decomposed by the irradiation of an actinic ray or radiation to generate an acid anion.

Each of $R_{04}$, $R_{05}$ and $R_{07}$ to $R_{09}$ independently represents a hydrogen atom, an alkyl group, a cycloalkyl group, a halogen atom, a cyano group or an alkoxycarboxyl group.

$R_{06}$ represents a cyano group, a carboxyl group, —CO—$OR_{25}$ or —CO—N($R_{26}$)($R_{27}$). $R_{25}$ represents an alkyl group, a cycloalkyl group, an alkenyl group, a cycloalkenyl group, an aryl group or an aralkyl group. Each of $R_{26}$ and $R_{27}$ independently represents a hydrogen atom, an alkyl group, a cycloalkyl group, an alkenyl group, a cycloalkenyl group, an aryl group or an aralkyl group. $R_{26}$ and $R_{27}$ may combine with each other to form a ring along with a nitrogen atom.

Each of $X_1$, $X_2$ and $X_3$ independently represents a single bond, an arylene group, an alkylene group, a cycloalkylene group, —O—, —$SO_2$—, —CO—, —N($R_{33}$)— or a divalent linking group in which a plurality of these groups are combined. $R_{33}$ represents a hydrogen atom, an alkyl group, a cycloalkyl group, an alkenyl group, a cycloalkenyl group, an aryl group or an aralkyl group.

An alkyl group of $R_{04}$, $R_{05}$ and $R_{07}$ to $R_{09}$, is preferably a group having 20 or less carbon atoms, more preferably a group having 8 or less carbon atoms. Examples of such an alkyl group may include a methyl group, an ethyl group, a propyl group, an isopropyl group, an n-butyl group, a sec-butyl group, a hexyl group, a 2-ethylhexyl group, an octyl group, and a dodecyl group. Further, these alkyl groups may have a substituent.

A cycloalkyl group of $R_{04}$, $R_{05}$ and $R_{07}$ to $R_{09}$ may be a monocyclic group or a polycyclic group. A cycloalkyl group is preferably a group having 3 to 8 carbon atoms. Examples of such a cycloalkyl group may include a cyclopropyl group, a cyclopentyl group and cyclohexyl group.

Examples of the halogen atom of $R_{04}$, $R_{05}$ and $R_{07}$ to $R_{09}$ may include a fluorine atom, a chlorine atom, a bromine atom and an iodine atom. Among them, a fluorine atom is particularly preferred.

Examples of the alkyl group contained in an alkoxycarboxyl group of $R_{04}$, $R_{05}$ and $R_{07}$ to $R_{09}$ may include examples previously exemplified as an alkyl group of $R_{04}$, $R_{05}$ and $R_{07}$ to $R_{09}$.

Examples of the alkyl group of $R_{25}$ to $R_{27}$ and $R_{33}$ may include examples previously exemplified as an alkyl group of $R_{04}$, $R_{05}$ and $R_{07}$ to $R_{09}$.

Examples of the cycloalkyl group of $R_{25}$ to $R_{27}$ and $R_{33}$ may include examples previously exemplified as a cycloalkyl group of $R_{04}$, $R_{05}$ and $R_{07}$ to $R_{09}$.

The alkenyl group of $R_{25}$ to $R_{27}$ and $R_{33}$ is preferably a group having 2 to 6 carbon atoms. Examples of such an alkenyl group may include a vinyl group, a propenyl group, an allyl group, a butenyl group, a pentenyl group and a hexenyl group.

The cycloalkenyl group of $R_{25}$ to $R_{27}$ and $R_{33}$ is preferably a group having 3 to 6 carbon atoms. Examples of such a cycloalkenyl group may include cyclohexenyl group.

The aryl group of $R_{25}$ to $R_{27}$ and $R_{33}$ may be a monocyclic aromatic group or a polycyclic aromatic group. This aryl group is preferably a group having 6 to 14 carbon atoms. This aryl group may further have a substituent. In addition, aryl groups may combine with each other to form a polycyclic ring. Examples of the aryl group of $R_{25}$ to $R_{27}$ and $R_{33}$ may include a phenyl group, a tolyl group, a chloro phenyl group, a methoxy phenyl group and a naphthyl group.

The aralkyl group of $R_{25}$ to $R_{27}$ and $R_{33}$ is preferably a group having 7 to 15 carbon atoms. Such an aralkyl group may have a substituent. Examples of the aralkyl group of $R_{25}$ to $R_{27}$ and $R_{33}$ may include a benzyl group, a phenetyl group and a cumyl group.

The ring that $R_{26}$ and $R_{27}$ may combine with each other to form along with a nitrogen atom is preferably a 5- to 8-membered ring, and specific examples thereof may include a pyrrolidine, a piperidine and a piperazine.

The arylene group of $X_1$ to $X_3$ is preferably a group having 6 to 14 carbon atoms. Examples of such an arylene group may include a phenylene group, a tolylene group and a naphthylene group. Such an arylene group may further have a substituent.

The alkylene group of $X_1$ to $X_3$ is preferably a group having 1 to 8 carbon atoms. Examples of such an alkylene group may include a methylene group, an ethylene group, a propylene group, a butylene group, a hexylene group and an octylene group. Such an alkylene group may further have a substituent.

A cycloalkylene group of $X_1$ to $X_3$ is preferably a group having 5 to 8 carbon atoms. Examples of such a cycloalkylene group may include a cyclopentylene group and a cyclohexylene group. Such a cycloalkylene group may further have a substituent.

Examples of the preferred substituent which may be possessed by each of groups in Formulas (B1) to (B3) may include a hydroxyl group; a halogen atom(fluorine, chlorine, bromine, iodine); a nitro group; a cyano group; an amide group; a sulfonamide group; alkyl group being previously exemplified as $R_{04}$, $R_{05}$ and $R_{07}$ to $R_{09}$; an alkoxy group such as a methoxy group, an ethoxy group, a hydroxyethoxy group, a propoxy group, a hydroxypropoxy group, and a butoxy group; an alkoxycarboxyl group such as a methoxycarbonyl group and an ethoxycarbonyl group; an acyl group such as a formyl group, an acetyl group and a benzoyl group; an acyloxy group such as an acetoxy group and a butyryloxy group; and a carboxyl group. These substituents may have preferably 8 or less carbon atoms.

A represents a structural moiety that decomposes to generate an acid anion upon irradiation with an actinic ray or radiation, specific examples thereof may include a photo-initiator for cationic photopolymerization, a photo-initiator for radical photopolymerization, a photodecoloring agent for dyes, a photodiscoloring agent, and a structural moiety which may be possessed by a publicly known compound capable of generating an acid upon irradiation with light, which is used for microresist or the like.

In addition, A is more preferably an ionic structural moiety having a sulfonium salt structure or an iodonium salt structure. More specifically, A is preferably a group represented by the following Formula (ZI) or (ZII).

ZI

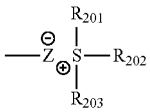

ZII

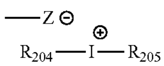

In Formula (ZI),

Each $R_{201}$, $R_{202}$ and $R_{203}$ independently represents an organic group.

The organic group as $R_{201}$, $R_{202}$ and $R_{203}$ has generally 1 to 30 carbon atoms, and preferably 1 to 20 carbon atoms. In addition, two groups of $R_{201}$ to $R_{203}$ may combine to form a ring structure, and may contain an oxygen atom, a sulfur atom, an ester bond, an amide bond, and a carbonyl group in the ring. Examples of the group that two groups of $R_{201}$ to $R_{203}$ may combine to form may include an alkylene group such as a butylene group and a pentylene group.

$Z^-$ represents an acid anion which is generated by decomposing upon irradiation with an actinic ray or radiation. $Z^-$ is preferably a non-nucleophilic anion. Examples of the non-nucleophilic anion may include a sulfonate anion, a carboxylate anion, sulfonylimide anion, a bis(alkylsulfonyl) imide anion and a tris(alkylsulfonyl)methyl anion.

In addition, a non-nucleophilic anion is an anion having an extremely low ability of causing a nucleophilic reaction. When a non-nucleophilic anion is used, the decomposition with time due to an intramolecular nucleophilic reaction can be suppressed. Accordingly, it is possible to enhance the stability of the resin and the composition with time.

Examples of the organic group as $R_{201}$, $R_{202}$ and $R_{203}$ may include a group corresponding to each group represented by (ZI-1), (ZI-2), (ZI-3) group to be described later.

Examples of the more preferred group represented by (ZI) group may include examples of (ZI-1) group, (ZI-2) group, (ZI-3) group and (ZI-4) group to be described later.

A (ZI-1) group is a group that at least one aryl group of $R_{201}$ to $R_{203}$ in Formula (ZI) has an arylsulfonium as a cation.

All of $R_{201}$ to $R_{203}$ may be an aryl group, some of $R_{201}$ to $R_{203}$ may be an aryl group, and the rest thereof may be an alkyl group or a cycloalkyl group.

Examples of (ZI-1) group may include a group corresponding to each of a triarylsulfonium, a diarylalkylsulfonium, an aryldialkylsulfonium, a diarylcycloalkylsulfonium, and an aryldicycloalkylsulfonium.

An aryl group in arylsulfonium is preferably a phenyl group or a naphthyl group, and more preferably a phenyl group. An aryl group may have a heterocyclic ring structure containing a hetero atom such as an oxygen atom, a nitrogen atom and a sulfur atom.

Examples of the heterocyclic ring structure may include a pyrrole, a furan, a thiophene, an indole, a benzofuran and a benzothiophene. If an arylsulfonium has two or more aryl groups, these aryl groups may be same or different.

An alkyl group or a cycloalkyl group which may be optionally possessed by the arylsulfonium is preferably a straight or branched alkyl group having 1 to 15 carbon atoms or a cycloalkyl group having 3 to 15 carbon atoms. Examples of such an alkyl group or a cycloalkyl group may include a methyl group, an ethyl group, a propyl group, an n-butyl group, a sec-butyl group, a t-butyl group, a cyclopropyl group, a cyclobutyl group and a cyclohexyl group.

An aryl group, an alkyl group or a cycloalkyl group of $R_{201}$ to $R_{203}$ may have an alkyl group (having, for example, 1 to 15 carbon atoms), a cycloalkyl group (having, for example, 3 to 15 carbon atoms), an aryl group (having, for example, 6 to 14 carbon atoms), an alkoxy group (having, for example, 1 to 15 carbon atoms), a halogen atom, a hydroxyl group or phenylthio group as a substituent.

Examples of the preferred substituent may include a straight or branched alkyl group having 1 to 12 carbon atoms, a cycloalkyl group having 3 to 12 carbon atoms, and a straight, branched or cyclic alkoxy group having 1 to 12 carbon atoms. Examples of the more preferred substituent may include an alkyl group having 1 to 4 carbon atoms and an alkoxy group having 1 to 4 carbon atoms. A substituent may be substituted with any one of three kinds of $R_{201}$ to $R_{203}$, and substituted with two or more of them. In addition, when $R_{201}$ to $R_{203}$ are a phenyl group, these substituents is preferably the one substituted in p-position of the phenyl group.

Subsequently, a (ZI-2) group will be described.

The (ZI-2) group is a group in which each of $R_{201}$ to $R_{203}$ in Formula (ZI) independently represents an organic group having no aromatic ring. Here, the aromatic ring also includes a heterocyclic ring containing a heteroatom.

The organic group containing no aromatic ring as $R_{201}$ to $R_{203}$ has generally 1 to 30 carbon atoms, and preferably 1 to 20 carbon atoms.

Each of $R_{201}$ to $R_{203}$ independently represents preferably an alkyl group, a cycloalkyl group, an allyl group or a vinyl group, more preferably a straight or branched 2-oxoalkyl group, a 2-oxocycloalkyl group or an alkoxycarbonylmethyl group, and particularly preferably a straight or branched 2-oxoalkyl group.

Preferred examples of the alkyl group and a cycloalkyl group of $R_{201}$ to $R_{203}$ may include a straight or branched alkyl group having 1 to 10 carbon atoms (for example, a methyl group, an ethyl group, a propyl group, butyl group or a pentyl group) and a cycloalkyl group having 3 to 10 carbon atoms (for example, a cyclopentyl group, a cyclohexyl group or a norbonyl group). More preferred examples of such an alkyl group may include a 2-oxoalkyl group and an alkoxycarbonyl methyl group. Still more preferred examples of the cycloalkyl group may include a 2-oxocycloalkyl group.

A 2-oxoalkyl group may be a straight or branched group. Preferred examples of the 2-oxoalkyl group may include a group which has >C═O in 2-position of the above-described alkyl group. Preferred examples of the 2-oxocycloalkyl group may include a group which has >C═O at the 2-position of the cycloalkyl group.

Preferred examples of the alkoxy group in an alkoxycarbonyl methyl group may include an alkoxy group having 1 to 5 carbon atoms (for example, a methoxy group, an ethoxy group, a propoxy group, a butoxy group or a pentoxy group).

$R_{201}$ to $R_{203}$ may be further substituted with a halogen atom, an alkoxy group (having, for example, 1 to 5 carbon atoms), a hydroxyl group, a cyano group or a nitro group.

Subsequently, a (ZI-3) group will be described.

The (ZI-3) group is a group represented by the following Formula (ZI-3), and also a group having a phenacyl sulfonium salt structure.

ZI-3

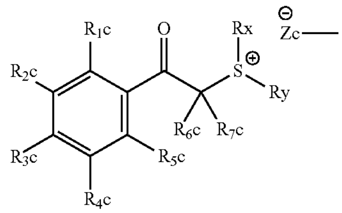

In Formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more of $R_{1c}$ to $R_{5c}$, $R_{6c}$ and $R_{7c}$, and $R_x$ and $R_y$ may combine with each other to form a ring structure, respectively. This ring structure may include an oxygen atom, a sulfur atom, a ketone group, an ester bond and/or an amide bond. Examples of the group formed by combining them may include a butylene group, a pentylene group and the like.

$Zc^-$ represents a non-nucleophilic anion, and examples thereof may include the non-nucleophilic anion which is the same as $Z^-$ in Formula (ZI).

As for the specific structure of a cation moiety of Formula (ZI-3), reference may be made to the structure of a cation moiety of an acid-generating agent described in [0047] and [0048] of Patent Application Laid-Open No. 2004-233661 and [0040] to [0046] of Patent Application Laid-Open No. 2003-35948.

Subsequently, a (ZI-4) group will be described.

The (ZI-4) group is a group represented by the following Formula (ZI-4). The group is effective in the suppression of outgas.

ZI-4

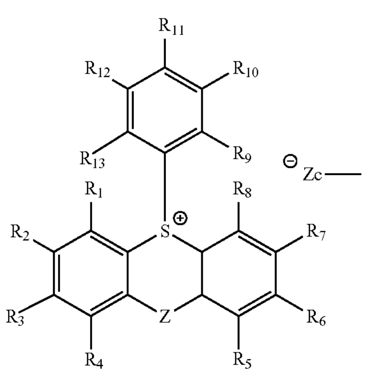

In Formula (ZI-4), each of $R_1$ to $R_{13}$ independently represents a hydrogen atom or a substituent.

At least one of $R_1$ to $R_{13}$ is preferably a substituent containing an alcoholic hydroxyl group. Further, here "an alcoholic hydroxyl group" means a hydroxyl group in which bonded to a carbon atom of an alkyl group.

Z is a single bond or a divalent linking group.

$Zc^-$ represents a non-nucleophilic anion; examples thereof include the same as $Z^-$ in Formula (ZI).

When $R_1$ to $R_{13}$ are a substituent including an alcoholic hydroxyl group, $R_1$ to $R_{13}$ are preferably a group represented by —(WY). Here, Y is an alkyl group substituted by a hydroxyl group and W is a single bond or a divalent linking group.

Examples of the alkyl group represented by Y may include an ethyl group, a propyl group and an isopropyl group. Y includes particularly preferably a structure represented by $—CH_2CH_2OH$.

A divalent linking group represented by W is not particularly limited, but preferably includes a single bond, an alkoxy group, an acyloxy group, an acylamino group, an alkyl and a arylsulfonylamino group, an alkylthio group, an alkylsulfonyl group, an acyl group, an alkoxycarboxyl group or a divalent group in which any hydrogen atom in a carbamoyl group is substituted by a single bond, and more preferably, a single bond, an acyloxy group, an alkylsulfonyl group, an acyl group or a divalent group in which arbitrary hydrogen atom in an alkoxycarboxyl group is substituted by a single bond.

When $R_1$ to $R_{13}$ are a substituent containing, an alcoholic hydroxyl group, the carbon number contained is preferably 2 to 10, more preferably 2 to 6, and particularly preferably 2 to 4.

A substituent containing an alcoholic hydroxyl group of $R_1$ to $R_{13}$ may have two or more alcoholic hydroxyl groups. The number of an alcoholic hydroxyl group possessed by the substituent containing an alcoholic hydroxyl group as $R_1$ to $R_{13}$ is 1 to 6, preferably 1 to 3, and more preferably 1.

The number of an alcoholic hydroxyl group that (ZI-4) group contains is preferably 1 to 10, more preferably 1 to 6, and still more preferably 1 to 3 after all of $R_1$ to $R_{13}$ are combined.

When $R_1$ to $R_{13}$ do not contain an alcoholic hydroxyl group, examples of $R_1$ to $R_{13}$ may include a hydrogen atom, a halogen atom, an alkyl group, a cycloalkyl group, an alkenyl group, a cycloalkenyl group, an alkynyl group, an aryl group, heterocyclic ring group, a cyano group, a nitro group, a carboxyl group, an alkoxy group, an aryloxy group, a silyl oxy group, a heterocyclic oxy group, an acyloxy group, a carbamoyl oxy group, an alkoxycarbonyloxy group, an aryloxycarbonyloxy group, an amino group (including an anilyno group), an ammonio group, an acylamino group, an aminocarbonylamino group, an alkoxycarbonylamino group, an aryloxycarbonylamino group, a sulfamoylamino group, an alkyl and an arylsulfonylamino group, a mercapto group, an alkylthio group, an arylthio group, a polycyclic-thio group, a sulfamoyl group, a sulfo group, an alkyl and arylsulfinyl group, an alkyl and arylsulfonyl group, an acyl group, an aryloxycarbonyl group, an alkoxycarboxyl group, a carbamoyl group, an aryl and heterocyclic azo group, an imide group, a phophino group, a phophinyl group, a phophinyloxy group, a phophinylamino group, a phosphono group, a silyl group, a hydrazino group, a ureido group, a boronic acid group [$—B(OH)_2$], a phosphate group [$—OPO(OH)_2$], a sulfate group ($—OSO_3H$), and other known substituent.

When $R_1$ to $R_{13}$ do not contain an alcoholic hydroxyl group, examples of $R_1$ to $R_{13}$ may include preferably a hydrogen atom, a halogen atom, an alkyl group, a cycloalkyl group, a cyano group, an alkoxy group, an acyloxy group, an acylamino group, an aminocarbonyl amino group, an alkoxycarbonylamino group, an alkyl and arylsulfonylamino group, an alkylthio group, a sulfamoyl group, an alkyl and arylsulfonyl group, an alkoxycarboxyl group or a carbamoyl group.

When $R_1$ to $R_{13}$ do not contain an alcoholic hydroxyl group, examples of $R_1$ to $R_{13}$ may include particularly preferably a hydrogen atom, an alkyl group, a cycloalkyl group, a halogen atom or an alkoxy group.

Adjacent two groups of $R_1$ to $R_{13}$ may combine with each other to form a ring structure. In the ring structure, an aromatic and non-aromatic hydrocarbon ring and heterocyclic ring is included. These ring structures may be further combined to form a condensed ring.

In the (ZI-4) group, preferably at least one of $R_1$ to $R_{13}$ may have a structure containing an alcoholic hydroxyl group, and more preferably at least one of $R_9$ to $R_{13}$ may have a structure containing an alcoholic hydroxyl group.

Z represents a single bond or a divalent linking group as described above. Examples of the divalent linking group may include an alkylene group, an arylene group, a carbonyl group, a sulfonyl group, a carbonyloxy group, a carbonyl amino group, a sulfonyl amide group, an ether bond, a thioether bond, an amino group, a disulfide group, an acyl group, an alkylsulfonyl group, —CH═CH—, an aminocarbonylamino group and aminosulfonylamino group.

This divalent linking group may have a substituent. Examples of these substituents may include the same as the examples previously exemplified as $R_1$ to $R_{13}$.

Z is preferably, a single bond, an ether bond or a thioether bond, and is particularly preferably a single bond.

Subsequently, Formula (ZII) will be described.

In Formula (ZII), each of $R_{204}$ and $R_{205}$ independently represents an aryl group, an alkyl group or a cycloalkyl group.

Specific examples of the aryl group, an alkyl group, a cycloalkyl group of $R_{204}$ and $R_{205}$ and the preferred embodiment thereof are the same as those described as for $R_{201}$ to $R_{203}$ in the previously described compound (ZI-1).

An aryl group, an alkyl group, or a cycloalkyl group of $R_{204}$ and $R_{205}$ may have a substituent. Examples of such a substituent are the same as those described as for $R_{201}$ to $R_{203}$ in the previously described compound (ZI-1).

$Z^-$ represents an acid anion which is generated by decomposing upon irradiation with an actinic ray or radiation, a non-nucleophilic anion is preferred, and examples of the group are the same as the examples of $Z^-$ in Formula (ZI).

The preferred examples of A include a group represented by the following Formula (ZCI) or (ZCII).

ZCI

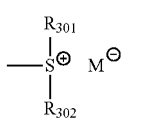

ZCII

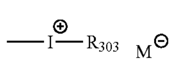

In Formulas (ZCI) and (ZCII),

Each of $R_{301}$ and $R_{302}$ independently represents an organic group. The organic group has generally 1 to 30 carbon atoms, and preferably 1 to 20 carbon atoms. $R_{301}$ and $R_{302}$ may combine with each other to form a ring structure. This ring structure may contain at least one of an oxygen atom, a sulfur atom, an ester bond, an amide bond and carbonyl group in the ring. Examples of the group that $R_{301}$ and $R_{302}$ may combine with each other to form may include an alkylene group such as a butylene group and a pentylene group.

Examples of the organic group of $R_{301}$ and $R_{302}$ may include examples exemplified of an aryl group, an alkyl group and a cycloalkyl group of $R_{201}$ to $R_{203}$ in Formula (ZI).

M represents an atomic group which forms an acid by adding a proton. Examples thereof may include, more specifically, a structure represented by any one of the following Formula AN1 to AN3. Among these, a structure represented by Formula AN1 is particularly preferred.

$R_{303}$ represents an organic group. The organic group as $R_{303}$ has generally 1 to 30 carbon atoms, and preferably 1 to 20 carbon atoms. Specific examples of the organic group as $R_{303}$ may include an aryl group, an alkyl group, a cycloalkyl group exemplified as specific examples of $R_{204}$, $R_{205}$ in Formula (ZII).

In addition, examples of the structural moiety that generates an acid upon irradiation with an actinic ray or radiation may include the structural moiety consisting of a sulfonic acid precursor that the following photoacid-generating agent has. Such a photoacid-generating agent includes, for example, examples of the following (1) to (3) compounds.

(1) M. TUNOOKA et al., Polymer Preprints Japan, 35(8); G. Berner et al., J. Rad. Curing, 13(4); W. J. Mijs et al., Coating Technol., 55(697), 45(1983); H. Adachi et al., Polymer Preprints, Japan, 37(3); Compounds that generate a sulfonic acid by photodecomposing, which are represented by an iminosulfonate and the like described in Europe Patent Nos. 0199,672, 84515, 199,672, 044,115 and 0101,122, and U.S. Pat. Nos. 618,564, 4,371,605, 4,431,774, and Japanese Patent Application Laid-Open Nos. S64-18143, H2-245756 and H4-365048.

(2) Disulfone compound described in Japanese Patent Application Laid-Open No. S61-166544.

(3) V. N. R. Pillai, Synthesis, (1), 1(1980); A. Abad et al, Tetrahedron Lett., (47)4555(1971); D. H. R. Barton et al., J. Chem. Soc., (C), 329(1970); Compound that generates an acid by light described in U.S. Pat. No. 3,779,778; and Europe Patent Nos. 126,712 and the like.

The repeating unit (B) may preferably have a structural moiety that is converted to an acid anion upon irradiation with an actinic ray or radiation. For example, A in Formulas (B1) to (B3) is a structural moiety that is converted to an acid anion upon irradiation with an actinic ray or radiation.

That is, the repeating unit (B) has more preferably a structure that generates an acid anion on the side chain of the resin upon irradiation with an actinic ray or radiation. When such a structure is employed, an acid anion generated is suppressed from diffusing, and thus resolution and roughness performance will be enhanced.

Each of a moiety-X1-A in Formula (B1), a moiety-X2-A in Formula (B2) and a moiety-X3-A in Formula (B3) may preferably be one represented by any one of the following Formula (L1), (L2) and (L3).

$$—X_{11}\text{-}L_{11}\text{-}X_{12}—Ar_1\text{-}X_{13}\text{-}L_{12}\text{-}Z_1 \quad \text{(L1)}$$

$$—Ar_2\text{-}X_{21}\text{-}L_{21}\text{-}X_{22}\text{-}L_{22}\text{-}Z_2 \quad \text{(L2)}$$

$$—X_{31}\text{-}L_{31}\text{-}X_{32}\text{-}L_{32}\text{-}Z_3 \quad \text{(L3)}$$

First, the moiety represented by Formula (L1) will be described.

$X_{11}$ represents —O—, —S—, —CO—, —$SO_2$—, —NR— (R is a hydrogen atom or an alkyl group), a divalent nitrogen-containing non-aromatic heterocyclic ring group or a combination thereof.

Each of $X_{12}$ and $X_{13}$ independently represents a single bond, —O—, —S—, —CO—, —$SO_2$—, —NR— (R is a hydrogen atom or an alkyl group), a divalent nitrogen-containing non-aromatic heterocyclic ring group or a combination thereof.

An alkyl group of R may be a straight or branched group. In addition, an alkyl group of R may further have a substituent. Such an alkyl group is a group preferably having 20 or less carbon atoms, more preferably having 8 or less carbon atoms, and still more preferably having 3 or less carbon atoms. Examples of such an alkyl group may include a methyl group, an ethyl group, a propyl group, an isopropyl group. As for R, a hydrogen atom, a methyl group or an ethyl group is particularly preferred.

In addition, a divalent nitrogen-containing non-aromatic heterocyclic ring group preferably means a 3- to 8-membered non-aromatic heterocyclic ring group having at least one nitrogen atom.

$X_{11}$ is more preferably —O—, —CO—, —NR— (R is a hydrogen atom or an alkyl group), or a combination thereof, and particularly preferably —COO— or —CONR— (R is a hydrogen atom or an alkyl group).

$L_{11}$ represents an alkylene group, alkylene group, a divalent aliphatic hydrocarbon ring group, or a combination of two or more of them. In the above-described combined group, the two or more groups combined may be same or different. In addition, these groups may be linked through O—, —S—, —CO—, —$SO_2$—, —NR— (R is a hydrogen atom or an alkyl group), a divalent nitrogen-containing non-aromatic heterocyclic ring group, a divalent aromatic ring group, or a combination thereof.

The alkylene group of $L_{11}$ may be a straight or branched group. Such an alkylene group is a group preferably having 1 to 8 carbon atoms, more preferably having 1 to 6 carbon atoms, and still more preferably having 1 to 4 carbon atoms.

Examples of the alkylene group of $L_{11}$ may include a group having a double bond at an arbitrary position in the above-described alkylene group.

The divalent aliphatic hydrocarbon ring group as $L_{11}$ may be a monocyclic or polycyclic group. Such a divalent aliphatic hydrocarbon ring group is a group preferably having 5 to 12 carbon atoms, and more preferably having 6 to 10 carbon atoms.

The divalent aromatic ring group as a linking group may be an arylene group or a heteroarylene group. This aromatic ring group may preferably have 6 to 14 carbon atoms. This aromatic ring group may have a substituent.

In addition, examples of —NR— and the divalent nitrogen-containing non-aromatic heterocyclic ring group as a linking group are the same as those in $X_{11}$ as described above, respectively.

$L_{11}$ is preferably an alkylene group, a divalent aliphatic hydrocarbon ring group, or a group formed by combining an alkylene group and a divalent aliphatic hydrocarbon ring group through —OCO—, —O— or —CONH— (for example, -an alkylene group-O-an alkylene group-, -an alkylene group-OCO-an alkylene group- or -a divalent aliphatic hydrocarbon ring group-O-an alkylene group-, -an alkylene group-CONH-an alkylene group-).

Examples of —NR— and a divalent nitrogen-containing non-aromatic heterocyclic ring group in $X_{12}$ and $X_{13}$ include specific examples of $X_{11}$ as described above, and the preferred examples thereof are also the same.

As $X_{12}$, a single bond, —S—, —O—, —CO—, —$SO_2$—, or a combination thereof is more preferred, and a single bond, —S—, —OCO— or —$OSO_2$— is particularly preferred.

As $X_{13}$, —O—, —CO—, —$SO_2$—, or a combination thereof is more preferred, and —$OSO_2$— is particularly preferred.

$Ar_1$ represents a divalent aromatic ring group. A divalent aromatic ring group may be an arylene group or a heteroarylene group. This divalent aromatic ring group may further have a substituent. Examples of the substituent may include an alkyl group, an alkoxy group and an aryl group.

$Ar_1$ is more preferably an arylene group having 6 to 18 carbon atoms that may have a substituent, or an aralkylene group formed by combining an arylene group having 6 to 18 carbon atoms and an alkylene group having 1 to 4 carbon atoms, and particularly preferably a phenylene group, a naphthylene group, a biphenylene group, or a phenylene group substituted with a phenyl group.

$L_{12}$ represents an alkylene group, alkylene group, a divalent aliphatic hydrocarbon ring group, a divalent aromatic ring group, or a group formed by combining two or more of them, and these groups are groups in which some or all of hydrogen atoms are substituted with a substituent selected from a fluorine atom, a fluorinated alkyl group, a nitro group, and a cyano group. In the above-described combined group, two or more combined groups may be same or different. In addition, these groups may be linked together through —O—, —S—, —CO—, —$SO_2$—, —NR— (R is a hydrogen atom or an alkyl group), a divalent nitrogen-containing non-aromatic heterocyclic ring group, a divalent aromatic ring group, or a combination thereof.

$L_{12}$ is more preferably an alkylene group in which some or all of hydrogen atoms are substituted with a fluorine atom or a fluorinated alkyl group (still more preferably a perfluoro alkyl group), a divalent aromatic ring group, or a combination thereof, and particularly preferably an alkylene group or a divalent aromatic ring group in which some or all of hydrogen atoms are substituted with a fluorine atom. $L_{12}$ is particularly preferably an alkylene group or a divalent aromatic ring group in which 30 to 100% of the number of hydrogen atom is substituted with a fluorine atom.

An alkylene group of $L_{12}$ may be a straight or branched group. Such an alkylene group may preferably have 1 to 6 carbon atoms, and more preferably 1 to 4 carbon atoms.

Examples of the alkylene group of $L_{12}$ may include a group having a double bond at an arbitrary position of the above-described alkylene group.

A divalent aliphatic hydrocarbon ring group of $L_{12}$ may be a monocyclic or polycyclic group. Such a divalent aliphatic hydrocarbon ring group may preferably have 3 to 17 carbon atoms.

Examples of the divalent aromatic ring group of $L_{12}$ are to the same as those previously described as a linking group in $L_{11}$.

In addition, examples of —NR— and a divalent nitrogen-containing non-aromatic heterocyclic ring group of a linking group in $L_{12}$ may include specific examples of each in $X_{11}$ as described above, and are the same as the preferred examples thereof $Z_1$ represents a moiety consisting of a sulfonic acid group upon irradiation with an actinic ray or radiation, and examples thereof specifically may include a structure represented by Formula (ZI).

Next, the portion represented by Formula (L2) will be described.

$Ar_2$ represents a divalent aromatic ring group. A divalent aromatic ring group may be an arylene group or a heteroarylene group. Such a divalent aromatic ring group is preferably a group having 6 to 18 carbon atoms. Such a divalent aromatic ring group may further have a substituent.

$X_{21}$ represents —O—, —S—, —CO—, —NR— (R is a hydrogen atom or an alkyl group), a divalent nitrogen-containing non-aromatic heterocyclic ring group, or a combination thereof.

Examples of —NR— and the divalent nitrogen-containing non-aromatic heterocyclic ring group in $X_{21}$ are the same as, for example, those previously described as for $X_{11}$.

$X_{21}$ is more preferably —O—, —S—, —CO—, —$SO_2$—, or, a combination thereof, and particularly preferably —O—, —OCO— or —$OSO_2$—.

$X_{22}$ represents a single bond, —O—, —S—, —CO—, —$SO_2$—, —NR— (R is a hydrogen atom or an alkyl group), a divalent nitrogen-containing non-aromatic heterocyclic ring group, or a combination thereof. Examples of —NR— and the divalent nitrogen-containing non-aromatic heterocyclic ring group in $X_{22}$ are the same as, for example, those previously described as for $X_{11}$.

$X_{22}$ is more preferably —O—, —S—, —CO—, —$SO_2$—, or a combination thereof, and particularly preferably, —O—, —OCO— or —$OSO_2$—.

$L_{21}$ represents a single bond, an alkylene group, alkylene group, a divalent aliphatic hydrocarbon ring group, a divalent aromatic ring group, or a group formed by combining two or more of them. In the above-described combined group, two or more combined groups may be same or different. In addition, these groups may be linked together through —O—, —S—, —CO—, —$SO_2$—, —NR— (R is a hydrogen atom or an alkyl group), a divalent nitrogen-containing non-aromatic heterocyclic ring group, a divalent aromatic ring group, or a combination thereof.

Examples of the alkylene group, the alkylene group and the divalent aliphatic hydrocarbon ring group of $L_{21}$ are the same as, for example, those previously described as for each in $L_{11}$.

A divalent aromatic ring group of $L_{21}$ may be an arylene group or a heteroarylene group. Such a divalent aromatic ring group may preferably have 6 to 14 carbon atoms.

Examples of —NR— and the divalent nitrogen-containing non-aromatic heterocyclic ring group in $L_{21}$ are the same as, for example, those previously described as for $X_{11}$.

$L_{21}$ is particularly preferably a single bond, an alkylene group, a divalent aliphatic hydrocarbon ring group, a divalent aromatic ring group, a group formed by combining two or more of them (for example, -an alkylene group-a divalent aromatic ring group- or -a divalent aliphatic hydrocarbon ring group-an alkylene group-), or a group formed by combining two or more of them through a linking group such as —OCO—, —COO—, —O— and —S— (for example, -an alkylene group-OCO-a divalent aromatic ring group-, -an alkylene group-S-a divalent aromatic ring group-, or -an alkylene group-O-an alkylene group-a divalent aromatic ring group-).

$L_{22}$ represents an alkylene group, alkylene group, a divalent aliphatic hydrocarbon ring group, a divalent aromatic ring group, or a group formed by combining two or more of them, and these groups may be a group in which some or all of hydrogen atoms are substituted with a substituent selected from a fluorine atom, a fluorinated alkyl group, a nitro group, and a cyano group. In the above-described combined group, two or more groups combined may be same or different. In addition, these groups may be linked together through —O—, S—, —CO—, —$SO_2$—, —NR— (R is a hydrogen atom or an alkyl group), a divalent nitrogen-containing non-aromatic heterocyclic ring group, a divalent aromatic ring group, or a combination thereof.

$L_{22}$ is more preferably an alkylene group or a divalent aromatic ring group in which some or all of hydrogen atoms are substituted with a fluorine atom or a fluorinated alkyl group (still more preferably a perfluoro alkyl group), or a combination thereof, and particularly preferably an alkylene group or a divalent aromatic ring group in which some or all of hydrogen atoms are substituted with a fluorine atom.

Specific examples of the alkylene group, the alkylene group, the aliphatic hydrocarbon ring group, the divalent aromatic ring group represented by $L_{22}$ and the group formed by combining two or more of them include specific examples previously exemplified as $L_{12}$ in Formula (L1).

In addition, examples of —NR— and a divalent nitrogen-containing non-aromatic heterocyclic ring group of a linking group $L_{22}$ include specific examples as each in the above-described $X_{11}$, and are the same as the preferred examples thereof.

$Z_2$ represents a moiety consisting of a sulfonic acid group upon irradiation with an actinic ray or radiation. Specific examples of $Z_2$ include the same as those previously described as for $Z_1$.

Subsequently, the portion represented by Formula (L3) will be described.

Each of $X_{31}$ and $X_{32}$ independently represents a single bond, —O—, —S—, —CO—, —$SO_2$—, —NR— (R is a hydrogen atom or an alkyl group), a divalent nitrogen-containing a non-aromatic heterocyclic ring group, or a combination thereof Examples of —NR— and a divalent nitrogen-containing non-aromatic heterocyclic ring group in each of $X_{31}$ and $X_{32}$ may include the same as those previously described as for $X_{11}$.

$X_{31}$ is more preferably a single bond, —O—, —CO—, —NR— (R is a hydrogen atom or an alkyl group), or a combination thereof, and particularly preferably, a single bond, —COO— or —CONR— (R is a hydrogen atom or an alkyl group).

$X_{32}$ is more preferably —O—, —S—, —CO—, —$SO_2$—, a divalent nitrogen-containing non-aromatic heterocyclic ring group, or a combination thereof, and particularly preferably, —O—, —OCO— or —$OSO_2$—.

$L_{31}$ represents a single bond, an alkylene group, alkylene group, a divalent aliphatic hydrocarbon ring group, a divalent aromatic ring group, or a group formed by combining two or more of them. In the above-described combined group, two or more combined groups may be same or different. In addition, these groups may be linked together through —O—, —S—, —CO—, —$SO_2$—, —NR— (R is a hydrogen atom or an alkyl group), a divalent nitrogen-containing non-aromatic heterocyclic ring group, a divalent aromatic ring group, or a combination thereof.

Examples of the alkylene group, alkylene group, a divalent aliphatic hydrocarbon ring group, and a divalent aromatic ring group of $L_{31}$ may include the same as those previously described as for $L_{21}$.

In addition, examples of —NR— and the divalent nitrogen-containing non-aromatic heterocyclic ring group of a linking group in $L_{31}$ may include specific examples as each in the above-described $X_{11}$, and are the same as the preferred examples thereof.

$L_{32}$ represents an alkylene group, alkylene group, a divalent aliphatic hydrocarbon ring group, a divalent aromatic ring group or a group formed by combining two or more of them. In the above-described combined group, two or more combined groups may be same or different. In addition, these groups may be linked together through —O—, —S—, —CO—, —$SO_2$—, —NR— (R is a hydrogen atom or an alkyl group), a divalent nitrogen-containing non-aromatic heterocyclic ring group, a divalent aromatic ring group, or a combination thereof.

The alkylene group, the alkylene group, the divalent aliphatic hydrocarbon ring group, the divalent aromatic ring group of $L_{32}$, or a group formed by combining two or more of them, may preferably be a group in which some or all of hydrogen atoms are substituted with a substituent selected from a fluorine atom, a fluorinated alkyl group, a nitro group and a cyano group.

$L_{32}$ is more preferably an alkylene group, a divalent aromatic ring group, or a combination thereof in which some or all of hydrogen atoms are substituted with a fluorine atom or a fluorinated alkyl group (still more preferably a perfluoro alkyl group), and particularly preferably an alkylene group or a divalent aromatic ring group in which some or all of hydrogen atoms are substituted with a fluorine atom.

Examples of the alkylene group, the alkylene group, the divalent aliphatic hydrocarbon ring group, the divalent aromatic ring group of $L_{32}$, and a group formed by combining two or more of them may include the same as those previously described as for $L_{12}$. Examples of —NR— and a divalent nitrogen-containing non-aromatic heterocyclic ring group of a linking group in $L_{32}$ include specific examples as each in the above-described $X_{11}$, and are the same as the preferred examples thereof.

In addition, when $X_3$ is a single bond and also $L_{31}$ is an aromatic ring group, if $R_{32}$ forms a ring with an aromatic ring group of $L_{31}$, an alkylene group represented by $R_{32}$ may preferably have 1 to 8 carbon atoms, more preferably of 1 to 4 carbon atoms, and still more preferably 1 to 2 carbon atoms.

$Z_3$ represents an onium salt consisting of an imide acid group or a methide acid group upon irradiation with an actinic ray or radiation. An onium salt represented by $Z_3$ is preferably a sulfonium salt or an iodonium salt, and preferably a structure represented by the following Formula (ZIII) or (ZIV).

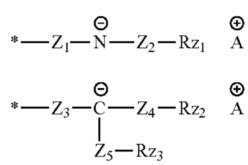

(ZIII)

(ZIV)

In Formulas (ZIII) and (ZIV), each of $Z_1$, $Z_2$, $Z_3$, $Z_4$ and $Z_5$ independently represents —CO— or —$SO_2$—, and still more preferably —$SO_2$—.

Each of $Rz_1$, $Rz_2$ and $Rz_3$ independently represents an alkyl group, monovalent aliphatic hydrocarbon ring group, an aryl group, or an aralkyl group. An embodiment of the group in which some or all of hydrogen atoms are substituted with a fluorine atom or a fluoroalkyl group (still more preferably a perfluoroalkyl group) is more preferred.

An alkyl group of $Rz_1$, $Rz_2$ and $Rz_3$ may be a straight or branched group. Such an alkyl group may preferably have 1 to 8 carbon atoms, more preferably 1 to 6 carbon atoms and still more preferably 1 to 4 carbon atoms.

A monovalent aliphatic hydrocarbon ring group of $Rz_1$, $Rz_2$ and $Rz_3$ may preferably have 3 to 10 carbon atoms, and more preferably 3 to 6 carbon atoms.

An aryl group of $Rz_1$, $Rz_2$ and $Rz_3$ may preferably have 6 to 18 carbon atoms, and an aryl group having 6 to 10 carbon atoms is more preferred. Such an aryl group is particularly preferably a phenyl group.

The preferred examples of the aralkyl group of $Rz_1$, $Rz_2$ and $Rz_3$ include a group formed by combining an alkylene group having 1 to 8 carbon atoms and the above-described aryl group. An aralkyl group formed by combining an alkylene group having 1 to 6 carbon atoms and the aryl group is more preferred, and an aralkyl group formed by combining an alkylene group having 1 to 4 carbon atoms and the aryl group is particularly preferred.

$A^+$ represents a sulfonium cation or and iodonium cation. The preferred examples of $A^+$ may include a sulfonium cation in Formula (ZI) or an iodonium cation structure in Formula (ZII).

Hereinafter, specific examples of the repeating unit (B) will be described, but the range of the present invention is not limited thereto.

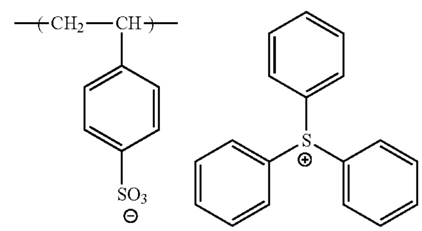

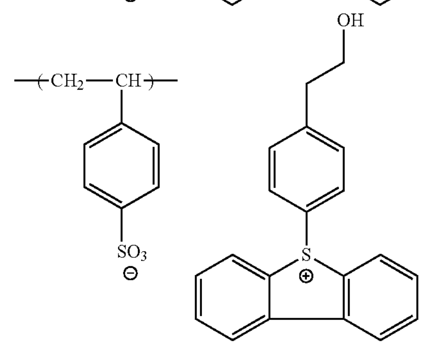

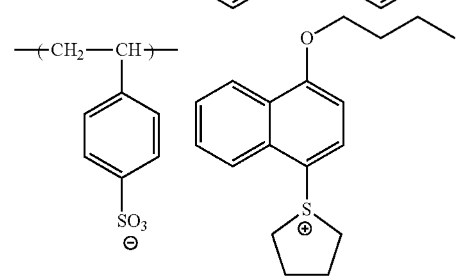

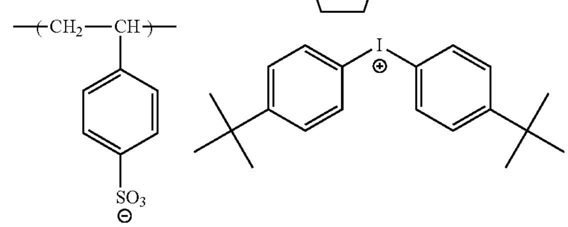

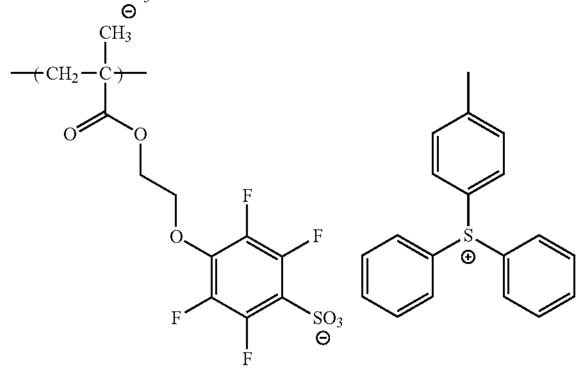

-continued
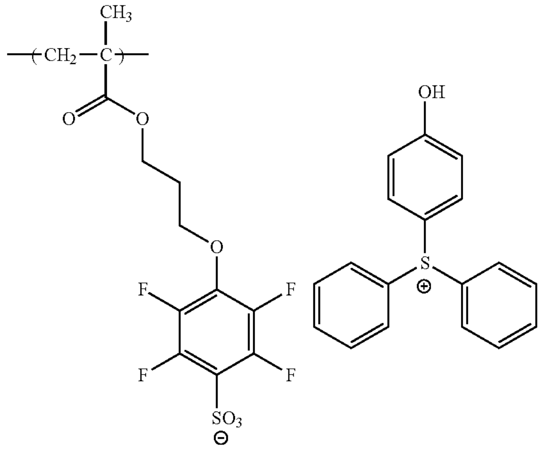
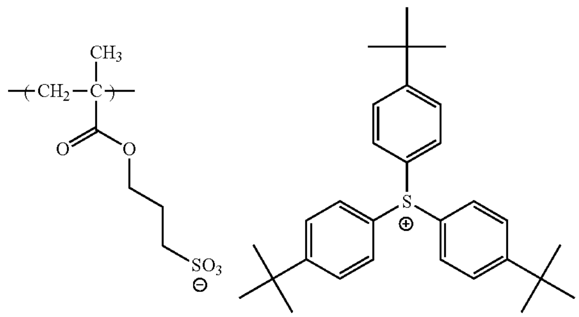
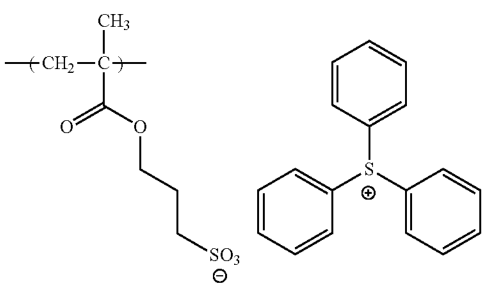
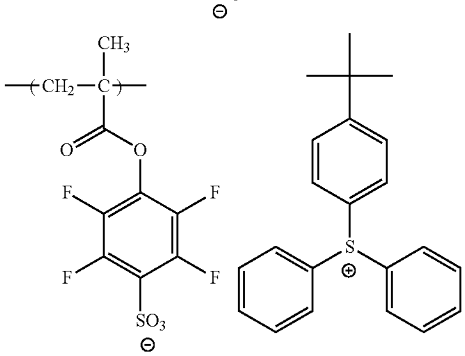
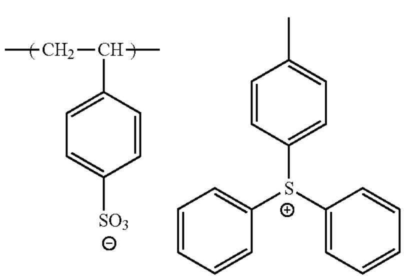
-continued
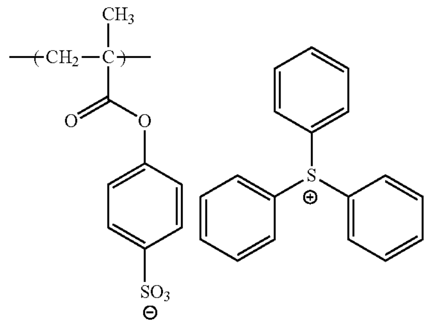
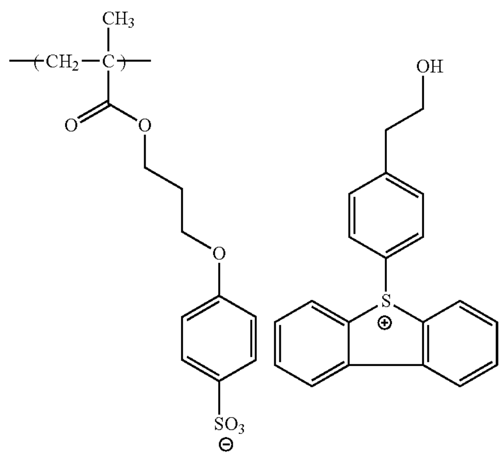
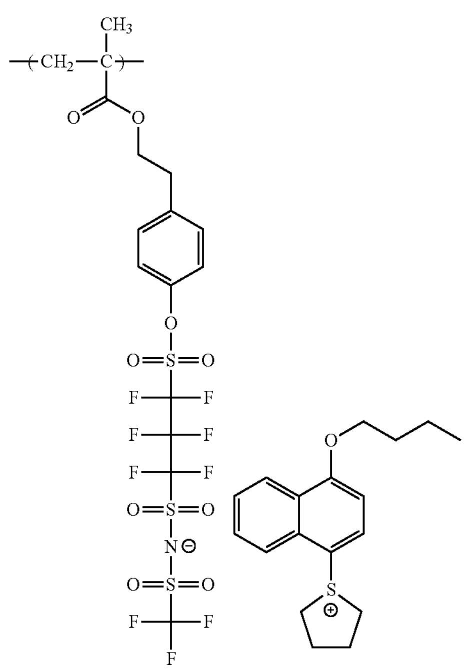

-continued
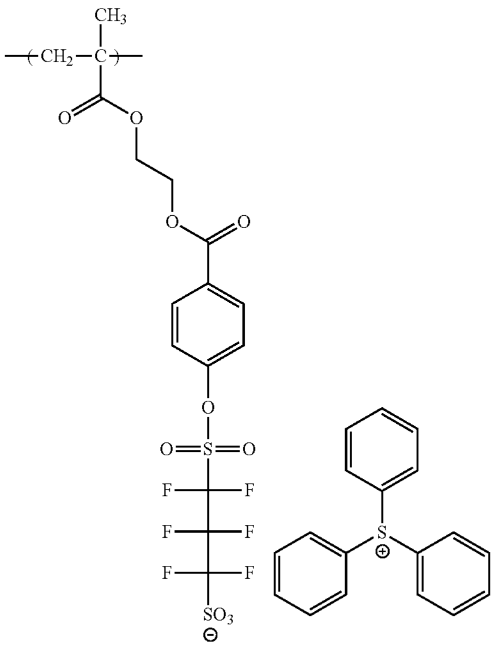
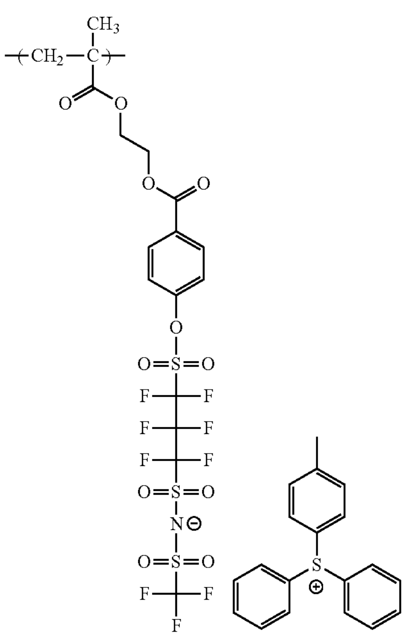
-continued
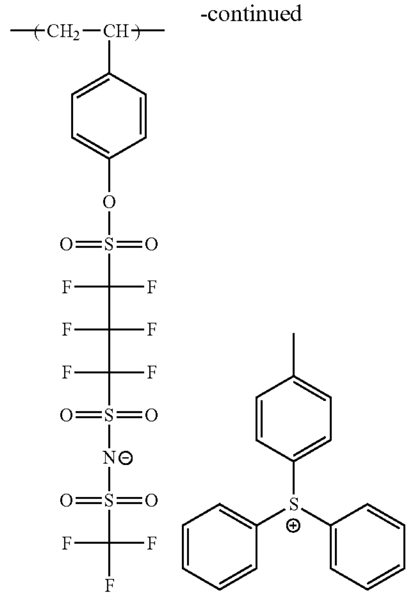
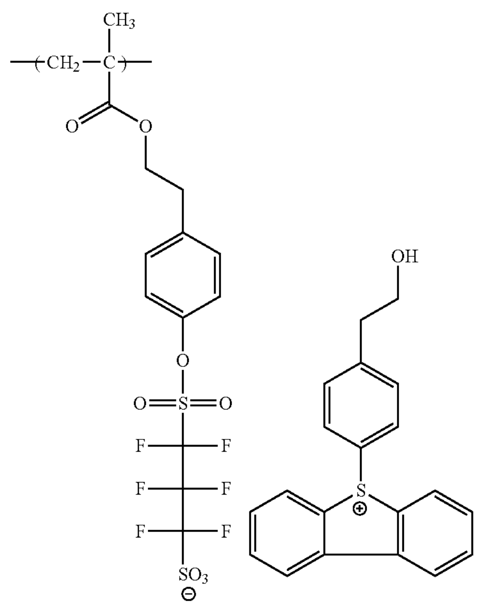
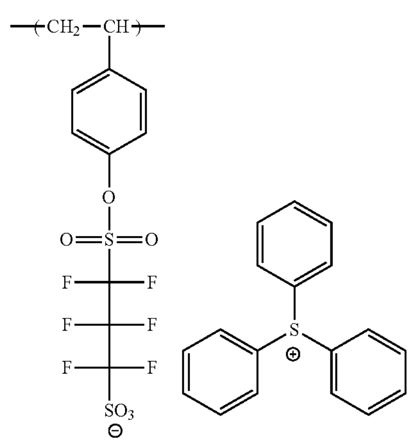

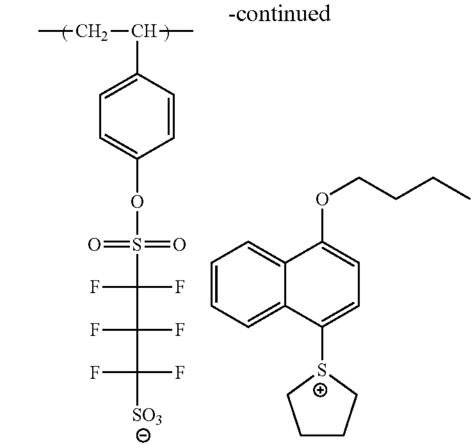
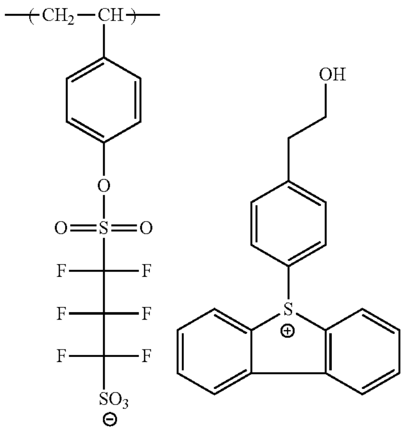
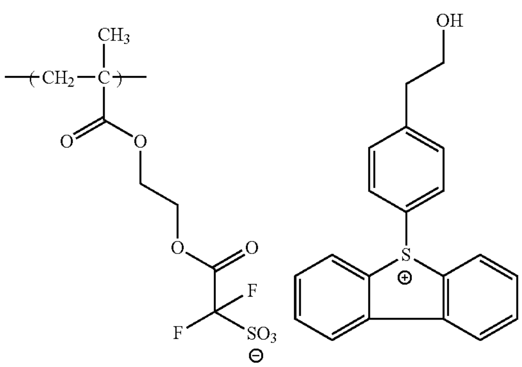
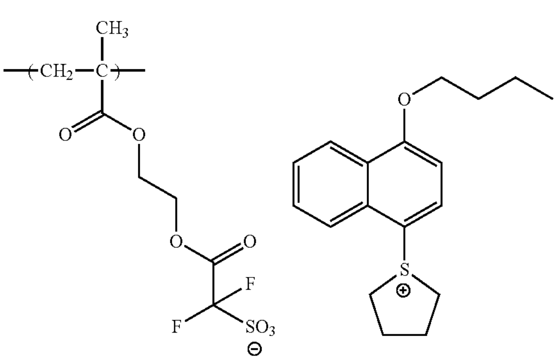
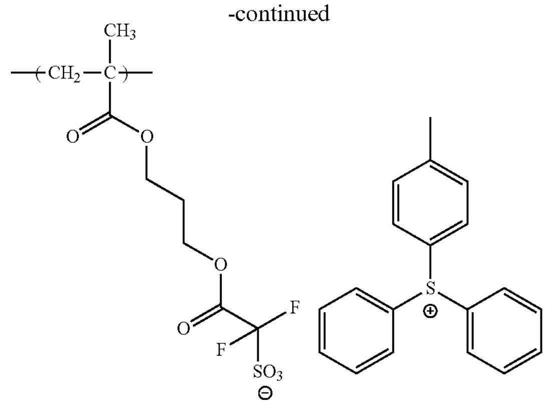
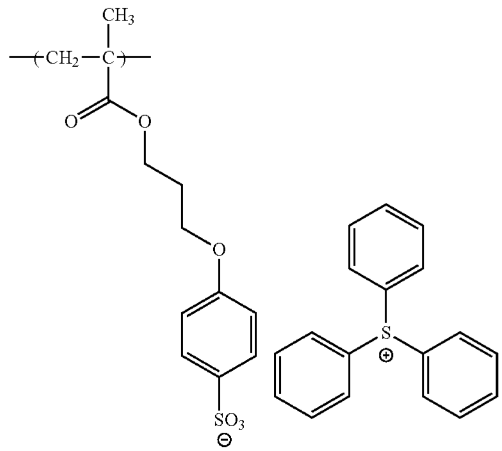
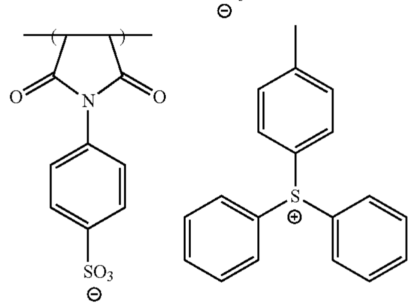
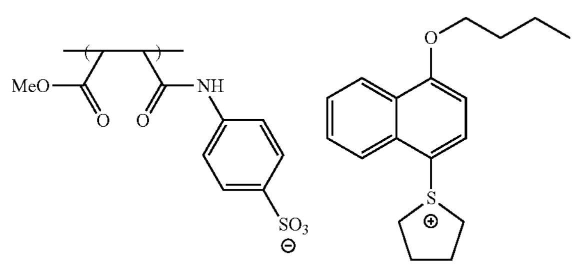
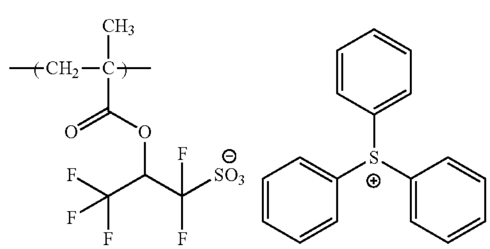

-continued
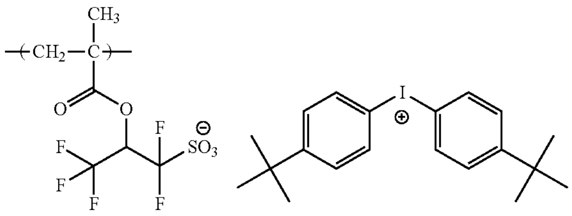
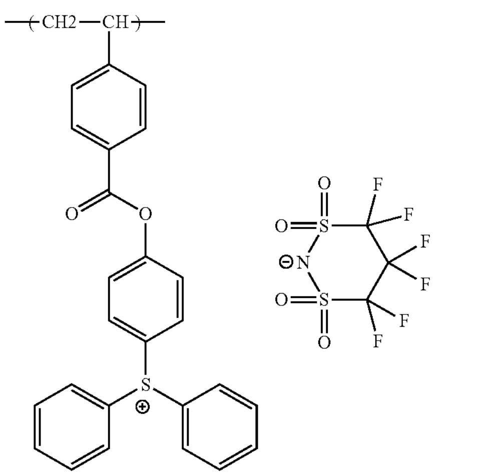
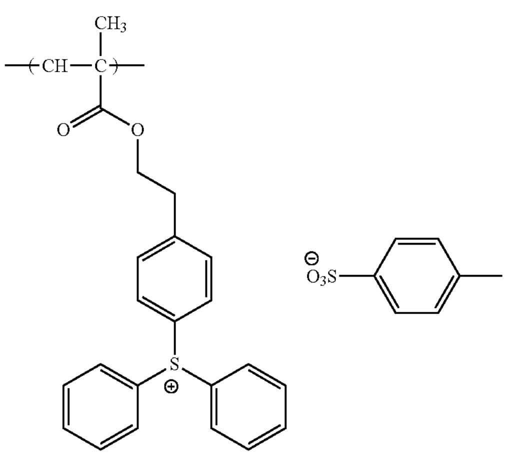
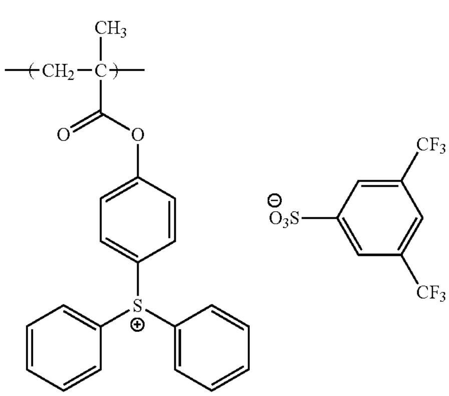
-continued
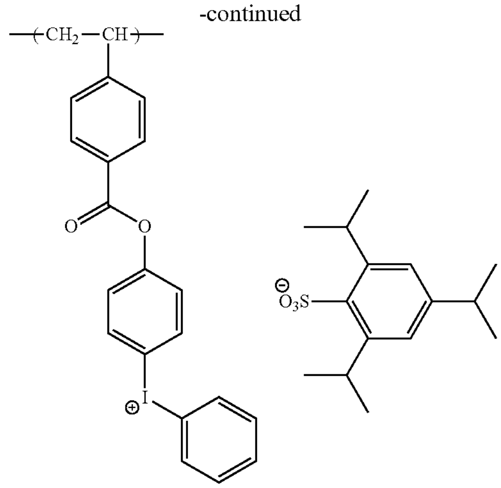
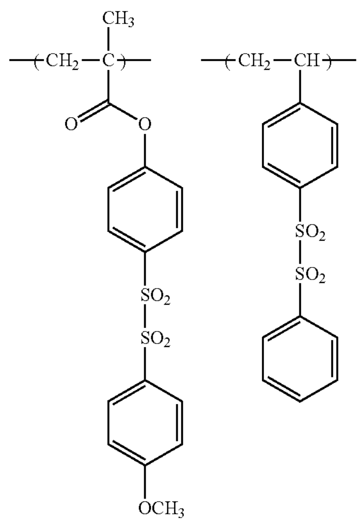
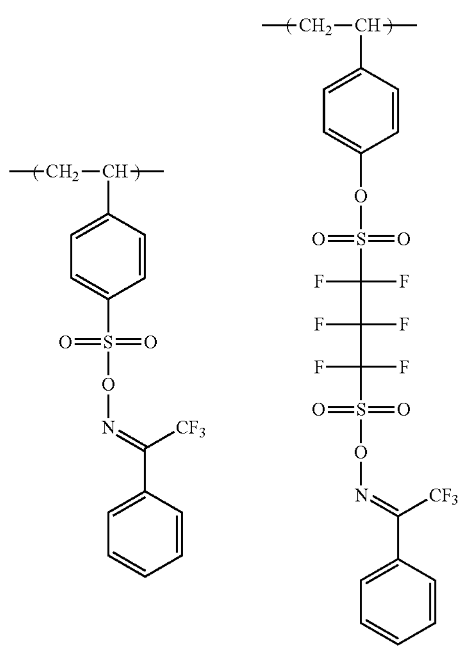

-continued

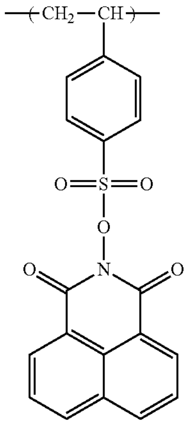

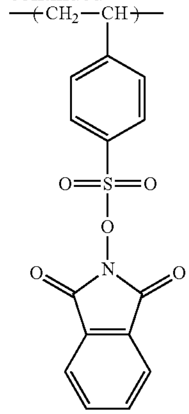

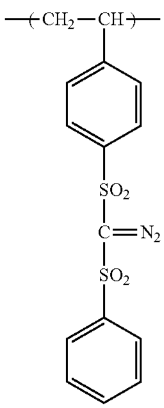

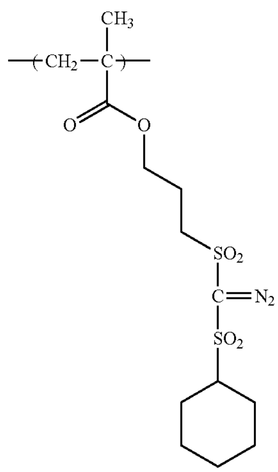

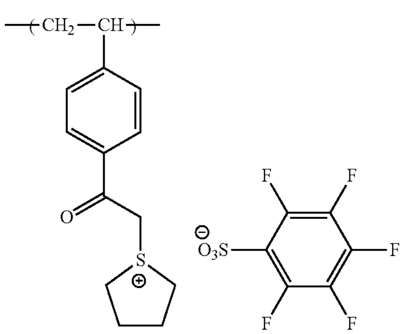

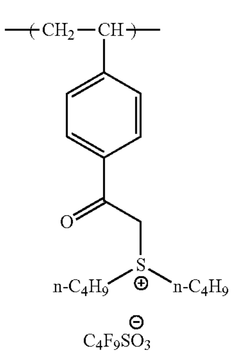

-continued

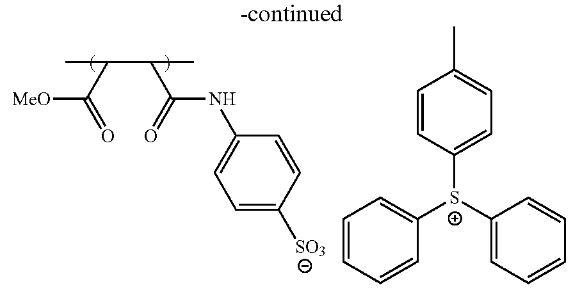

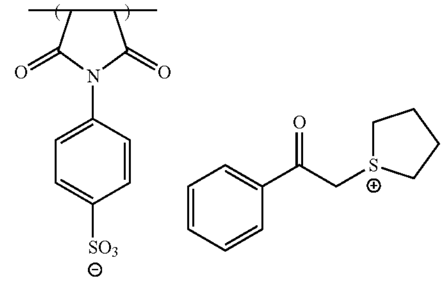

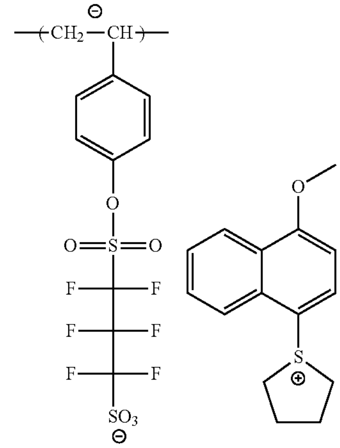

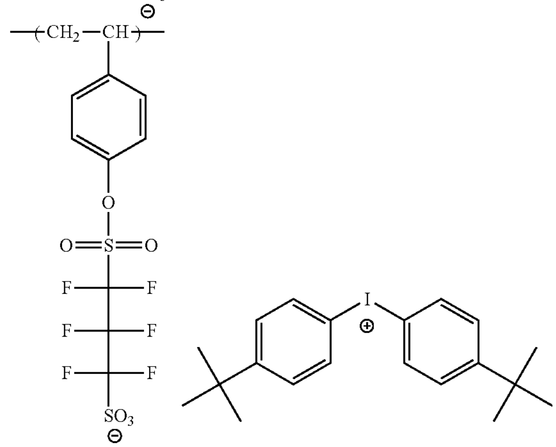

When the resin (Ab) contains the repeating unit (B), the content of the repeating unit (B) in the resin (Ab) is preferably 0.1 to 80 mol %, more preferably 0.5 to 60 mol %, and still more preferably 1 to 40 mol % based on the total repeating units in the resin (Ab).

The resin (Ab) may have a repeating unit having a hydroxyl group or a cyano group, and as for specific examples of the repeating unit having the above-described hydroxyl or cyano group, reference may be made to the description in [0161] of Japanese Patent Application Laid-Open No. 2012-208447, and the content of which is incorporated in the present specification.

The weight average molecular weight (Mw) of the resin (Ab) is preferably in the range of 1,000 to 200,000, respectively. The dissolution rate of the resin itself in an alkali is preferably 200,000 or less in terms of sensitivity. Polydispersity (Mw/Mn) is preferably 1.0 to 3.0, more preferably 1.0 to 2.5, and particularly preferably, is 1.0 to 2.0.

Among them, the weight average molecular weight (Mw) of the resin is preferably in the range of 1,000 to 200,000, more preferably in the range of 1,000 to 100,000, particularly preferably in the range of 1,000 to 50,000, and most preferably in the range of 1,000 to 25,000.

Here, the weight average molecular weight is defined as polystyrene conversion value by gel permeation chromatography. Specifically, the weight average molecular weight (Mw) and the number average molecular weight(Mn) of resin (Ab) are obtained by using HLC-8120 (Manufactured by Toso Co. Ltd.), TSK gel Multipore HXL-M (Manufactured by Toso Co. Ltd., 7.8 mmID×30.0 cm) as a column, and THF (tetrahydrofuran) as an eluent.

The resin (Ab) having polydispersity of 2.0 or less may be synthesized by performing radical polymerization through using the azo-based polymerization initiator. The resin (Ab) having the more preferred polydispersity of 1.0 to 1.5 may be synthesized by, for example, living radical polymerization.

The resin (Ab) may preferably be polymerized by the known anion polymerization method or the polymerization method.

An anion polymerization method is generally performed by using an alkali metal or an organic alkali metal as a polymerization initiator under an inert gas atmosphere such as a nitrogen, an argon and the like in an organic solvent at the temperature of −100 to 90° C. Moreover, in the copolymerization, block copolymers can be obtained by adding sequentially monomers to the reactor to polymerize them, and also random copolymers may be obtained by adding a mixture of respective monomers to the reactor polymerize them.

Examples of the alkali metal of the above-described polymerization initiator may include lithium, sodium, calcium, cesium and the like, and as an organic alkali metal, alkylate, allylate and arylate of the above-described alkali metal may be used. Specifically, examples thereof may include an ethyllithium, an n-butyllithium, a sec-butyllithium, a tert-butyllithium, an ethylsodium, a lithiumbiphenyl, a lithiumnaphthalene, a lithiumtriphenyl, a sodiumnaphthalene, a α-methylstyrenesodium dianion, a 1,1-diphenylhexyllithium, a 1,1-diphenyl-3-methylpentyllithium and the like.

The radical polymerization method is performed by using an azo compound such as azobisisobutyronitrile, an azobisisovaleronitrile and the like, and an organic oxide such as a benzoyl peroxide, methylethylketoneperoxide, a cumenehydroperoxide and the like as the known radical polymerization initiator, and if necessary, in combination of the known chain transfer agent such as a 1-dodecanethiol, at the temperature of 50 to 200° C. under an inert gas atmosphere such as a nitrogen, an argon and the like in an organic solvent.

Examples of the organic solvent may include an organic solvent which is generally used for anion polymerization such as aliphatic hydrocarbons such as an n-hexane, an n-heptane and the like, alicyclic hydrocarbons such as cyclohexane, cyclopentane and the like, aromatic hydrocarbons such as benzene, toluene and the like, ketones such as methylethylketone, cyclohexanone and the like, polyhydric alcohol derivatives such as propylene glycol monomethylether acetate, propyleneglycol monomethylether, ethylene glycolmonobutylether acetate, ethylene glycolmonobutylether, ethylene glycolmonoethylether acetate, ethylene glycolmonoethylether, propyleneglycol monoethylether acetate, propyleneglycol monoethylether and the like, ethers such as diethylether, tetrahydrofuran, dioxane and the like, anisole, hexamethyl phosphoramide and the like. These solvents are used alone or as a mixed solvent of two kinds or more. Examples of the more preferred solvents may include propyleneglycol monomethylether acetate, propyleneglycol monomethylether and cyclohexanone.

The resin (Ab) may also preferably have the repeating unit having at least one kind group selected from a lactone group, a hydroxyl group, a cyano group and an alkali-soluble group.

The repeating unit having a lactone group which may be contained in the resin (Ab) will be described.

As a lactone group, any group may be used as long as the group has a lactone structure, but a lactone structure having a 5- to 7-membered ring is preferred, and a group in which another ring structure is condensed to a lactone structure having a 5- to 7-membered ring in the form of forming a bicyclo structure or a spiro structure is preferred. It is more preferred that the group has a repeating unit having a lactone structure represented by any one of the following Formulas (LC1-1) to (LC1-16). Further, the lactone structure may be bonded directly to the main chain.

Examples of the preferred lactone structure include (LC1-1), (LC1-4), (LC1-5), (LC1-6), (LC1-13) and (LC1-14), and line edge roughness and development defect are improved by using a specific lactone structure.

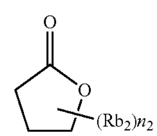

LC1-1

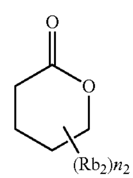

LC1-2

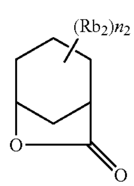

LC1-3

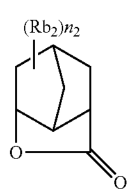

LC1-4

-continued

LC1-5

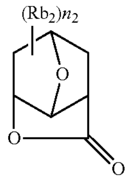

LC1-6

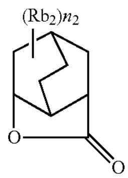

LC1-7

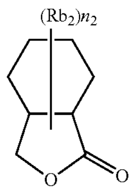

LC1-8

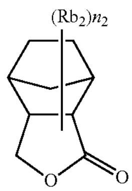

LC1-9

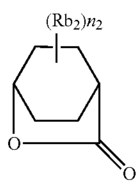

LC1-10

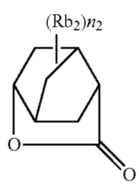

LC1-11

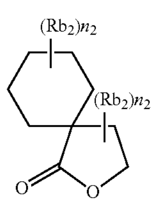

LC1-12

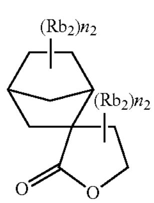

-continued

LC1-13

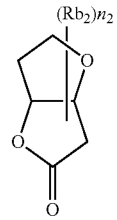

LC1-14

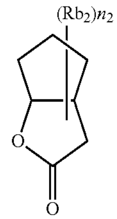

LC1-15

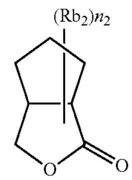

LC1-16

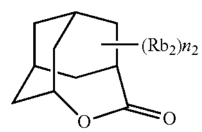

The lactone structure moiety may or may not have a substituent ($Rb_2$). Preferred examples of the substituent ($Rb_2$) include an alkyl group having 1 to 8 carbon atoms, a cycloalkyl group having 1 to 4 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group and the like. An alkyl group having 1 to 4 carbon atoms, a cyano group and an acid-decomposable group are more preferred. $n_2$ represents an integer of 0 to 4. When $n_2$ is 2 or more, each of a plurality of substituent ($Rb_2$) may be same or different, and a plurality of substituents ($Rb_2$) may combine with each other to form a ring.

Examples of the repeating unit having the lactone structure represented by any one of Formulas (LC1-1) to (LC1-16) include the repeating unit represented by the following Formula (AII).

(AII)

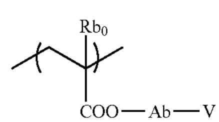

In Formula (AII), $Rb_0$ represents a hydrogen atom, a halogen atom or an alkyl group having 1 to 4 carbon atoms. Examples of the substituent which may be possessed by the alkyl group of $Rb_0$ may include a hydroxyl group and a halogen atom. Examples of the halogen atom of $Rb_0$ may include a fluorine atom, a chlorine atom, a bromine atom and an oxo atom. A hydrogen atom, a methyl group, a hydroxymethyl group or a trifluoromethyl group is preferred, and a hydrogen atom or a methyl group is particularly preferred.

Ab represents a single bond, an alkylene group, a divalent linking group having a monocyclic or polycyclic cycloalkyl structure, an ether bond, an ester bond, a carbonyl group or a divalent linking group in which these groups are combined. Ab is preferably a single bond and a divalent linking group represented by $-Ab_1-CO_2-$.

$Ab_1$ is a straight or branched alkylene group, or a monocyclic or polycyclic cycloalkylene group, and preferably a methylene group, an ethylene group, a cyclohexylene group, an adamantylene group or a norbonylene group.

V represents a group having the structure shown by any one of Formulas (LC1-1) to (LC1-16).

The repeating unit having a lactone group usually has an optical isomer, but any optical isomer may be used. In addition, one kind of optical isomer may be used alone, or a plurality of optical isomers may be used in mixtures. When one kind of optical isomer is mainly used, the optical purity (ee) thereof is preferably 90% or more, and more preferably 95% or more.

The content of the repeating unit having a lactone group is in a range of preferably 15 to 60 mol %, more preferably 20 to 50 mol %, and still more preferably 30 to 50 mol %, based on the total repeating units of the resin (Ab).

Hereinafter, specific examples of the repeating unit having a lactone group will be shown, but the present is not limited thereto.

(In the formulas, Rx represents $CH_3$, $CH_2OH$, or $CF_3$)

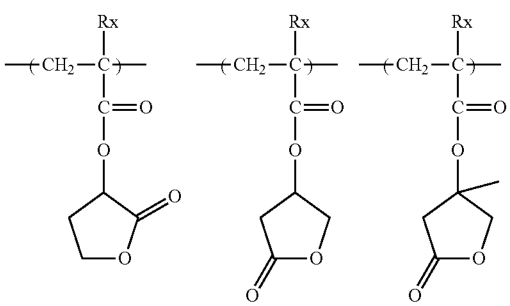

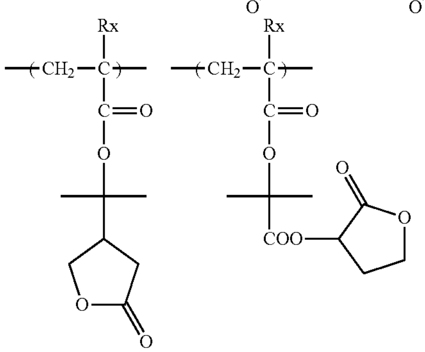

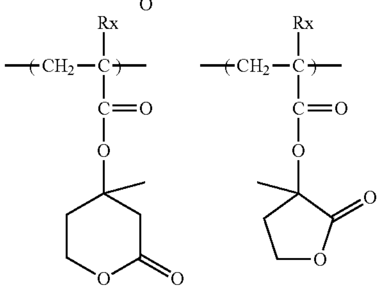

-continued

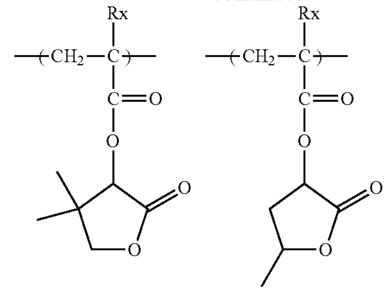

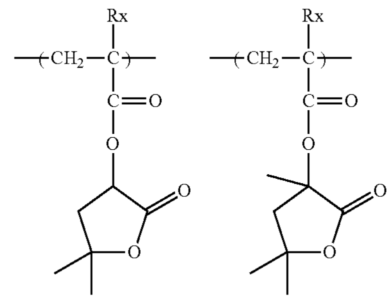

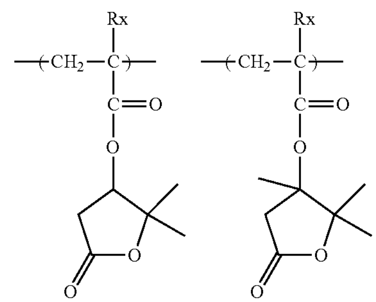

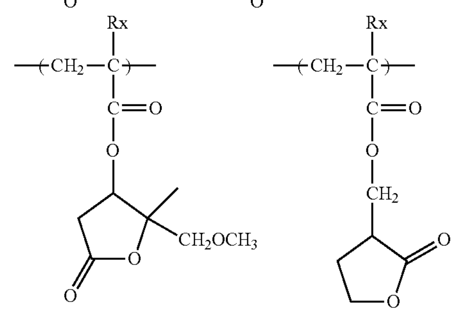

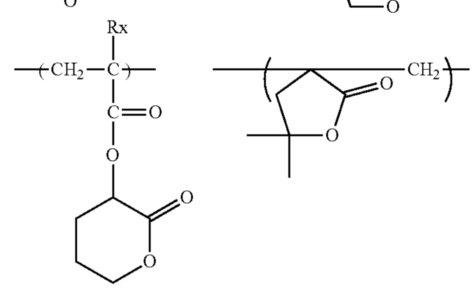

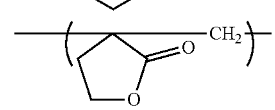

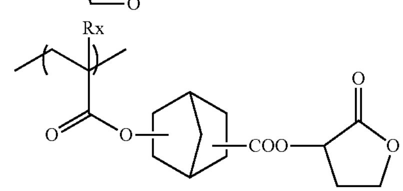

-continued
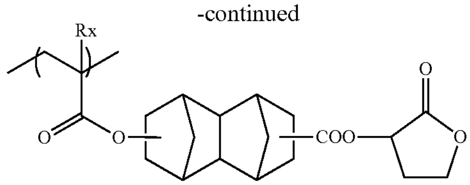
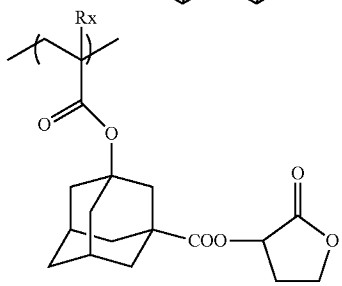
(In the formulas, Rx represents $CH_3$, $CH_2OH$, or $CF_3$)
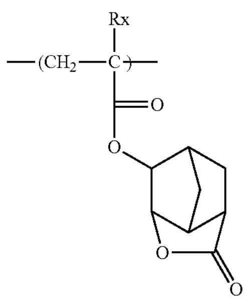
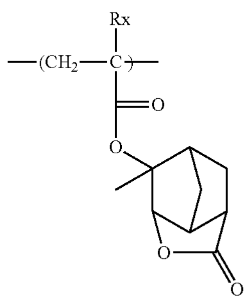
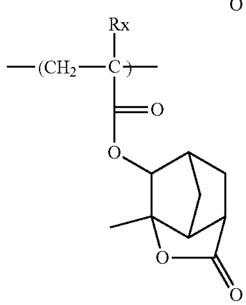
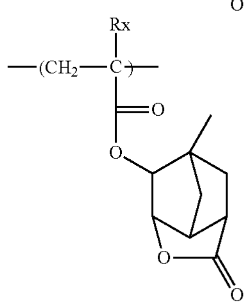
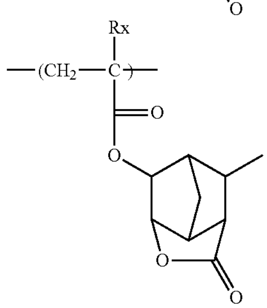
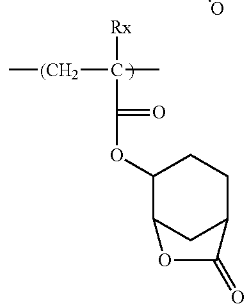
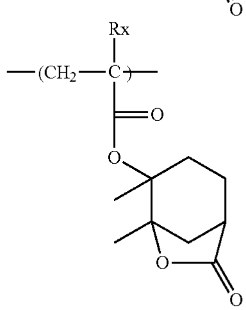
-continued
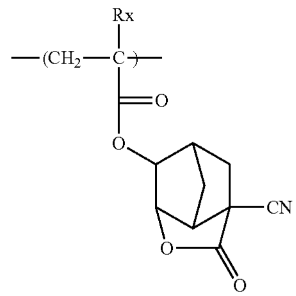
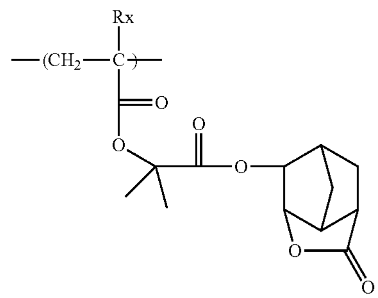
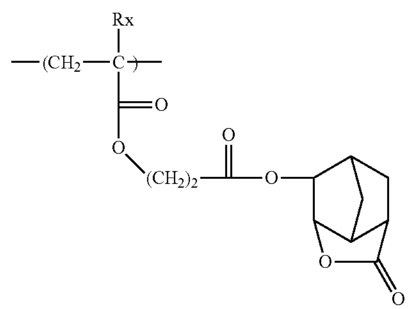
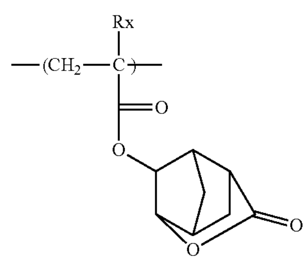
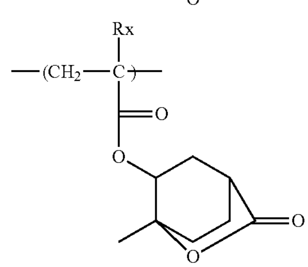
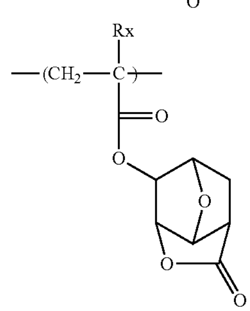

-continued
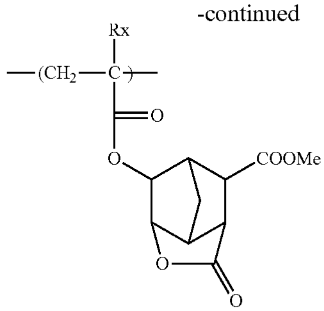
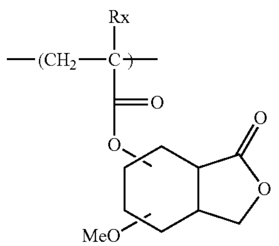
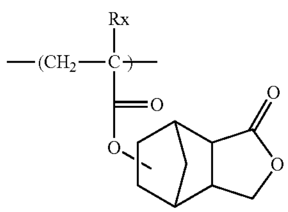
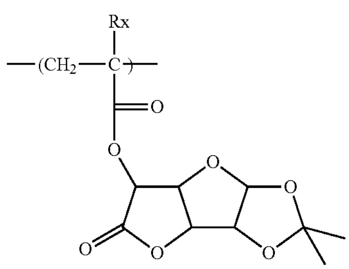
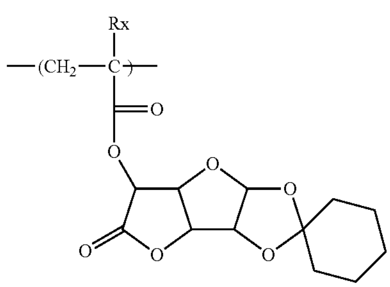
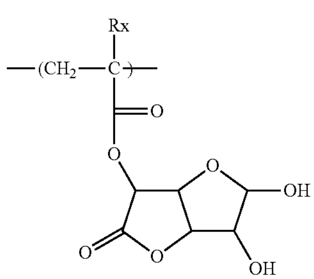
-continued
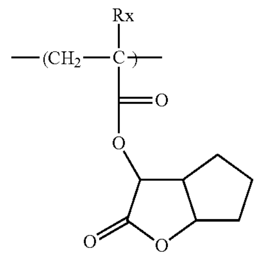
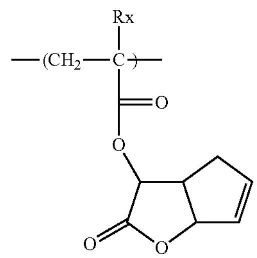
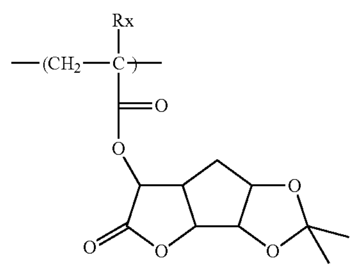
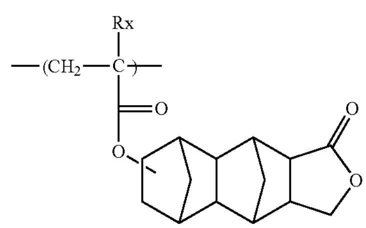
(In the formulas, Rx represents $CH_3$, $CH_2OH$, or $CF_3$)
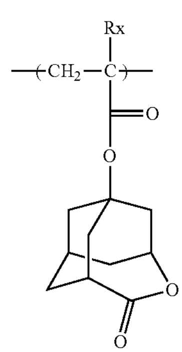
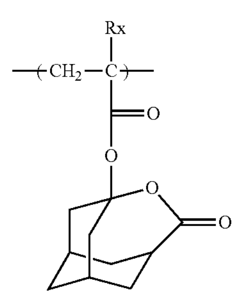

-continued

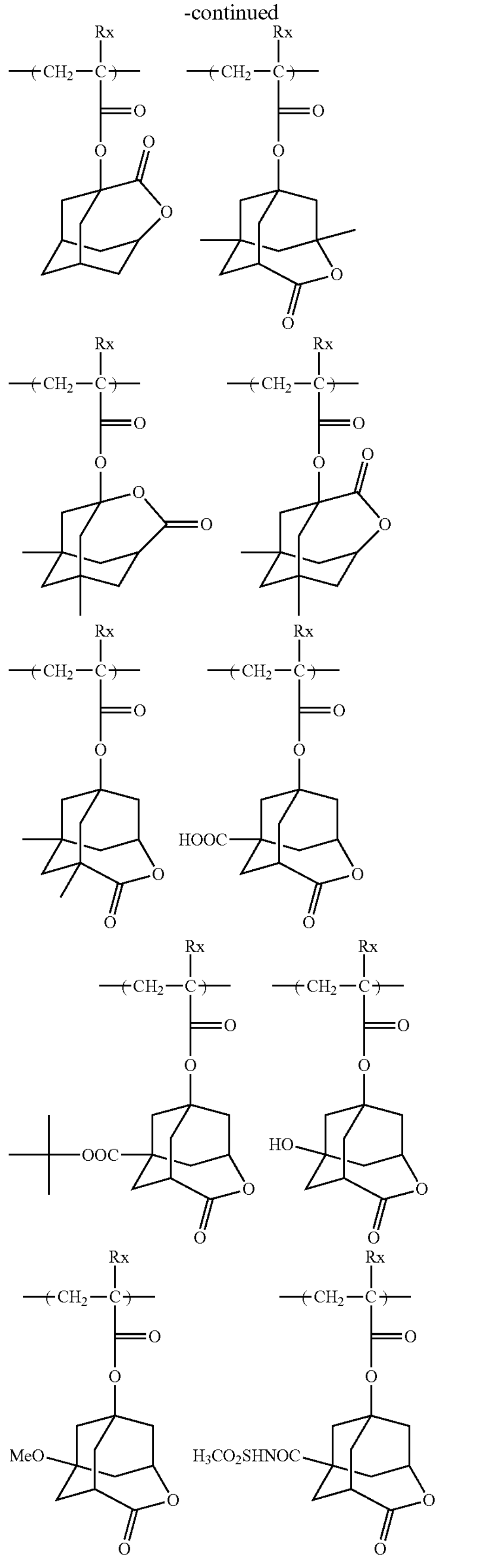

The resin (Ab) may be used in combination of two or more thereof.

The amount of the resin (Ab) added is, as a total amount, usually 10 to 99% by mass, preferably 20 to 99% by mass, and particularly preferably 30 to 99% by mass based on the total solid content of the composition of the present invention.

Hereinafter, specific examples of the resin (Ab) will be presented below, but they are not limited thereto.

(Ab-1)

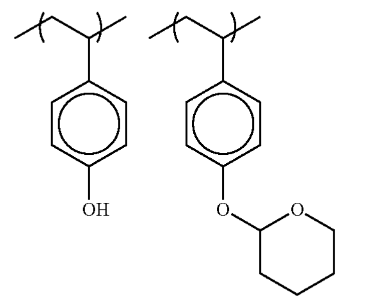

(Ab-2)

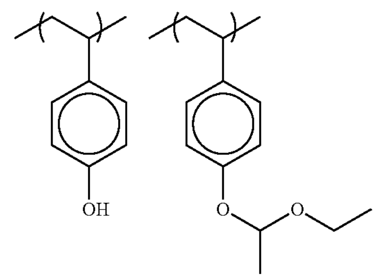

(Ab-3)

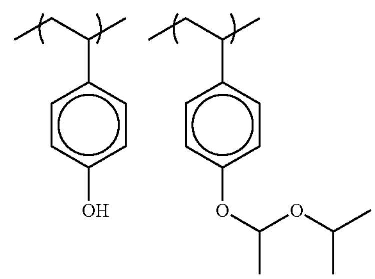

(Ab-4)

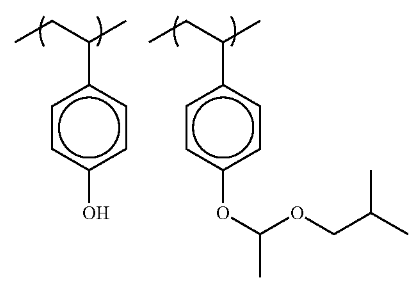

(Ab-5)

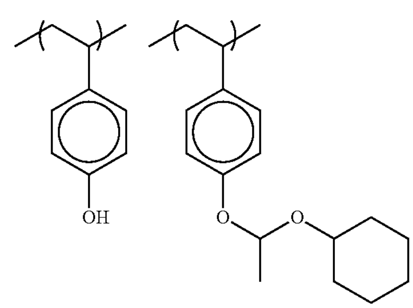

-continued
(Ab-6)
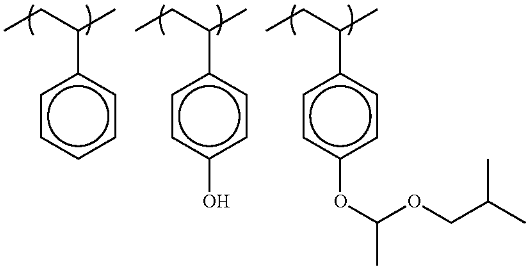
(Ab-7)
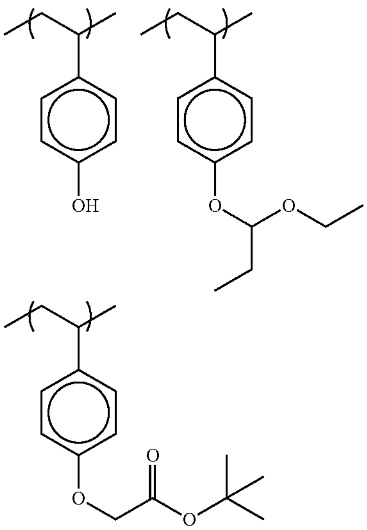
(Ab-8)
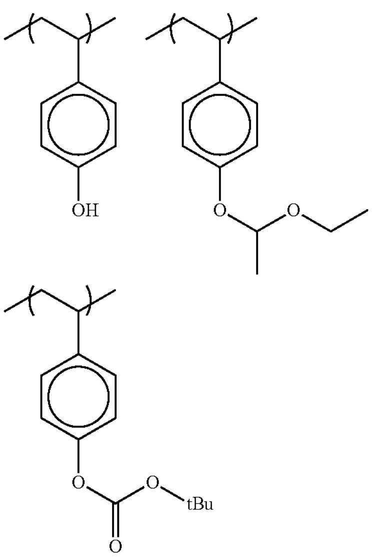
(Ab-9)
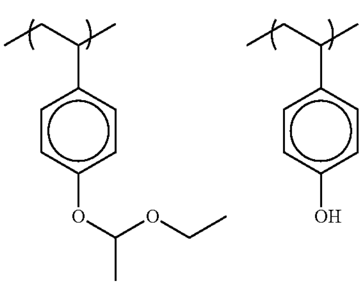
-continued
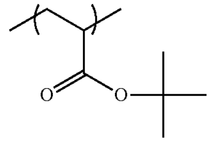
(Ab-10)
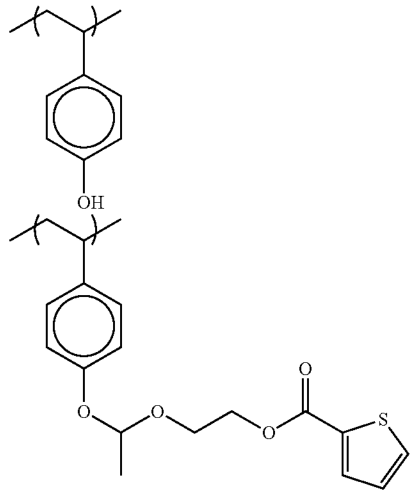
(Ab-11)
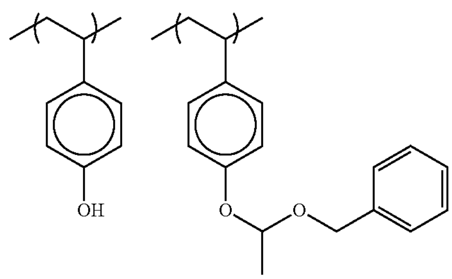
(Ab-12)
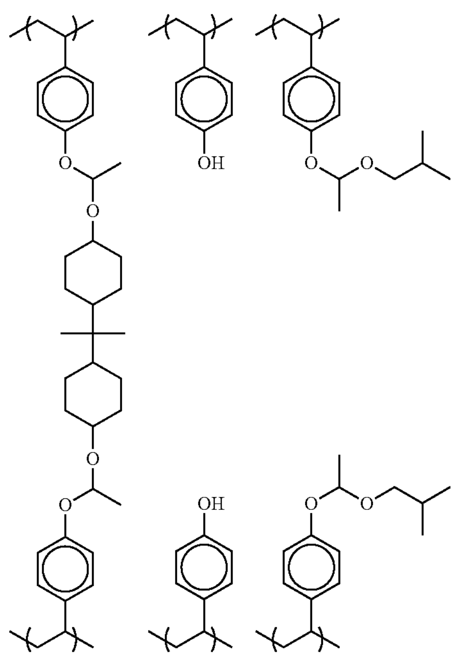

-continued
(Ab-13)
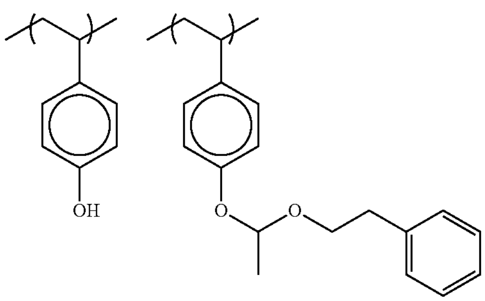
(Ab-14)
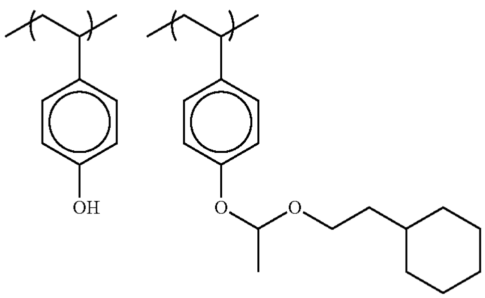
(Ab-15)
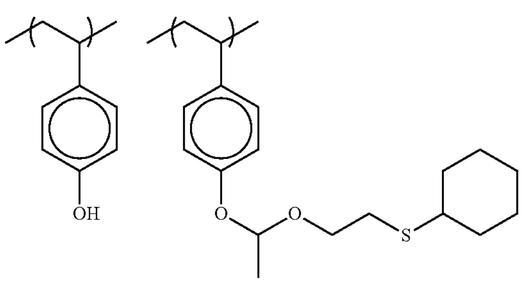
(Ab-16)
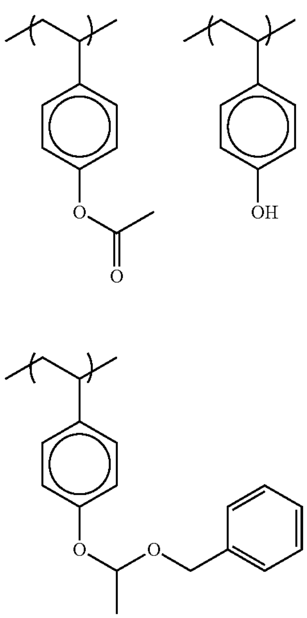
-continued
(Ab-17)
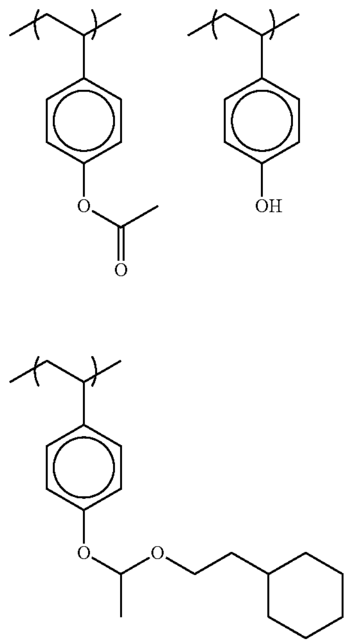
(Ab-18)
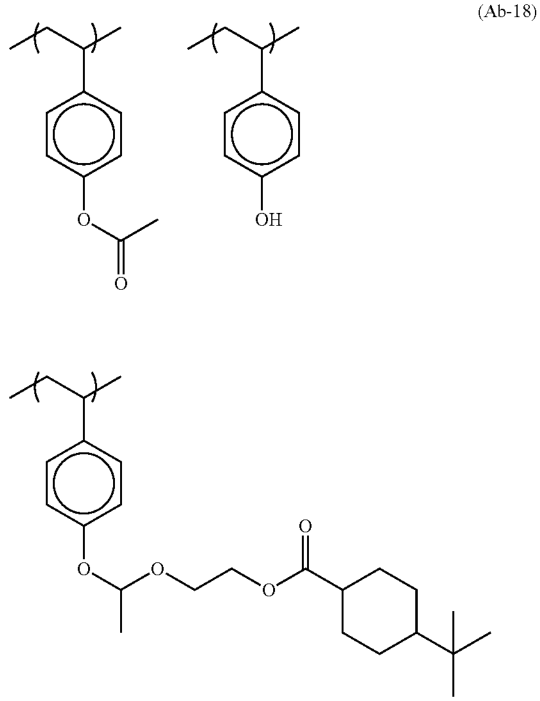
(Ab-19)
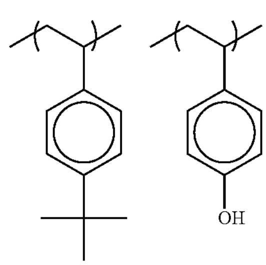

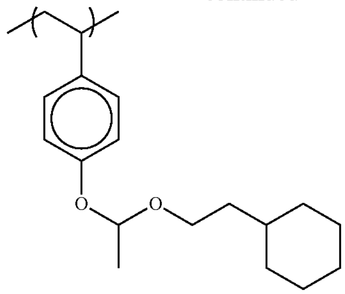
(Ab-20)
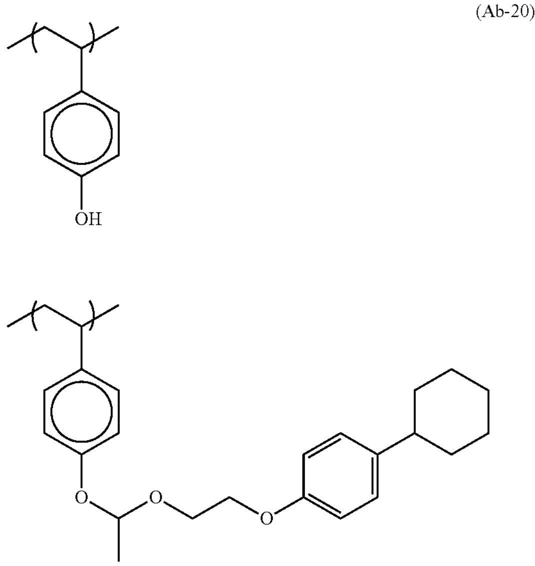
(Ab-21)
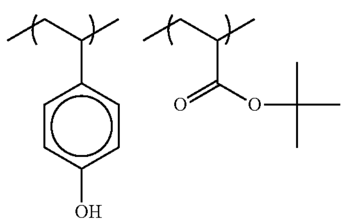
(Ab-22)
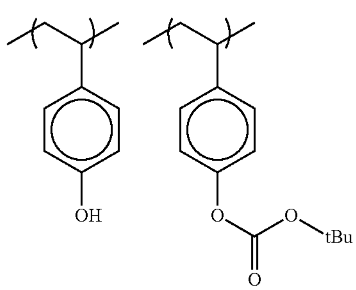
(Ab-23)
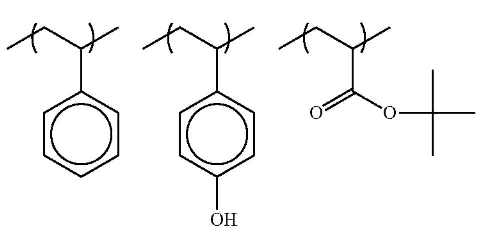
(Ab-24)
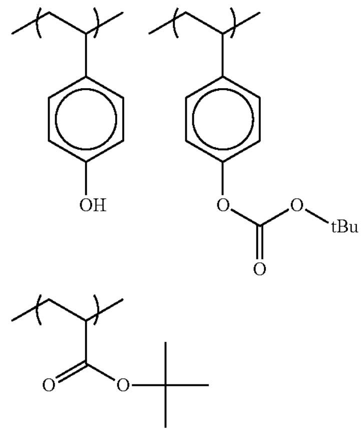
(Ab-25)
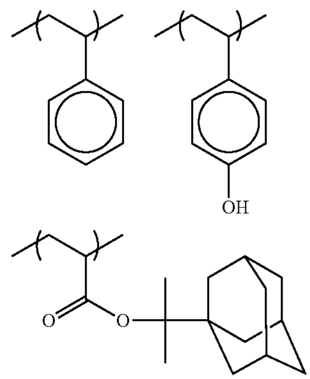
(Ab-26)
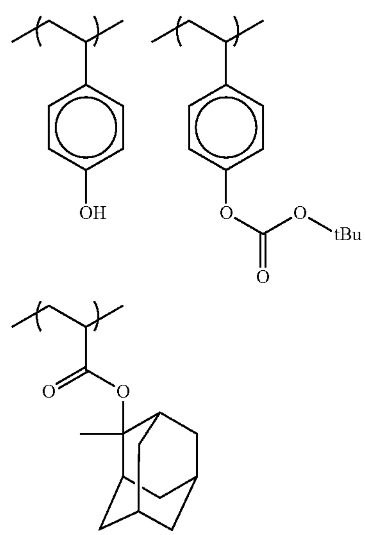
(Ab-27)
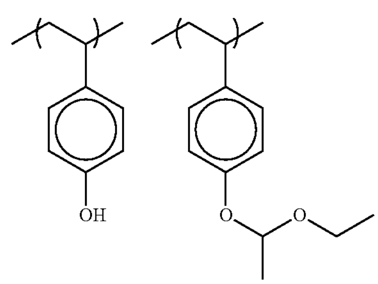

-continued
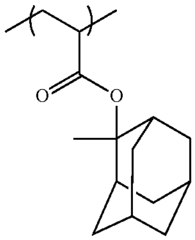
(Ab-28)
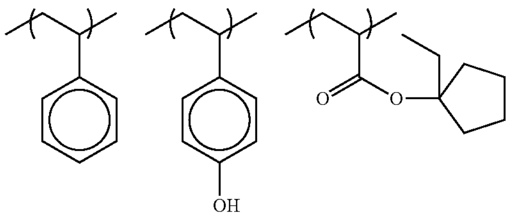
(Ab-29)
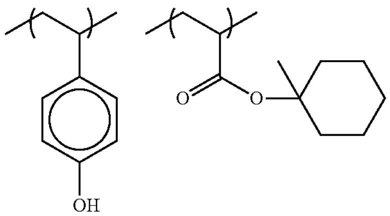
(Ab-30)
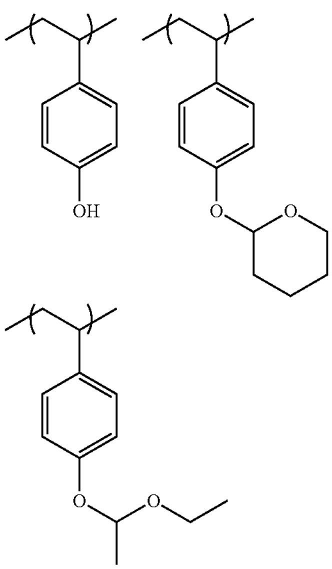
(Ab-31)
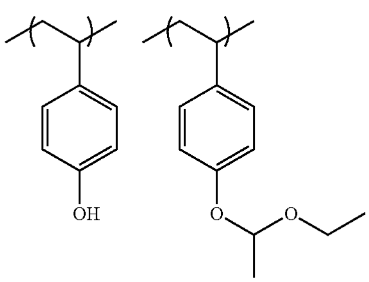
-continued
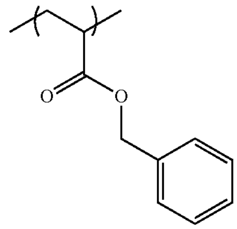
(Ab-32)
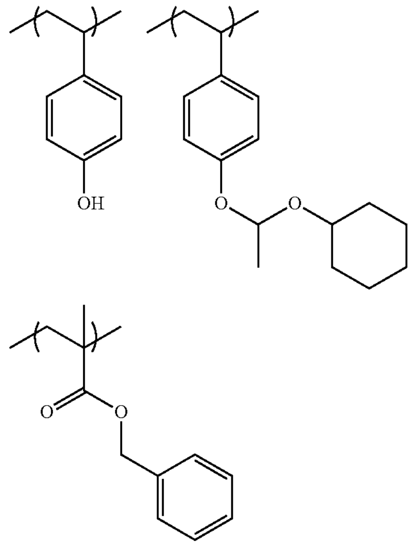
(Ab-33)
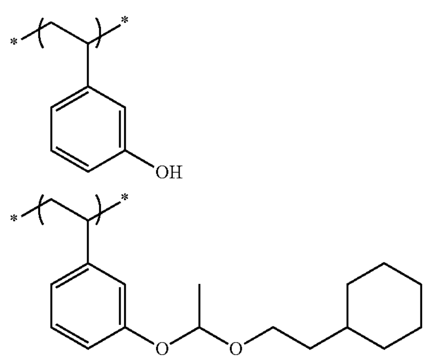
(Ab-34)
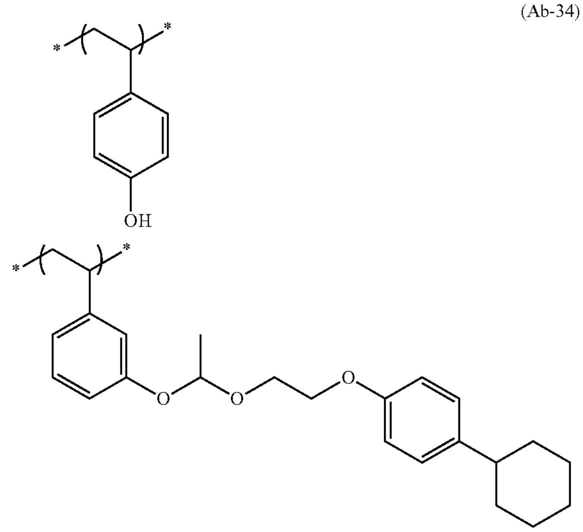

-continued
(Ab-35)
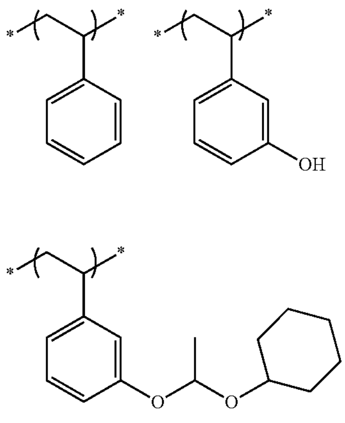
(Ab-36)
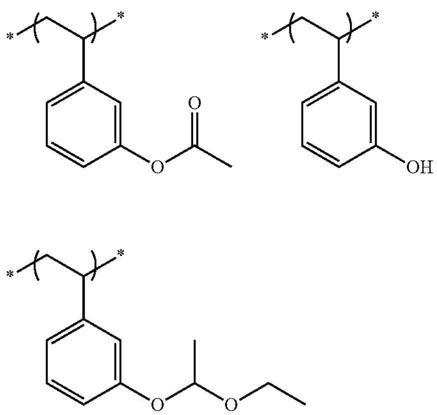
(Ab-37)
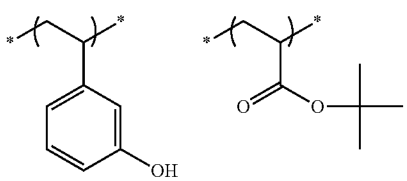
(Ab-38)
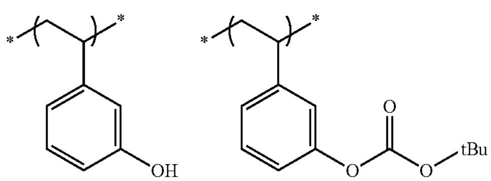
(Ab-39)
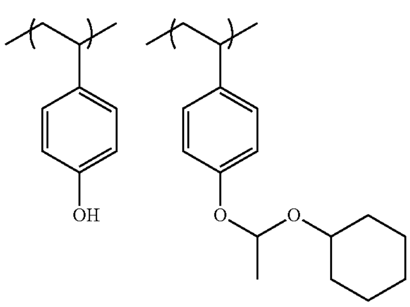
-continued
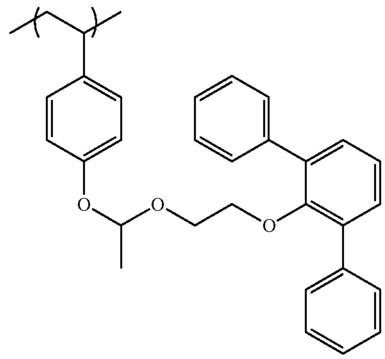
(Ab-40)
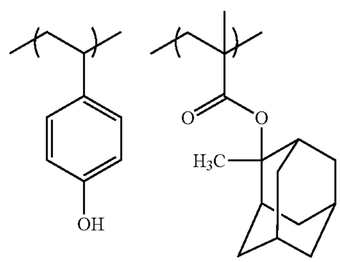
(Ab-41)
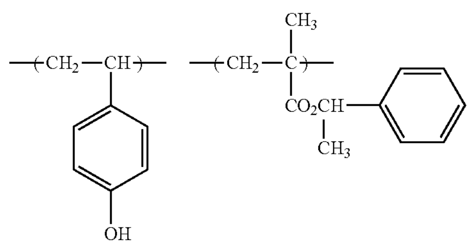
(Ab-42)
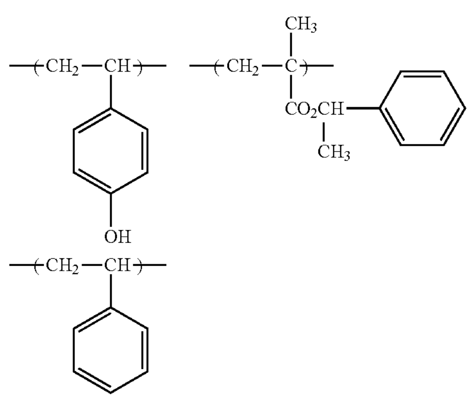
(Ab-43)
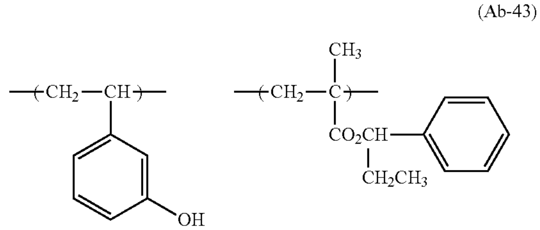

-continued
(Ab-44)
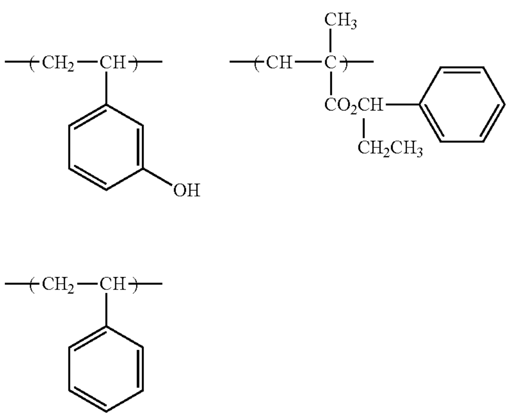
(Ab-45)
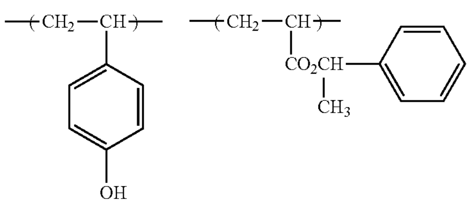
(Ab-46)
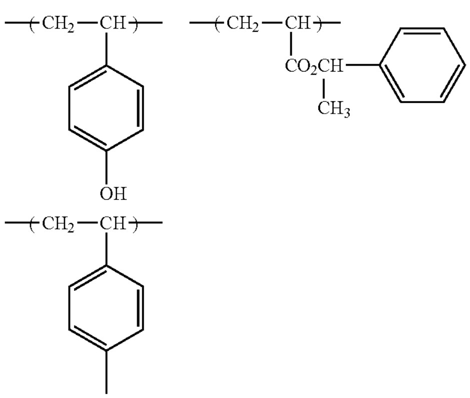
(Ab-47)
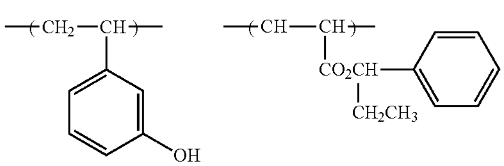
(Ab-48)
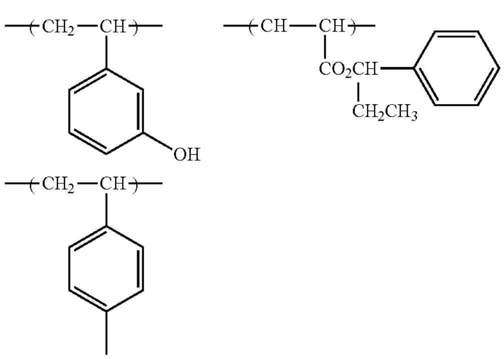
-continued
(Ab-49)
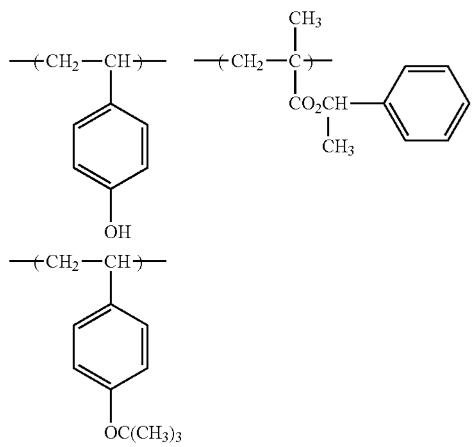
(Ab-50)
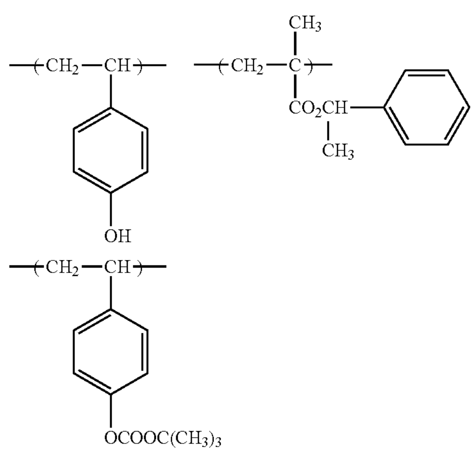
(Ab-51)
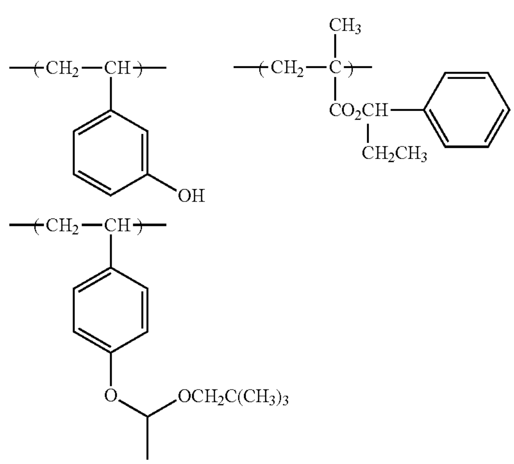
(Ab-52)
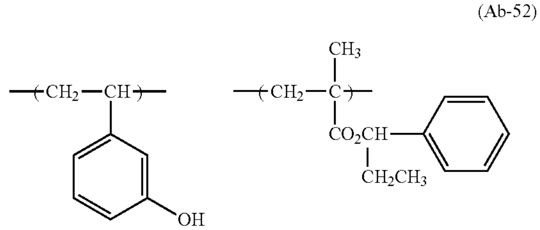

-continued
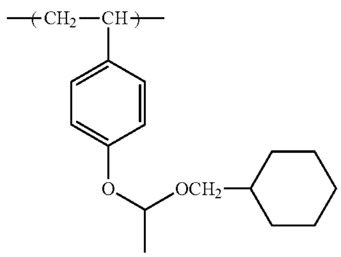
(Ab-53)
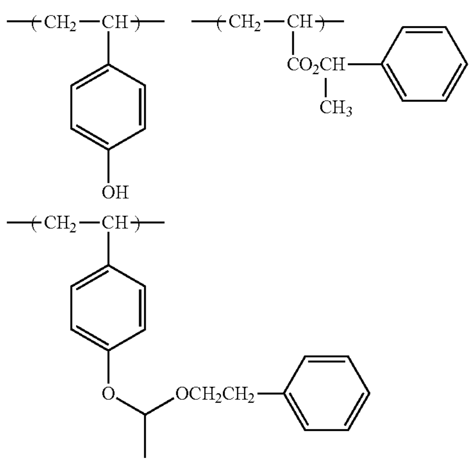
(Ab-54)
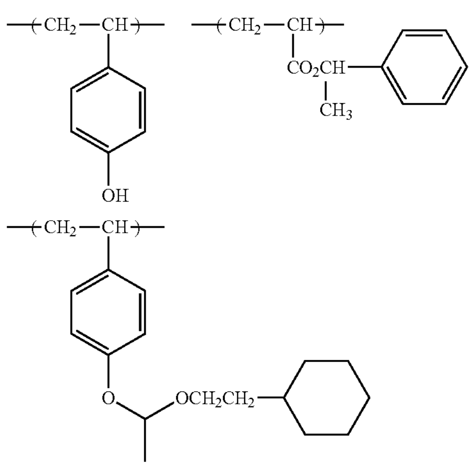
(Ab-55)
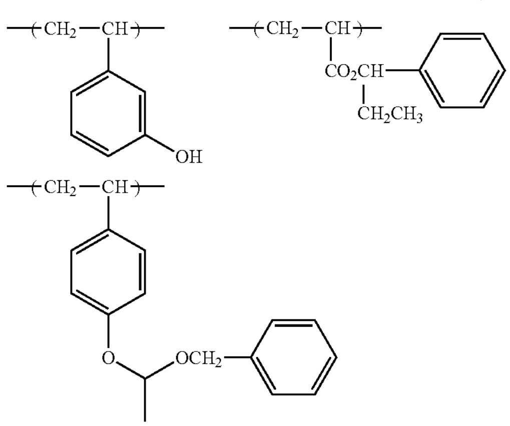
-continued
(Ab-56)
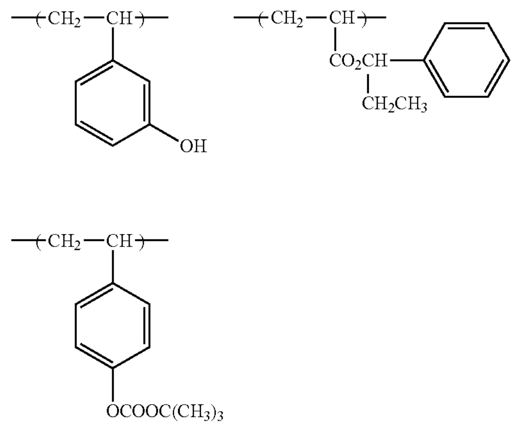
(Ab-57)
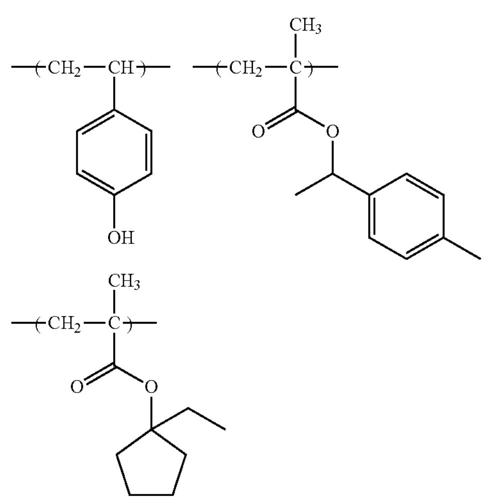
(Ab-58)
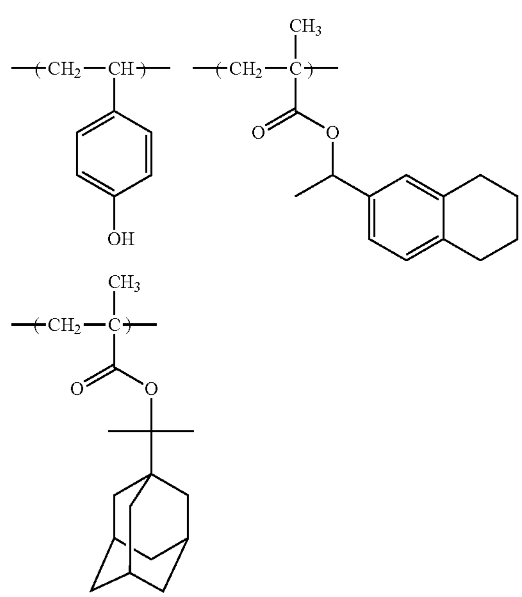

-continued
(Ab-59)
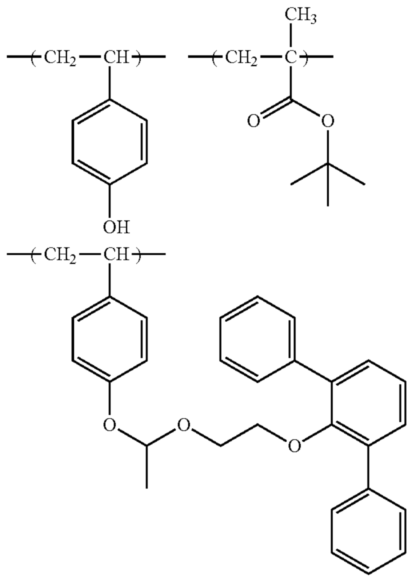
(Ab-60)
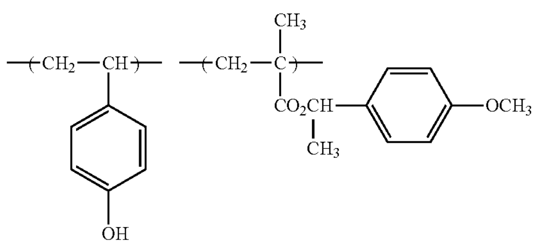
(Ab-61)
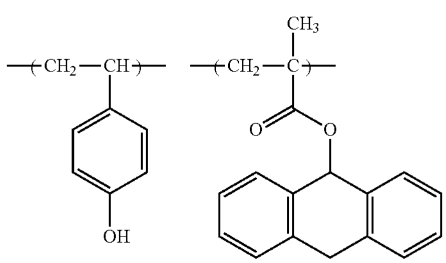
(Ab-62)
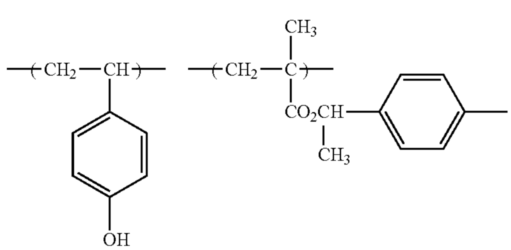
(Ab-63)
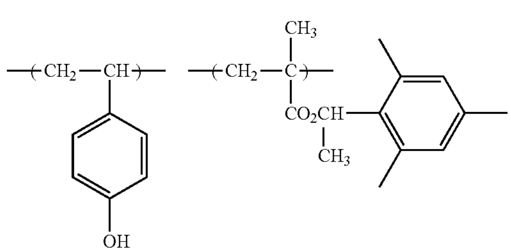
-continued
(Ab-64)
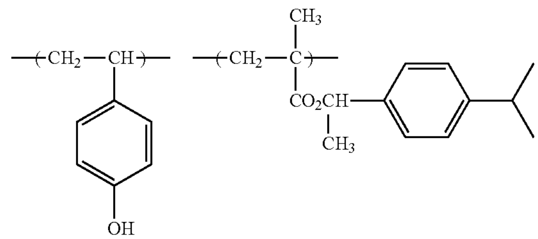
(Ab-65)
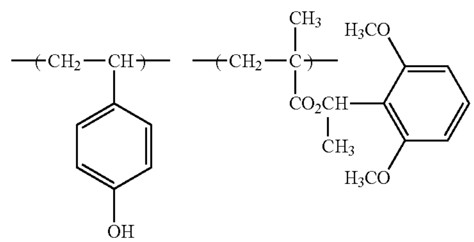
(Ab-66)
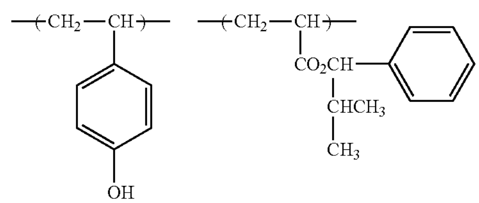
(Ab-67)
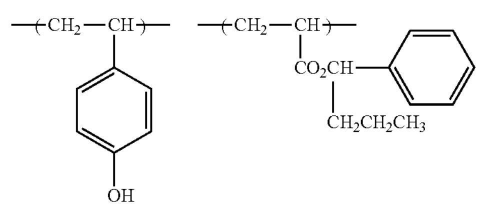
(Ab-68)
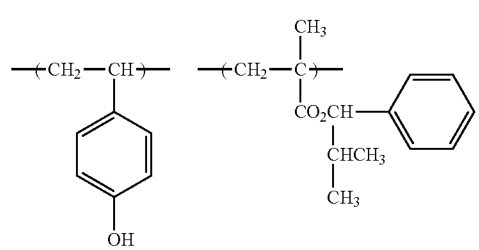
(Ab-69)
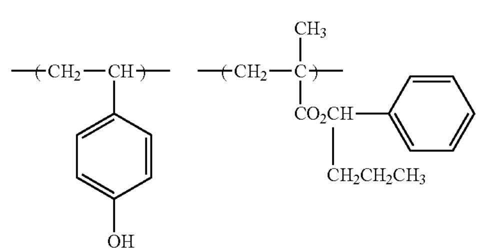

-continued
(Ab-70)
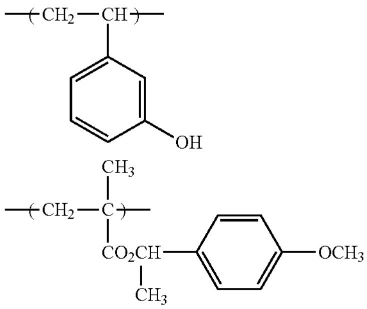
(Ab-71)
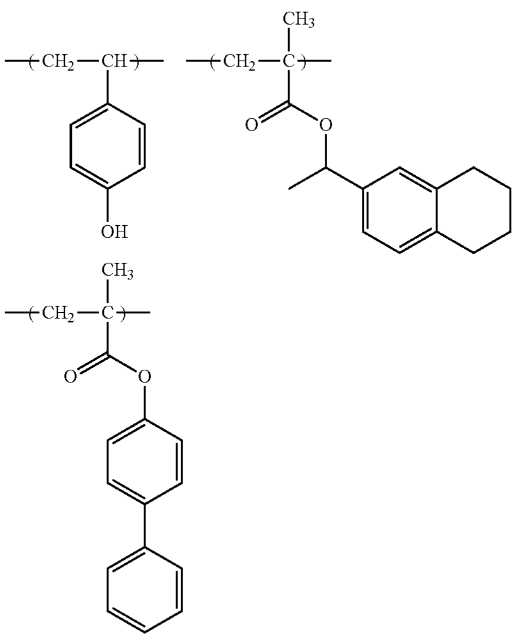
(Ab-72)
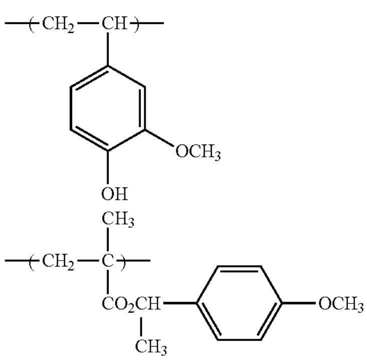
(Ab-73)
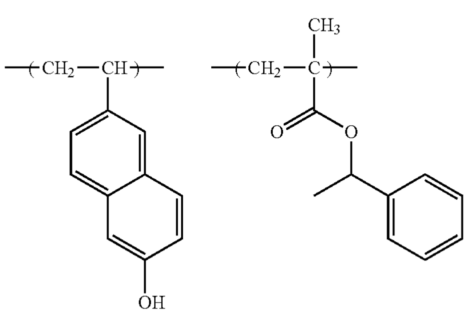
-continued
(Ab-74)
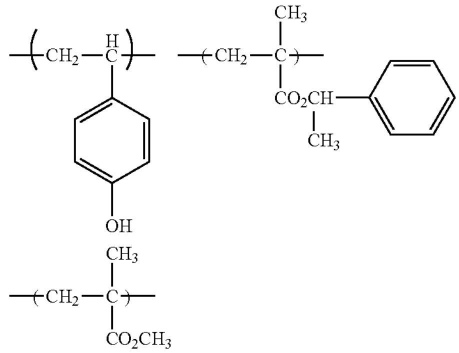
(Ab-75)
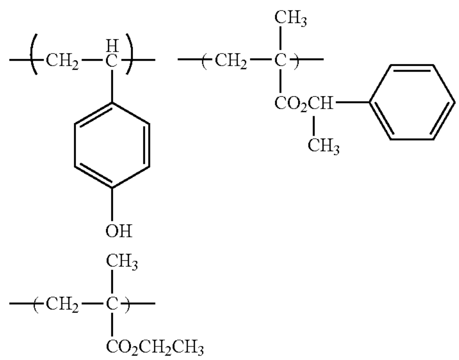
(Ab-76)
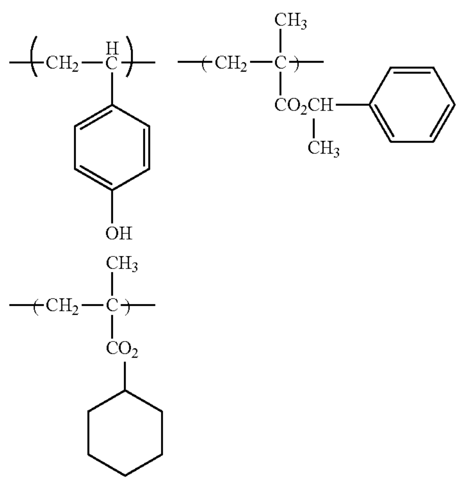
(Ab-77)
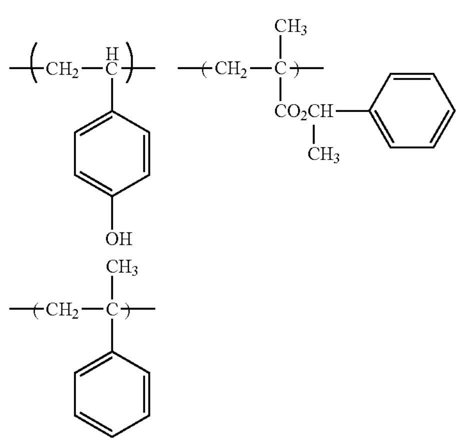

-continued
(Ab-78)
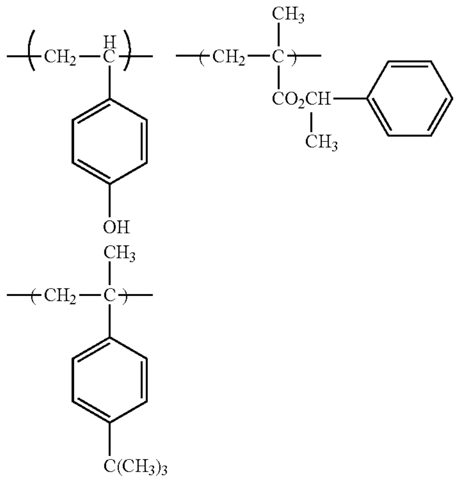
(Ab-79)
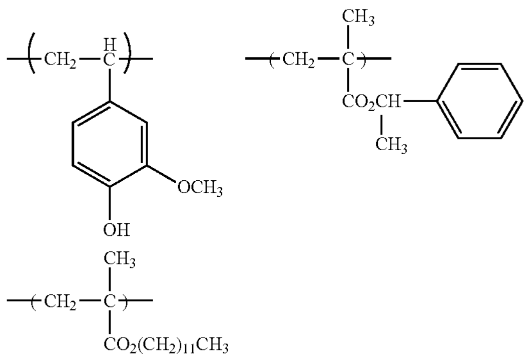
(Ab-80)
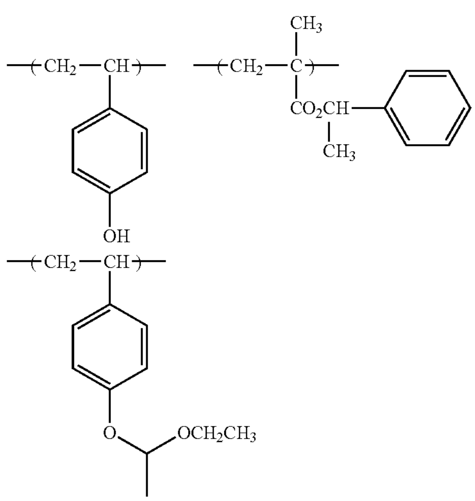
(Ab-81)
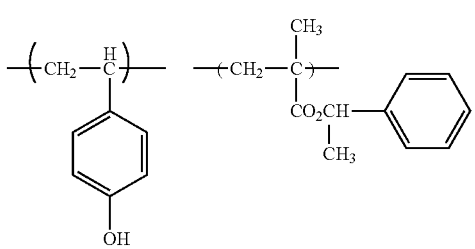
-continued
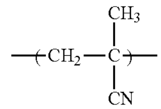
(Ab-82)
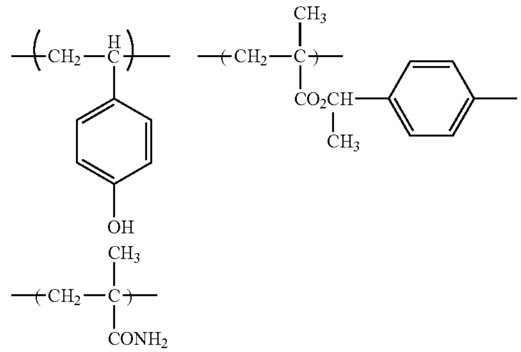
(Ab-83)
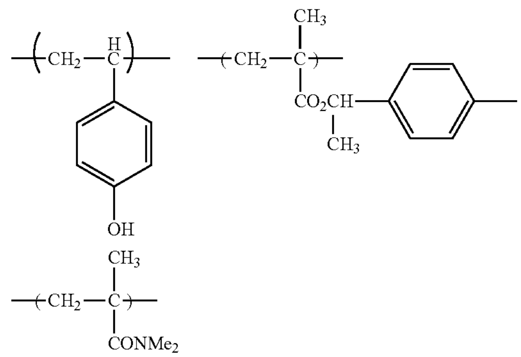
(Ab-84)
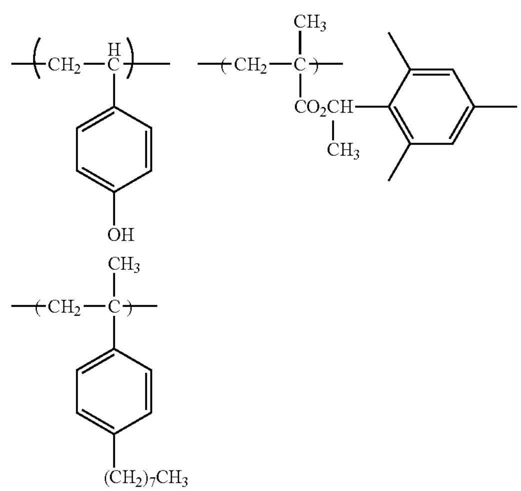
(Ab-85)
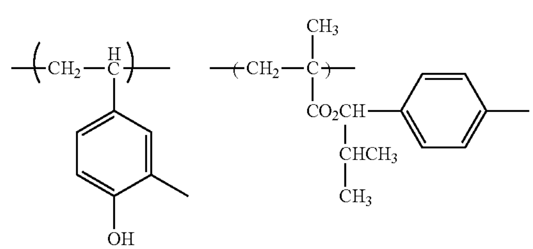

-continued
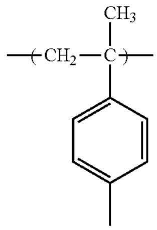
(Ab-86)
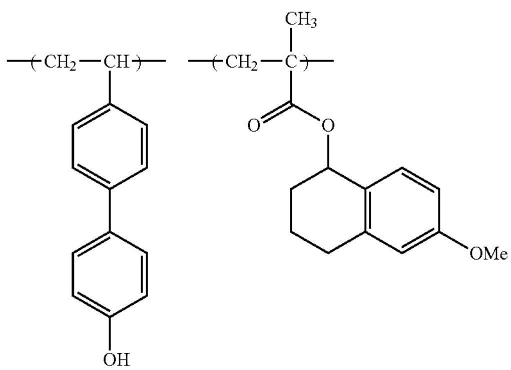
(Ab-87)
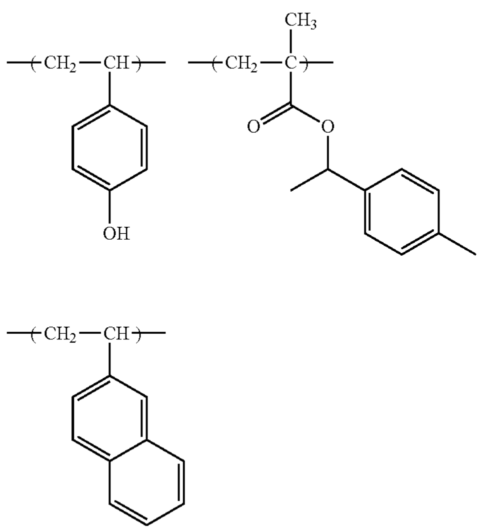
(Ab-88)
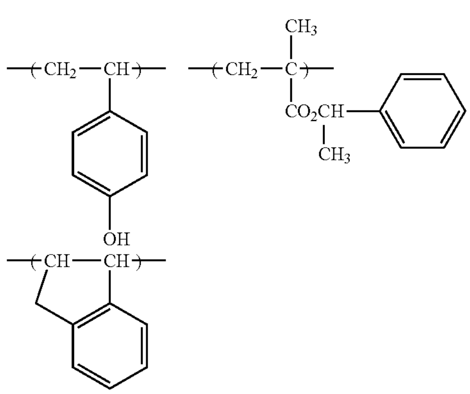
-continued
(Ab-89)
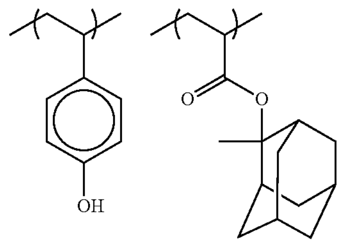
(Ab-90)
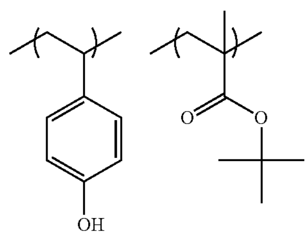
(Ab-91)
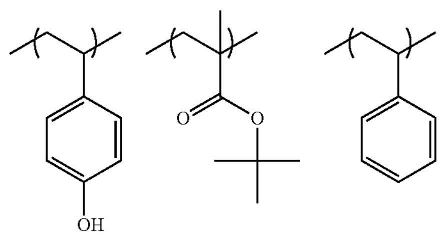
(Ab-92)
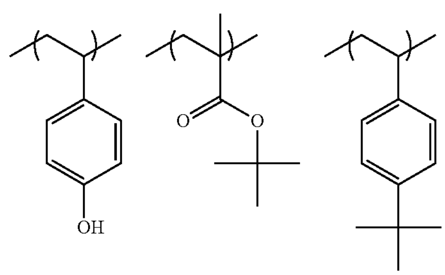
(Ab-93)
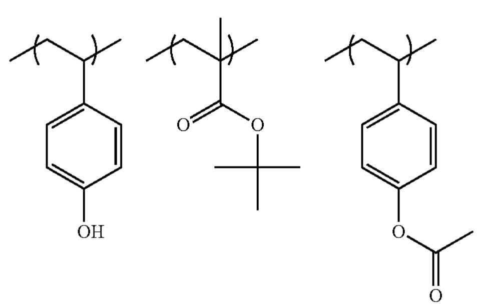

-continued
(Ab-94)
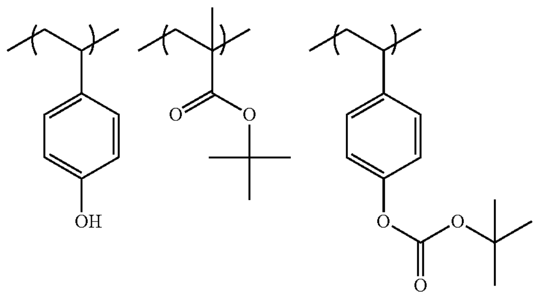
(Ab-95)
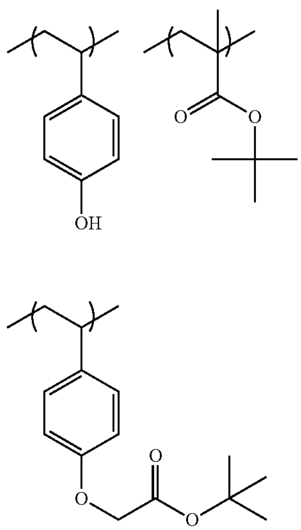
(Ab-96)
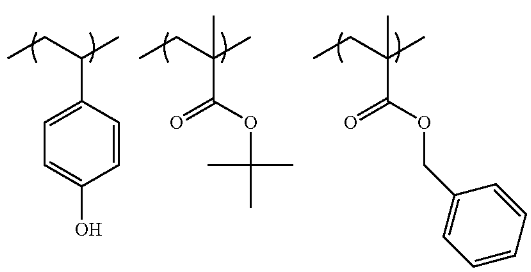
(Ab-97)
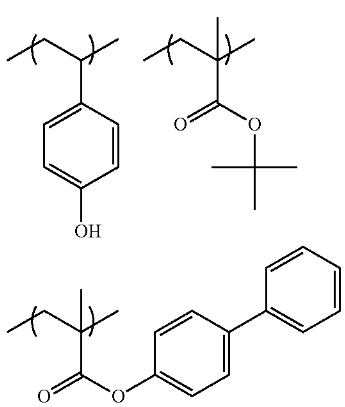
-continued
(Ab-98)
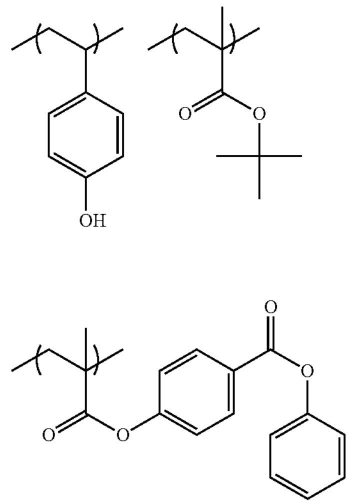
(Ab-99)
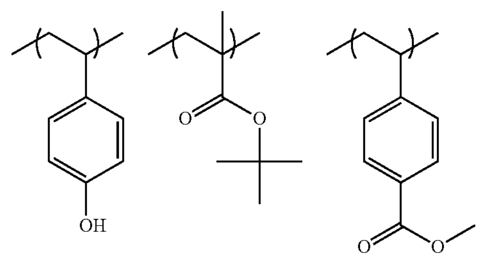
(Ab-100)
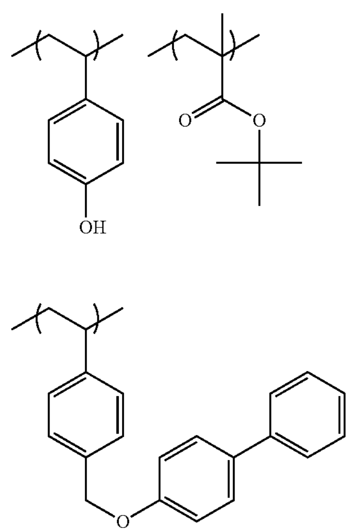
(Ab-101)
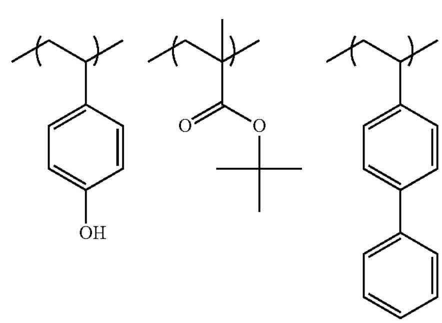

-continued
(Ab-102)
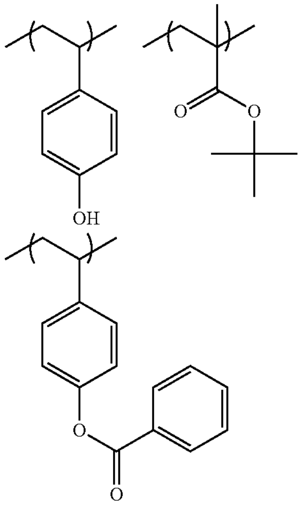
(Ab-103)
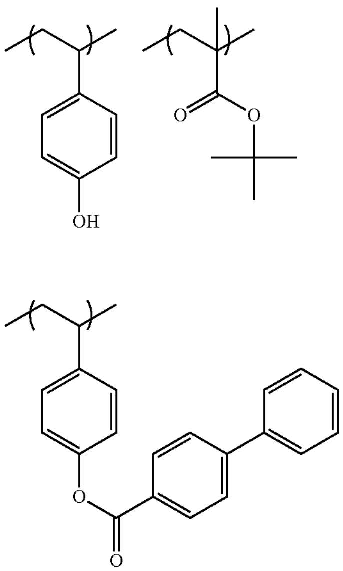
(Ab-104)
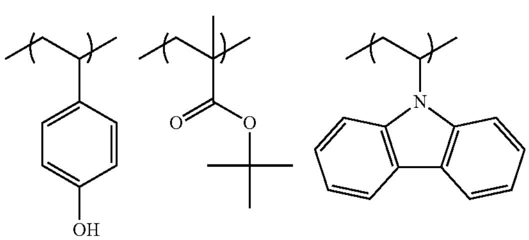
(Ab-105)
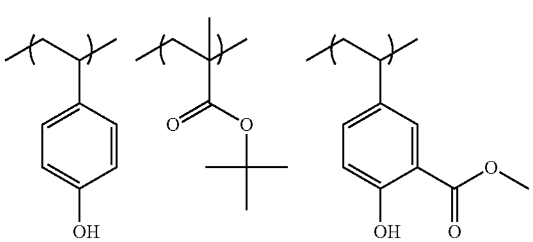
-continued
(Ab-106)
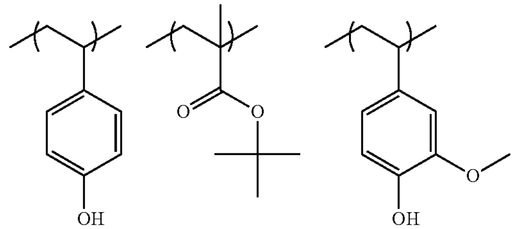
(Ab-107)
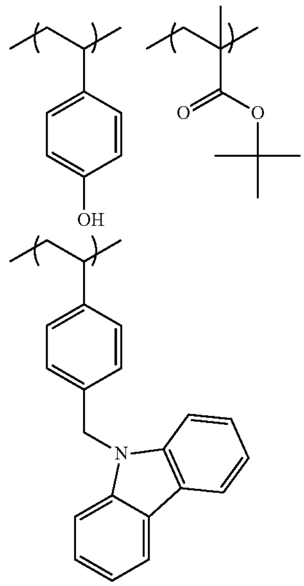
(Ab-108)
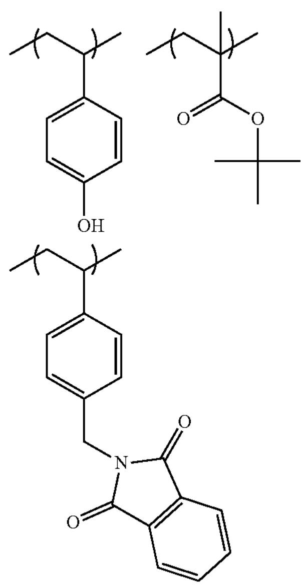
(Ab-109)
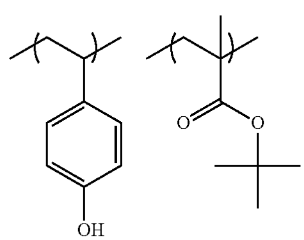

-continued
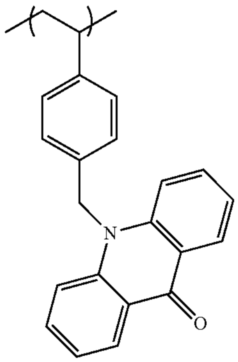
(Ab-110)
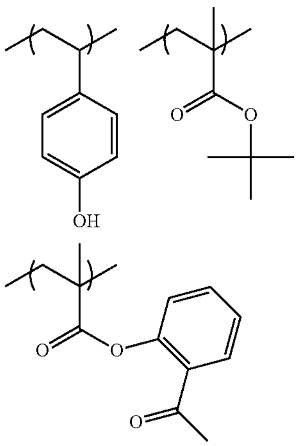
(Ab-111)
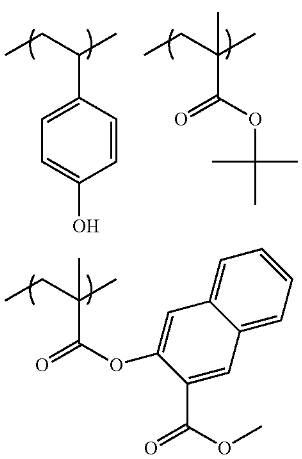
(Ab-112)
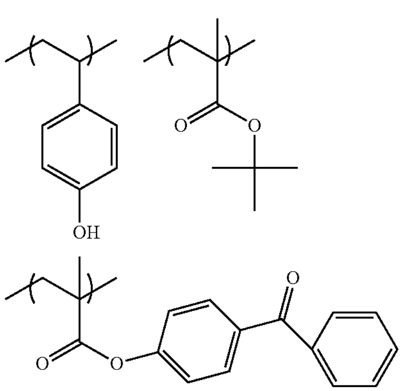
-continued
(Ab-113)
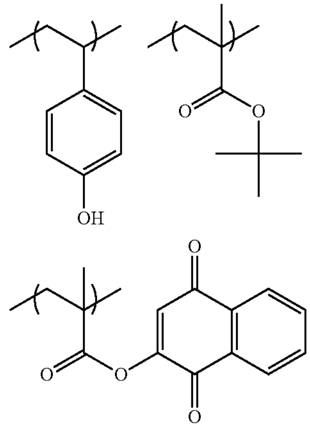
(Ab-114)
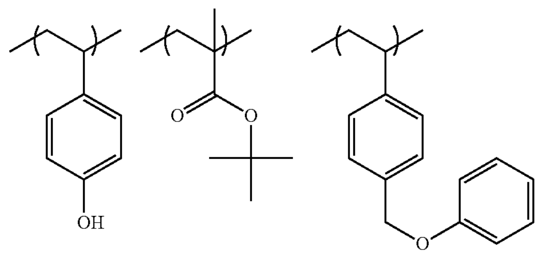
(Ab-115)
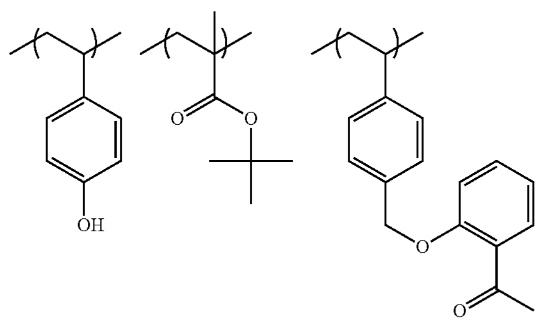
(Ab-116)
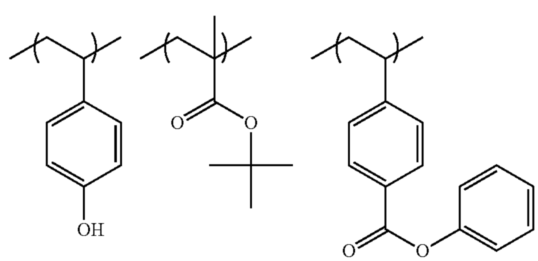
(Ab-117)
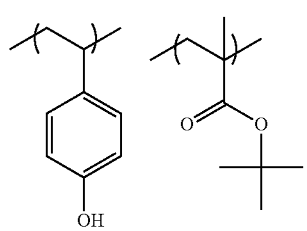

-continued
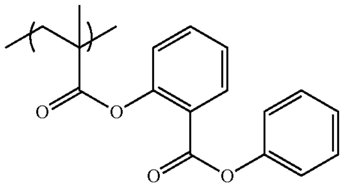
(Ab-118)
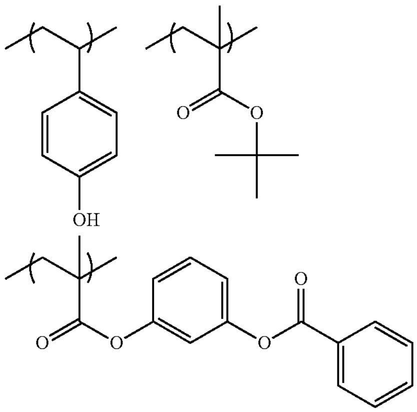
(Ab-119)
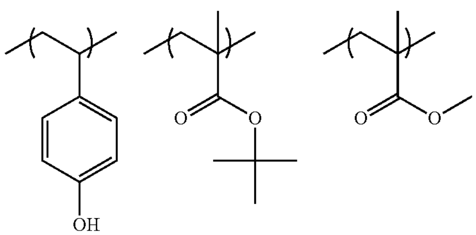
(Ab-120)
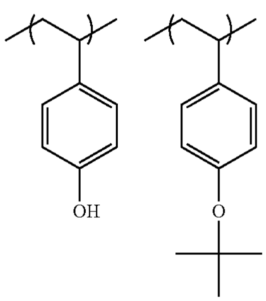
(Ab-121)
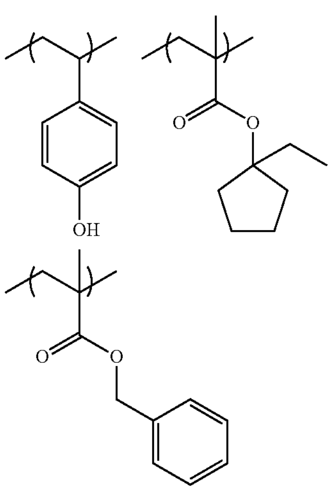
-continued
(Ab-122)
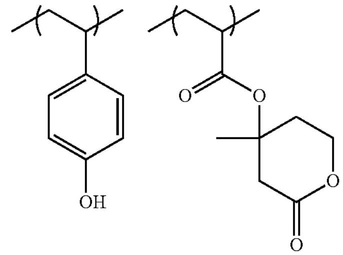
(Ab-123)
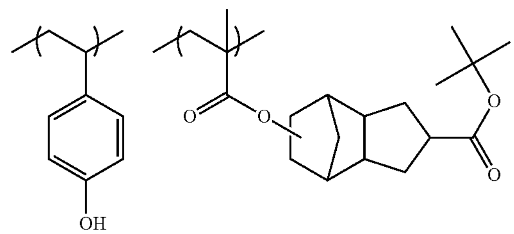
(Ab-124)
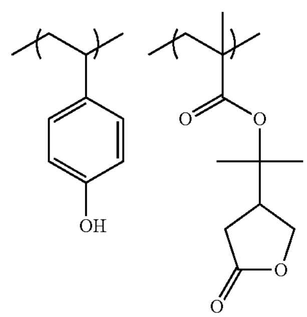
(Ab-125)
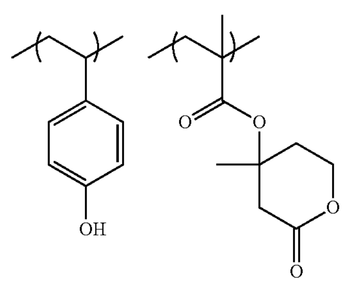
(Ab-126)
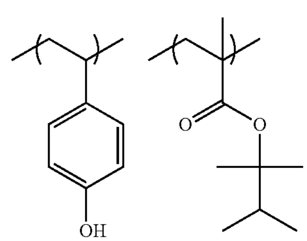

-continued
(Ab-127)
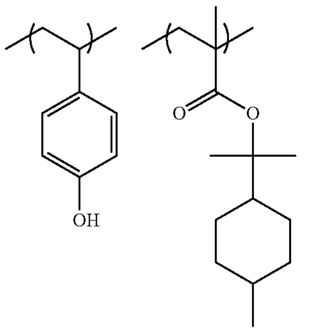
(Ab-128)
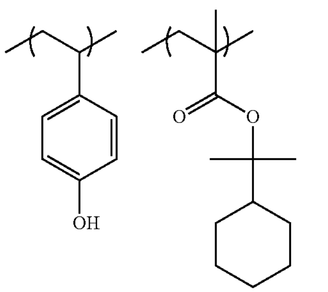
(Ab-129)
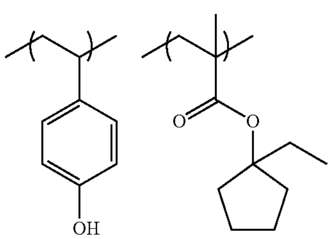
(Ab-130)
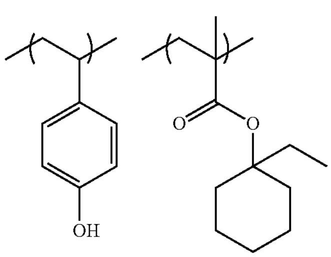
(Ab-131)
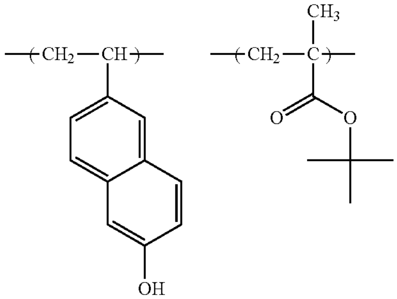
-continued
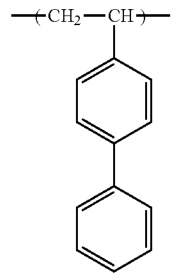
(Ab-132)
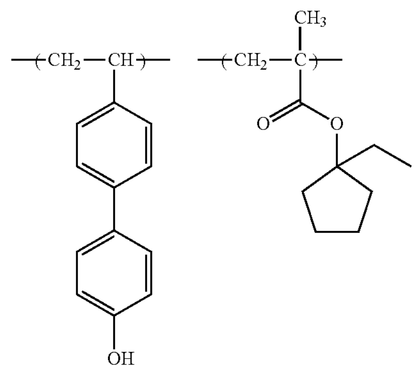
(Ab-133)
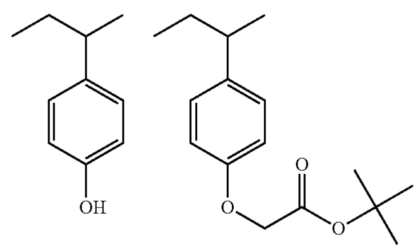
(Ab-134)
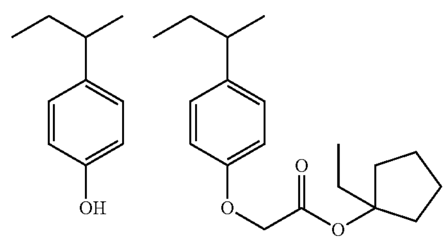
(Ab-135)
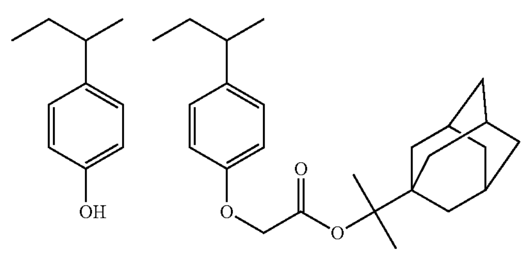
(Ab-136)
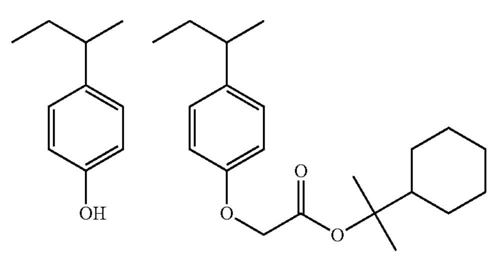

(Ab-137)
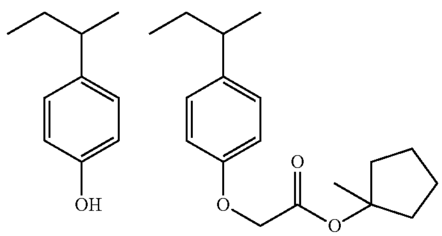
(Ab-138)
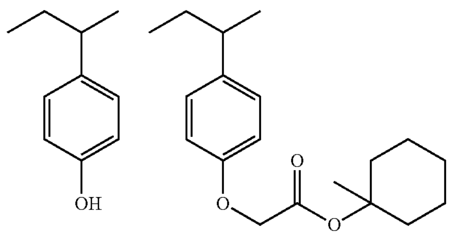
(Ab-139)
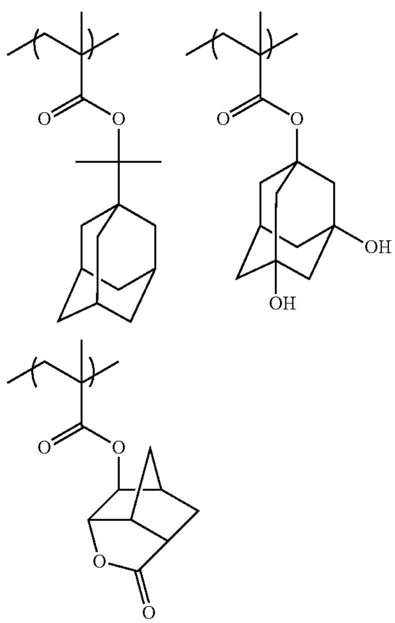
(Ab-140)
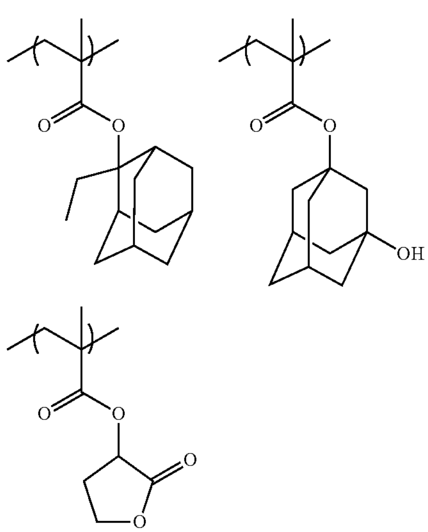
(Ab-141)
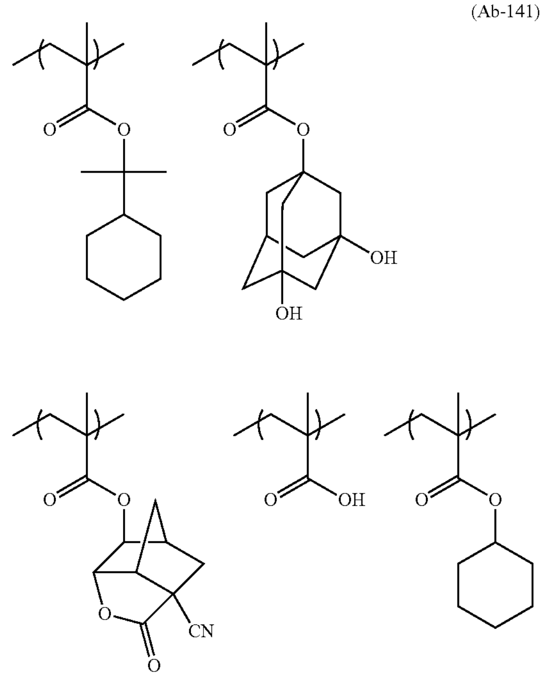
(Ab-142)
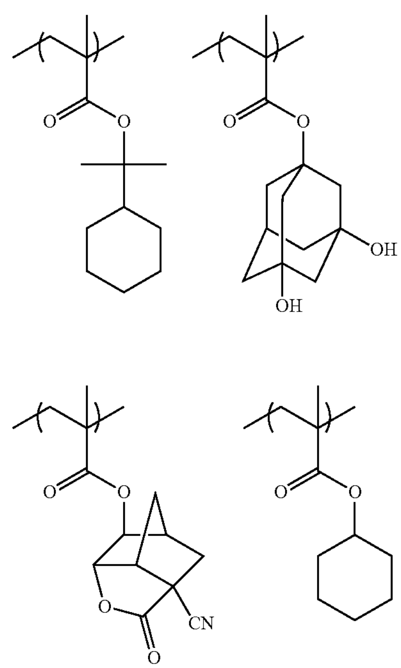
(Ab-143)
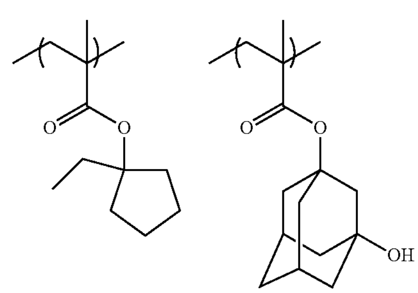

-continued
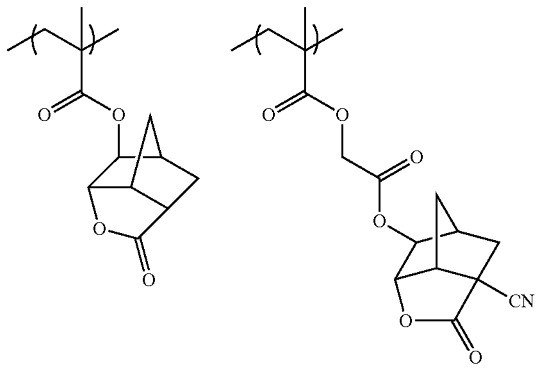
(Ab-144)
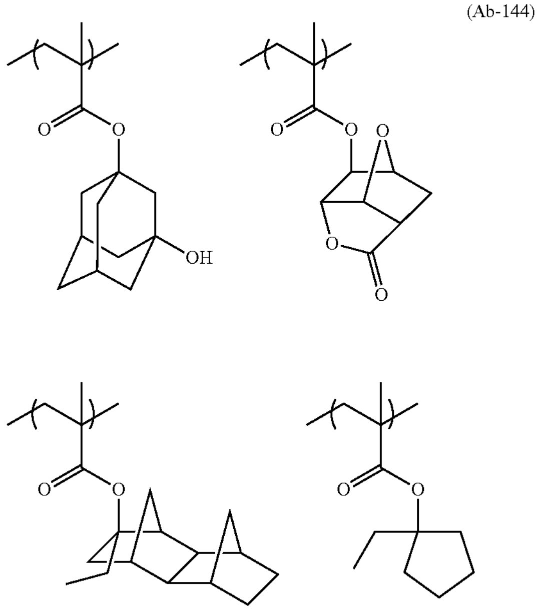
(Ab-145)
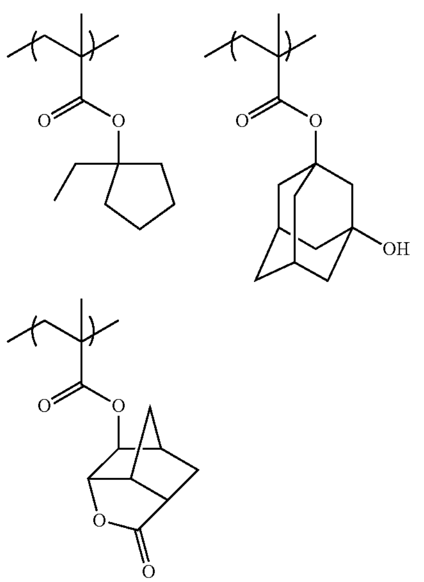
-continued
(Ab-146)
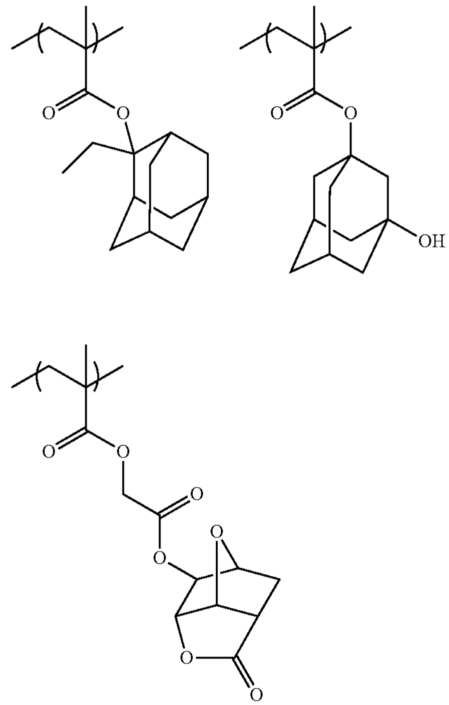
(Ab-147)
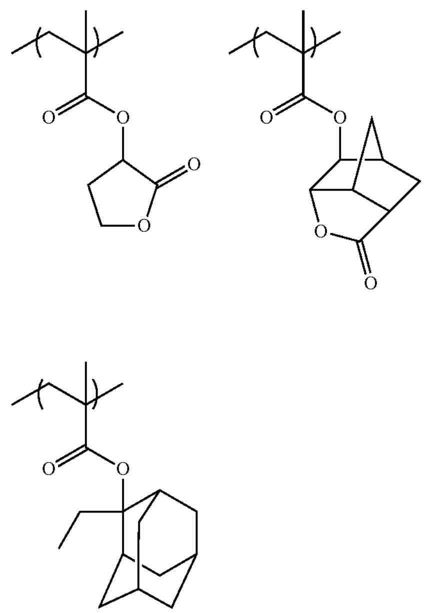
(Ab-148)
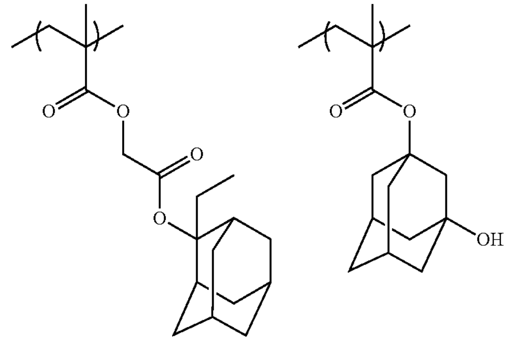

-continued
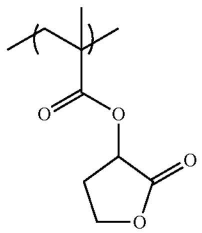
(Ab-149)
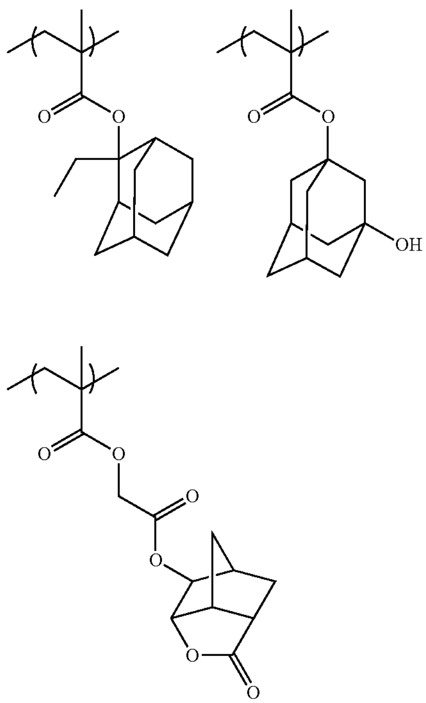
(Ab-150)
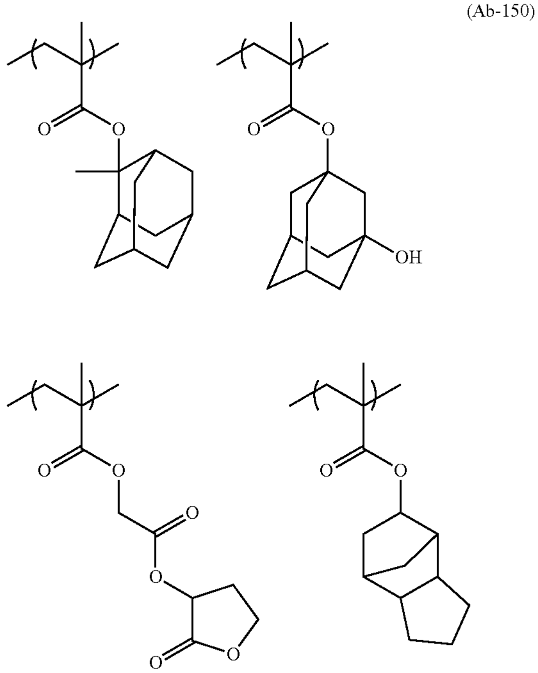
-continued
(Ab-151)
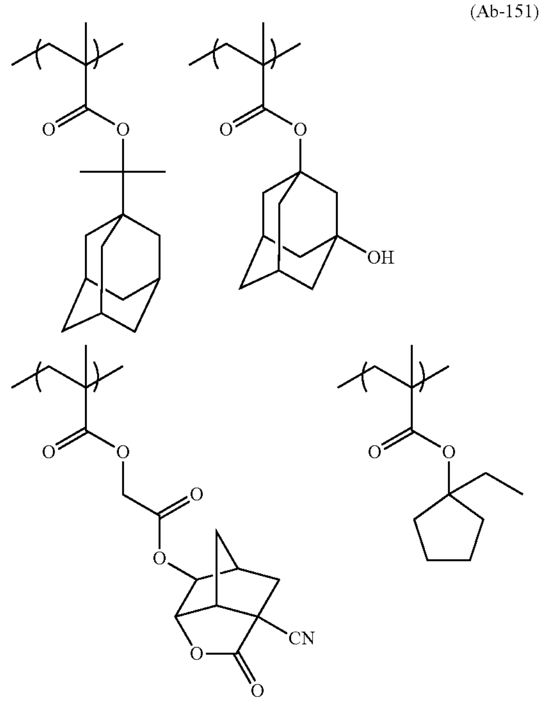
(Ab-152)
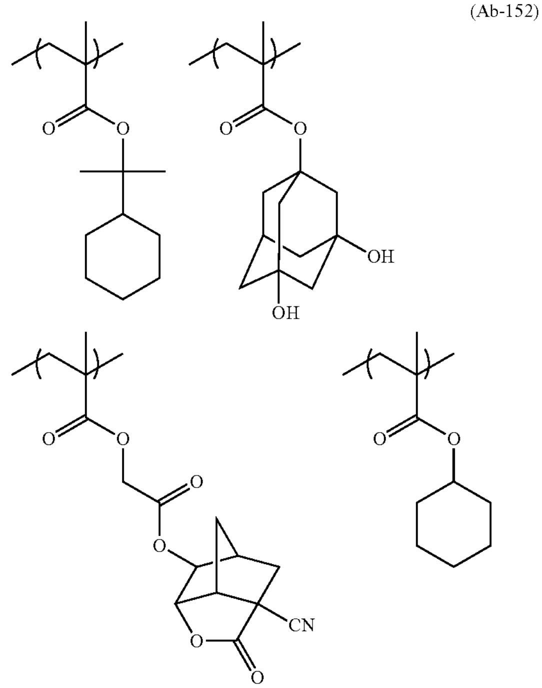
(Ab-153)
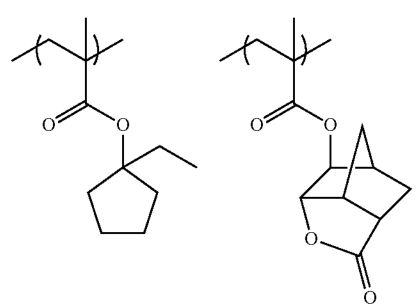

-continued
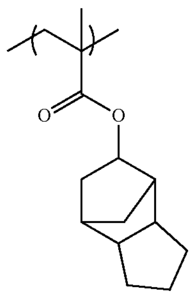
(Ab-154)
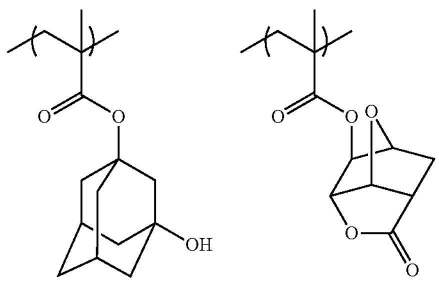
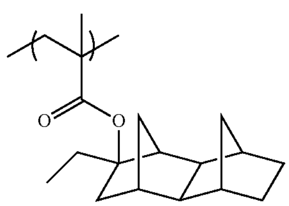
(Ab-155)
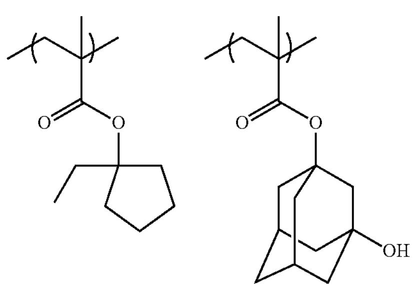
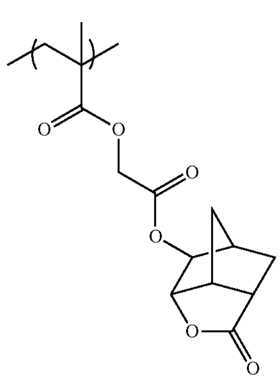
-continued
(Ab-156)
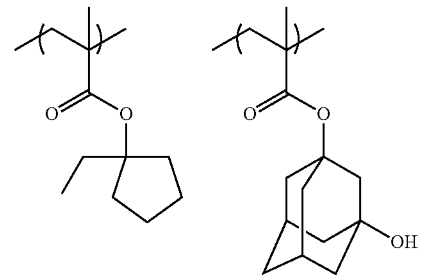
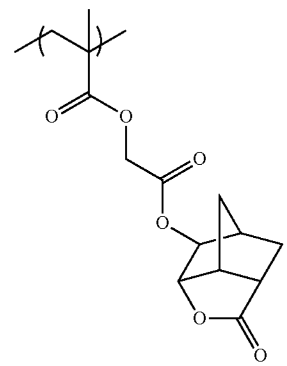
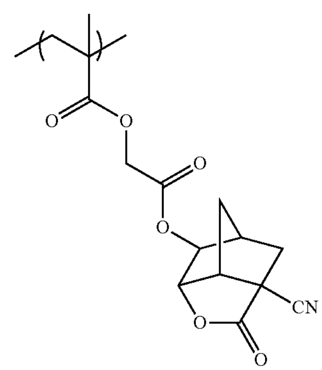
(Ab-157)
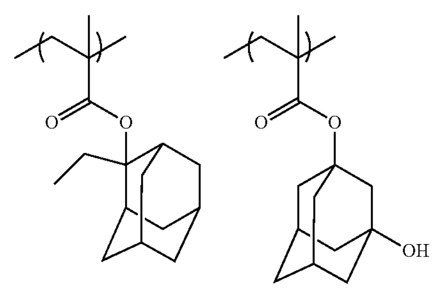
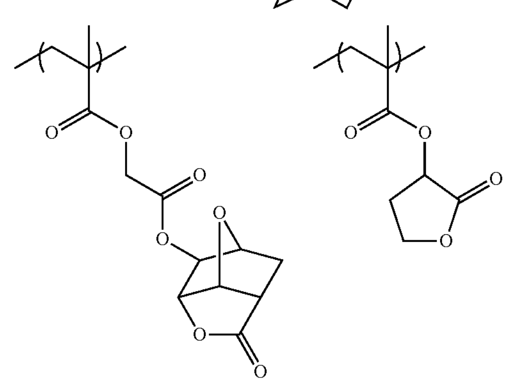

-continued
(Ab-158)
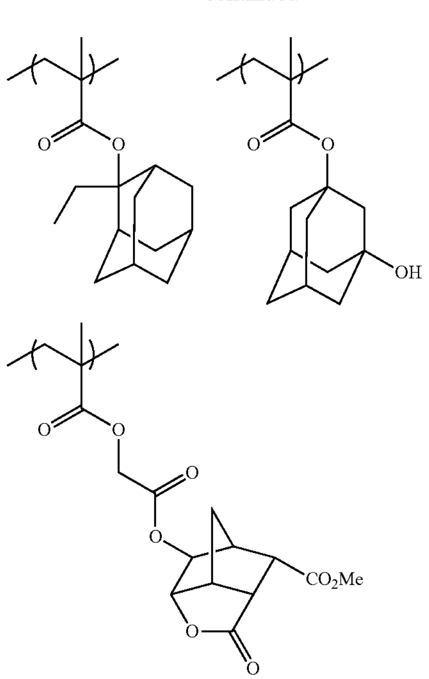
(Ab-159)
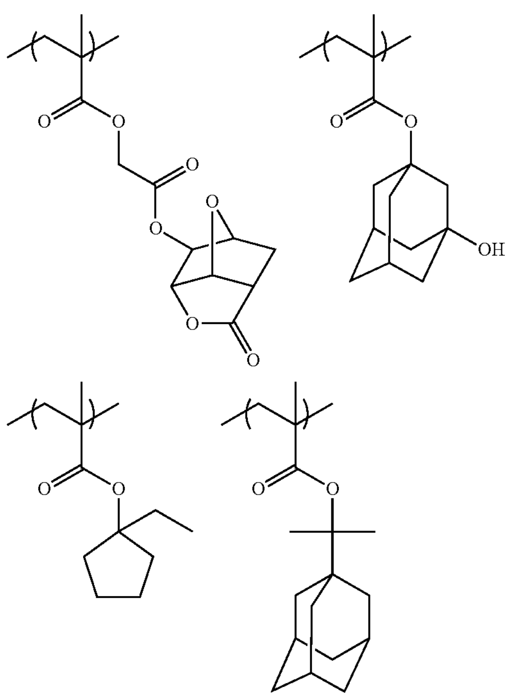
(Ab-160)
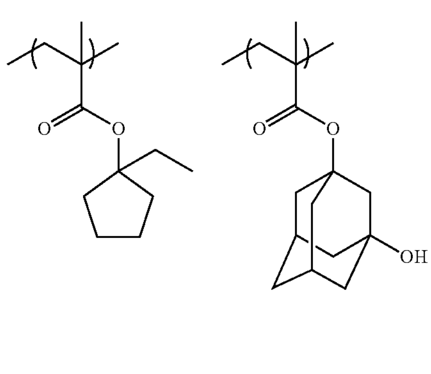
-continued
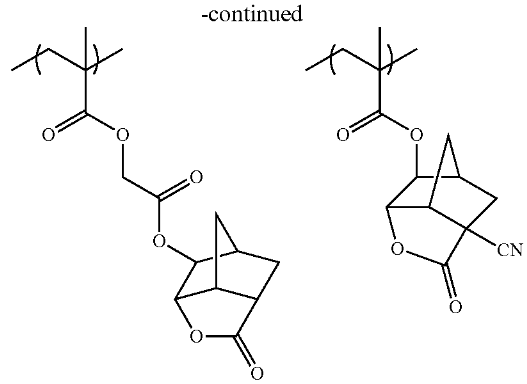
(Ab-161)
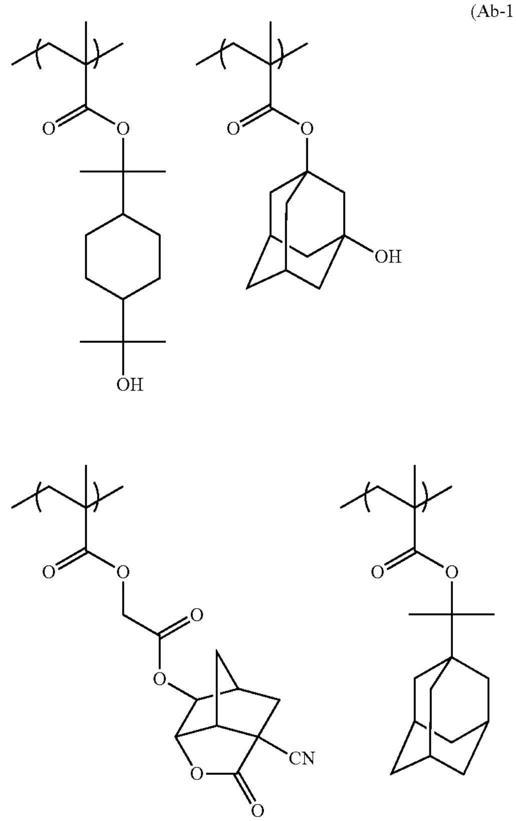
(Ab-162)
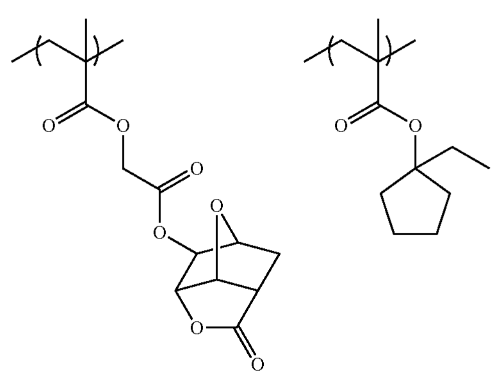

-continued
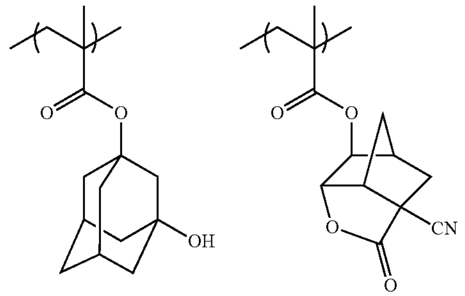
(Ab-163)
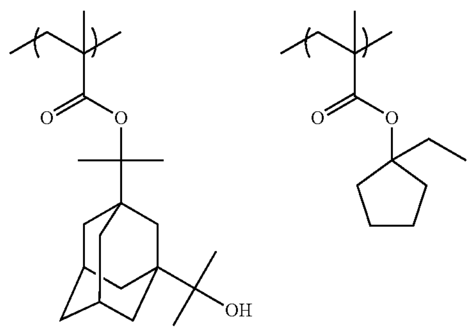
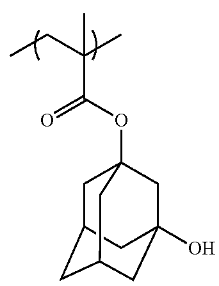
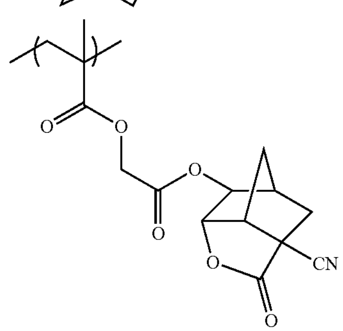
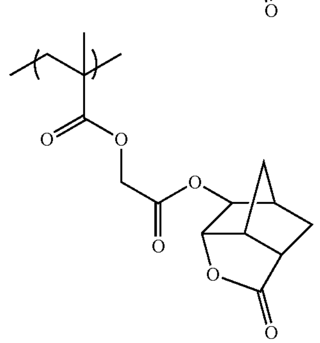
-continued
(Ab-164)
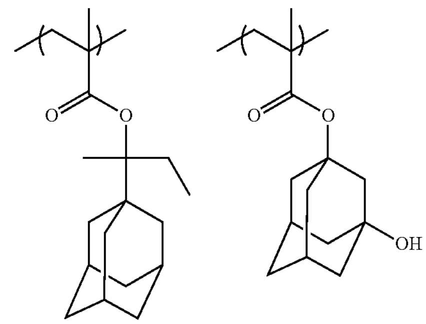
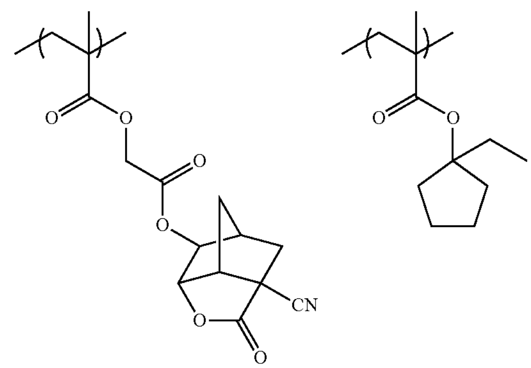
(Ab-165)
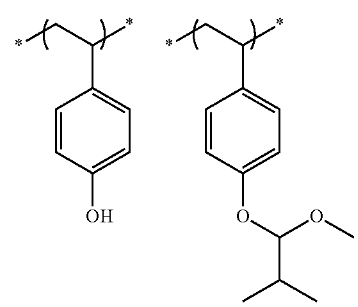
(Ab-166)
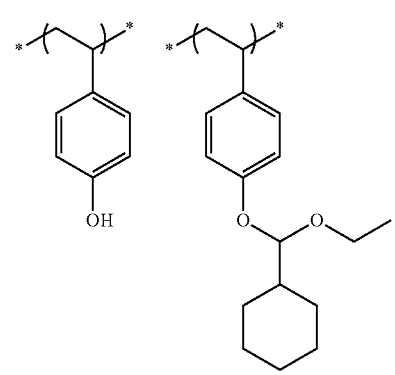

-continued
(Ab-167)
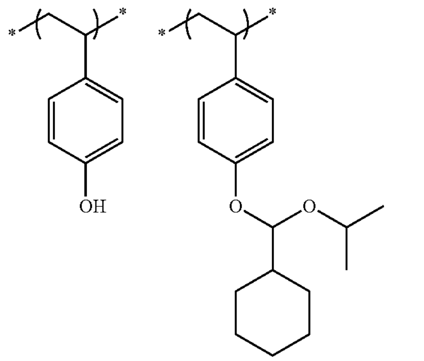
(Ab-168)
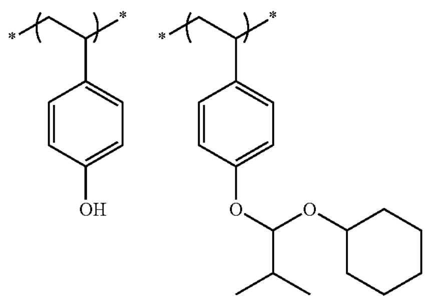
(Ab-169)
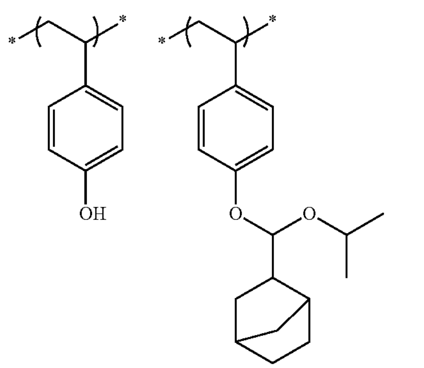
(Ab-170)
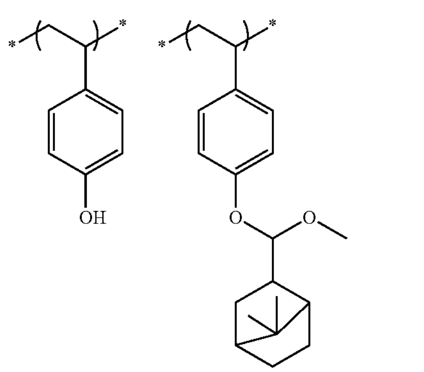
-continued
(Ab-171)
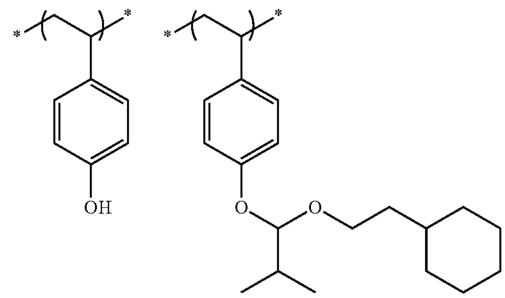
(Ab-172)
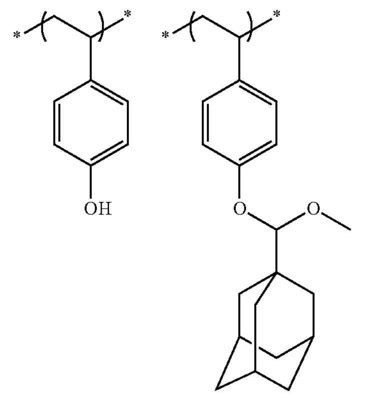
(Ab-173)
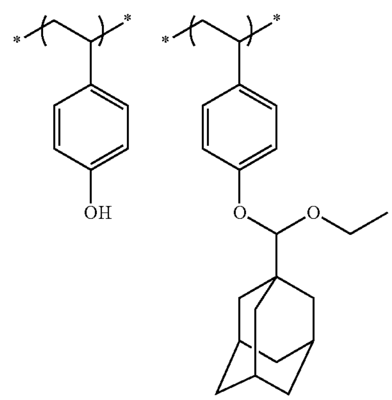
(Ab-174)
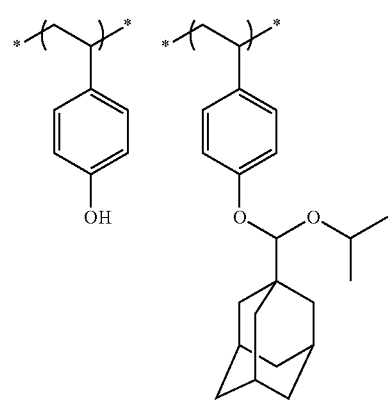

-continued
(Ab-175)
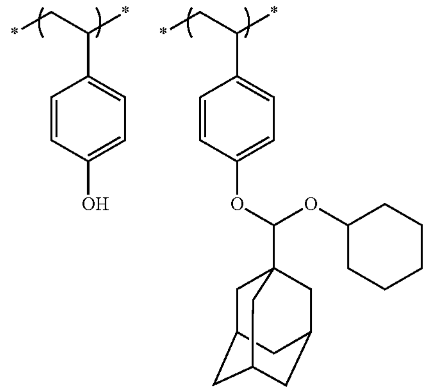
(Ab-176)
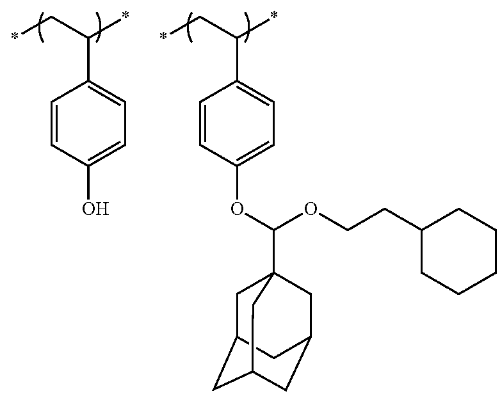
Ab-177
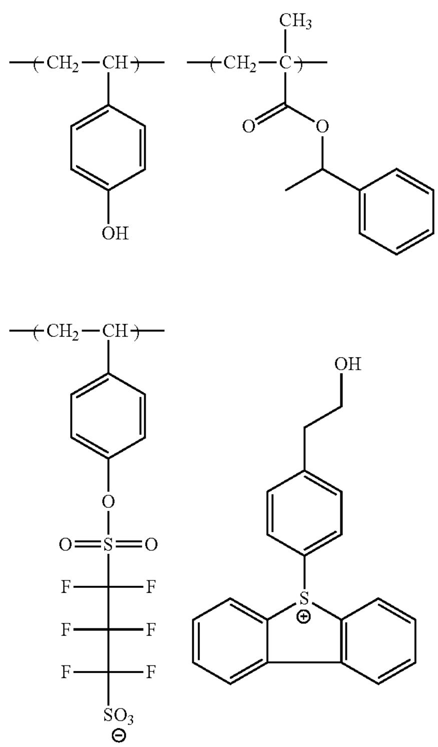
-continued
Ab-178
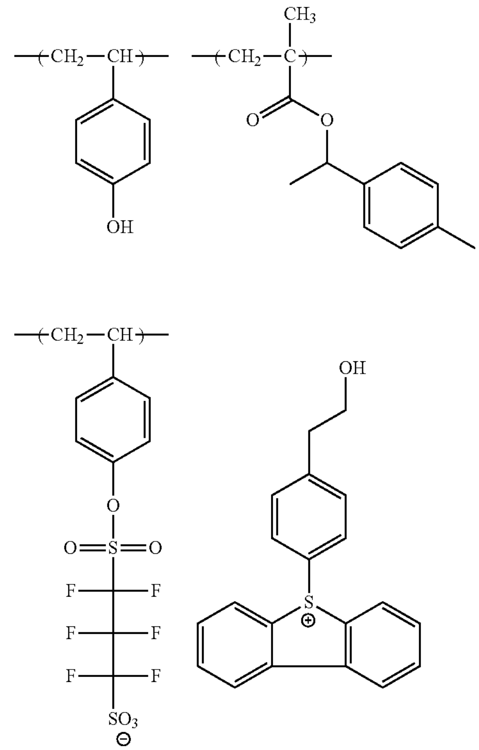
Ab-179
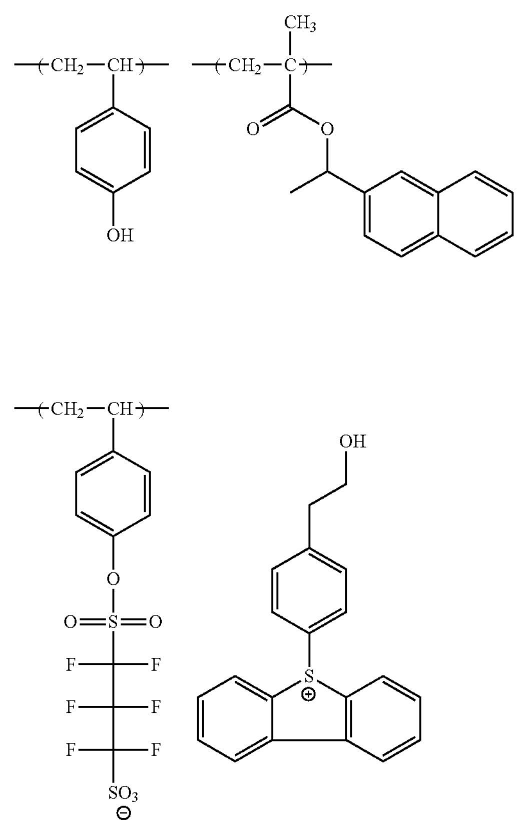

-continued
Ab-180
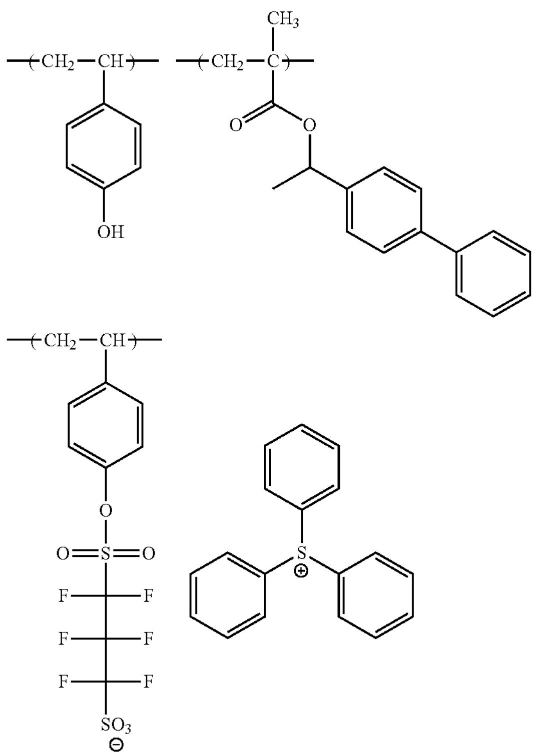
Ab-181
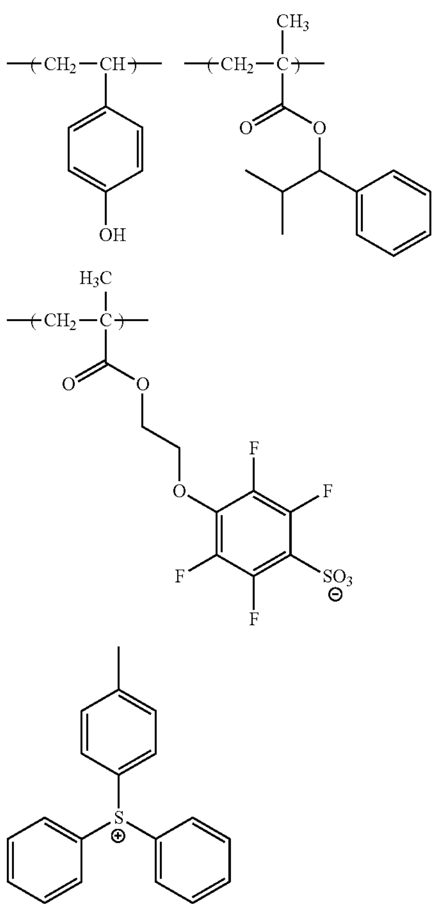
-continued
Ab-182
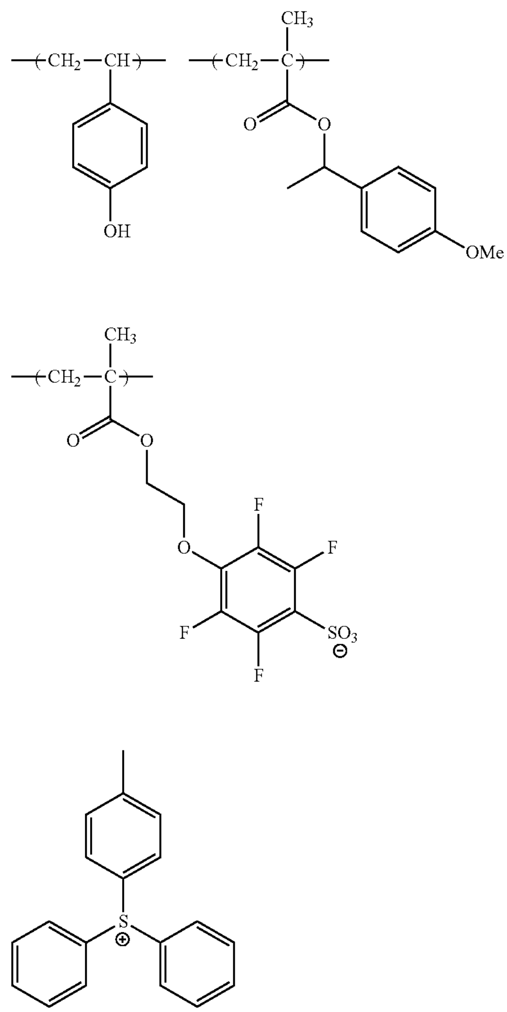
Ab-183
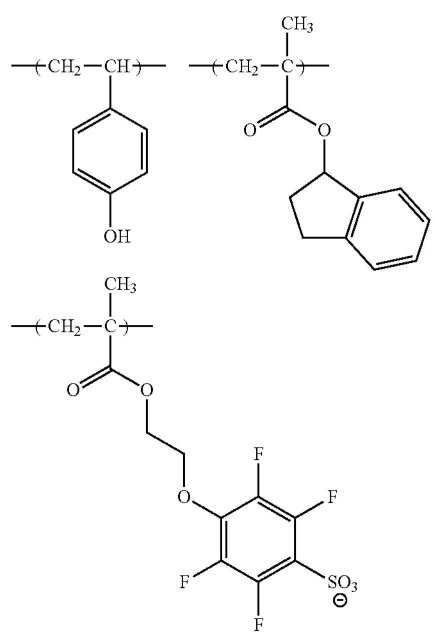

-continued
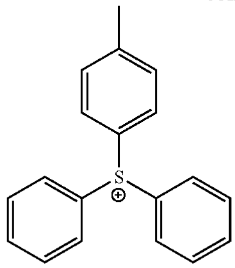
Ab-184
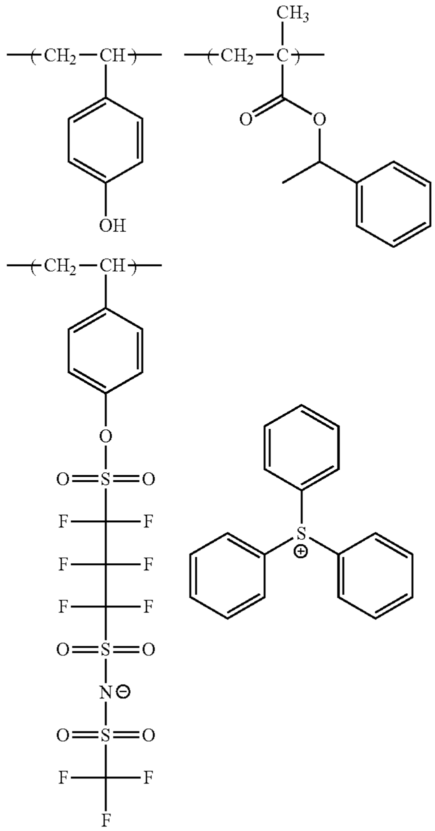
Ab-185
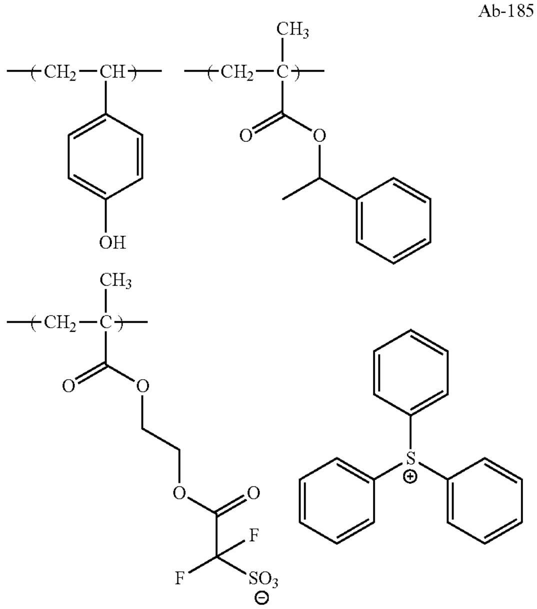
-continued
Ab-186
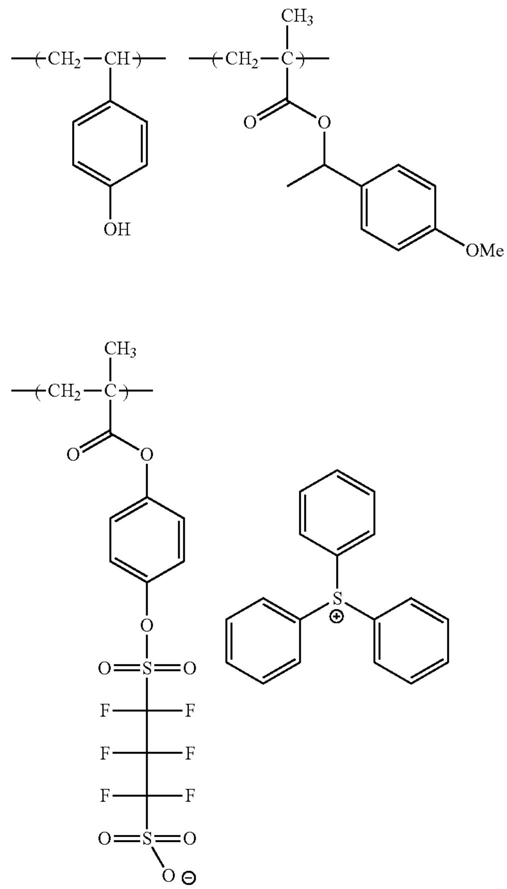
Ab-187
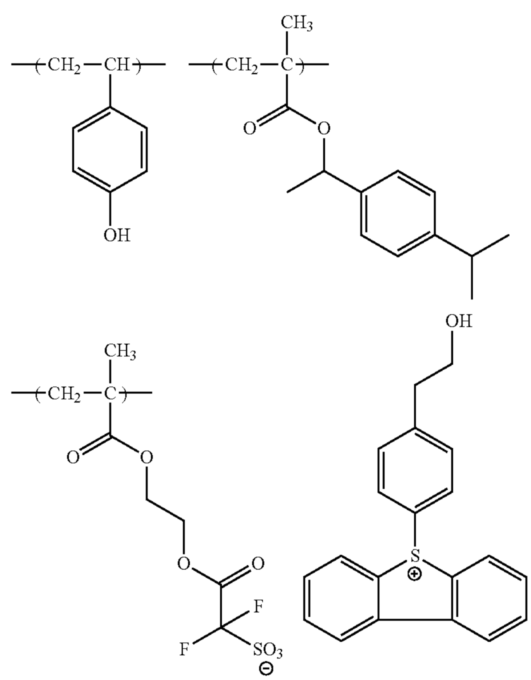

Ab-188
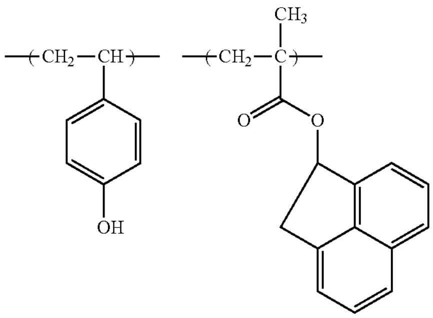
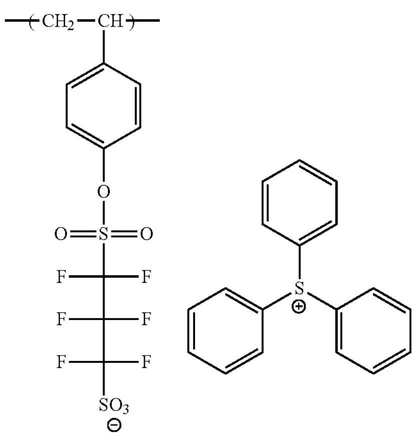
Ab-189
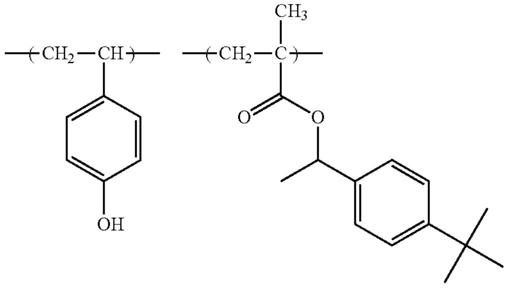
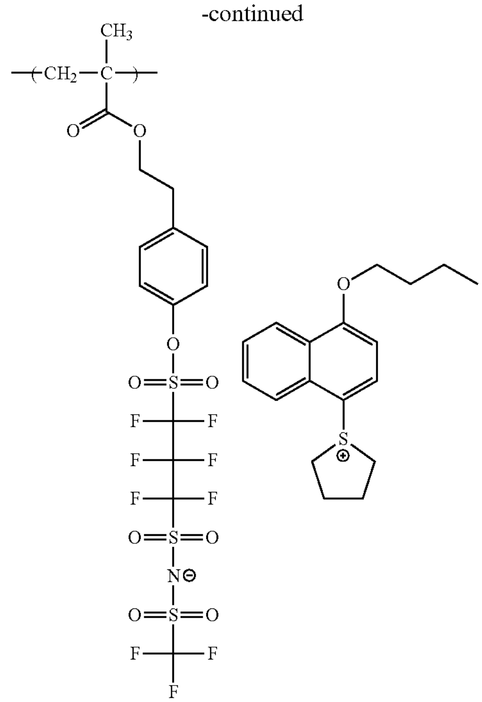
Ab-190
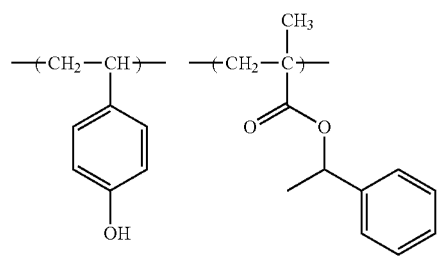
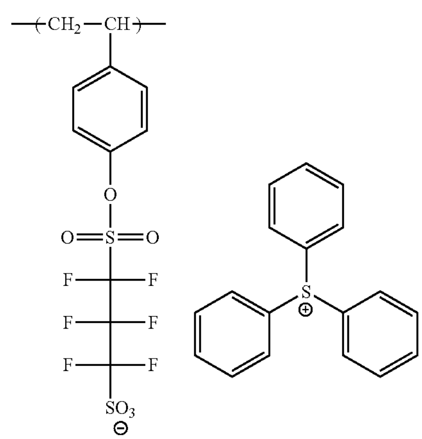
Ab-191
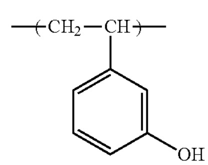

-continued
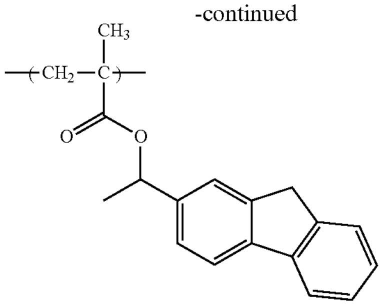
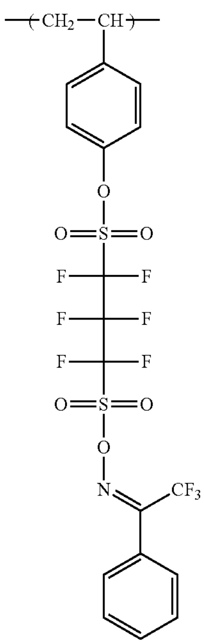
Ab-192
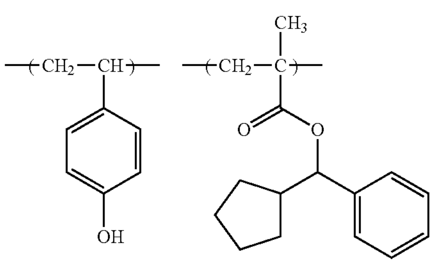
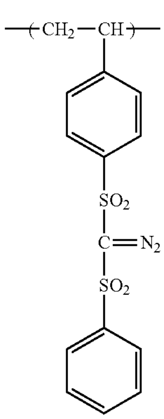
Ab-193
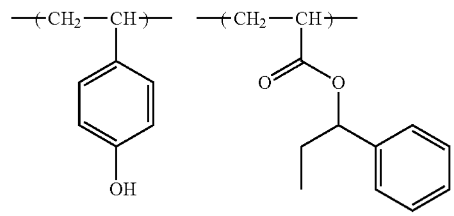
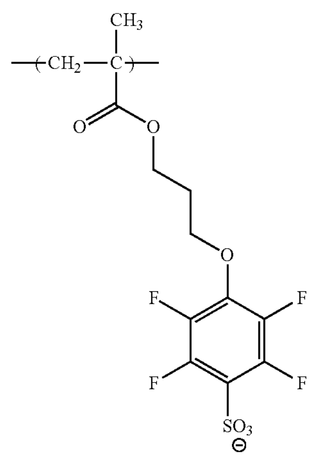
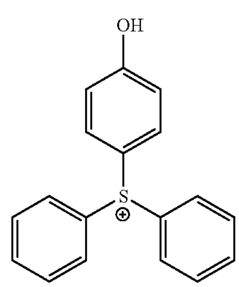
Ab-194
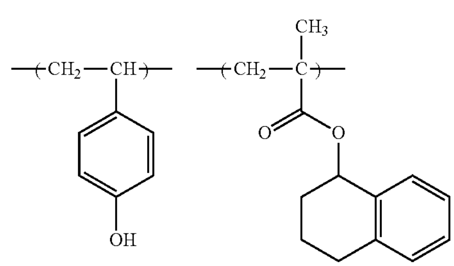

-continued
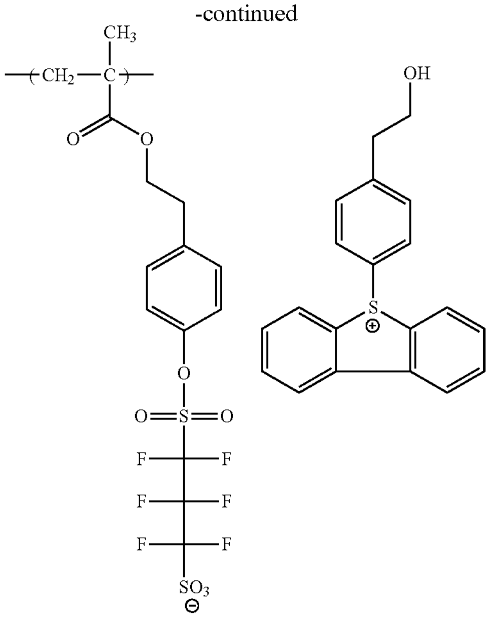
Ab-195
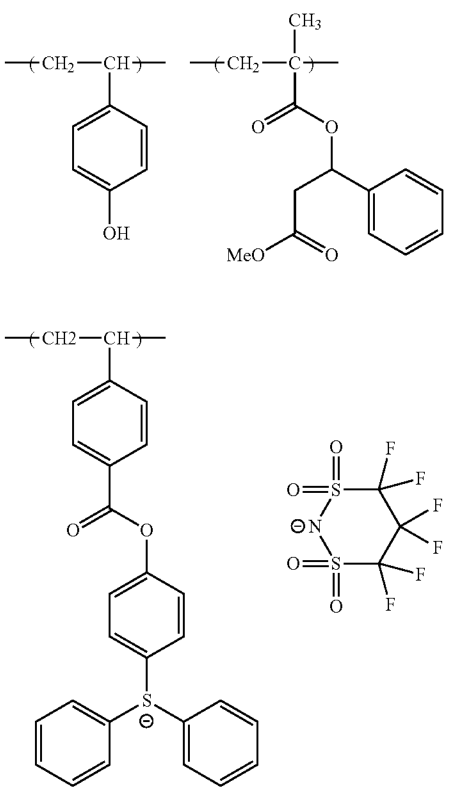
Ab-196
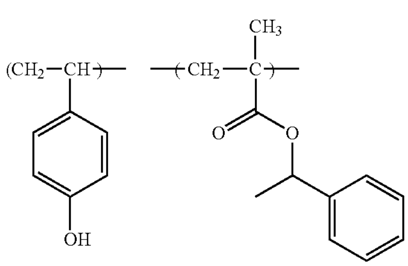
-continued
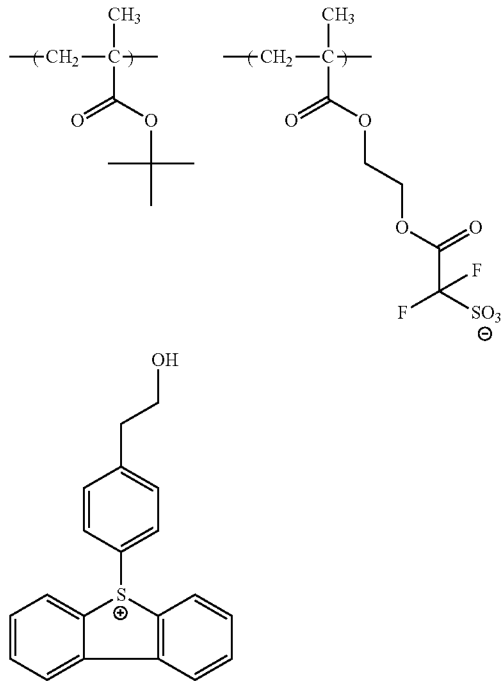
Ab-197
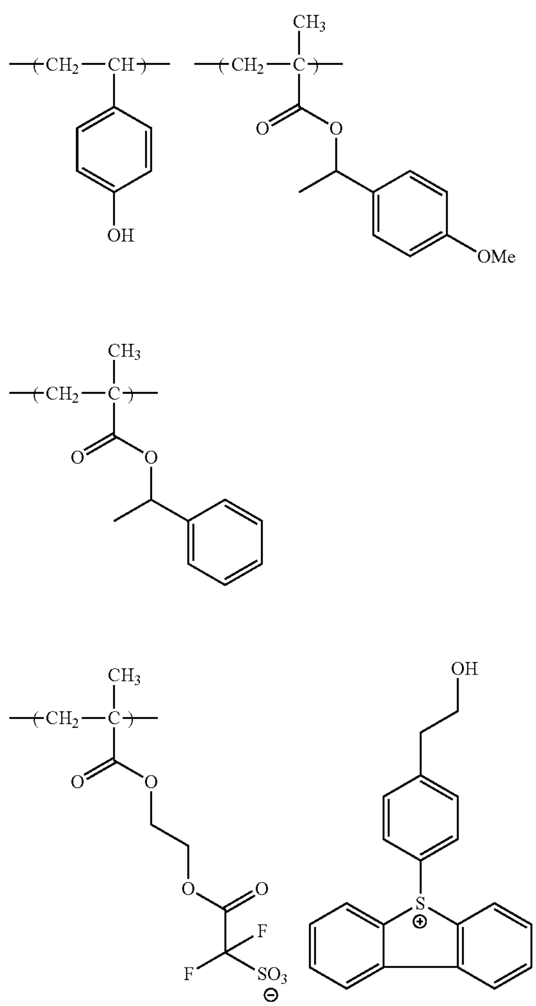

-continued
Ab-198
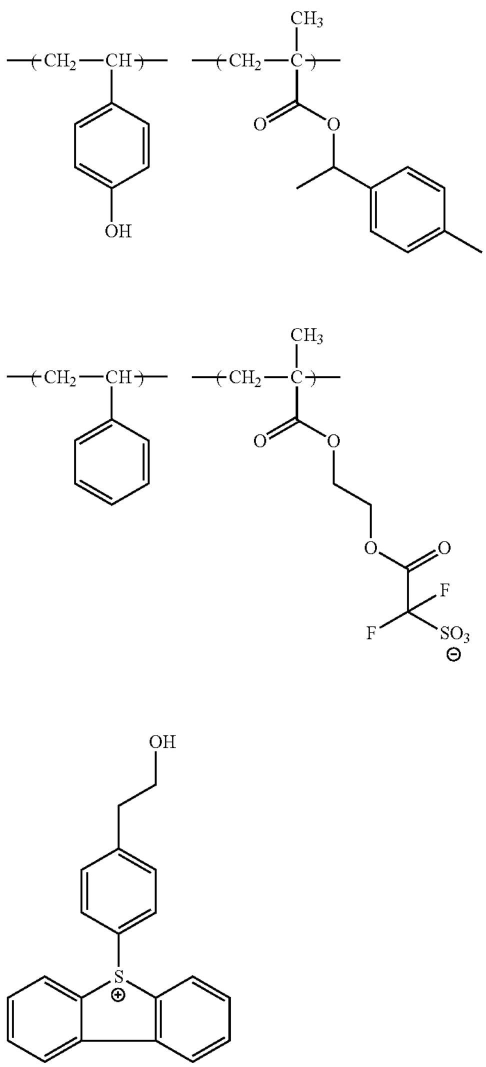
Ab-199
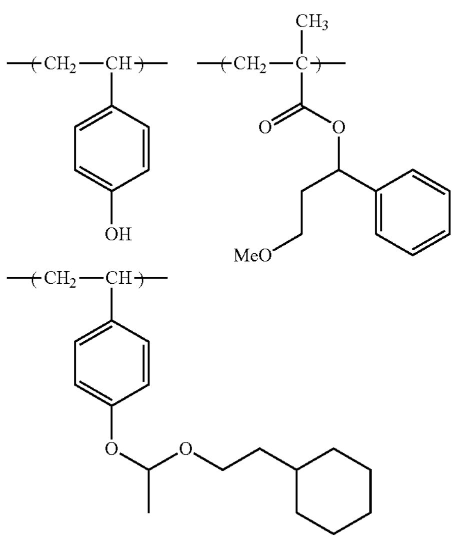
-continued
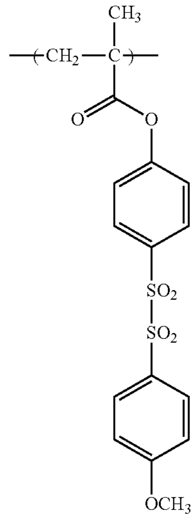
Ab-200
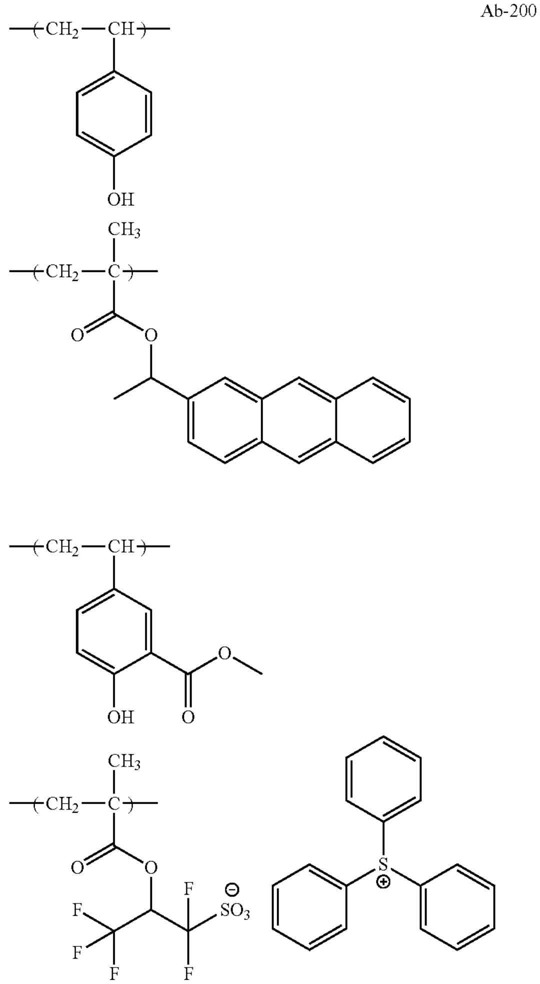
Ab-201
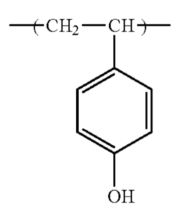

-continued
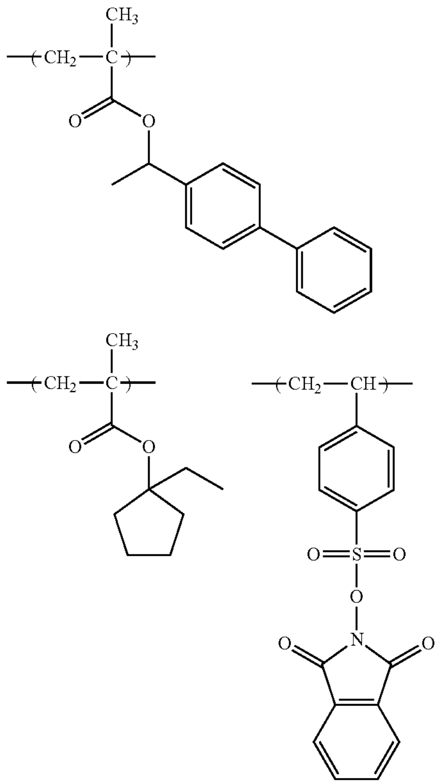
Ab-202
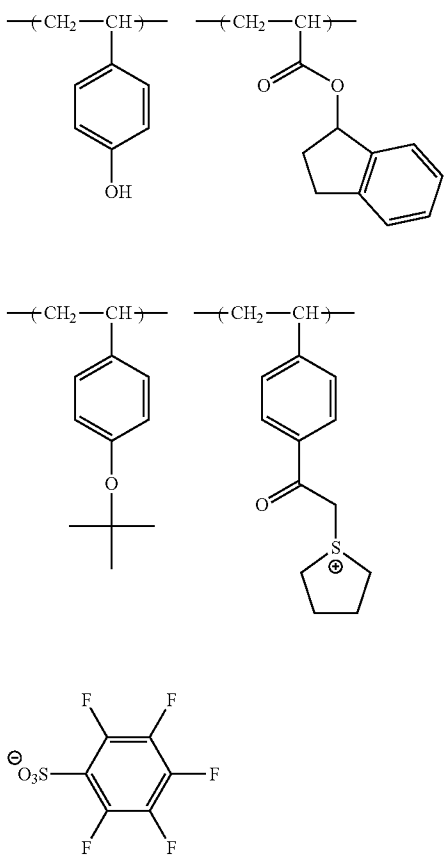
-continued
Ab-203
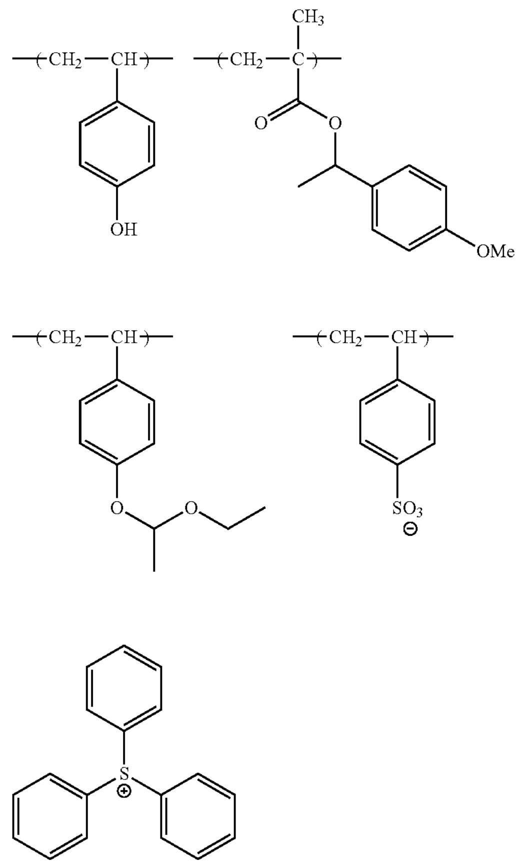
Ab-204
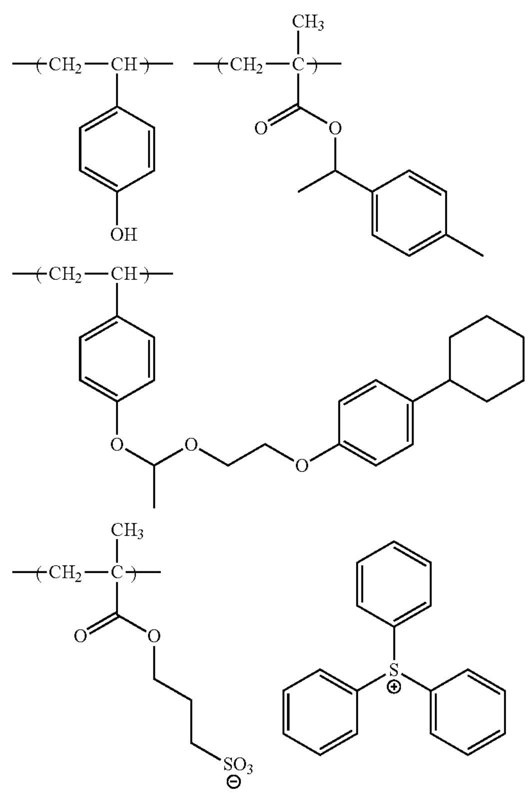

-continued
Ab-205
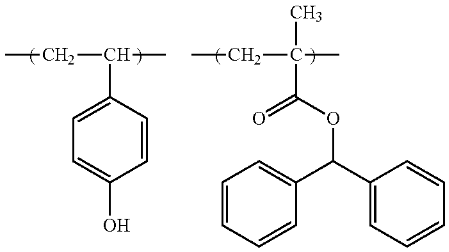
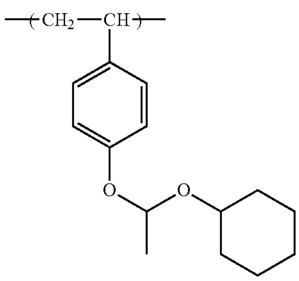
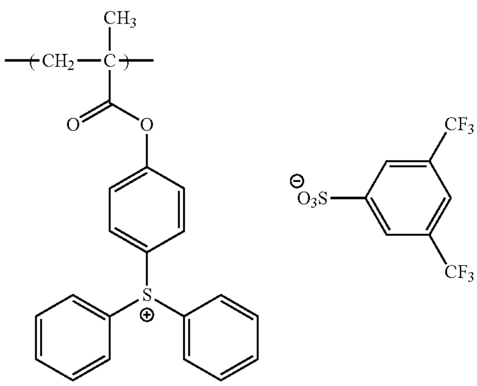
Ab-206
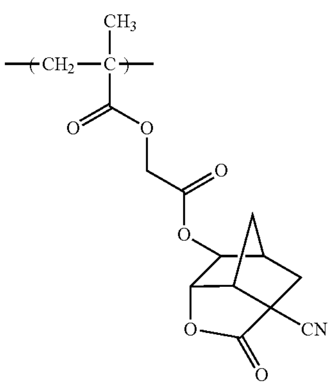
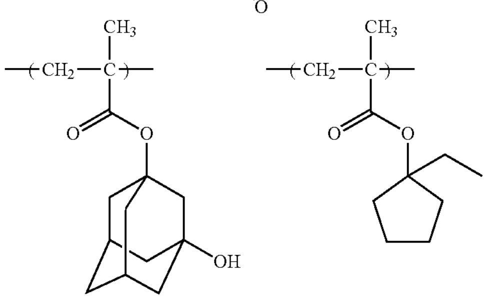
-continued
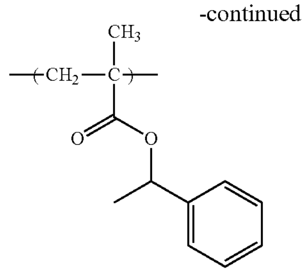
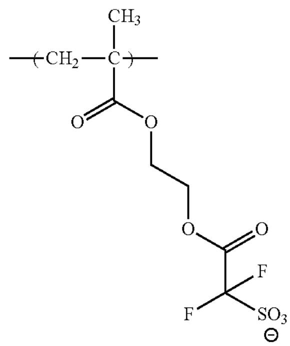
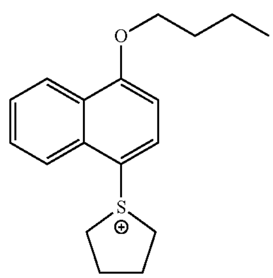
Ab-207
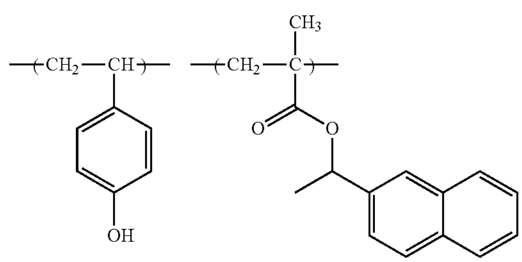
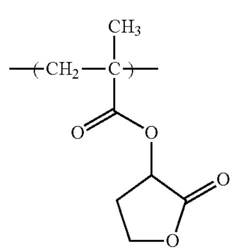

-continued
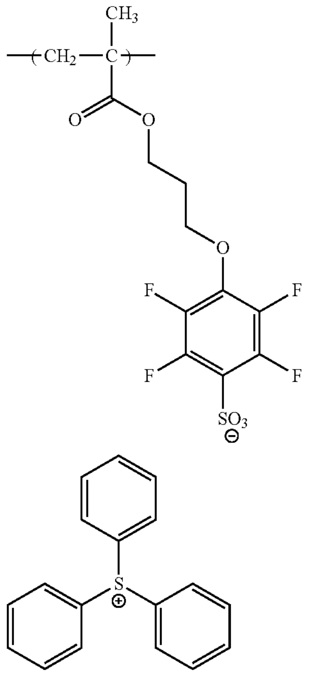
Ab-208
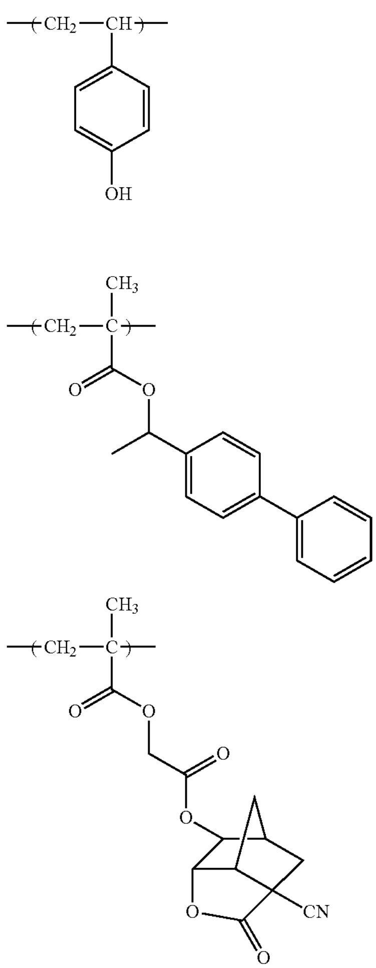
-continued
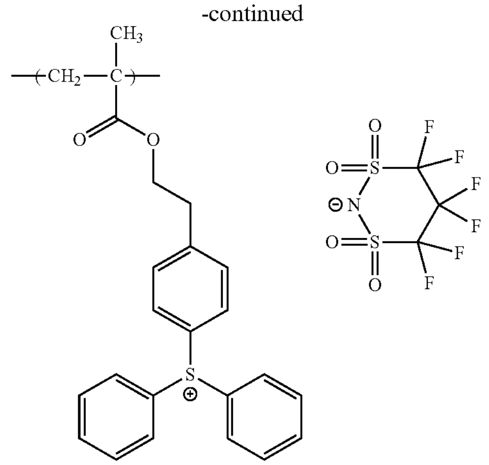
Ab-209
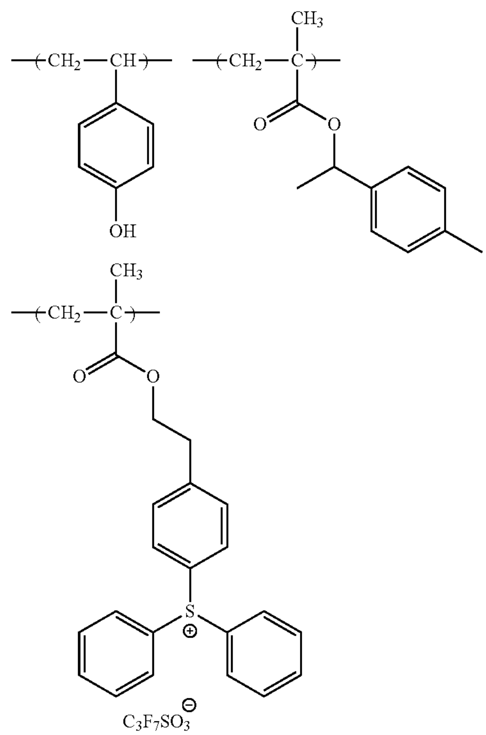
Ab-210
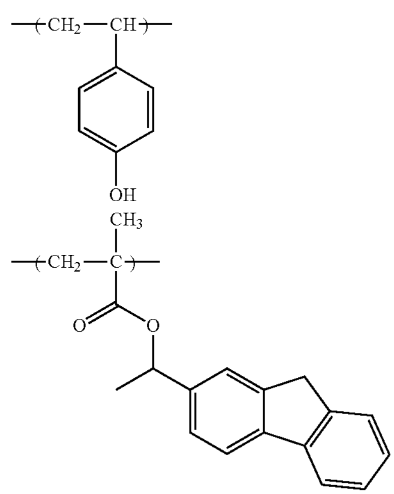

-continued
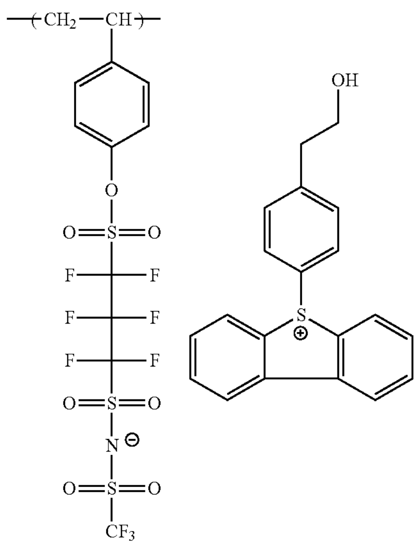
Ab-211
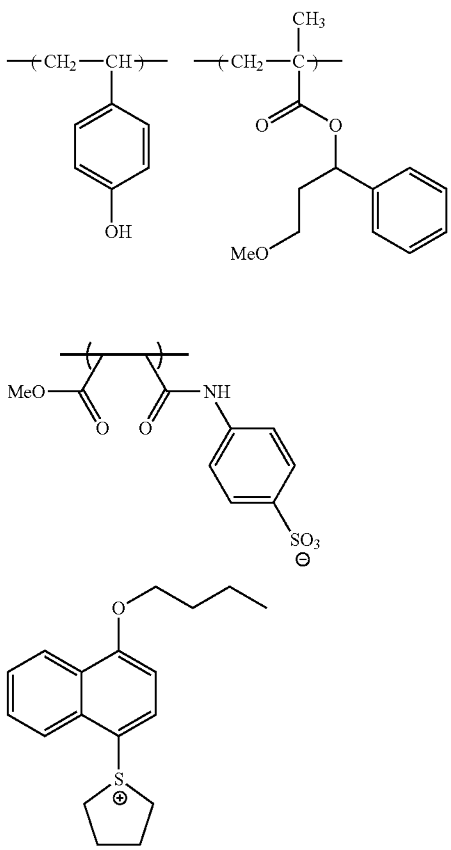
Ab-212
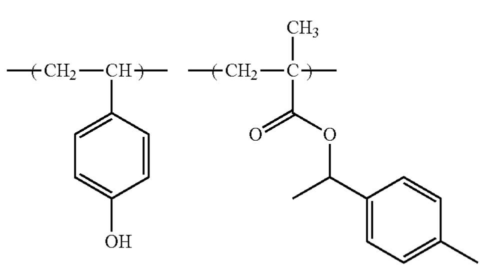
-continued
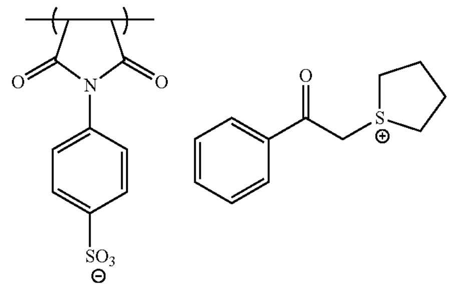
Ab-213
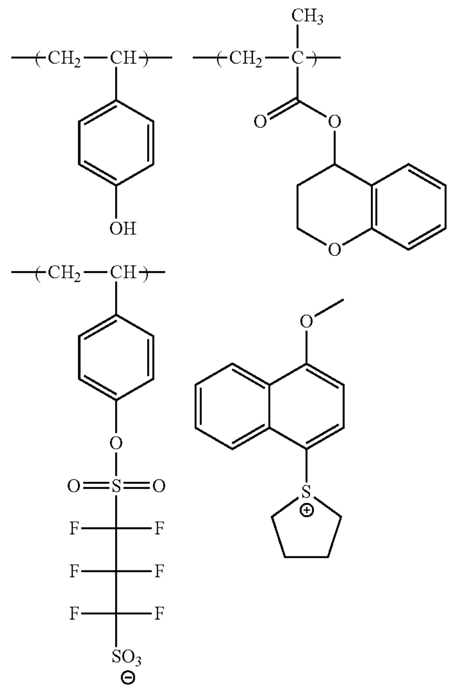
Ab-214
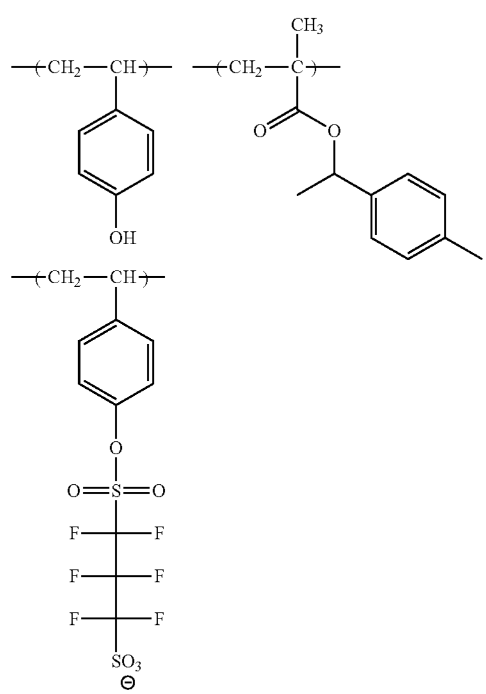

-continued
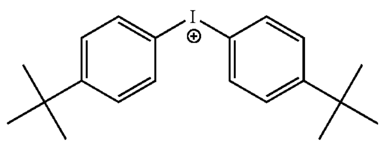
Ab-215
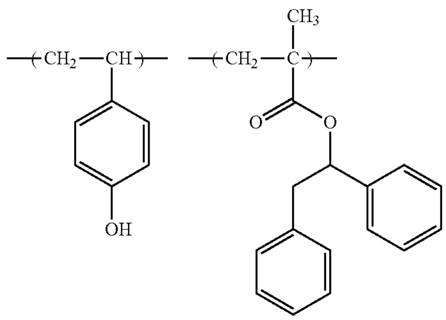
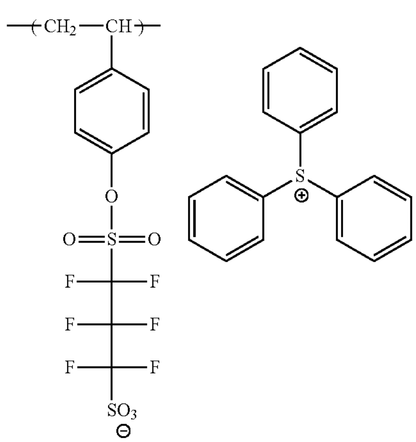
Ab-216
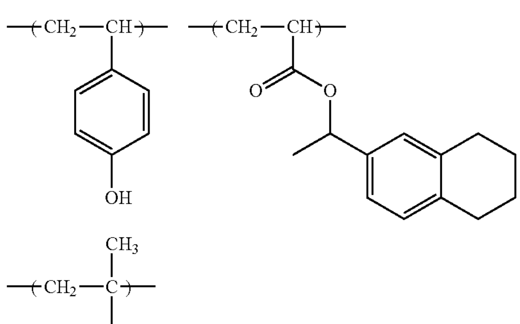
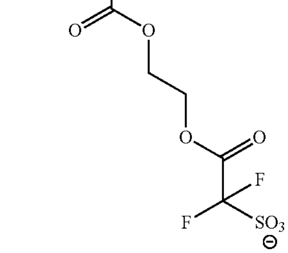
-continued
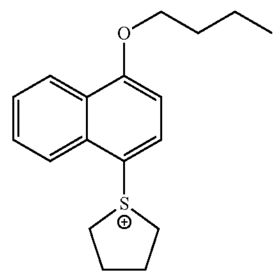
Ab-217
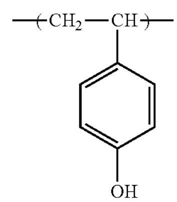
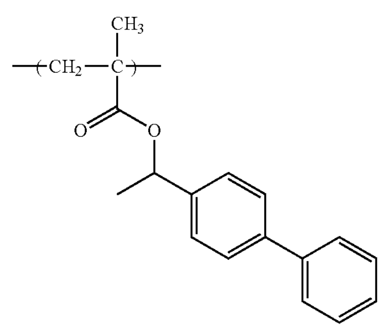
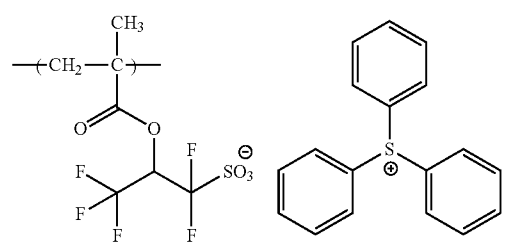
Ab-218
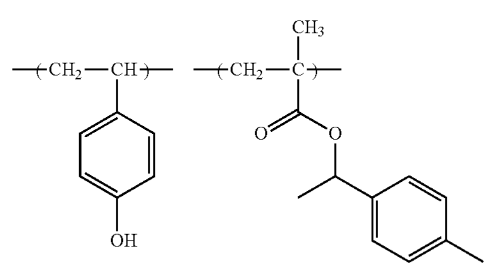

-continued
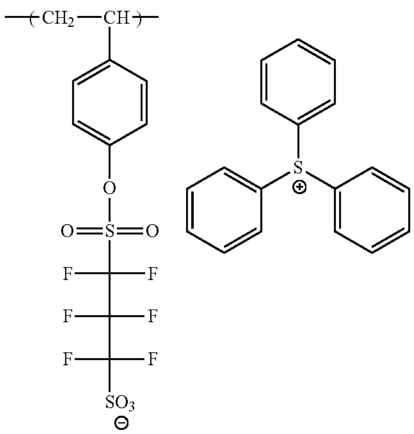
Ab-219
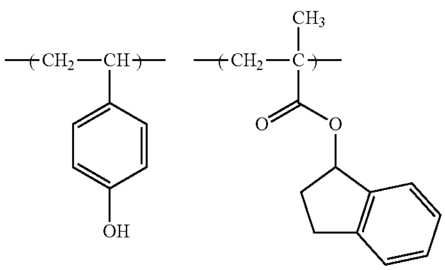
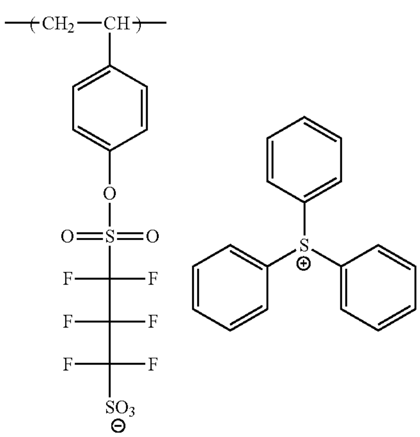
Ab-220
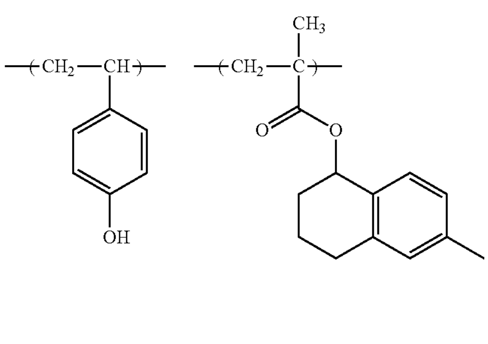
-continued
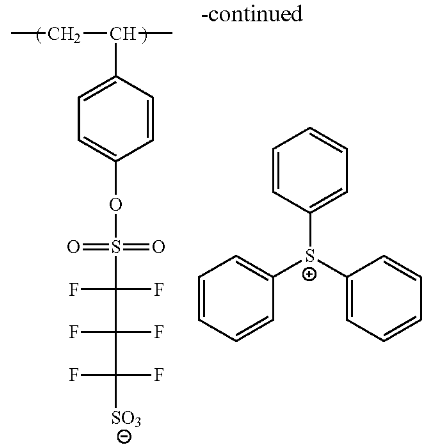
Ab-221
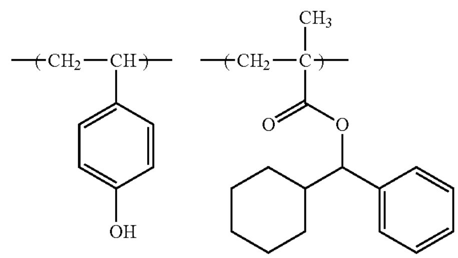
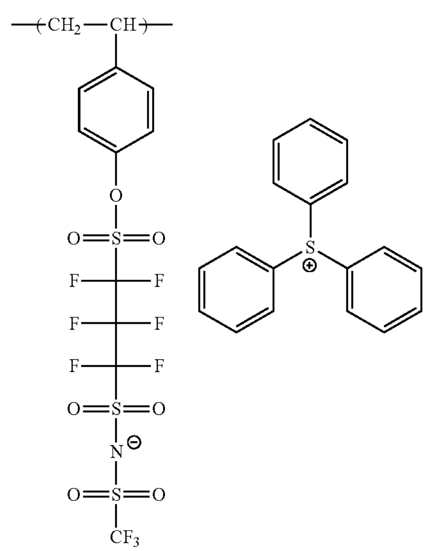
Ab-222
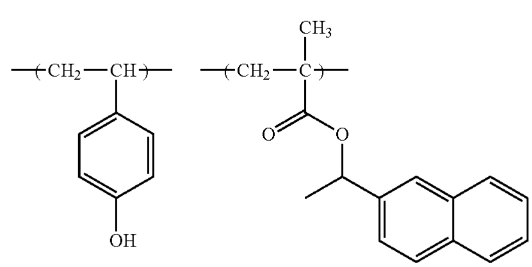

-continued
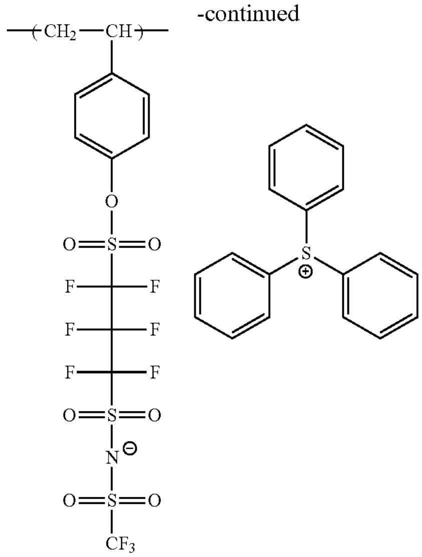
Ab-223
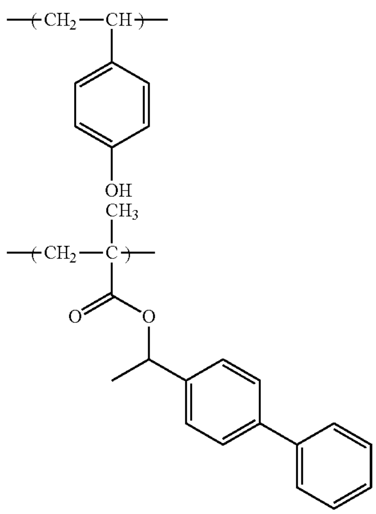
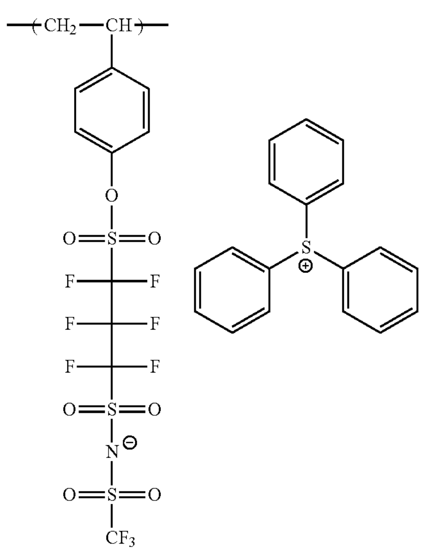
-continued
Ab-224
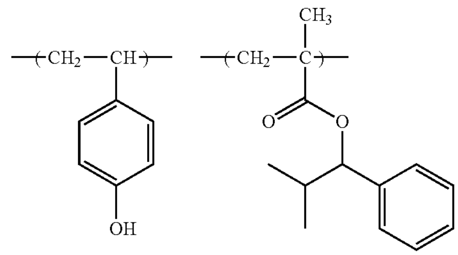
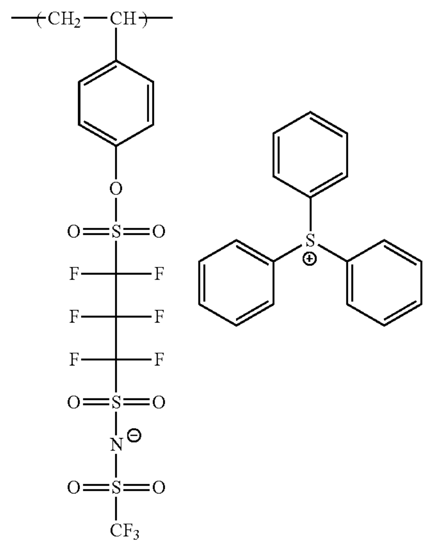
Ab-225
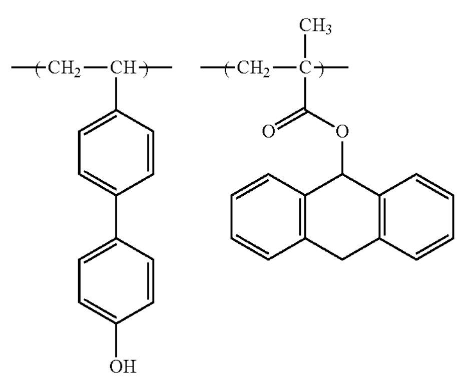

-continued
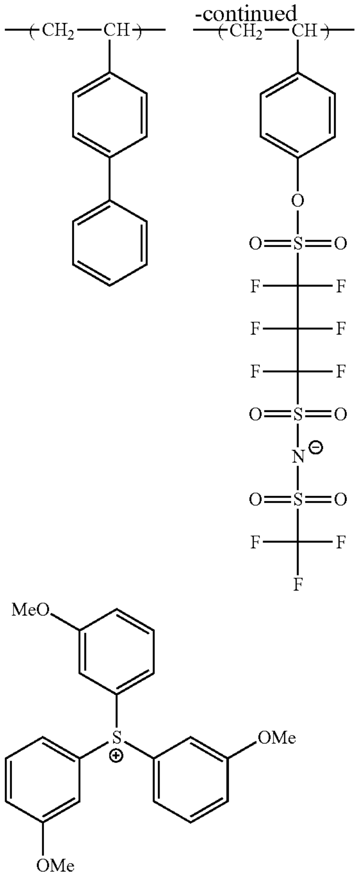
Ab-226
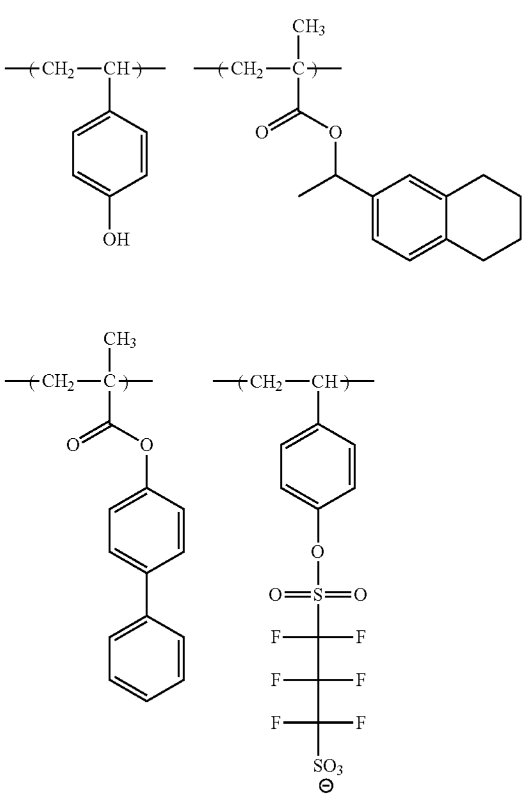
-continued
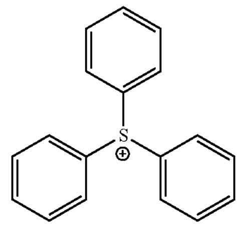
Ab-227
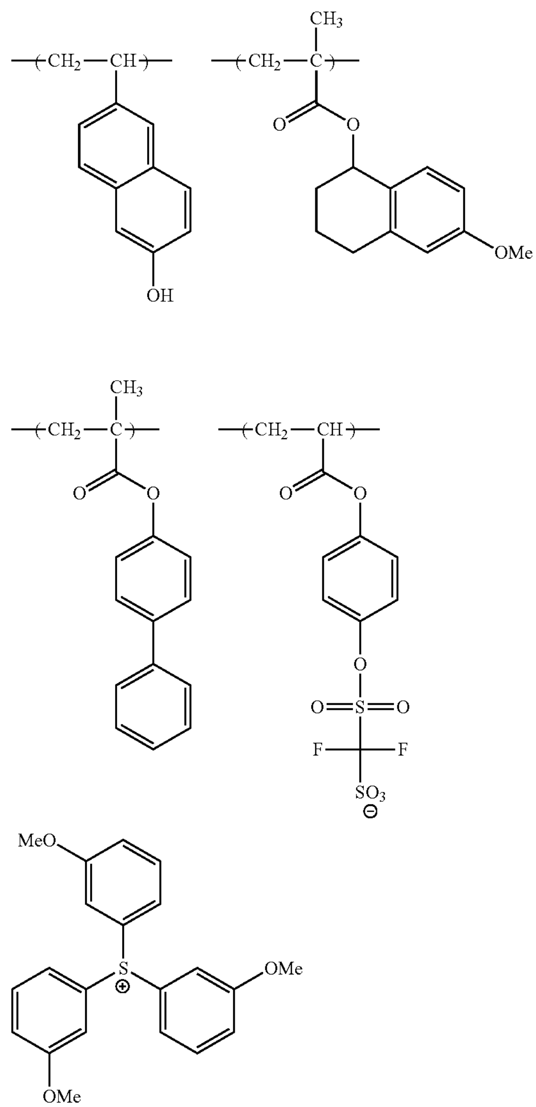
Ab-228
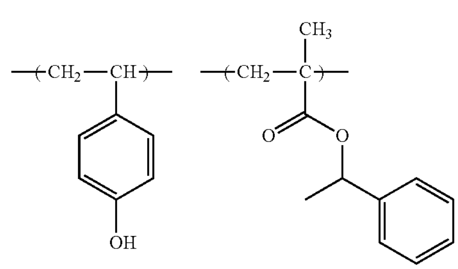

-continued
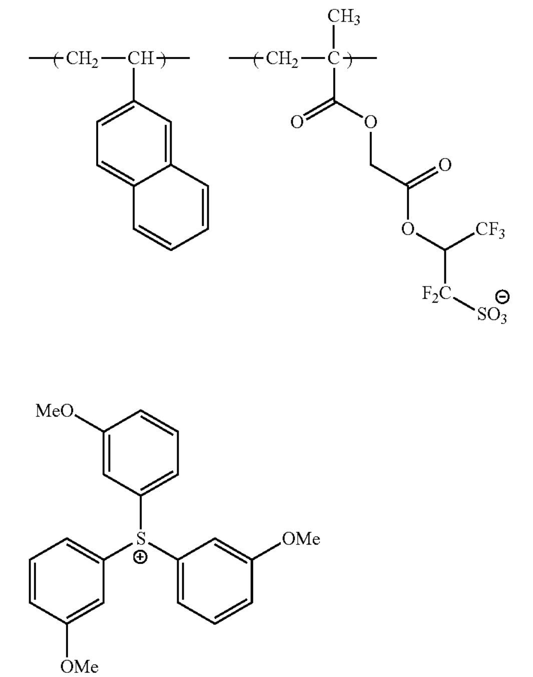
Ab-229
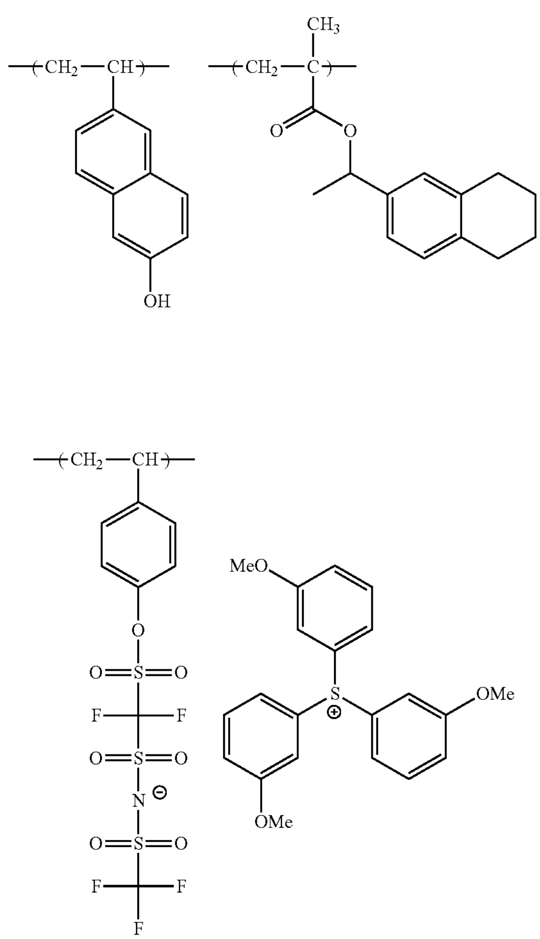
Ab-230
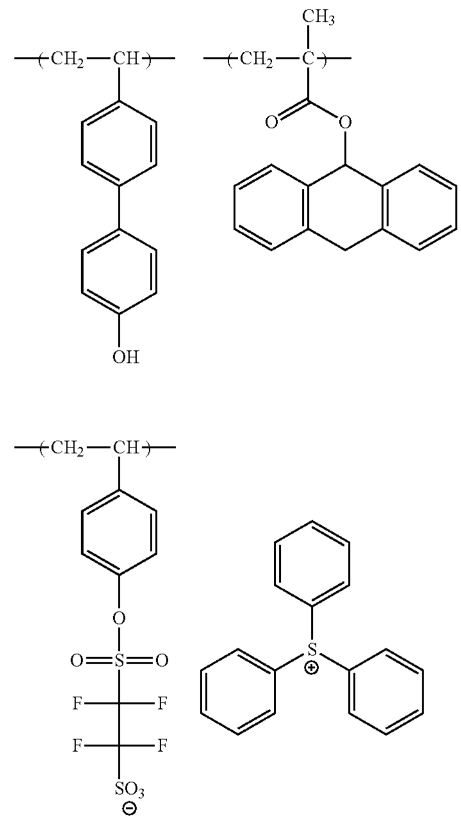
Ab-231
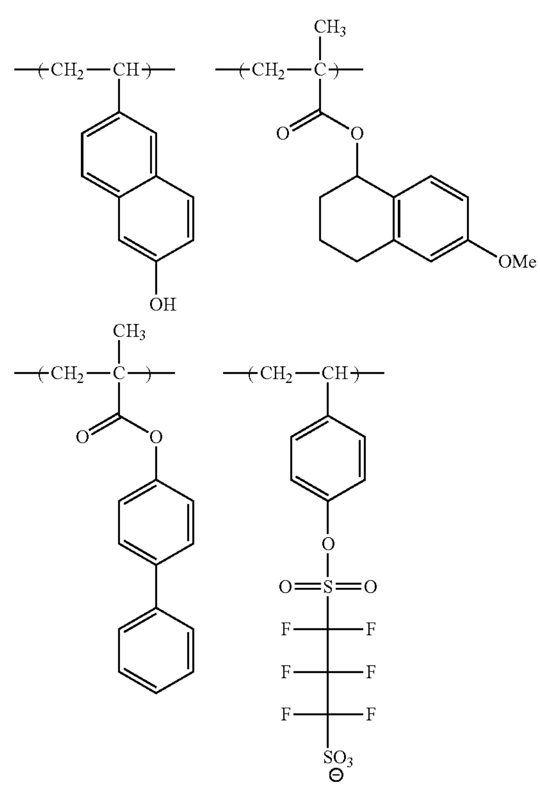

-continued
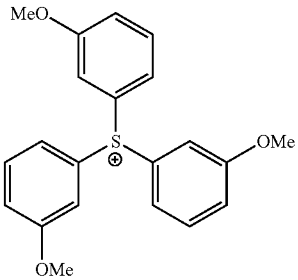
Ab-232
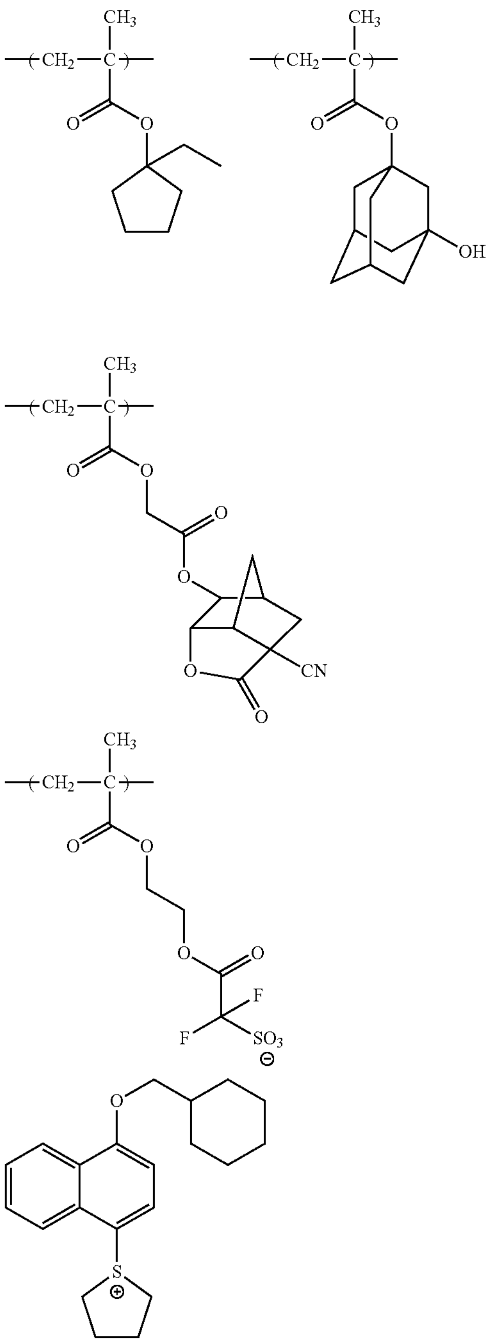
-continued
Ab-233
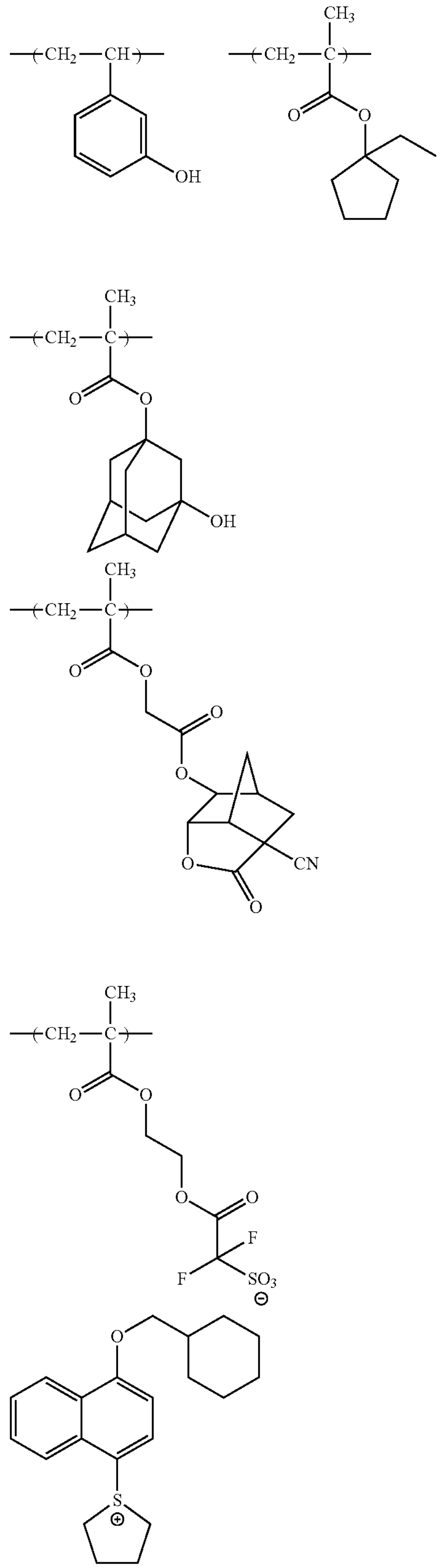

-continued
Ab-234
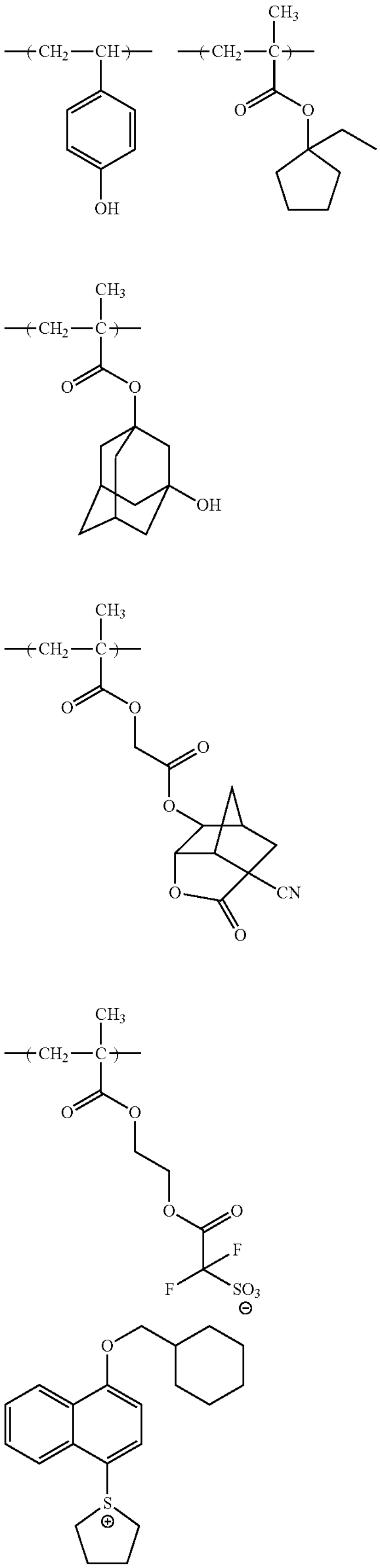
-continued
Ab-235
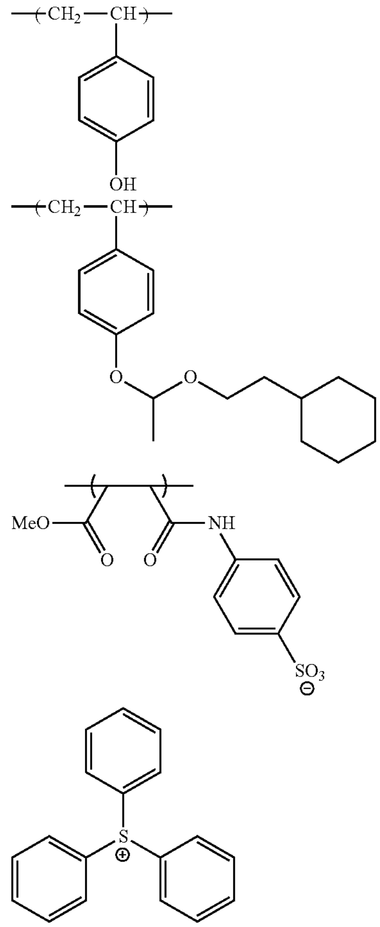
Ab-236
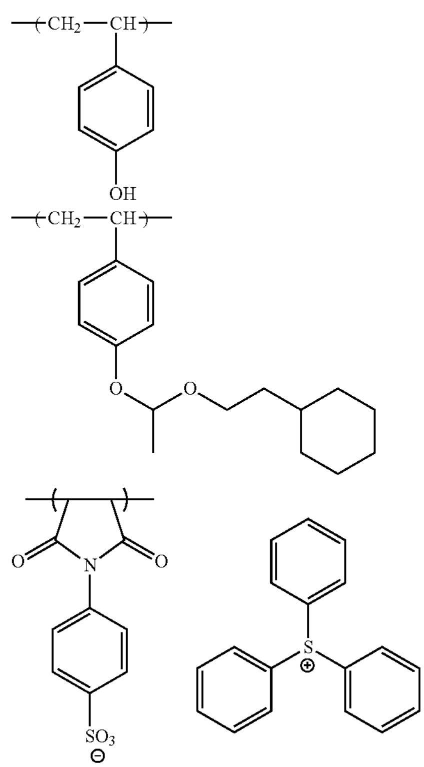

-continued
Ab-237
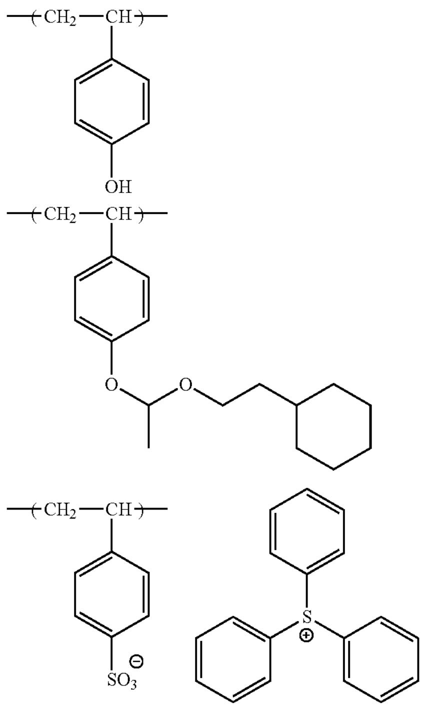
Ab-238
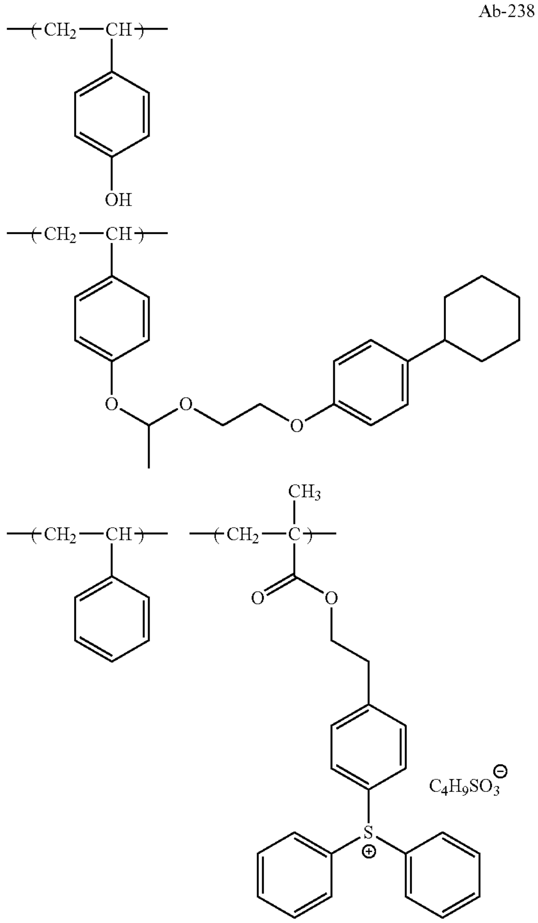
-continued
Ab-239
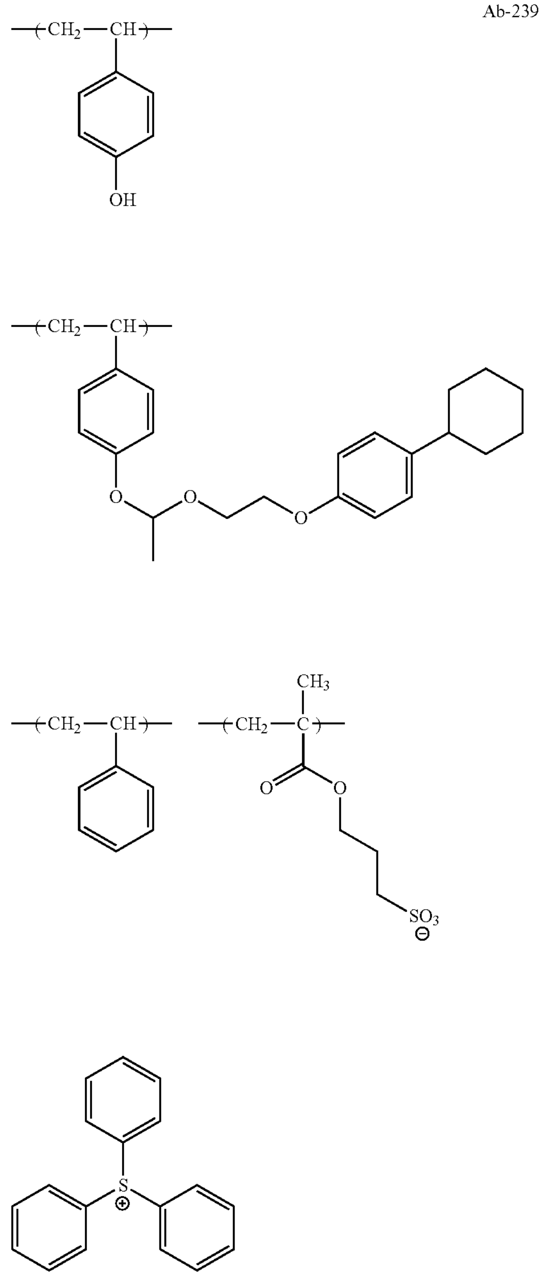
Ab-240
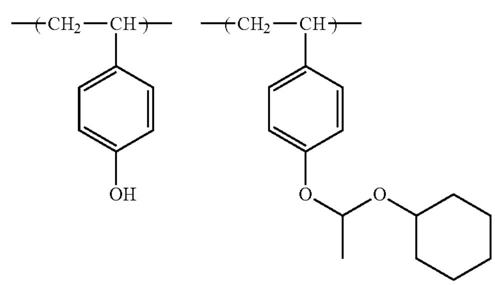

-continued
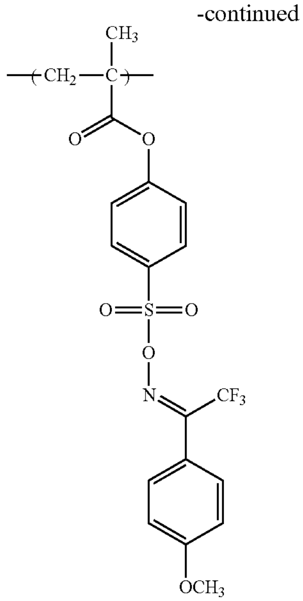
Ab-241
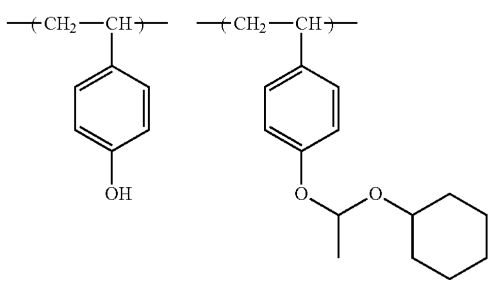
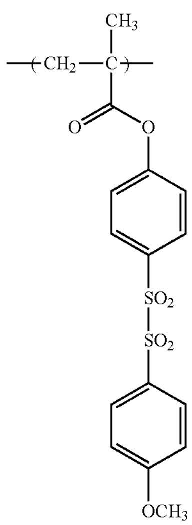
Ab-242
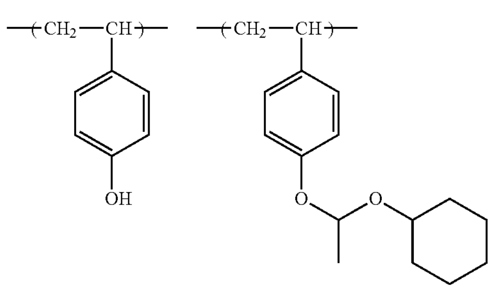
-continued
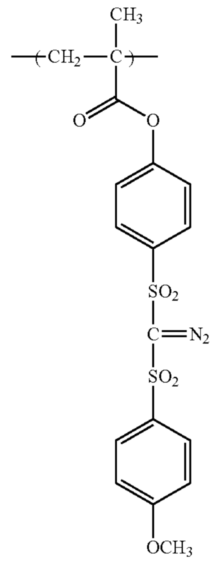
Ab-243
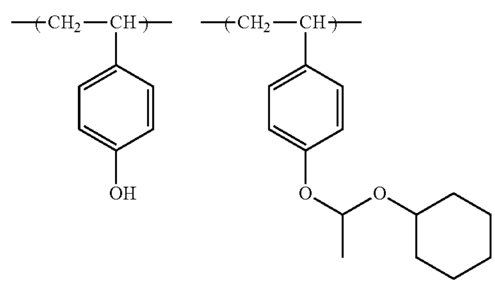
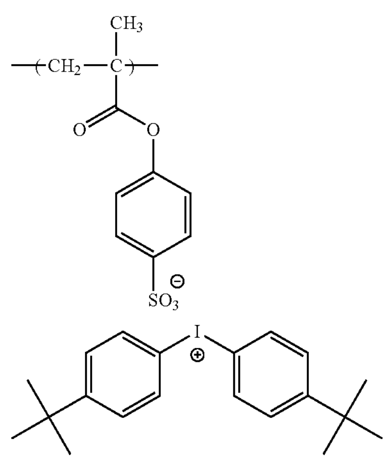
Ab-244
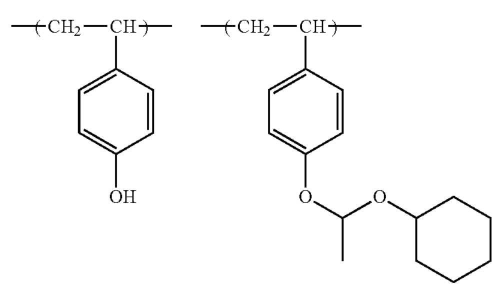

-continued
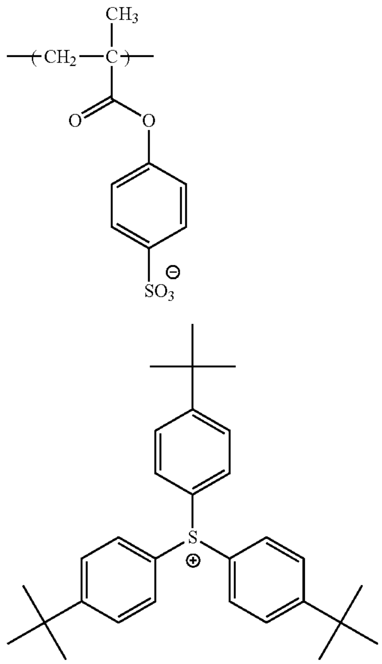
Ab-245
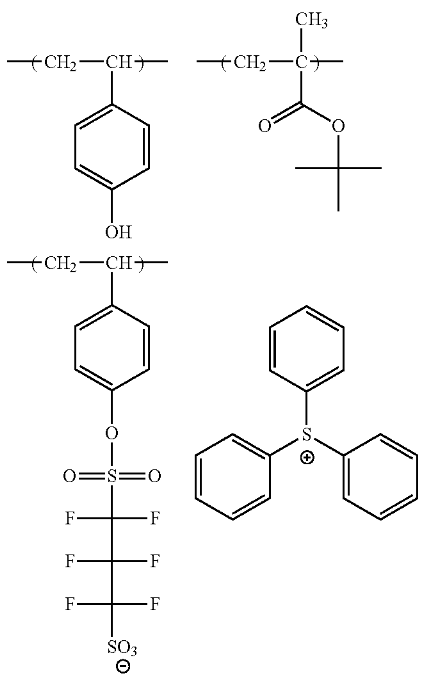
Ab-246
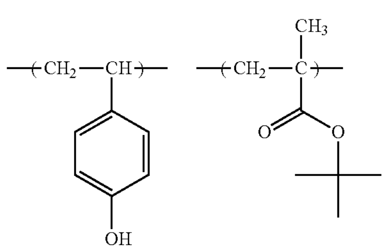
-continued
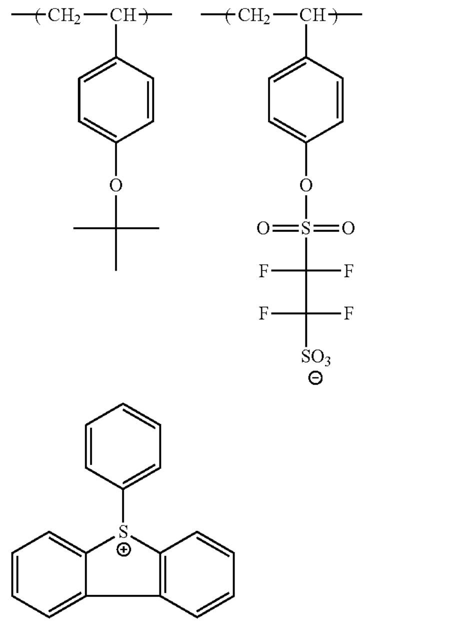
Ab-247
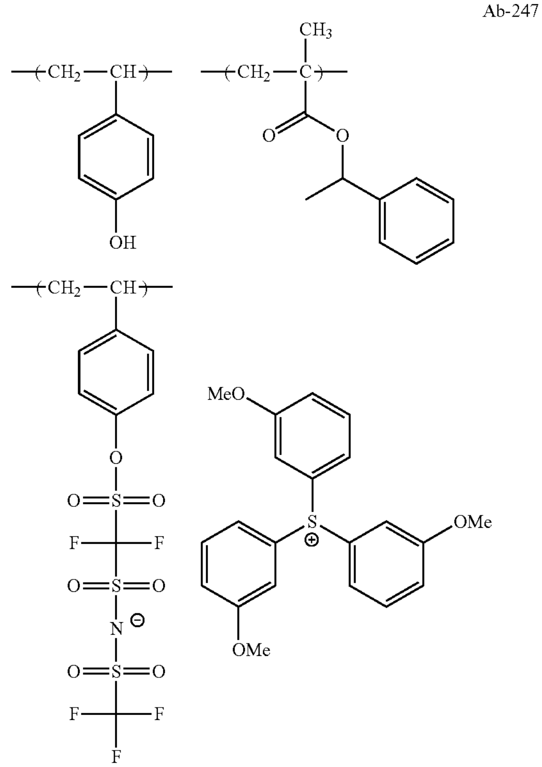
Ab-248
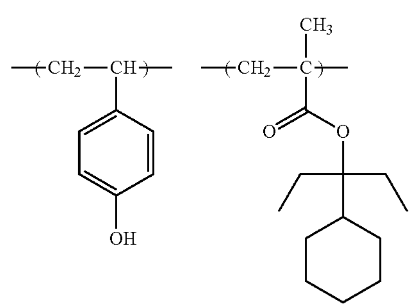

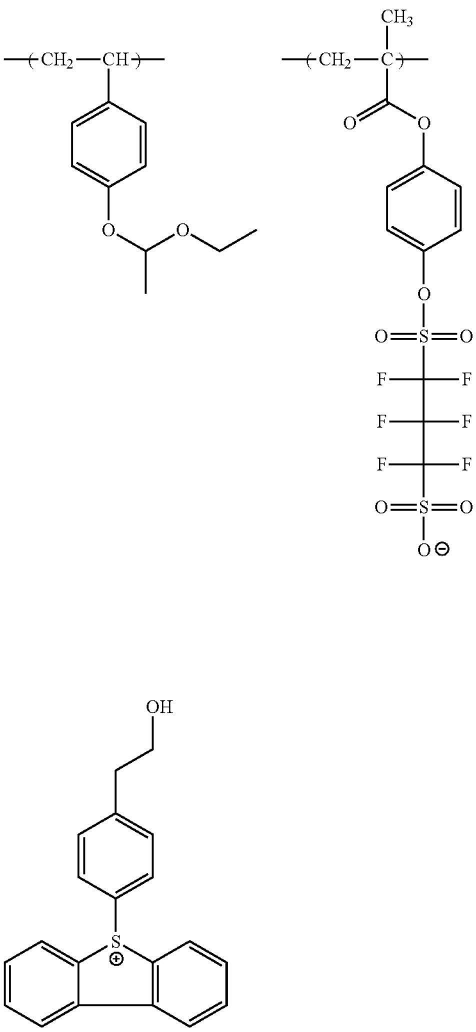
Ab-249
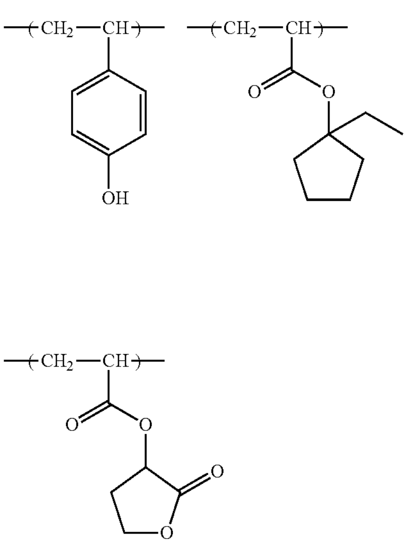
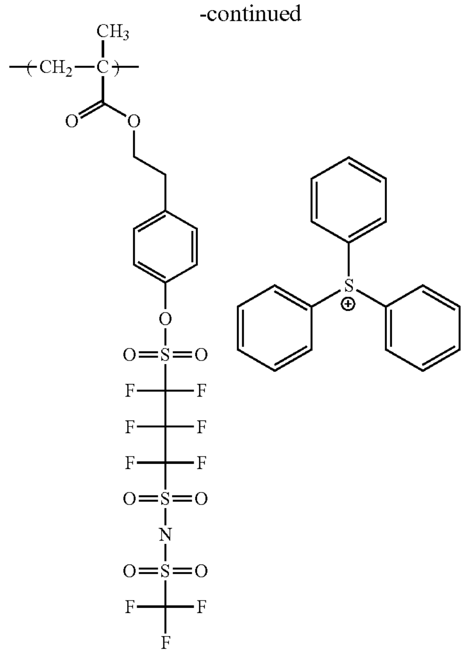
Ab-250
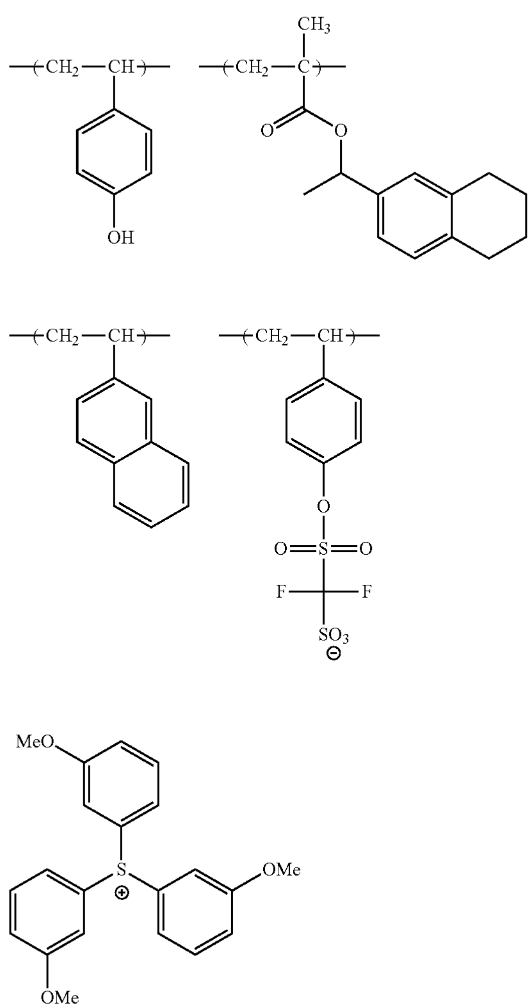

-continued
Ab-251
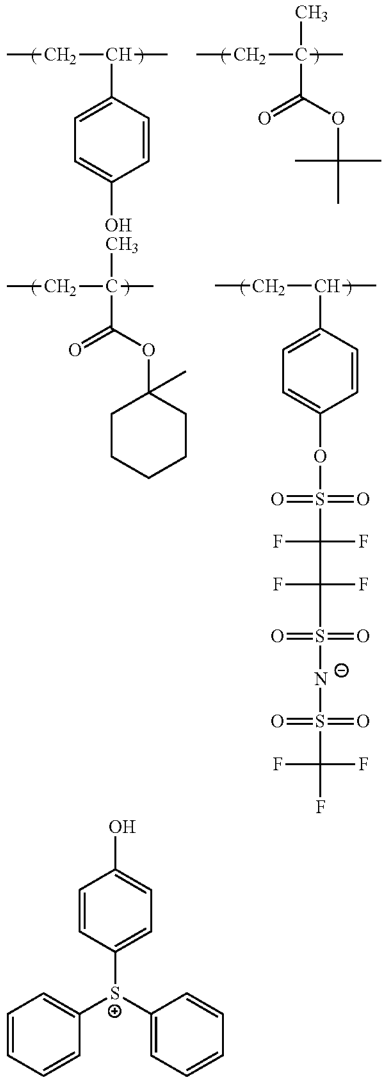
Ab-252
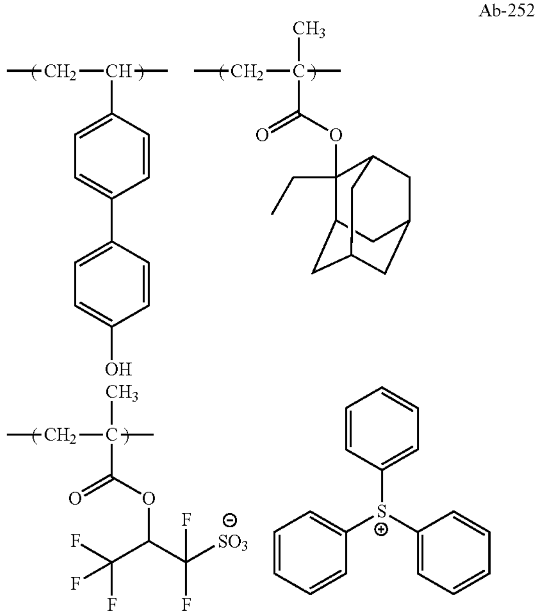
-continued
Ab-253
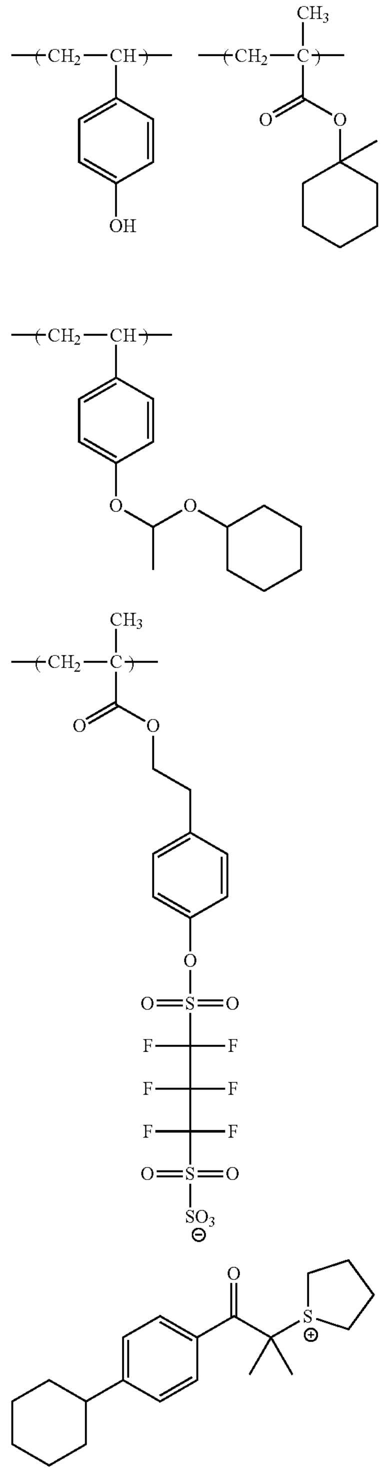
Ab-254
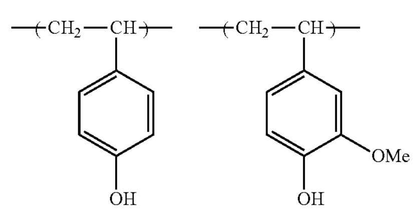

-continued
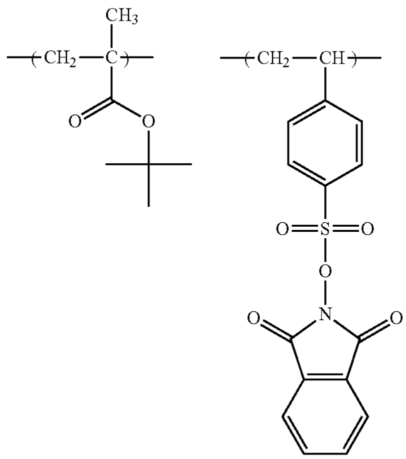
Ab-255
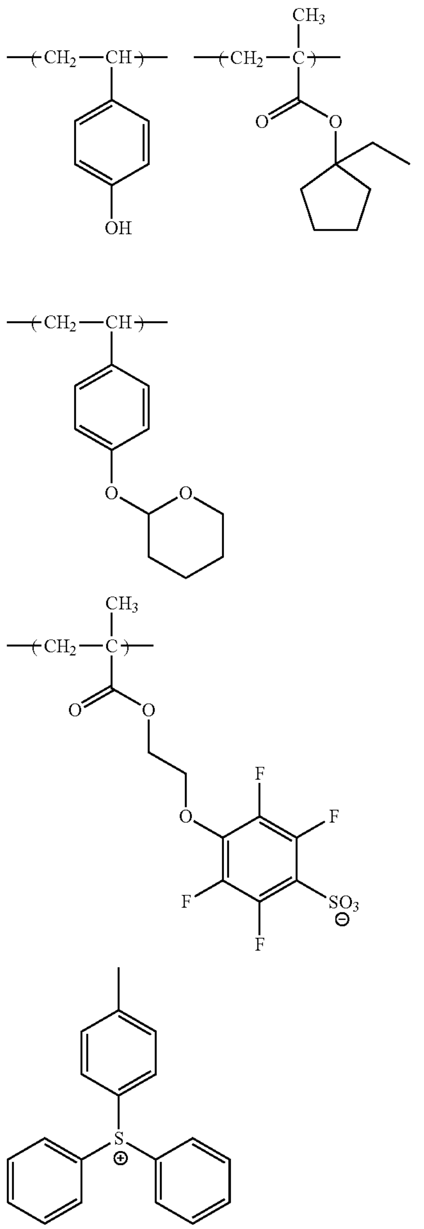
-continued
Ab-256
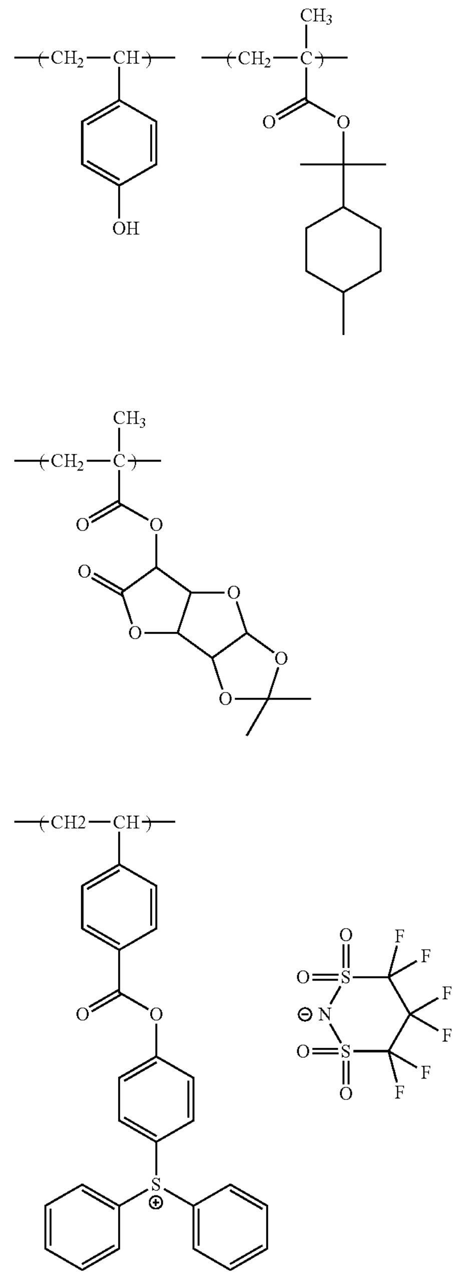
Ab-257
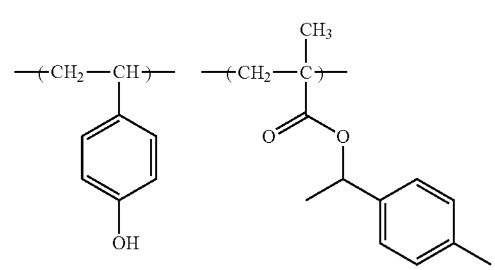

-continued
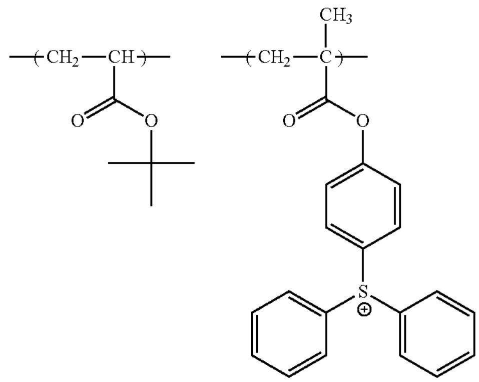
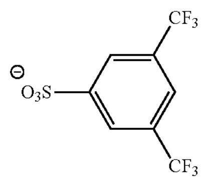
Ab-258
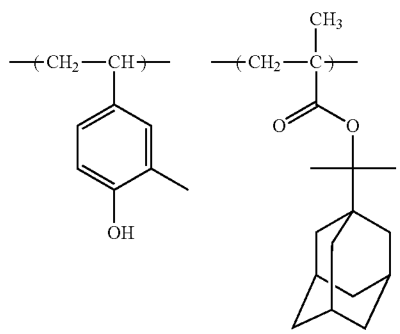
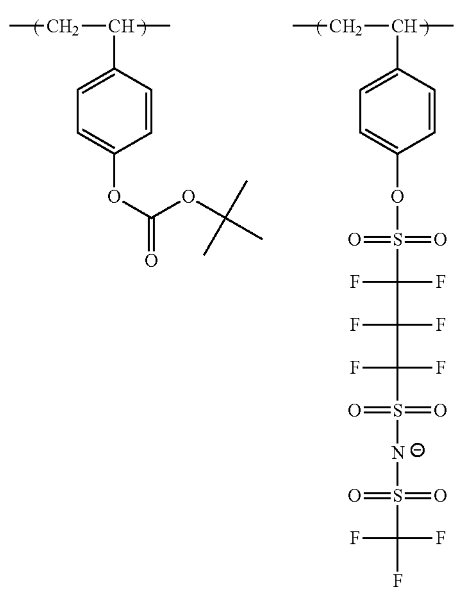
-continued
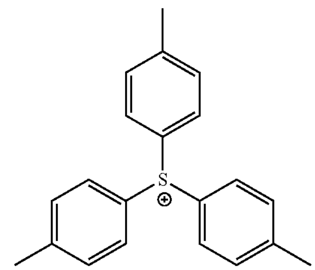
Ab-259
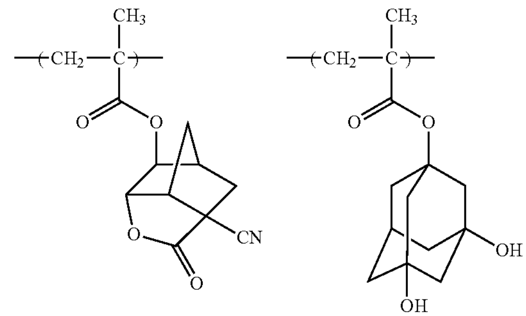
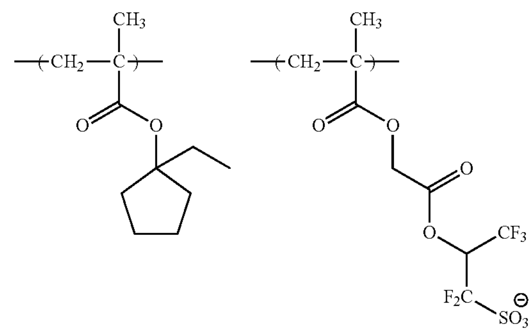
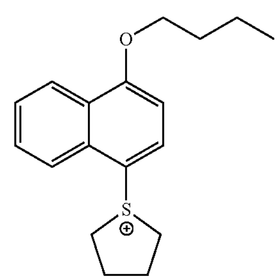
Ab-260
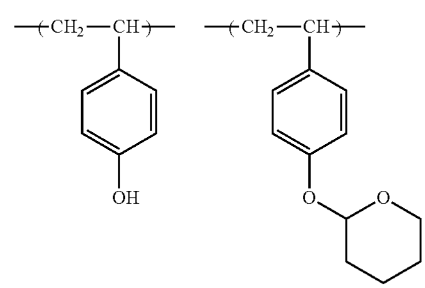

-continued
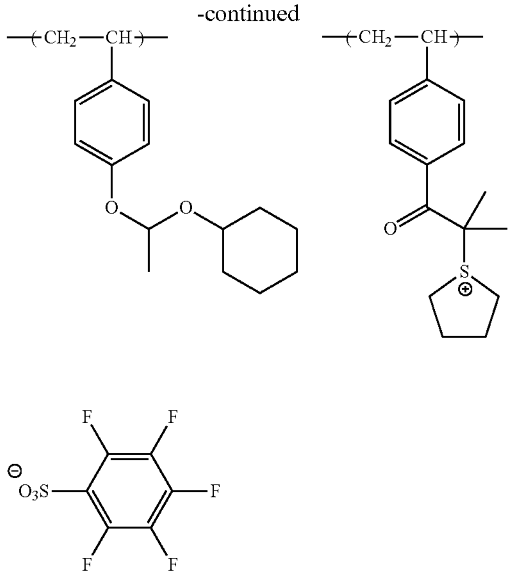
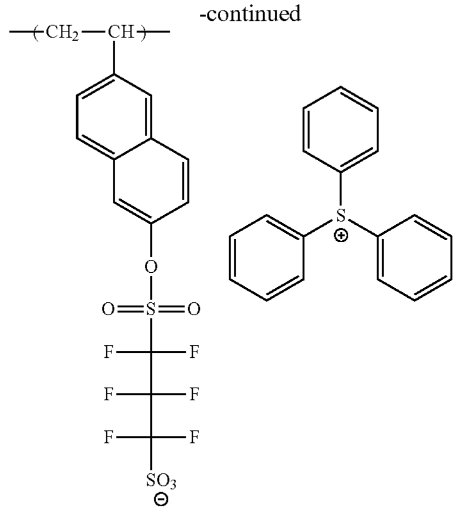
Ab-261
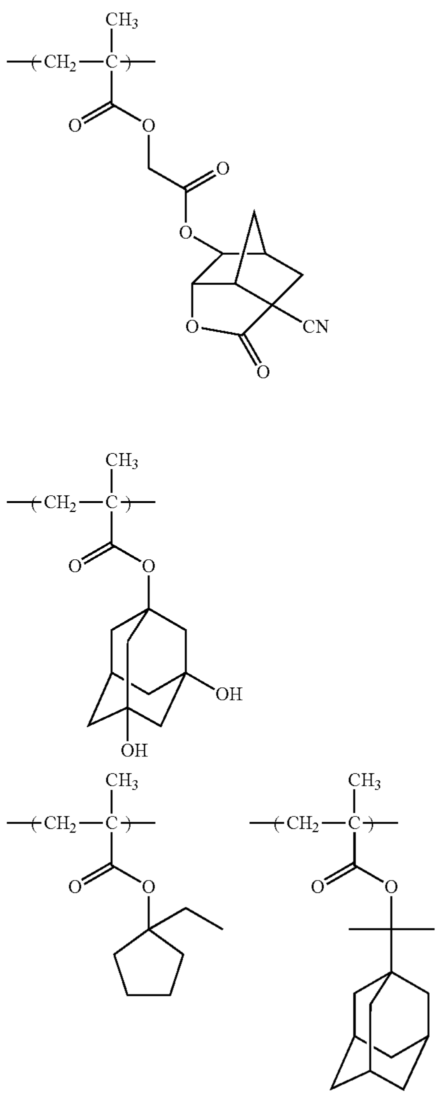
Ab-262
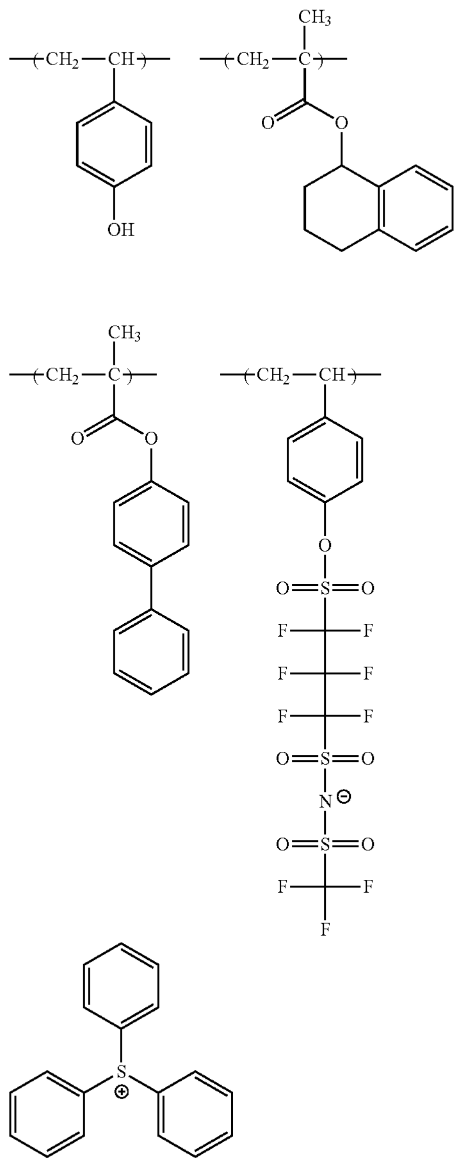

Ab-263
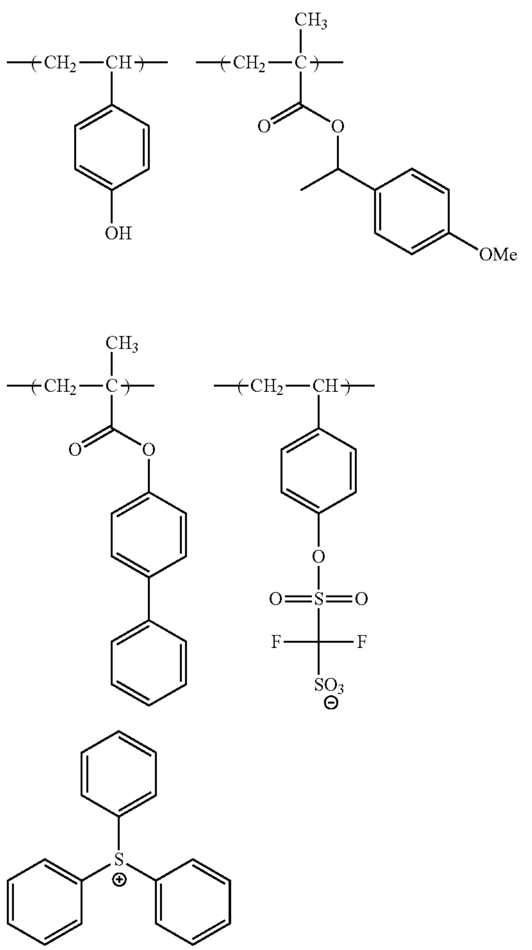
Ab-264
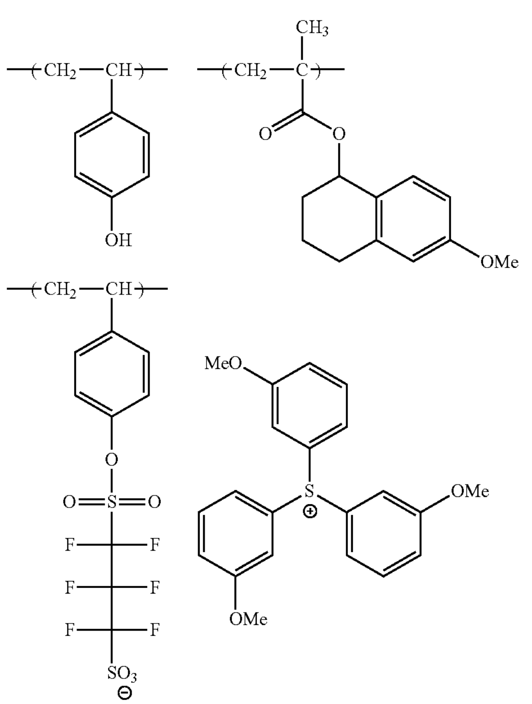
Ab-265
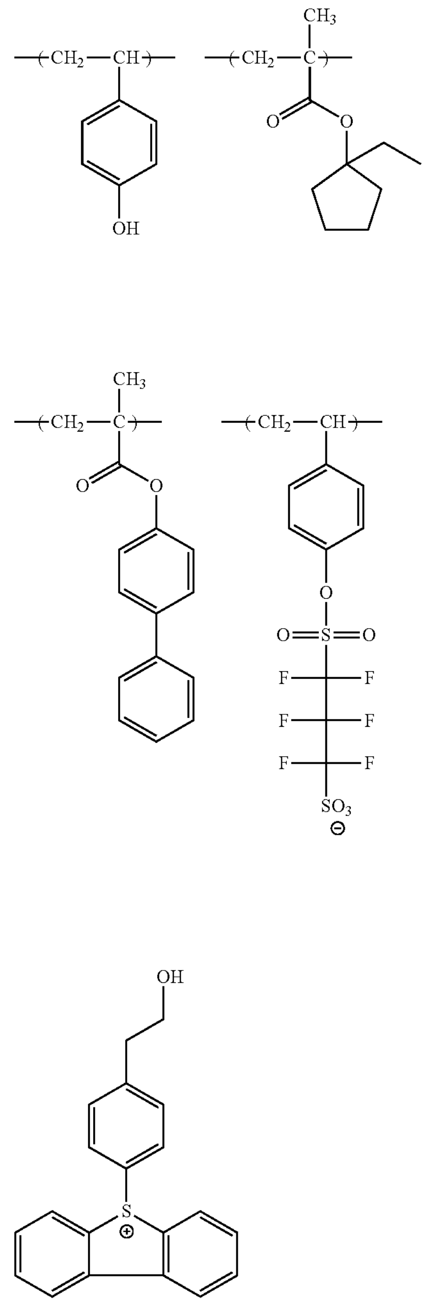
Ab-266
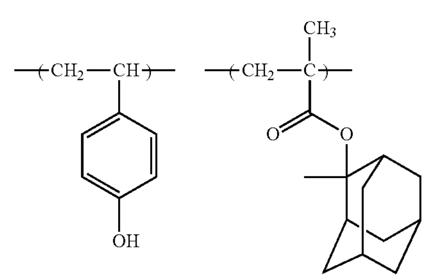

-continued
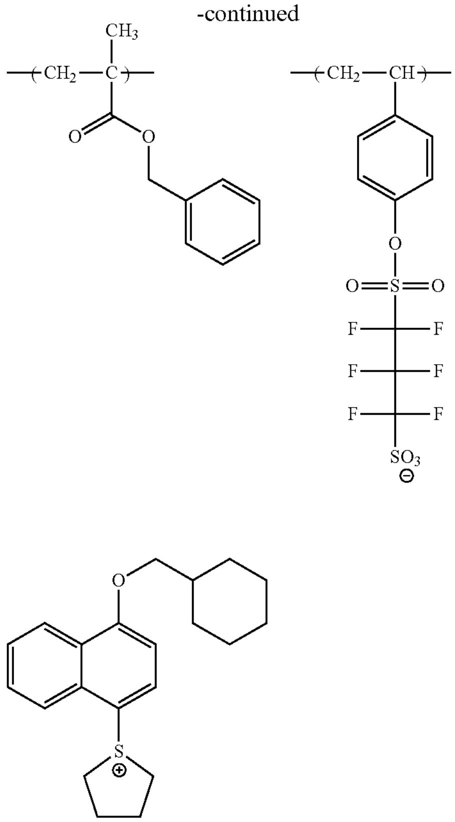
Ab-267
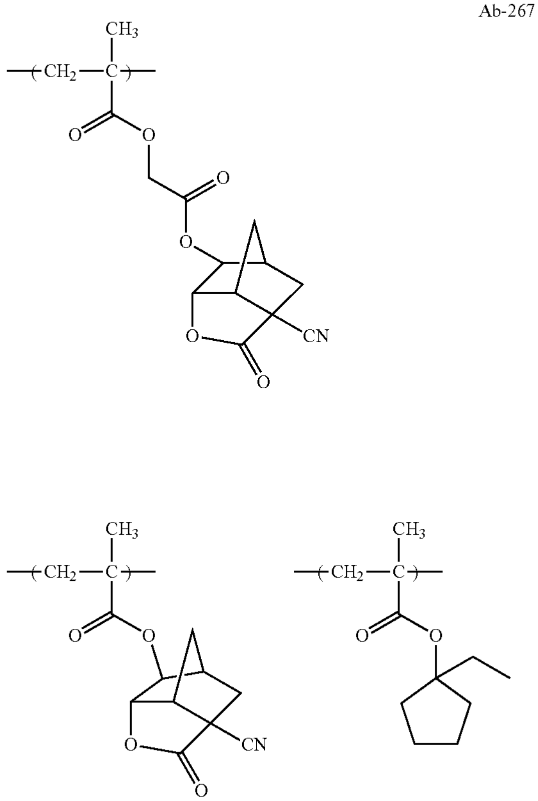
-continued
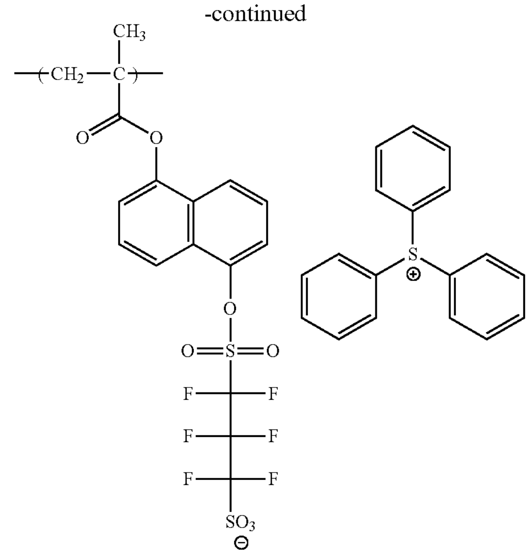
Ab-268
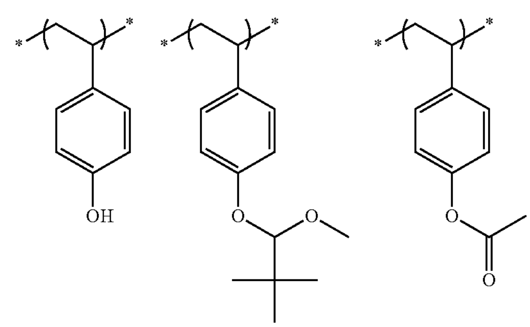
Ab-269
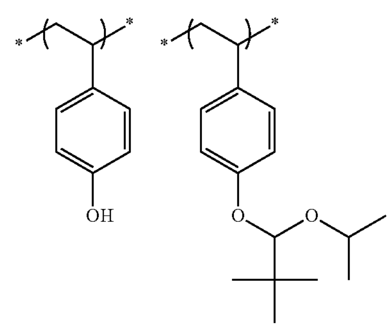
Ab-270
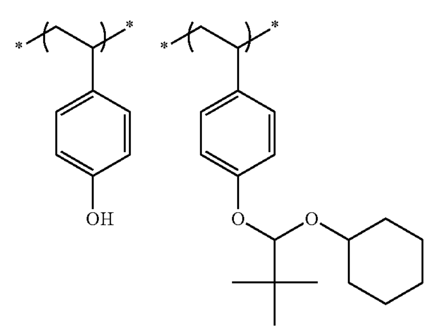

-continued
Ab-271
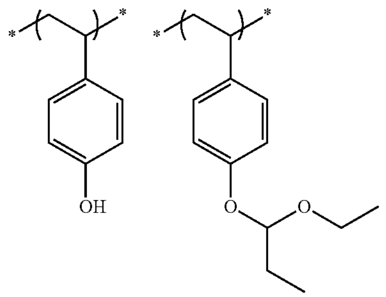
Ab-272
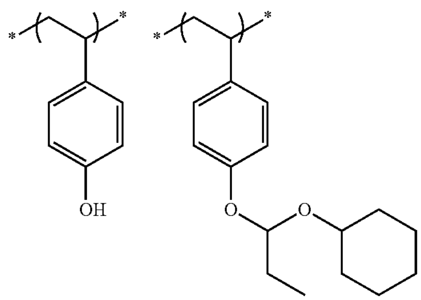
Ab-273
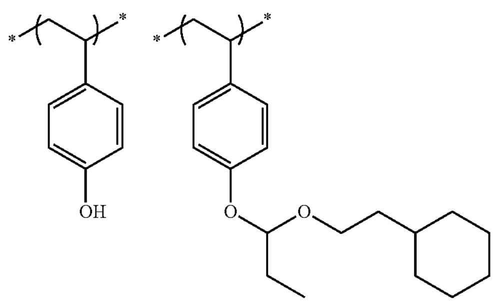
Ab-274
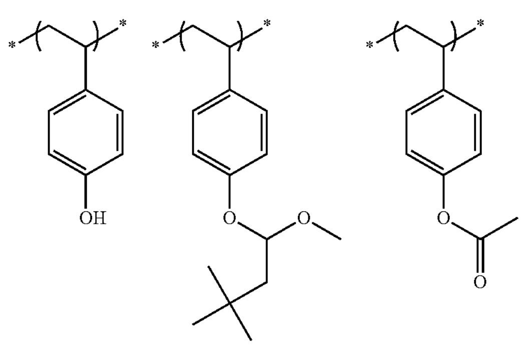
Ab-275
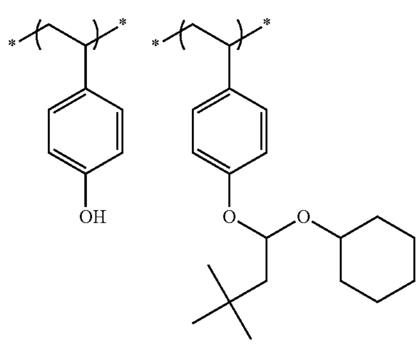
-continued
Ab-276
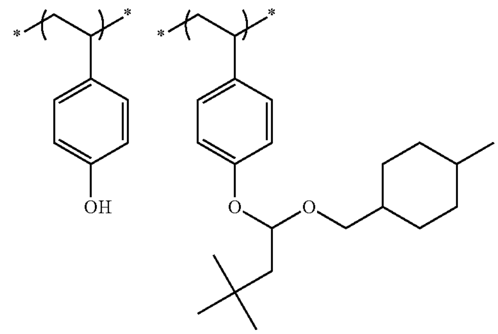
Ab-277
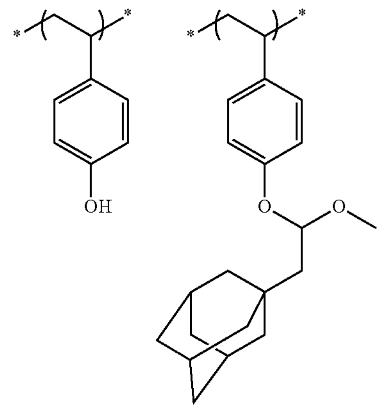
Ab-278
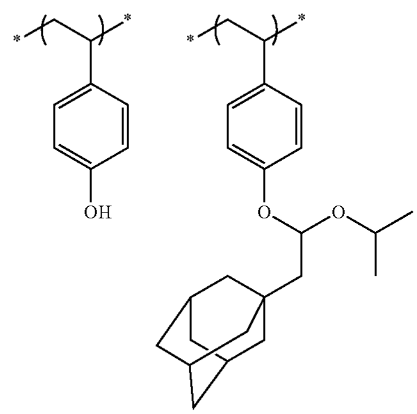
Ab-279
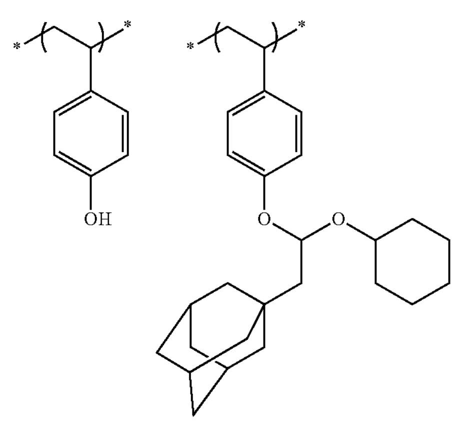

Ab-280
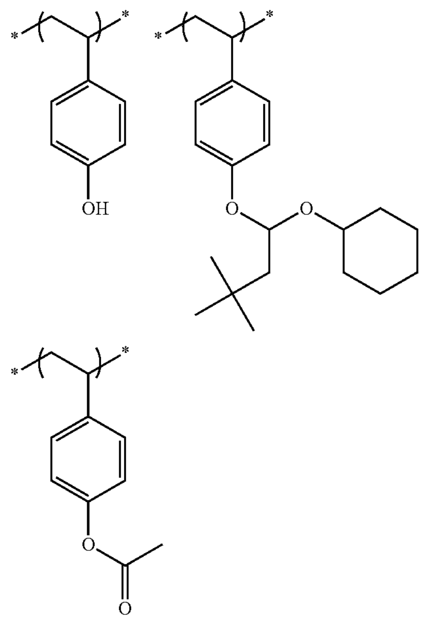
Ab-281
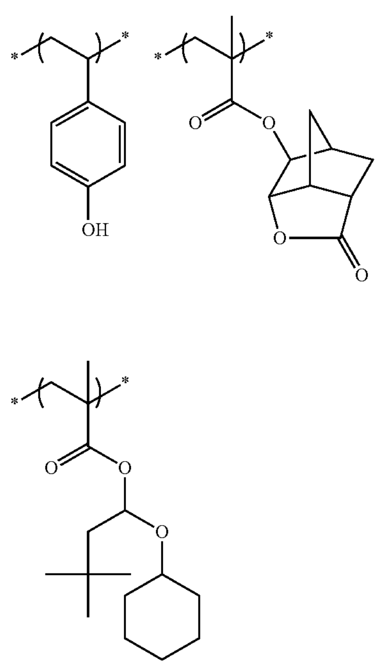
Ab-282
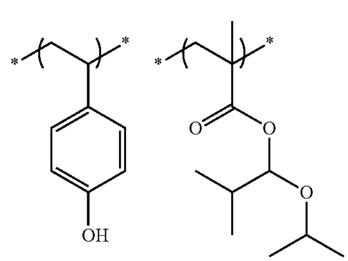
Ab-283
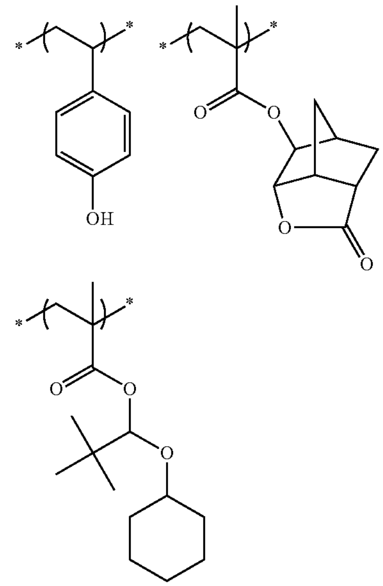
Ab-284
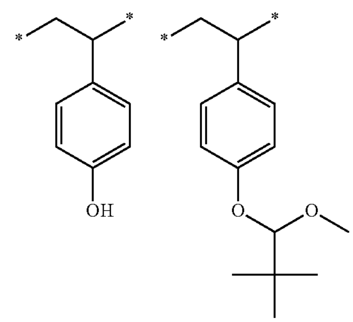
Ab-285
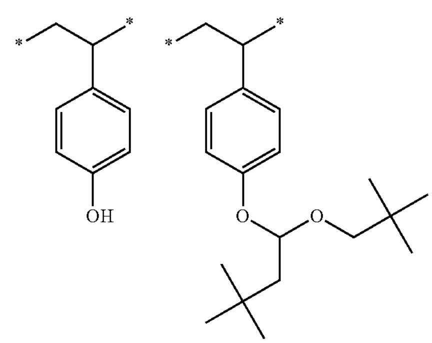
Ab-286
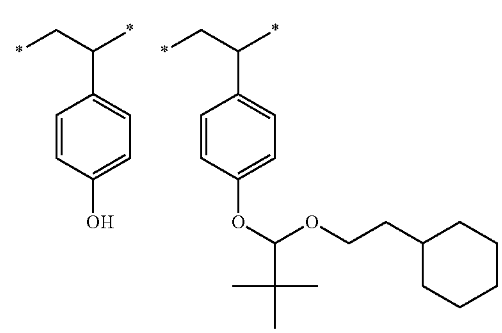

-continued
Ab-287
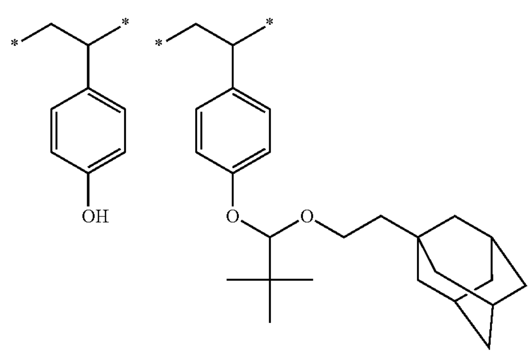
Ab-288
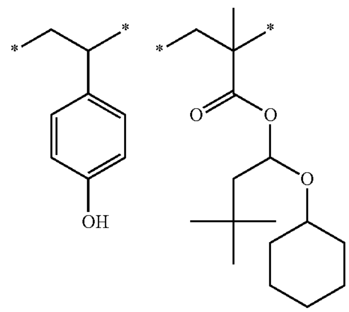
Ab-289
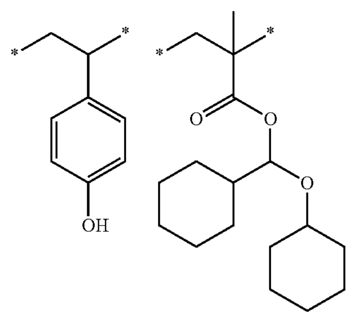
Ab-290
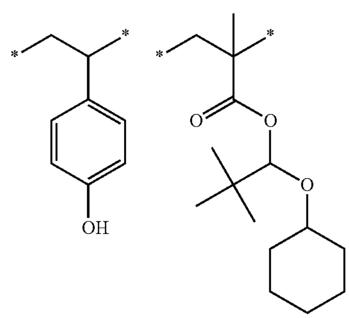
Ab-291
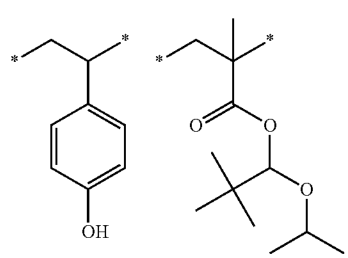
-continued
Ab-292
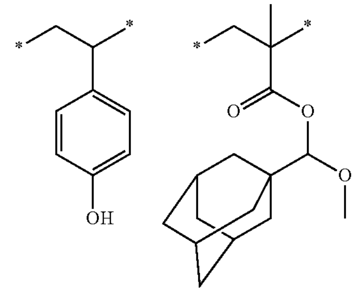
Ab-293
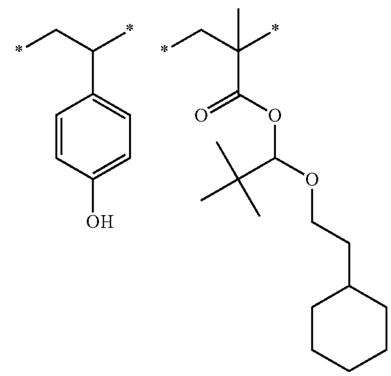
Ab-294
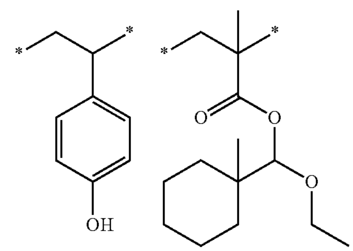
Ab-295
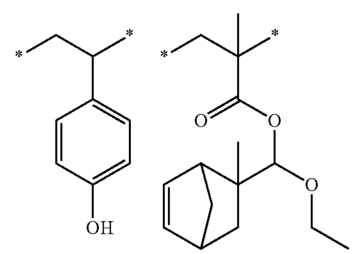
Ab-296
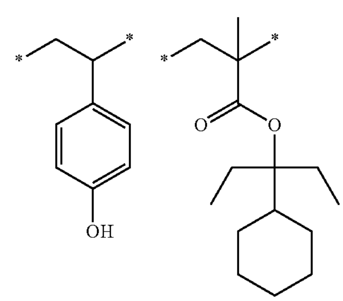

Ab-297
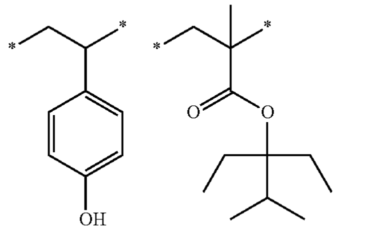
Ab-298
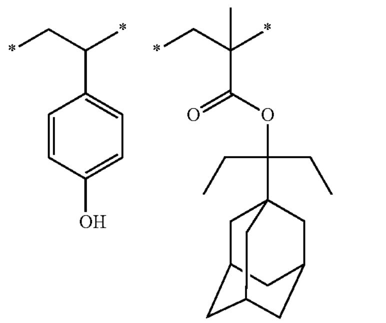
Ab-299
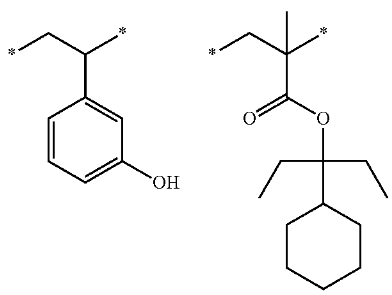
Ab-300
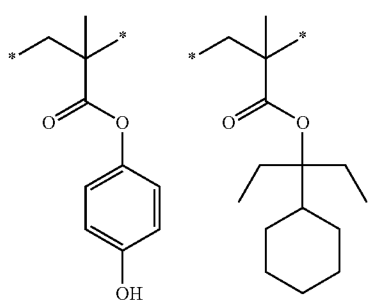
Ab-301
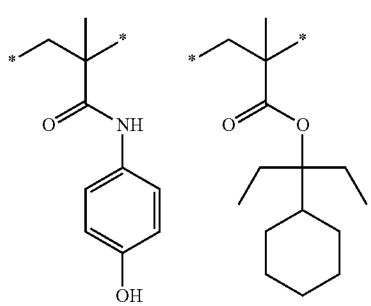
Ab-302
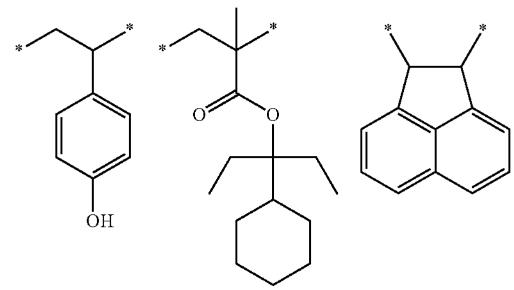
Ab-303
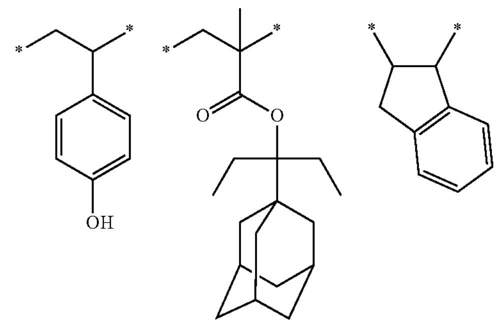
Ab-304
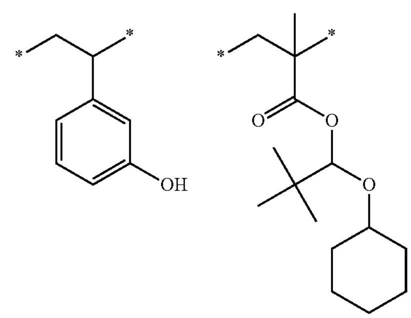
Ab-305
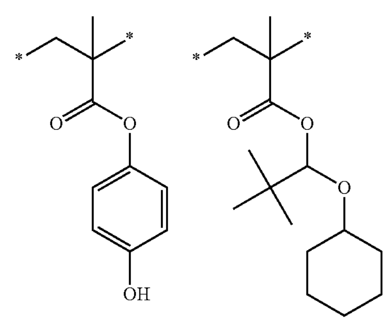
Ab-306
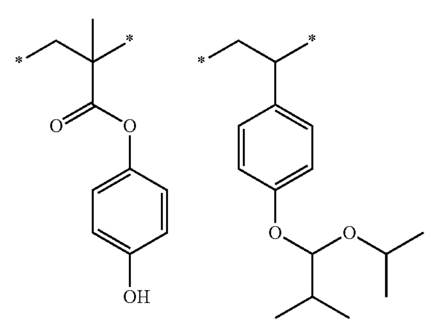

-continued
Ab-307
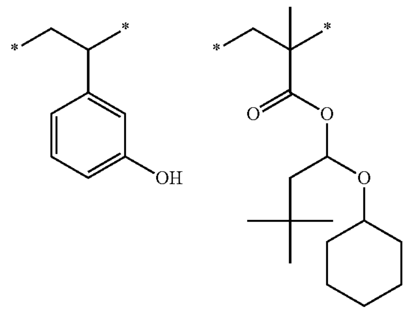
Ab-308
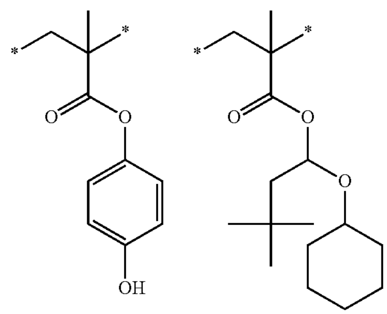
Ab-309
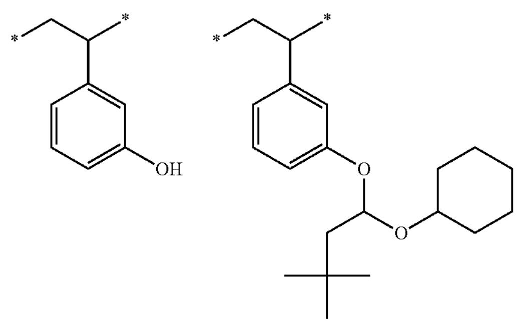
Ab-310
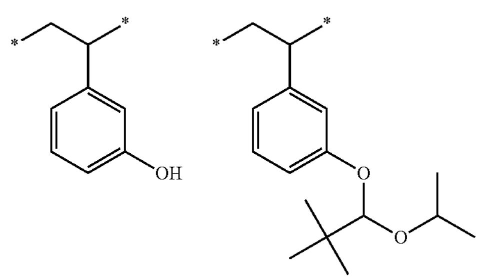
Ab-311
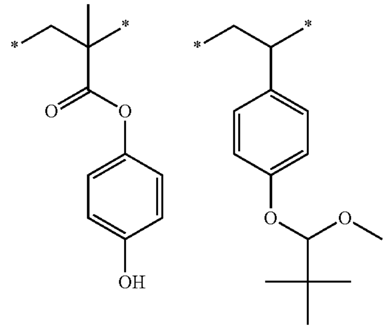
-continued
Ab-312
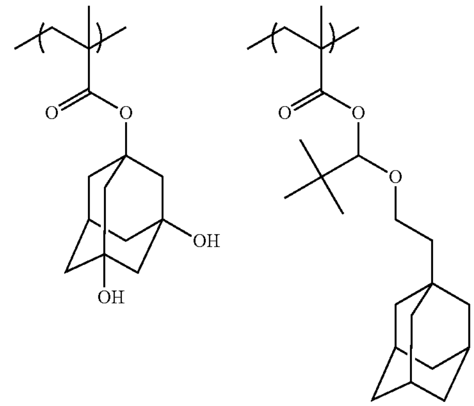
Ab-313
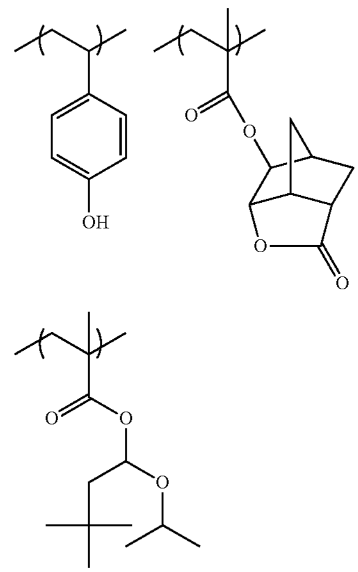
Ab-314
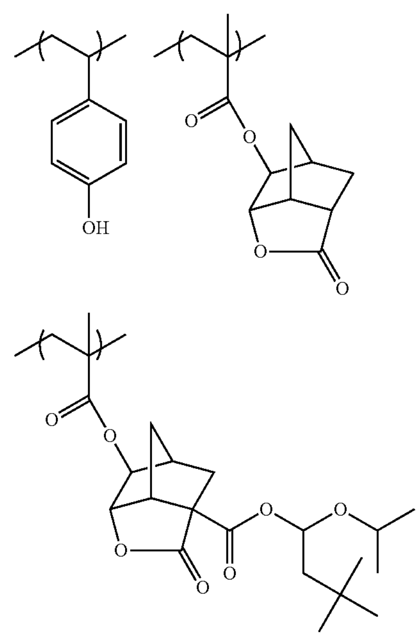

-continued
Ab-315
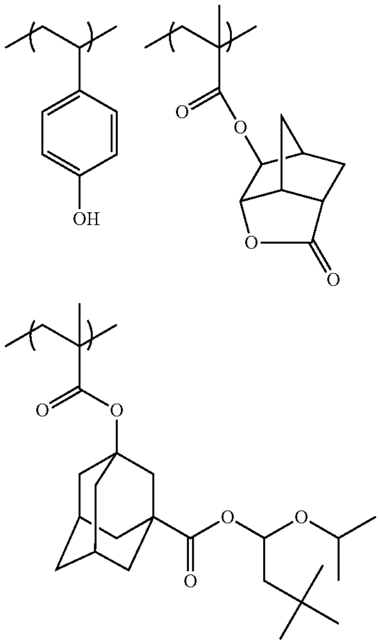
Ab-316
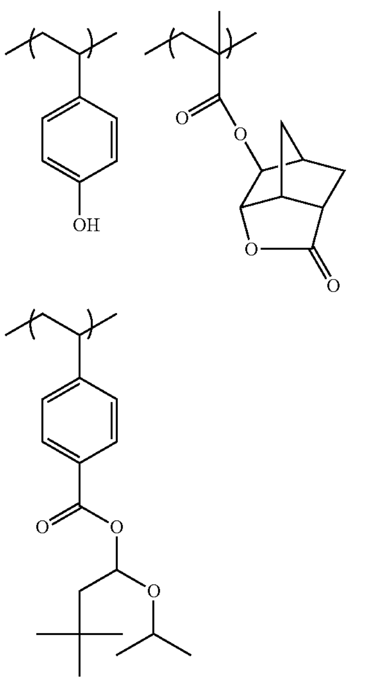
Ab-317
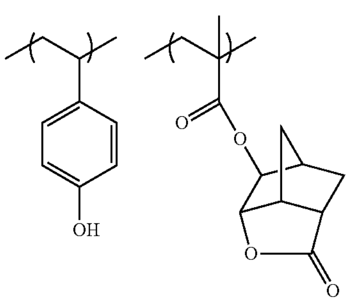
-continued
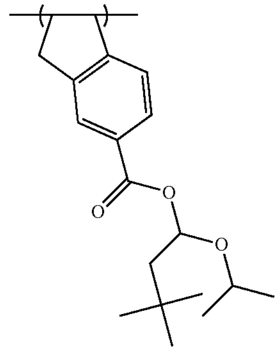
Ab-318
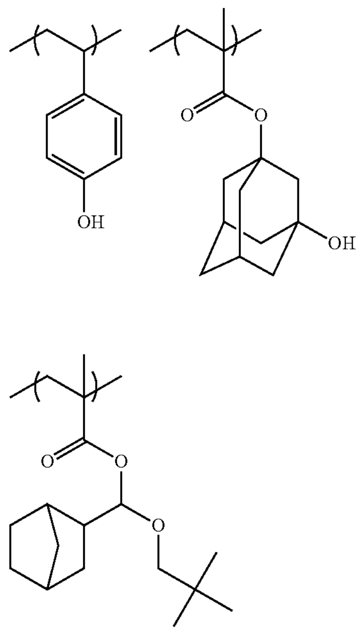
Ab-319
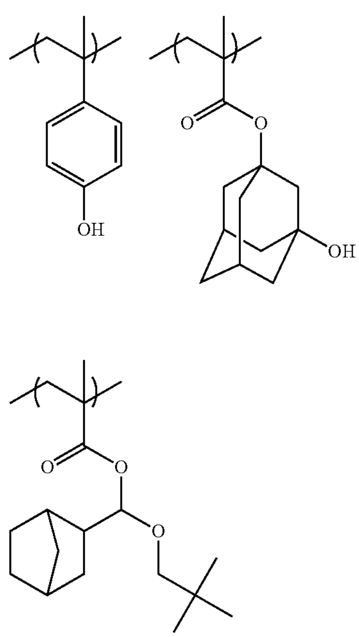

Ab-320
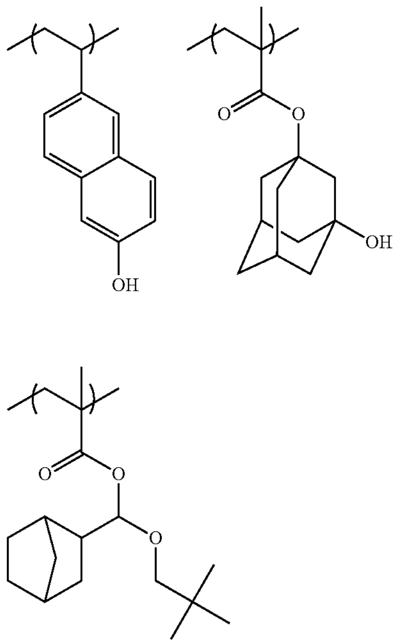
Ab-321
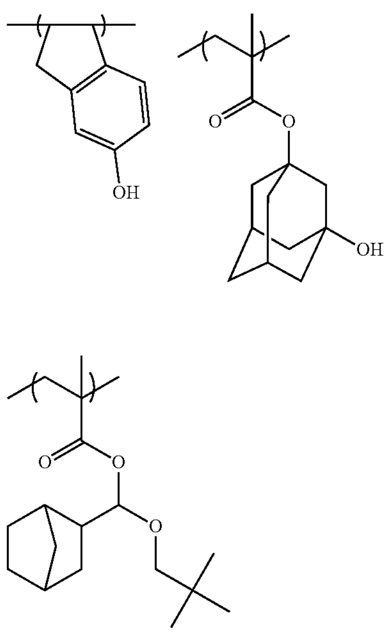
Ab-322
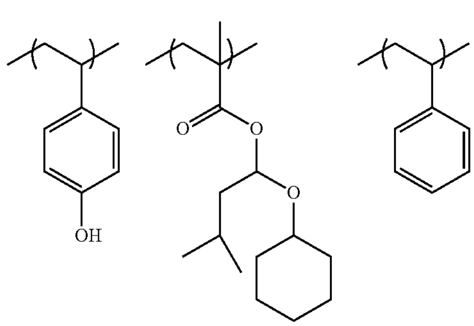
Ab-323
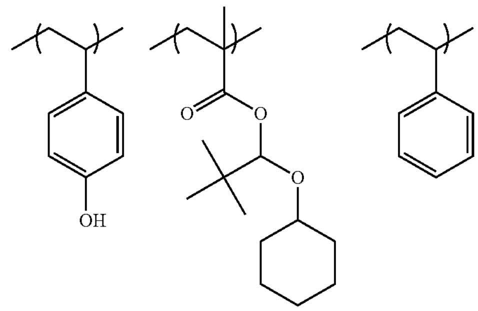
Ab-324
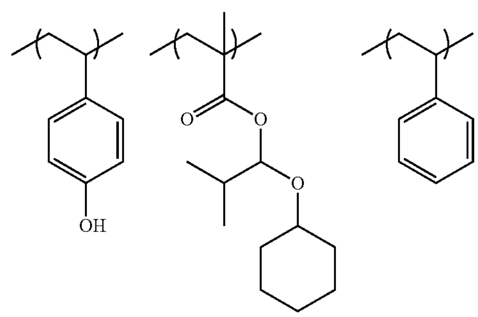
Ab-325
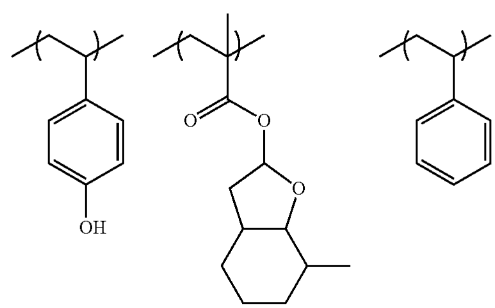
Ab-326
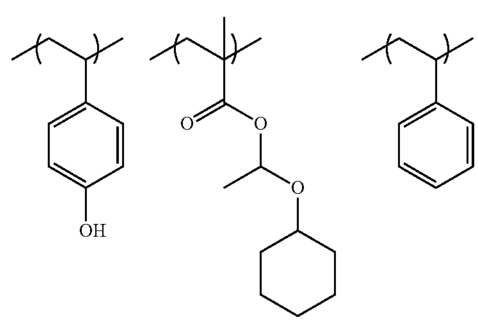

-continued
Ab-327
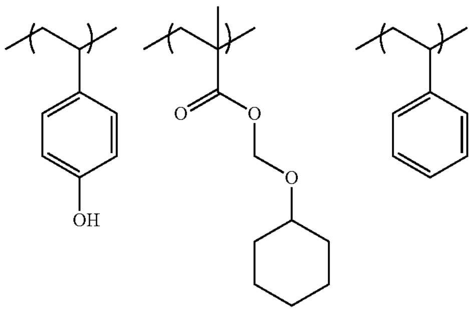
Ab-328
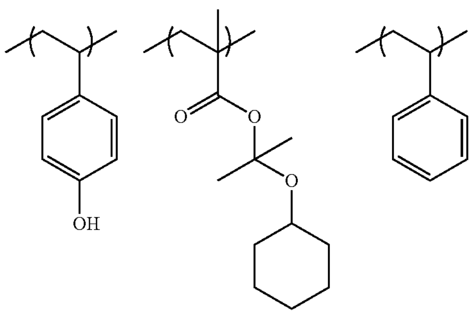
Ab-329
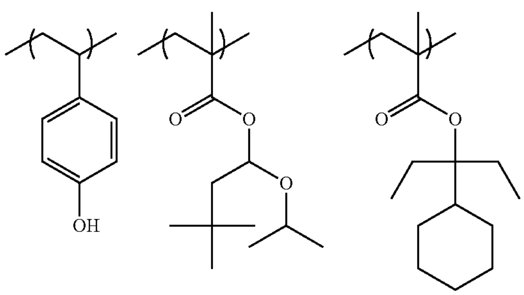
Ab-330
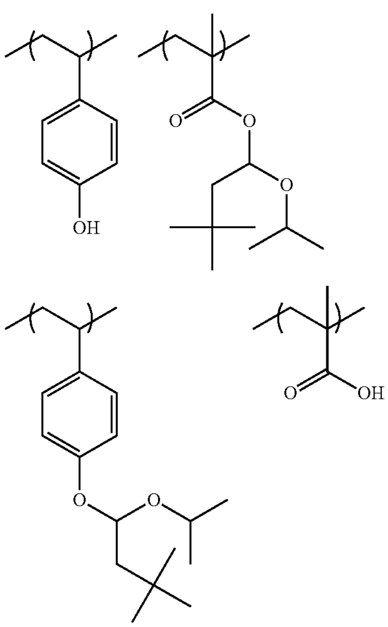
-continued
Ab-331
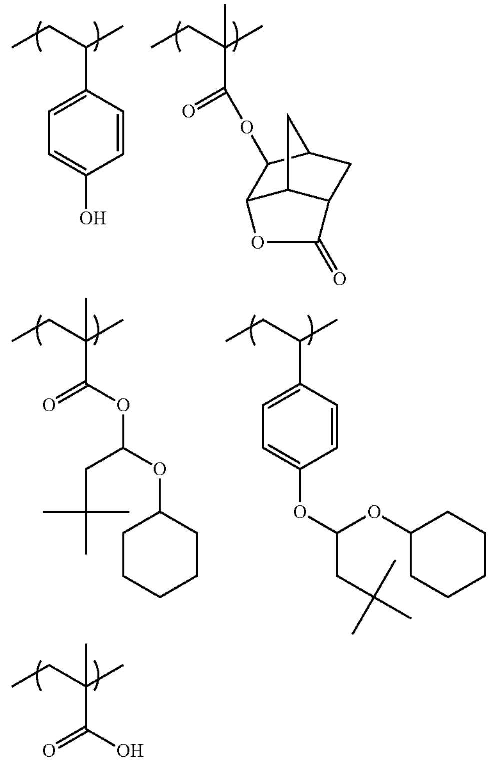
Ab-332
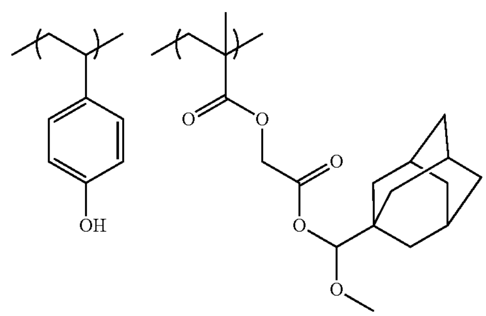
(Ab-333)
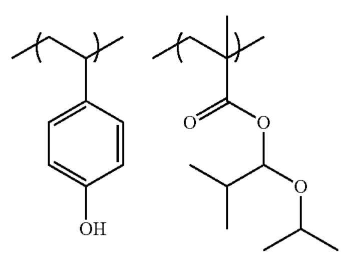
(Ab-334)
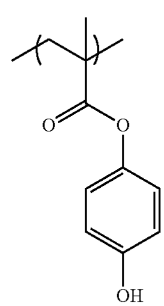

-continued
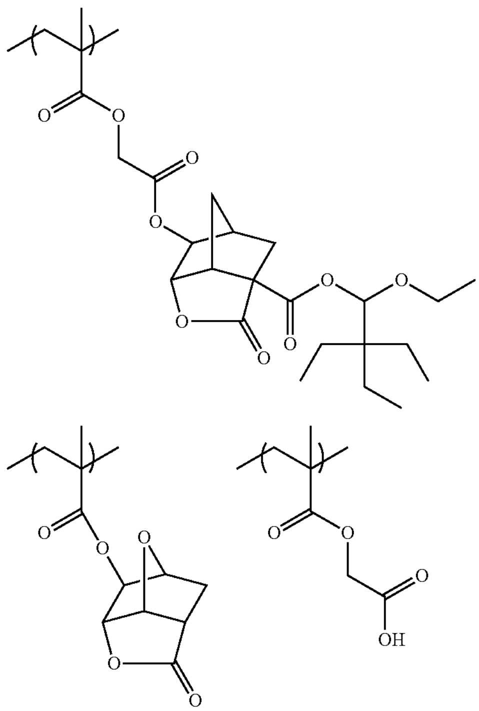
(Ab-335)
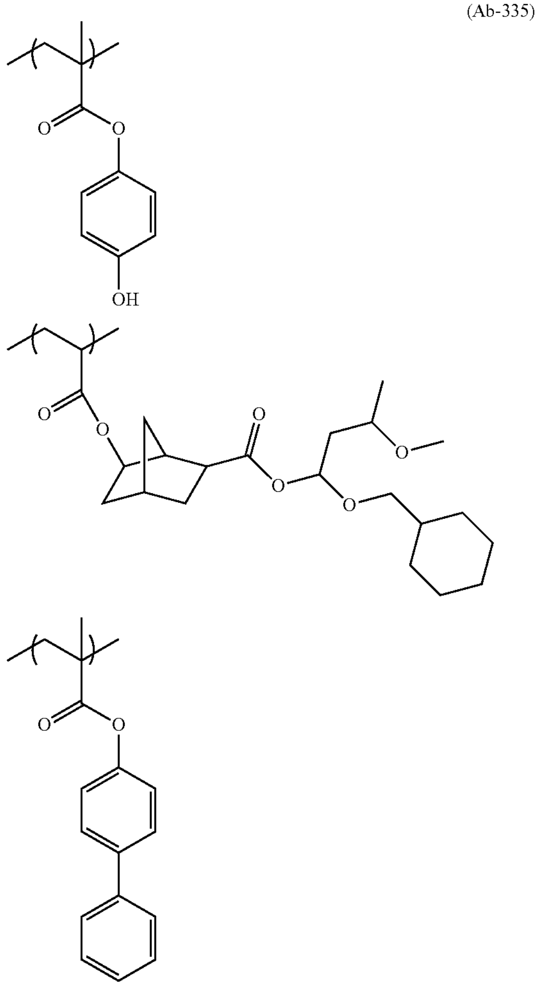
-continued
(Ab-336)
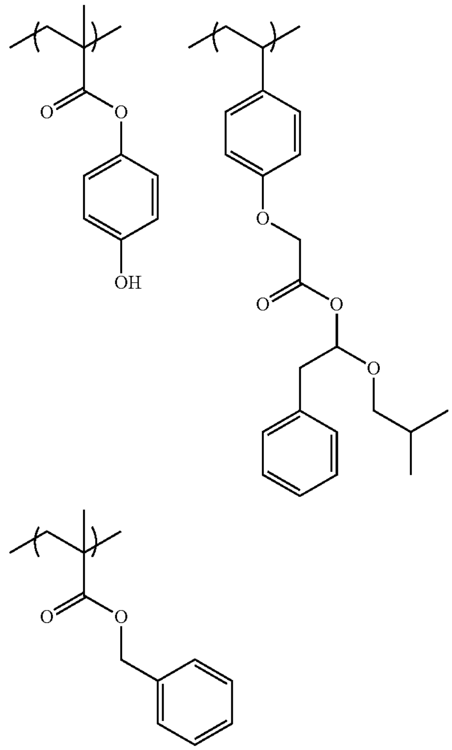
(Ab-337)
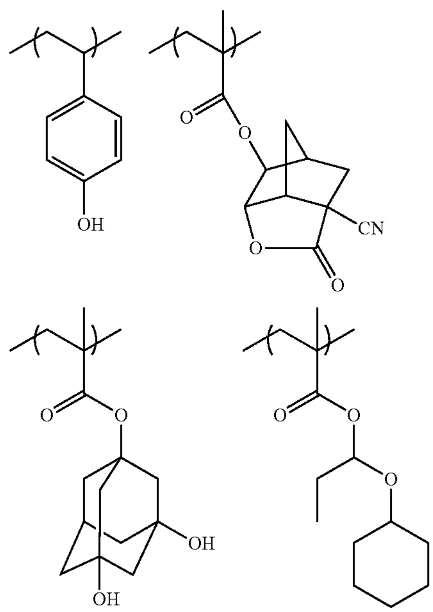
(Ab-338)
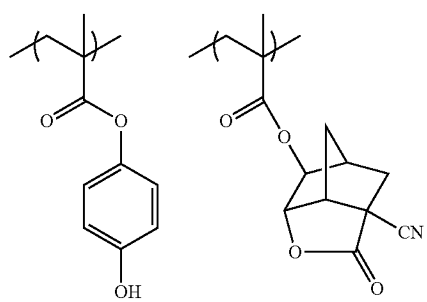

-continued

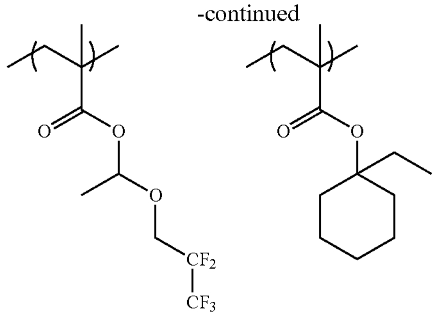

(Ab-339)

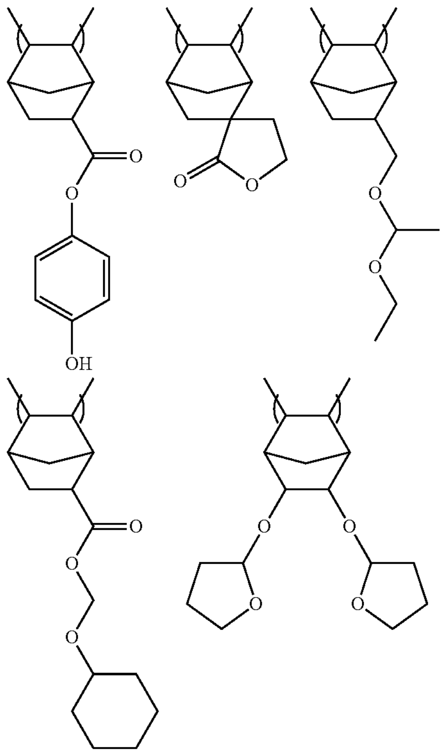

When the resin (Ab) does not contain the acid generating repeating unit (B), the content of the repeating unit that contains a fluorine atom is preferably 1 mol % or less, and the resin more preferably contains no fluorine atom. When the resin (Ab) has the repeating unit (B), the content of the repeating unit that contains a fluorine atom as the repeating unit other than the repeating unit (B) is more preferably 1 mol % or less, and the resin most preferably contains no fluorine atom.

[3] Compound Capable of Generating an Acid Upon Irradiation with an Actinic Ray or Radiation The composition of the present invention preferably contains compound capable of generating an acid upon irradiation with an actinic ray or radiation (hereinafter, also referred to as "an acid generator").

The compound capable of generating an acid upon irradiation with an actinic ray or radiation may be in the form of a low-molecular compound, or in the form of being inserted into a portion of a resin. In addition, the form of a low molecular compound and the form of being inserted into a portion of a polymer may be used in combination.

When the compound capable of generating an acid upon irradiation with an actinic ray or radiation is in the form of a low molecular compound, the molecular weight of the compound capable of generating an acid upon irradiation with an actinic ray or radiation is preferably 3,000 or less, more preferably 2,000 or less, and still more preferably 1,000 or less.

When the compound capable of generating an acid upon irradiation with an actinic ray or radiation is in the form of being inserted into a portion of a resin, the compound may be inserted into a portion of the resin (Ab), or may be inserted into a resin different from the resin (Ab).

An acid-generating agent is not particularly limited, but it is preferred that the compound capable of generating at least one from an organic acid, for example, a sulfonic acid, a bis(alkylsulfonyl)imide or a tris(alkylsulfonyl)methide upon irradiation with an actinic ray or radiation.

More preferably, the compound represented by the following Formula (ZI), (ZII), (ZIII) will be exemplified.

(ZI)

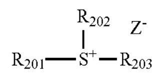

(ZII)

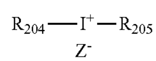

(ZIII)

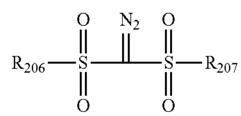

In Formula (ZI),

Each of $R_{201}$, $R_{202}$ and $R_{203}$ independently represents an organic group.

The organic group as $R_{201}$, $R_{202}$ and $R_{203}$ has generally 1 to 30 carbon atoms, and preferably 1 to 20 carbon atoms.

In addition, two groups of $R_{201}$ to $R_{203}$ may combine to form a ring structure, and may contain an oxygen atom, a sulfur atom, an ester bond, an amide bond, and a carbonyl group in the ring. Examples of the group that two groups of $R_{201}$ to $R_{203}$ may combine to form may include an alkylene group (for example, a butylene group, a pentylene group).

$Z^-$ represents a non-nucleophilic anion (an anion having an extremely low ability of causing a nucleophilic reaction).

Examples of the non-nucleophilic anion may include a sulfonate anion (an aliphatic sulfonate anion, an aromatic sulfonate anion, a camphor sulfonate anion and the like), a carboxylate anion (an aliphatic carboxylate anion, an aromatic carboxylate anion, an aralkyl carboxylate anion and the like), a sulfonylimide anion, a bis(alkylsulfonyl)imide anion, a tris(alkylsulfonyl)methide anion and the like.

An aliphatic moiety in an aliphatic sulfonate anion and an aliphatic carboxylate anion may be an alkyl group or a cycloalkyl group, and examples thereof may include preferably a straight or branched alkyl group having 1 to 30 carbon atoms and a cycloalkyl group having 3 to 30 carbon atoms.

Examples of the aromatic group in the aromatic sulfonate anion and the aromatic carboxylate anion may include preferably an aryl group having 6 to 14 carbon atoms, for example, a phenyl group, a tolyl group, a naphthyl group and the like.

Examples of the alkyl group, the cycloalkyl group and the aryl group exemplified above may have a substituent. Specific examples thereof may include a nitro group, a halogen atom such as a fluorine atom, a carboxyl group, a hydroxyl group, an amino group, a cyano group, an alkoxy group (having preferably 1 to 15 carbon atoms), a cycloalkyl group (having preferably 3 to 15 carbon atoms), an aryl group (having preferably 6 to 14 carbon atoms), an alkoxycarboxyl group (having preferably 2 to 7 carbon atoms), an acyl group (having preferably 2 to 12 carbon atoms), an alkoxycarbonyloxy group(preferably 2 to 7 carbon atoms), an alkylthio group (having preferably 1 to 15 carbon atoms), an alkylsulfonyl group (having preferably 1 to 15 carbon atoms), an alkylimino sulfonyl group (having preferably 2 to 15 carbon atoms), an aryloxysulfonyl group (having preferably 6 to 20 carbon atoms), an alkylaryloxy sulfonyl group (having preferably 7 to 20 carbon atoms), cycloalkylaryloxy sulfonyl group (having preferably 10 to 20 carbon atoms), an alkyloxyalkyloxy group (having preferably 5 to 20 carbon atoms), a cycloalkylalkyloxyalkyloxy group (having preferably 8 to 20 carbon atoms) and the like. Examples of the aryl group and the ring structure which may be possessed by each group may preferably include an alkyl group (having preferably 1 to 15 carbon atoms) as a substituent.

Examples of the aralkyl group in the aralkyl carboxylate anion may include preferably an aralkyl group having 7 to 12 carbon atoms, for example, a benzyl group, a phenetyl group, a naphthylmethyl group, a naphthylethyl group, a naphthylbutyl group and the like.

Examples of the sulfonylimide anion may include saccharin anion.

The alkyl group in the bis(alkylsulfonyl)imide anion and the tris(alkylsulfonyl)methide anion is preferably an alkyl group having 1 to 5 carbon atoms. Examples of the substituent of such an alkyl group may include a halogen atom, an alkyl group substituted with a halogen atom, an alkoxy group, an alkylthio group, an alkyloxysulfonyl group, an aryloxysulfonyl group, a cycloalkylaryloxysulfonyl group and the like, and preferably a fluorine atom or an alkyl group substituted with a fluorine atom.

In addition, alkyl groups in a bis(alkylsulfonyl)imide anion may combine with each other to form a ring structure. Accordingly, the acid strength is increased.

Examples of the other non-nucleophilic anions may include fluorinated phosphate (for example, $PF_6^-$), fluorinated boron (for example, $BF_4^-$), fluorinated antimony (for example, $SbF_6^-$) and the like.

Examples of the non-nucleophilic anion may include preferably an aliphatic sulfonate anion in which at least α-position of the sulfonic acid is substituted with a fluorine atom, an aromatic sulfonate anion substituted with a group having a fluorine atom or a fluorine atom, a bis(alkylsulfonyl)imide anion in which an alkyl group is substituted with a fluorine atom, a tris(alkylsulfonyl)methide anion in which an alkyl group is substituted with a fluorine atom. Examples of the non-nucleophilic anion include more preferably perfluoro aliphatic sulfonate anion (having more preferably 4 to 8 carbon atoms), benzenesulfonate anion having a fluorine atom, still more preferably a nonafluorobutane sulfonate anion, a perfluorooctane sulfonate anion, a pentafluorobenzene sulfonate anion, a 3,5-bis(trifluoromethyl)benzene sulfonate anion.

From the viewpoint of acid strength, a group in which the acid generated has pKa of −1 or less is preferred, and the sensitivity is enhanced.

In addition, Examples of the non-nucleophilic anion may include an anion represented by the following Formula (AN1) as a preferred aspect.

(AN1)

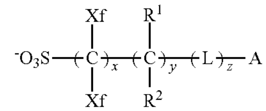

In the formula,

Each Xf independently represents a fluorine atom, or an alkyl group substituted with at least one fluorine atom.

Each of $R^1$ and $R^2$ independently represents a hydrogen atom, a fluorine atom, or an alkyl group, and when a plurality of $R^1$ and $R^2$ are present, each of them may be same or different.

L represents a divalent linking group, and when a plurality L is present, each of them may be same or different.

A represents a cyclic organic group.

x represents an integer of 1 to 20, y represents an integer of 0 to 10, and z represents an integer of 0 to 10.

As for Formula (AN1), it will be described in more detail.

An alkyl group in an alkyl group substituted with a fluorine atom of Xf is preferably a group having 1 to 10 carbon atoms, and still more preferably 1 to 4 carbon atoms. Further, the alkyl group substituted with a fluorine atom is preferably a perfluoroalkyl group.

Xf is preferably a fluorine atom or a perfluoroalkyl group having 1 to 4 carbon atoms. Specifically, Xf preferably includes a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, $CH_2CH_2C_4F_9$, and among these, a fluorine atom or $CF_3$ is preferred. In particular, it is preferred that both Xf are a fluorine atom.

Each of an alkyl group of $R^1$ and $R^2$ may have a substituent (preferably a fluorine atom) and preferably has 1 to 4 carbon atoms. The alkyl group is more preferably a perfluoroalkyl group having 1 to 4 carbon atoms. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, and among them, $CF_3$ is preferred.

As $R_1$ or $R_2$, a fluorine atom or $CF_3$ is preferred.

x is preferably 1 to 10, and more preferably 1 to 5.

y is preferably 0 to 4, and more preferably 0.

z is preferably 0 to 5, and more preferably 0 to 3.

A divalent linking group of L is not particularly limited, and examples thereof include —COO—, —OCO—, —CO—, —O—, —S—, —SO—, $—SO_2—$, an alkylene group, a cycloalkylene group, an alkylene group or a linking group in which a plurality of these groups are combined, preferably a linking group having a total carbon number of 12 or more. Among these, —COO—, —OCO—, —CO—, and O— are preferred, and, —COO—, and —OCO— are more preferred.

Examples of the cyclic organic group of A are not particularly limited as long as they have a cyclic structure, alicyclic group, and include an aryl group, heterocyclic ring group (containing a group may not have aromaticity as well as a group may have aromaticity) and the like.

The alicyclic group may be monocyclic or polycyclic, and examples thereof preferably include a monocyclic cycloalkyl group such as a cyclopentyl group, a cyclohexyl group and a cyclooctyl group and a polycyclic cycloalkyl group such as a norbornyl group, a tricyclodecanyl group, a tetracyclodecanyl group, and an adamantyl group. Among them, an alicyclic group with a bulky structure having 7 or more carbon atoms such as a norbornyl group, a tricyclodecanyl group, a tetracyclodecanyl group, and an adamantyl group, is preferred from the viewpoint of restraining diffusion in film during a post-exposure baking process and enhancing the MEEF.

Examples of the aryl group include benzene ring, a naphthalene ring, phenanthrene ring, an anthracene ring and the like.

Examples of the heterocyclic ring group include a group derived from a furan ring, a thiophene ring, a benzofuran ring, a benzothiophene ring, a dibenzofuran ring, a dibenzothiophene ring, and a pyridine ring. Among them, a group derived from a furan ring, a thiophene ring and a pyridine ring is preferred.

In addition, examples of the cyclic organic group include a lactone structure, and specific examples thereof include a lactone structure represented by Formulas (LC1-1) to (LC1-17) which may be possessed by the above-described resin (P).

The cyclic organic group may have a substituent, and examples of the corresponding substituent may include an alkyl group (may be straight, branched or cyclic, and preferably has 1 to 12 carbon atoms), a cycloalkyl group (may be monocyclic, polycyclic or spirocyclic, and preferably has 3 to 20 carbon atoms), an aryl group (preferably has 6 to 14 carbon atoms), a hydroxyl group, an alkoxy group, an ester group, an amide group, a urethane group, a ureido group, a thioether group, a sulfonamide group, a sulfonic acid ester group and the like. Further, the carbon constituting the cyclic organic group (the carbon contributing to ring formation) may be carbonyl carbon.

Examples of the organic group of $R_{201}$, $R_{202}$ and $R_{203}$ may include an aryl group, an alkyl group, a cycloalkyl group and the like.

At least one of $R_{201}$, $R_{202}$ and $R_{203}$ is preferably an aryl group, and all three are more preferably an aryl group. As an aryl group, other than a phenyl group, a naphthyl group and the like, a heteroaryl group such as an indole residue, a pyrrole residue and the like is preferred. Examples of the alkyl group and a cycloalkyl group of $R_{201}$ to $R_{203}$ include preferably a straight or branched alkyl group having 1 to 10 carbon atoms, a cycloalkyl group having 3 to 10 carbon atoms and the like. Examples of the alkyl group include more preferably a methyl group, an ethyl group, an n-propyl group, an i-propyl group, an n-butyl group and the like. Examples of the cycloalkyl group include still more preferably a cyclopropyl group, a cyclobutyl group, a cyclopentyl group, a cyclohexyl group, a cycloheptyl group and the like. These groups may also have a substituent. Examples of such a substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarboxyl group (preferably having 2 to 7 carbon atoms), an acyl group (preferably having 2 to 12 carbon atoms), an alkoxycarbonyloxy group (preferably having 2 to 7 carbon atoms) and the like, but are not limited thereto.

In addition, when two of $R_{201}$ to $R_{203}$ combine to form a ring structure, the structure represented by the following Formula (A1) is preferred.

(A1)

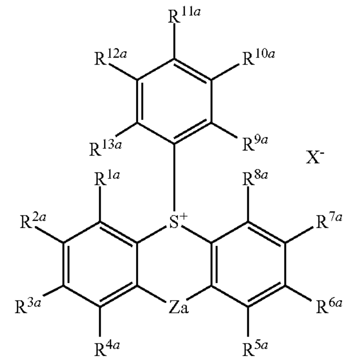

In Formula (A1),

Each of $R^{1a}$ to $R^{13a}$ independently represents a hydrogen atom or a substituent.

It is preferred that one to three kinds of $R^{1a}$ to $R^{13a}$ are not a hydrogen atom, and more preferred that any one of $R^{9a}$ to $R^{13a}$ is not a hydrogen atom.

Za represents a single bond or a divalent linking group.

$X^-$ is the same as $Z^-$ in Formula (ZI).

When $R^{1a}$ to $R^{13a}$ are not a hydrogen atom, specific examples thereof may include a halogen atom, a straight, branched, or cyclic alkyl group, an alkenyl group, an alkynyl group, an aryl group, heterocyclic ring group, a cyano group, a nitro group, a carboxyl group, an alkoxy group, an aryloxy group, a silyloxy group, a heterocyclicoxy group, an acyloxy group, a carbamoyloxy group, alkoxycarbonyloxy group, an aryloxycarbonyloxy group, an amino group (containing an anylino group), an ammonio group, an acylamino group, an aminocarbonylamino group, an alkoxycarbonylamino group, an aryloxycarbonylamino group, a sulfamoylamino group, an alkyl and arylsulfonylamino group, a mercapto group, an alkylthio group, an arylthio group, a heterocyclic ring thio group, a sulfamoyl group, a sulfo group, an alkyl and arylsulfinyl group, an alkyl and arylsulfonyl group, an acyl group, an aryloxycarbonyl group, an alkoxycarboxyl group, a carbamoyl group, an aryl and heterocyclic azo group, an imide group, a phophino group, a phophinyl group, a phophinyloxy group, a phophinylamino group, a phosphono group, a silyl group, a hydrazino group, a ureido group, a boronic acid group [—B(OH)$_2$], a phosphate group [—OPO(OH)$_2$], a sulfate group (—OSO$_3$H), and other known substituent.

When $R^{1a}$ to $R^{13a}$ are not a hydrogen atom, a straight, branched, or cyclic alkyl group that is substituted with a hydroxyl group is preferred.

Examples of the divalent linking group of Za may include an alkylene group, an arylene group, a carbonyl group, a sulfonyl group, a carbonyloxy group, a carbonylamino group, a sulfonyl amide group, an ether bond, a thioether bond, an amino group, a disulfide group, —(CH$_2$)$_n$—CO—, —(CH$_2$)$_n$—SO$_2$—, —CH═CH—, an aminocarbonylamino group, an amino sulfonylamino group and the like (n is an integer of 1 to 3).

In addition, examples of the preferred structure when at least one of $R_{201}$, $R_{202}$ and $R_{203}$ is not an aryl group may include a cation structure of the compound illustrated in [0046], [0047], and [0048] of Patent Application Laid-Open No. 2004-233661, [0040] to [0046] of Patent Application Laid-Open No. 2003-35948, and the compound illustrated in Formulas (I-1) to (I-70) of U.S. Patent Application Laid-Open No. 2003/0224288A1 and Formulas (IA-1) to (IA-54), Formulas (IB-1) to (IB-24) of U.S. Patent Application Laid-Open No. 2003/0077540A 1.

In Formula (ZII), (ZIII), each of $R_{204}$ to $R_{207}$ independently represents an aryl group, an alkyl group or a cycloalkyl group.

The aryl group, the alkyl group and the cycloalkyl group of $R^{204}$ to $R^{207}$ are the same as an aryl group explained as the aryl group, the alkyl group, the cycloalkyl group of $R^{201}$ to $R^{203}$ in the above-described compound (ZI).

The aryl group, the alkyl group, the cycloalkyl group $R^{204}$ to $R^{207}$ may have a substituent. Examples of the substituent may include those which may be possessed by the aryl group, the alkyl group, the cycloalkyl group of $R_{201}$ to $R_{203}$ in the above-described compound (ZI).

$Z^-$ represents a non-nucleophilic anion, and examples thereof are the same as the non-nucleophilic anion of $Z^-$ in Formula (ZI).

As an acid-generating agent, the compound represented by the following Formula (ZIV), (ZV), (ZVI) may also be described.

(ZIV)

$$Ar_3—SO_2—SO_2—Ar_4$$

(ZV)

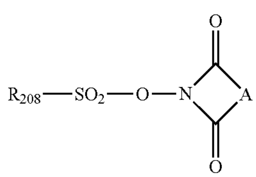

-continued (ZVI)

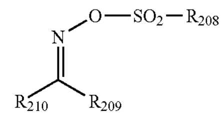

In Formulas (ZIV) to (ZVI),

Each $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, alkylene group or an arylene group.

Specific examples of the aryl group of $Ar_3$, $Ar_4$, $R_{208}$, $R_{209}$ and $R_{210}$ may include the same as the specific examples of the aryl group as $R_{201}$, $R_{202}$ and $R_{203}$ in Formula (ZI).

Specific examples of the alkyl group and a cycloalkyl group of $R_{208}$, $R_{209}$ and $R_{210}$ may include the same as the specific examples of the alkyl group and a cycloalkyl group of $R_{201}$, $R_{202}$ and $R_{203}$ in Formula (ZI).

Examples of the alkylene group of A may include an alkylene group having 1 to 12 carbon atoms (for example, a methylene group, an ethylene group, a propylene group, an isopropylene group, a butylene group, an isobutylene group and the like), examples of the alkenylene group of A may include an alkenylene group having 2 to 12 carbon atoms (for example, an ethenylene group, a propenylene group, a butenylene group and the like), and examples of the arylene group of A include an arylene group having 6 to 10 carbon atoms (for example, a phenylene group, a tolylene group, a naphthylene group and the like) respectively.

Hereinafter, among acid-generating agents, particularly preferred examples thereof will be described.

(z1)

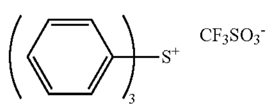

(z2)

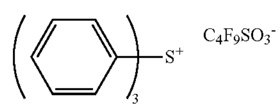

(z3)

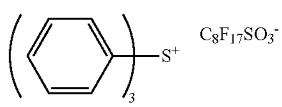

(z4)

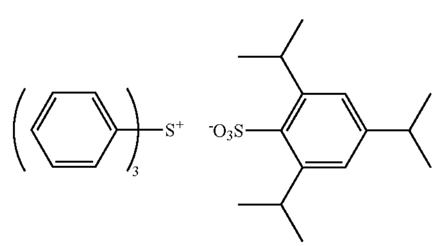

(z5)

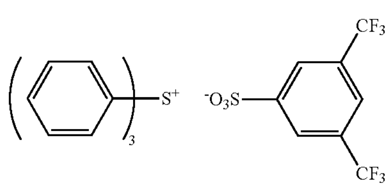

(z6)

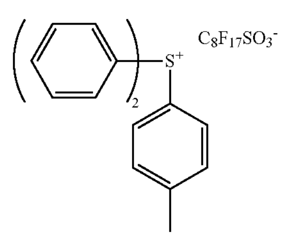

(z7)

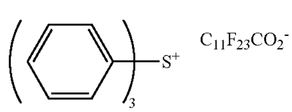

(z8)

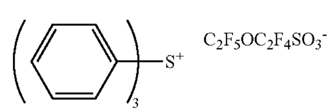

-continued
(z9)
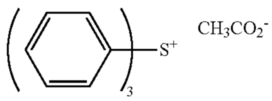
(z10)
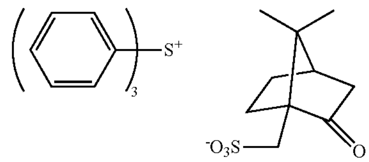
(z11)
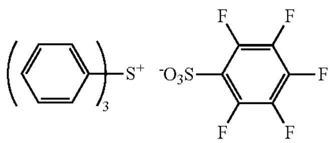
(z12)
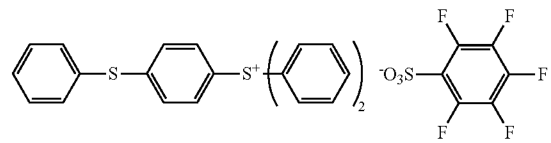
(z13)
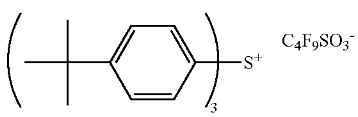
(z14)
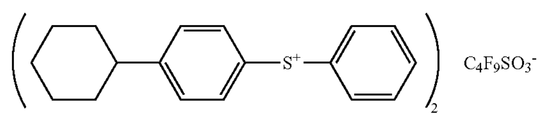
(z15)
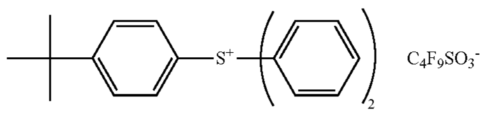
(z16)
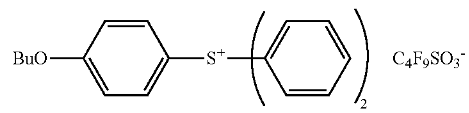
(z17)
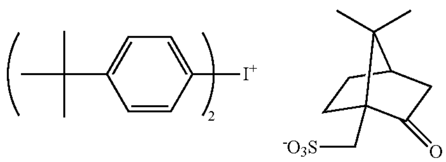
(z18)
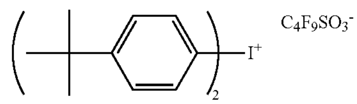
(z19)
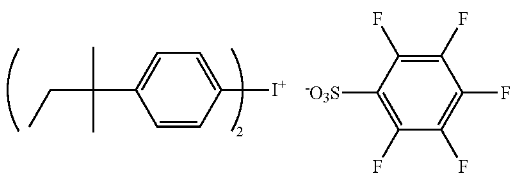
(z20)
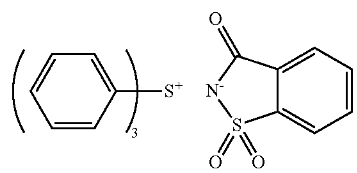
(z21)
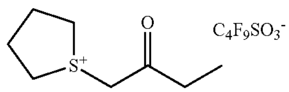
(z22)
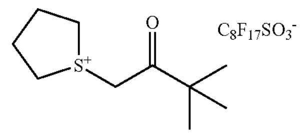
(z23)
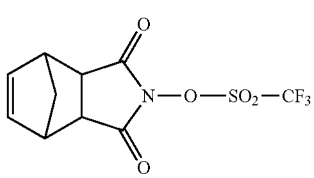
(z24)
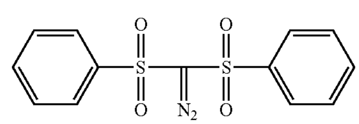
(z25)
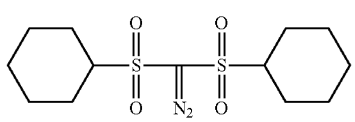
(z26)
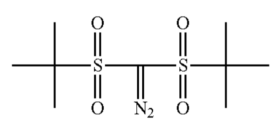
(z27)
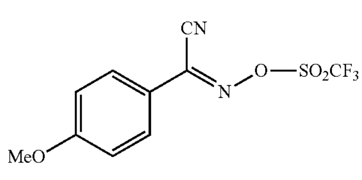

-continued
(z28)
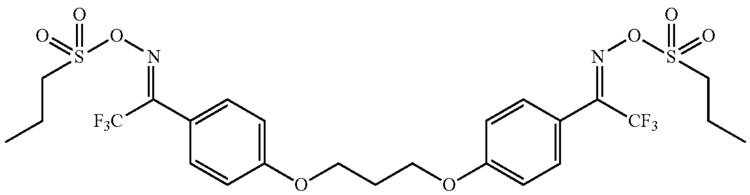
(z29)
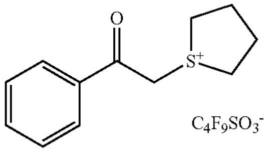
(z30)
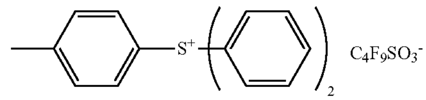
(z31)
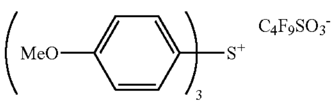
(z32)
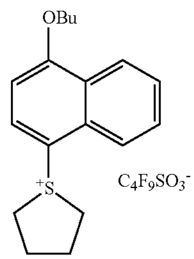
(z33)
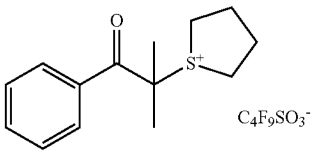
(z34)
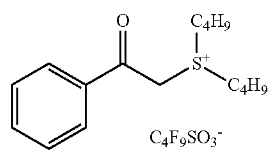
(z35)
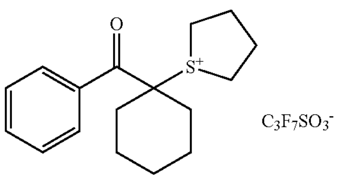
(z36)
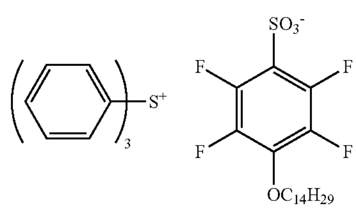
(z37)
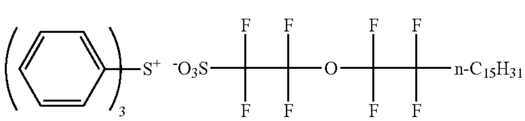
(z38)
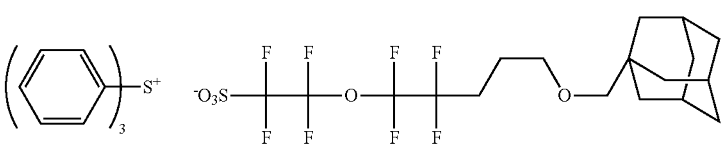
(z39)
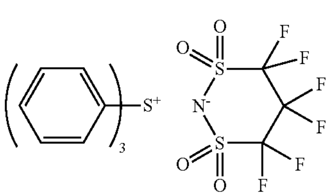
(z40)
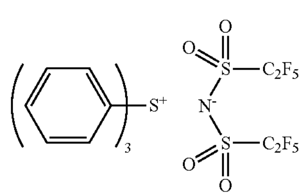

-continued
(z41)
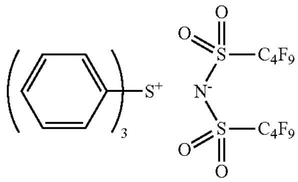
(z42)
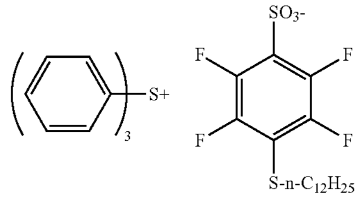
(z43)
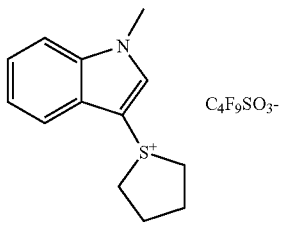
(z44)
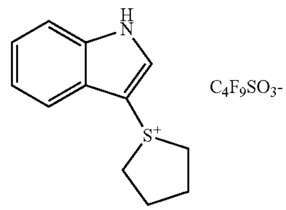
(z45)
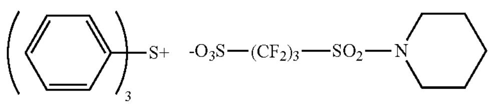
(z46)
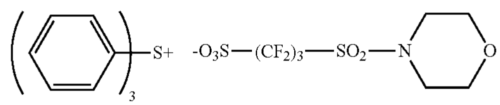
(z47)
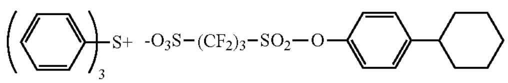
(z48)
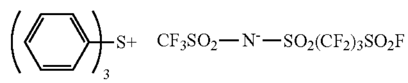
(z49)
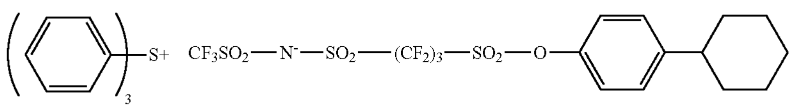
(z50)
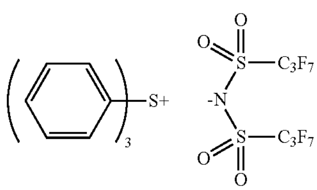
(z51)
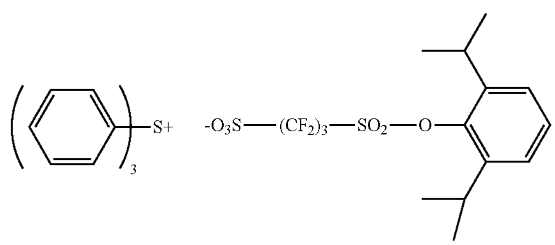
(z52)
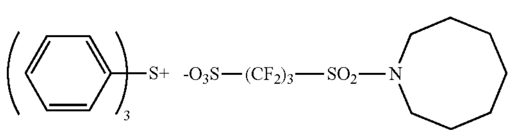
(z53)
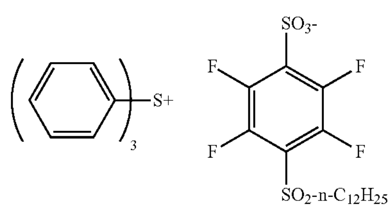
(z54)
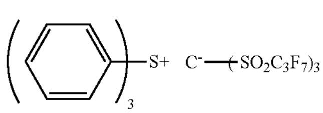
(z55)
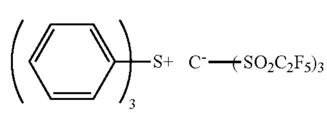
(z56)
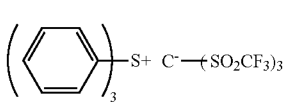
(z57)
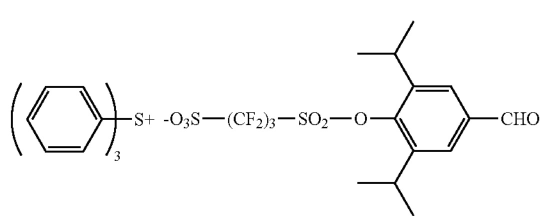

-continued
(z58)
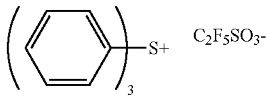
(z59)
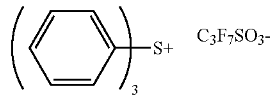
(z60)
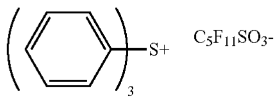
(z61)
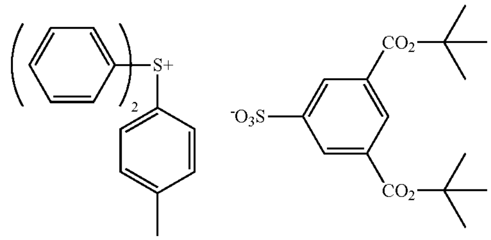
(z62)
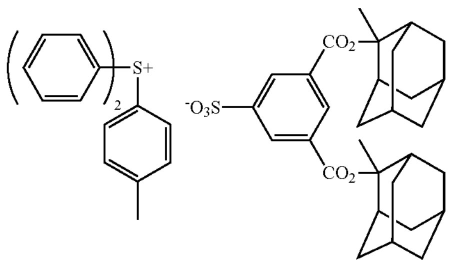
(z63)
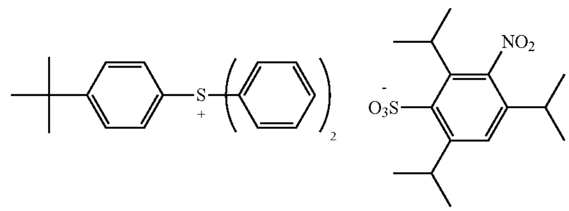
(z64)
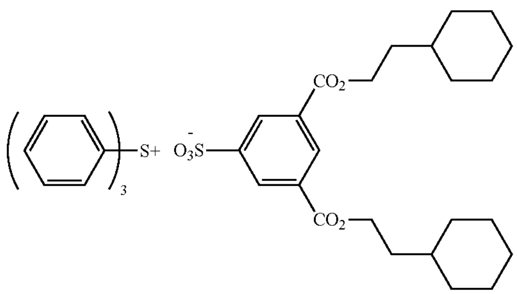
(z65)
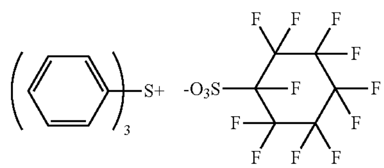
(z66)
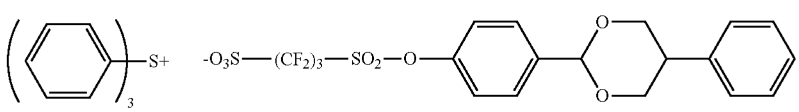
(z67)
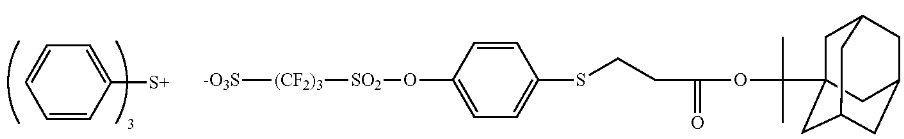
(z68)
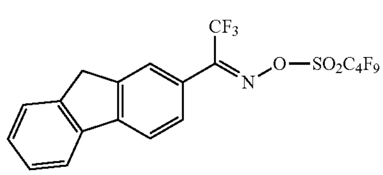
(z69)
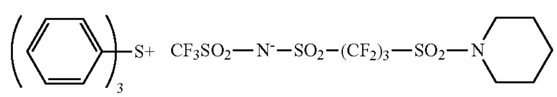
(z70)
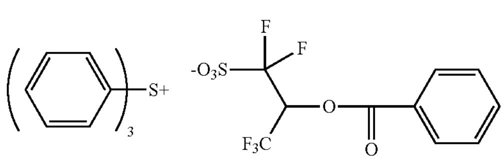
(z71)
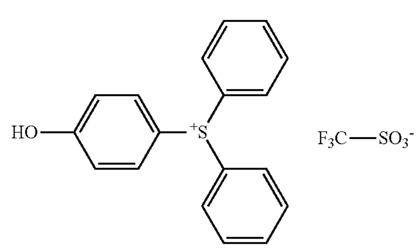

-continued
(z72)
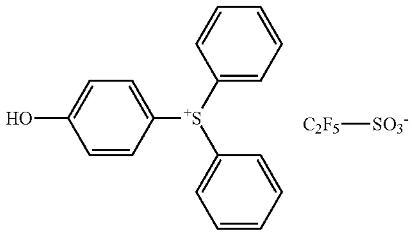
(z73)
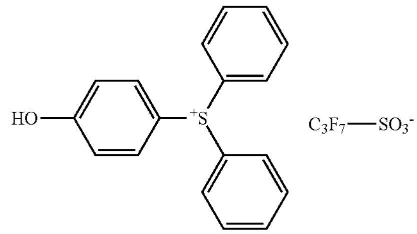
(z74)
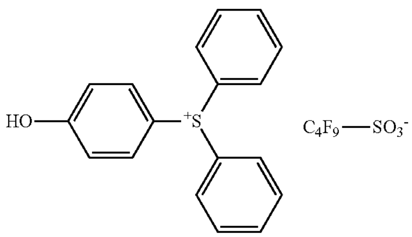
(z75)
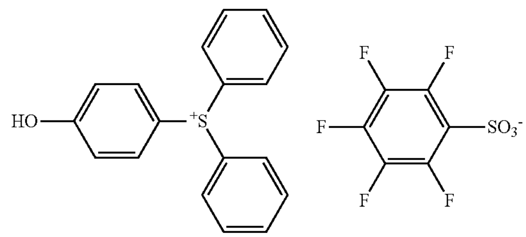
(z76)
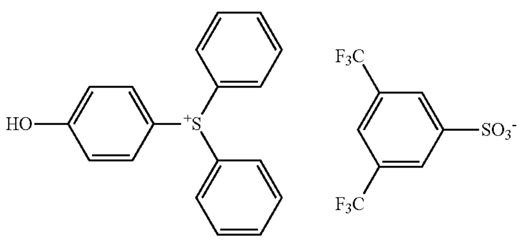
(z77)
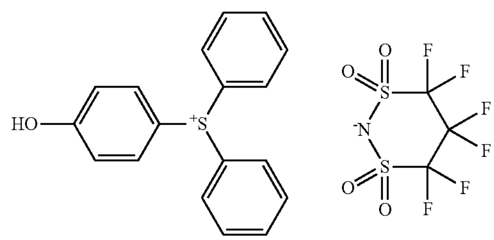
(z78)
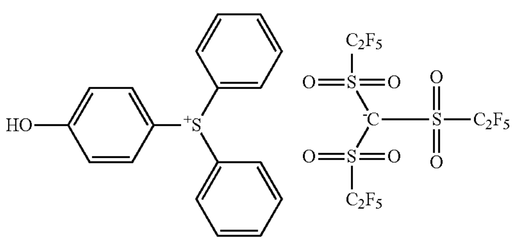
(z79)
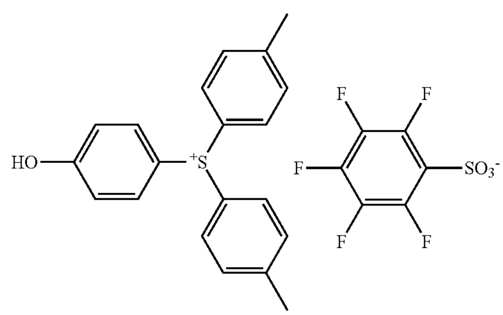
(z80)
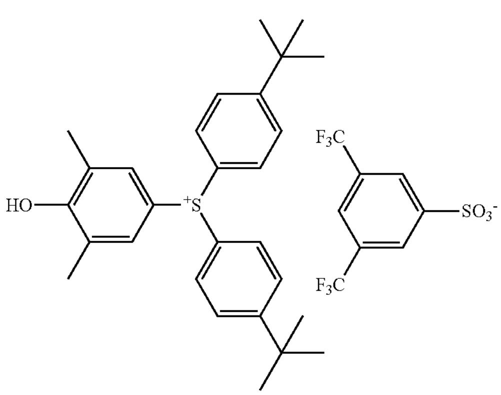
(z81)
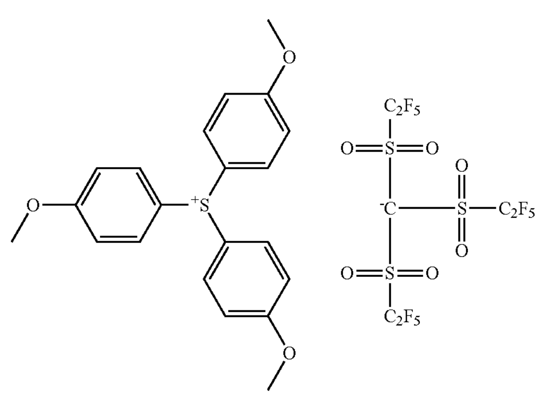

-continued
(z82)
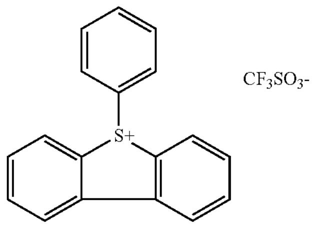
(z83)
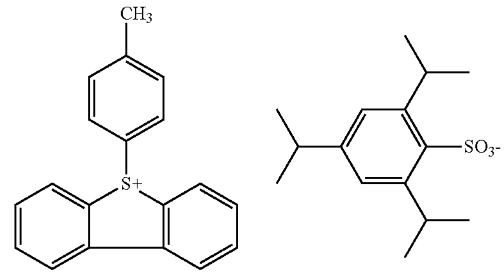
(z84)
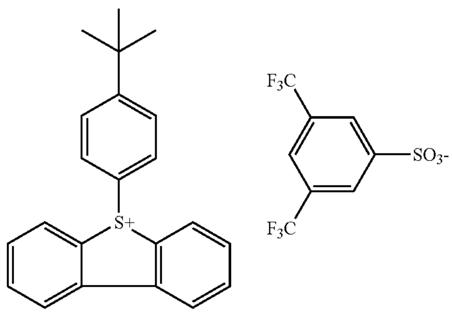
(z85)
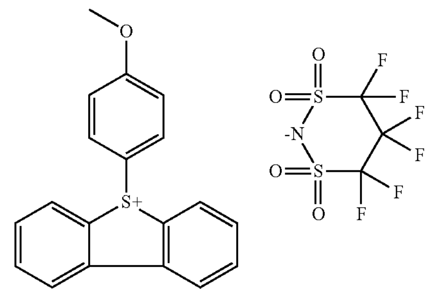
(z86)
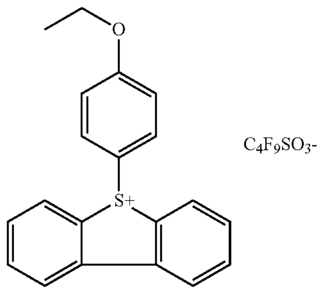
(z87)
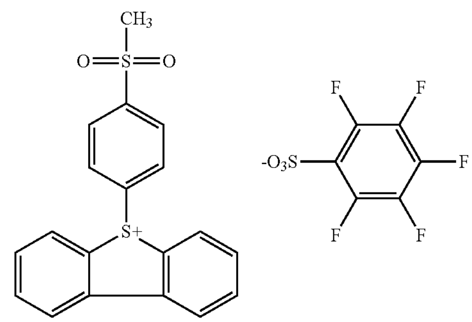
(z88)
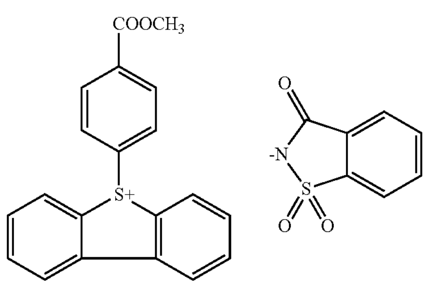
(z89)
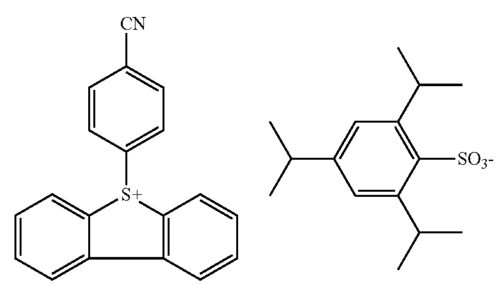
(z90)
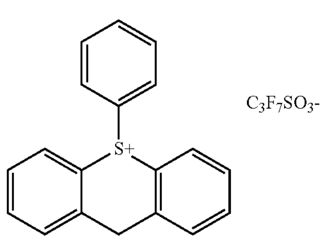
(z91)
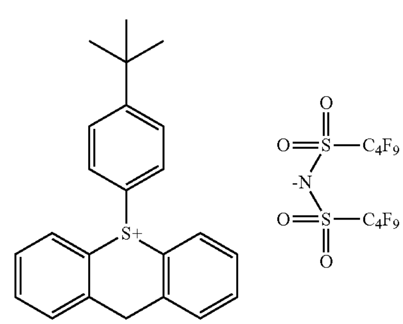

-continued
(z92)
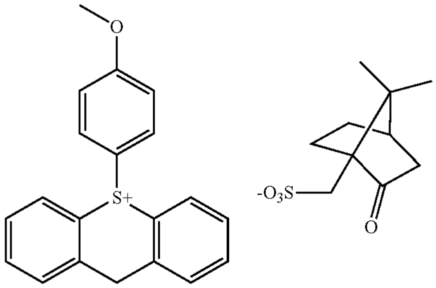
(z93)
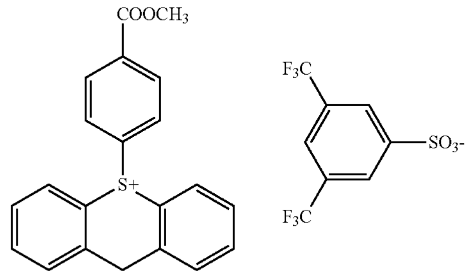
(z94)
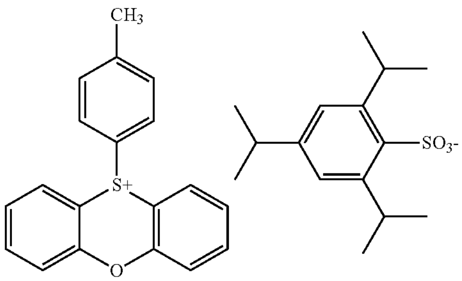
(z95)
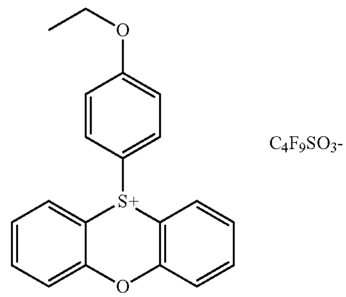
(z96)
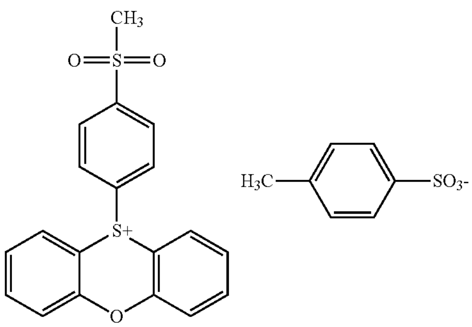
(z97)
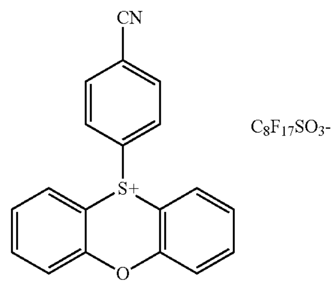
(z98)
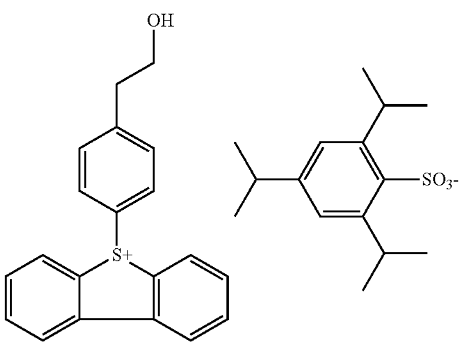
(z99)
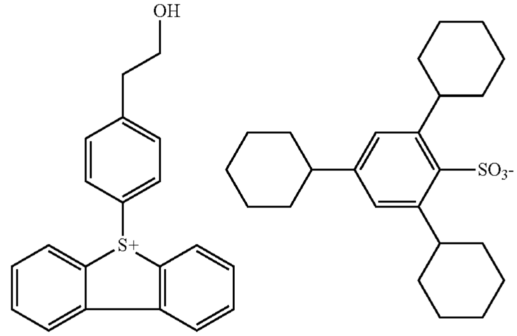
(z100)
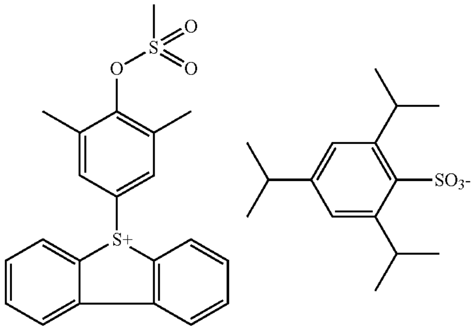
(z101)
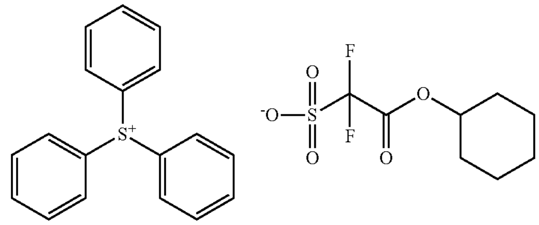

-continued
(z102)
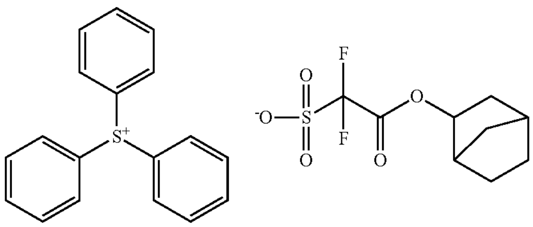
(z103)
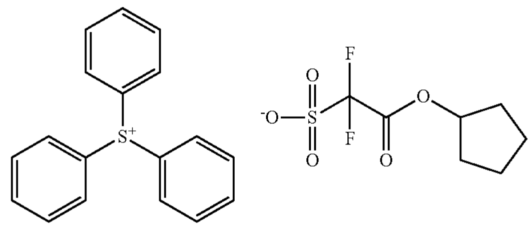
(z104)
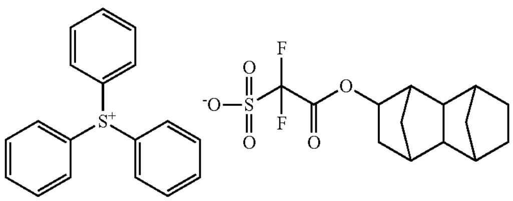
(z105)
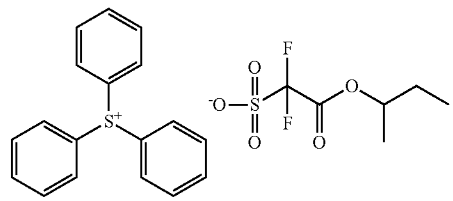
(z106)
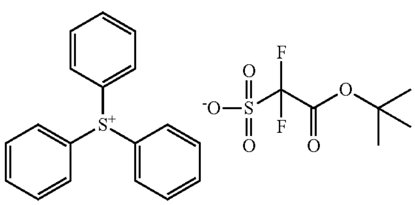
(z107)
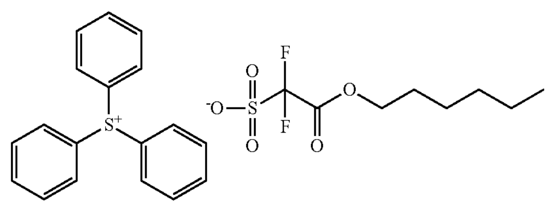
(z108)
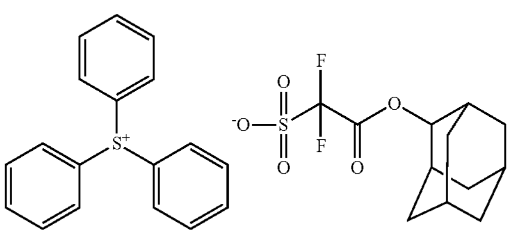
(z109)
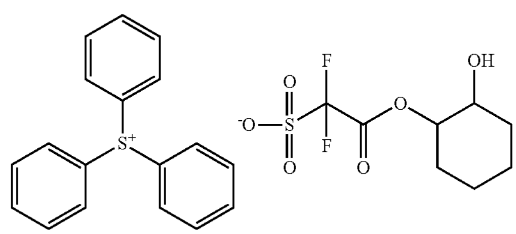
(z110)
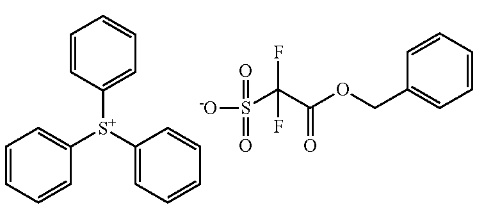
(z111)
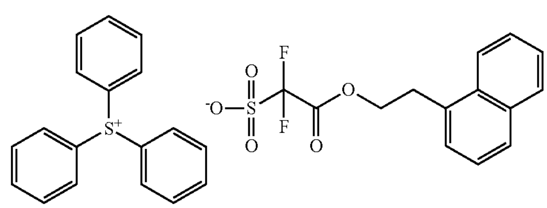
(z112)
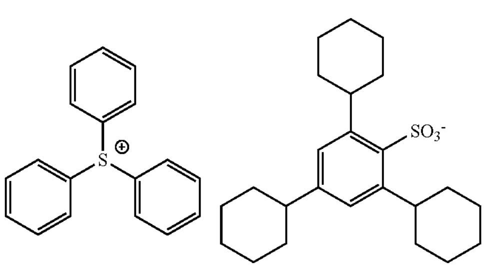
(z113)
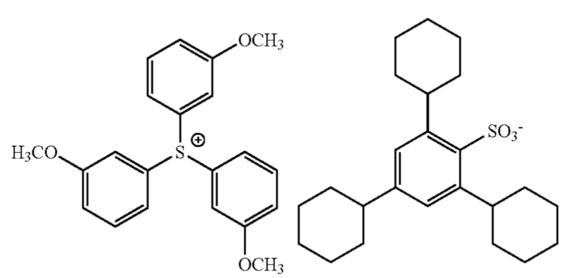

-continued
(z114)
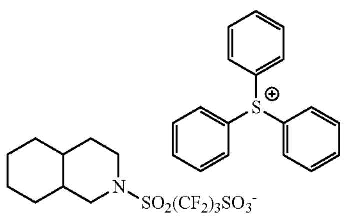
(z115)
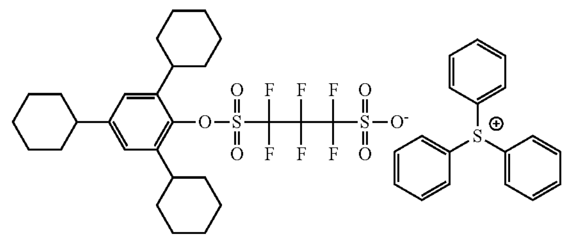
(z116)
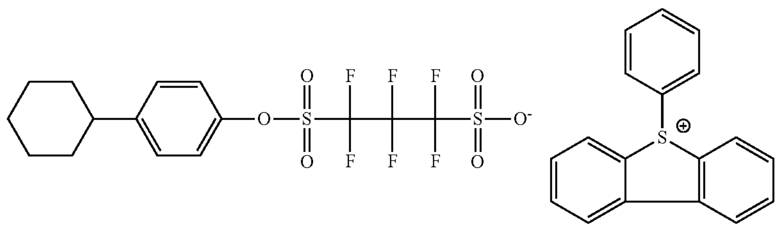
(z117)
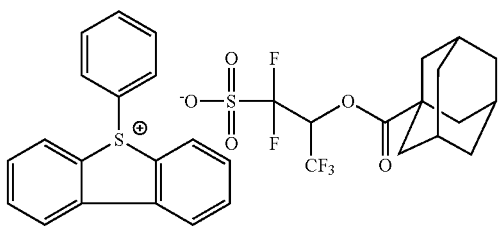
(z118)
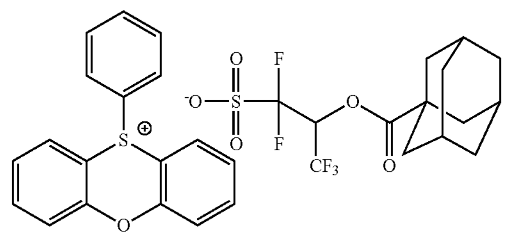
(z119)
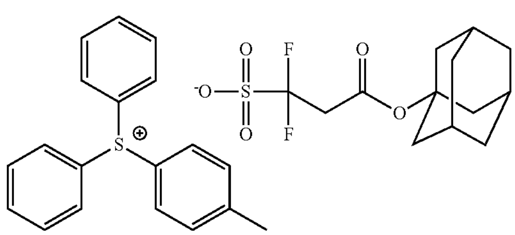
(z120)
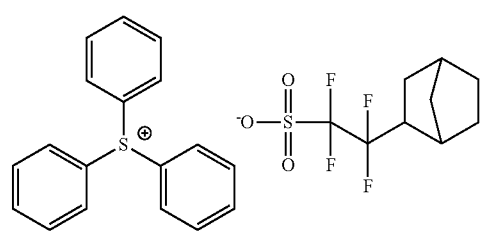
(z121)
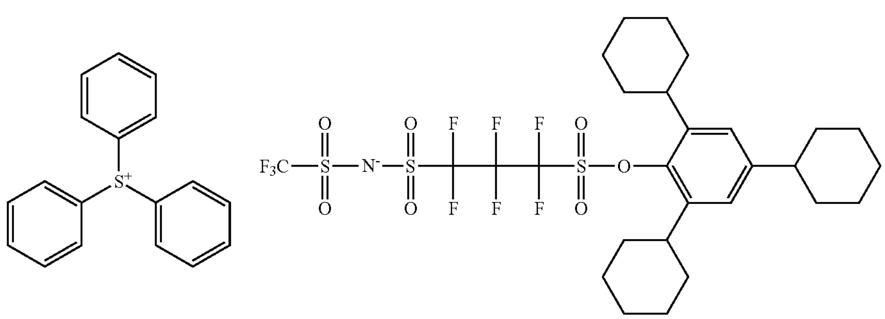
(z122)
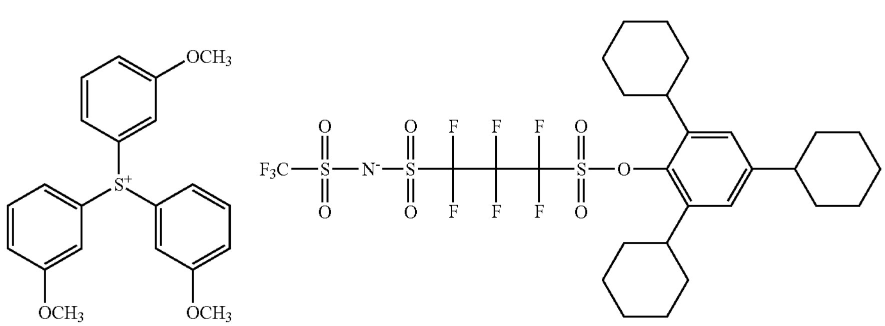

-continued
(z123)
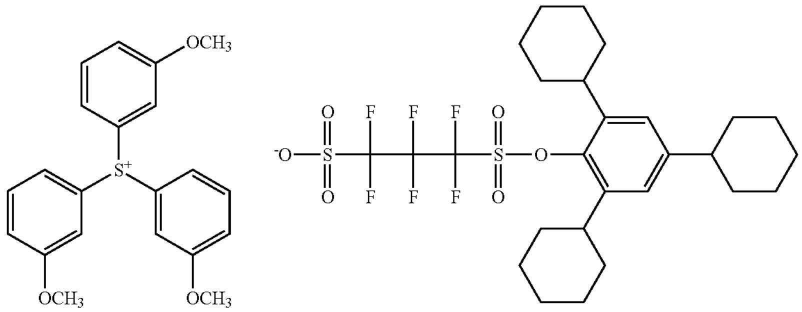
(z124)
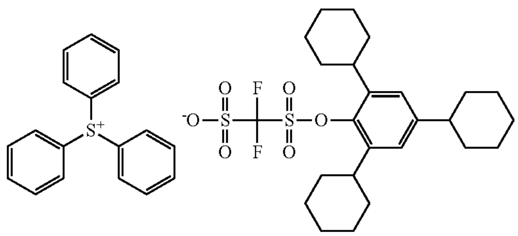
(z125)
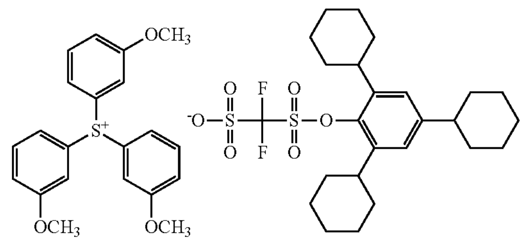
(z126)
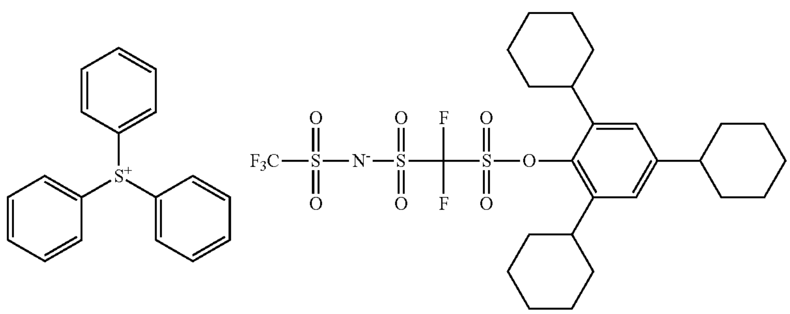
(z127)
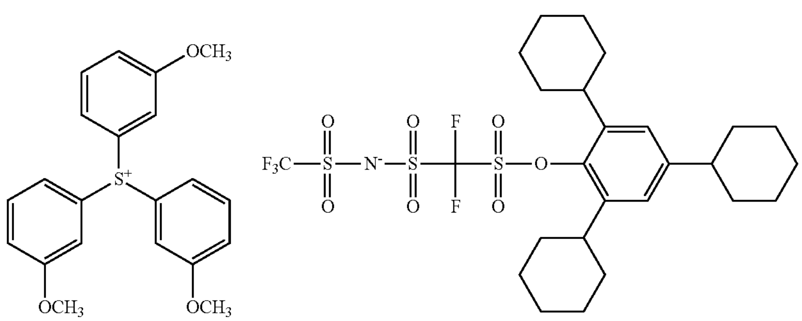
(z128)
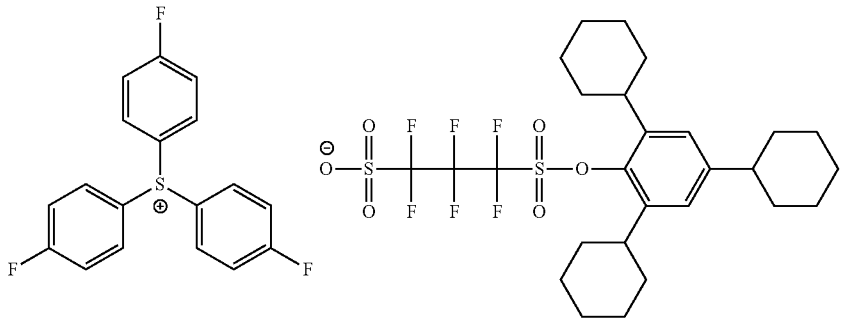

-continued
(z129)
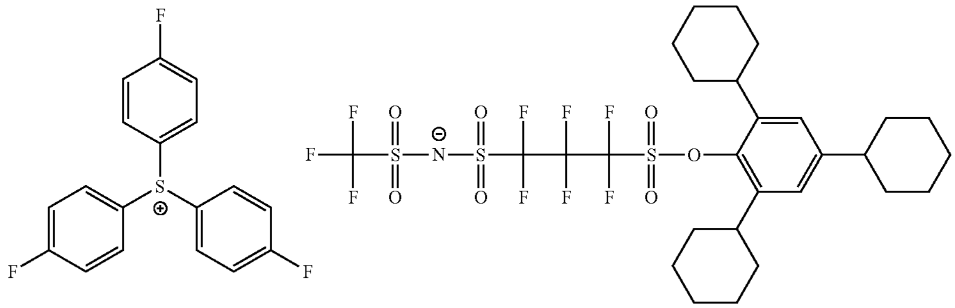
(z130)
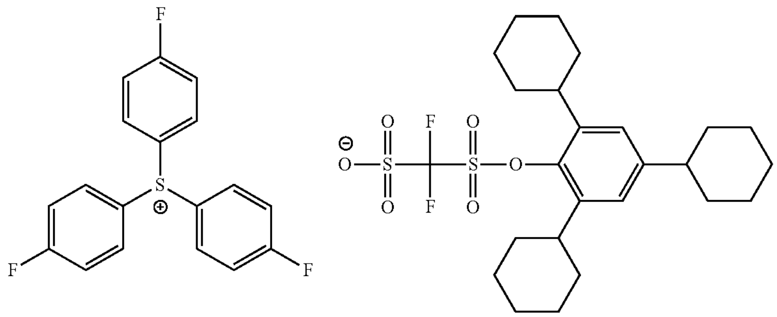
(z131)
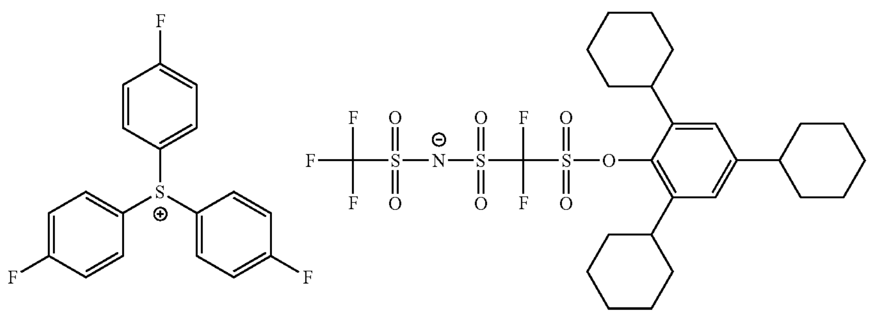
(z132)
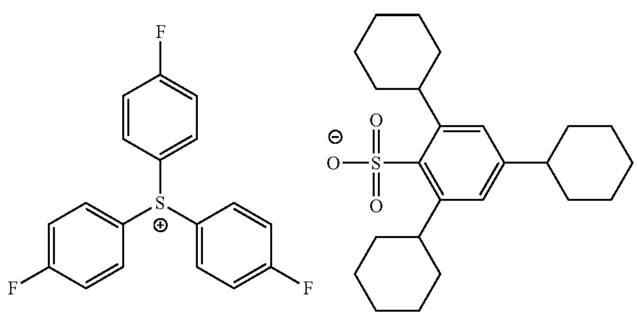
(z133)
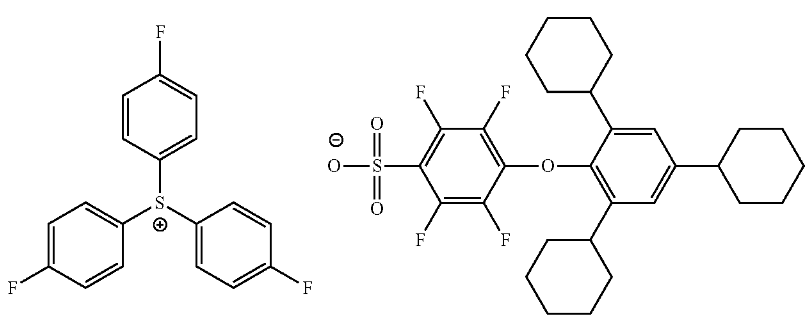

-continued
(z134)
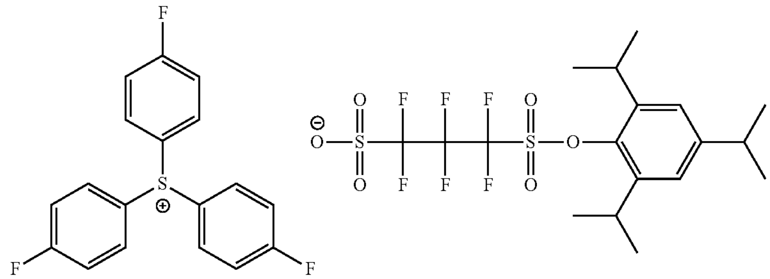
(z135)
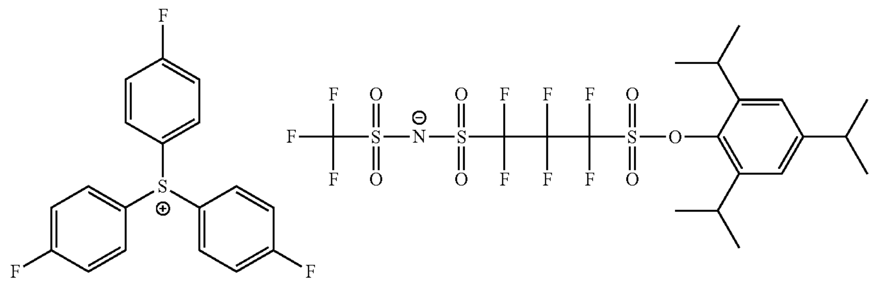
(z136)
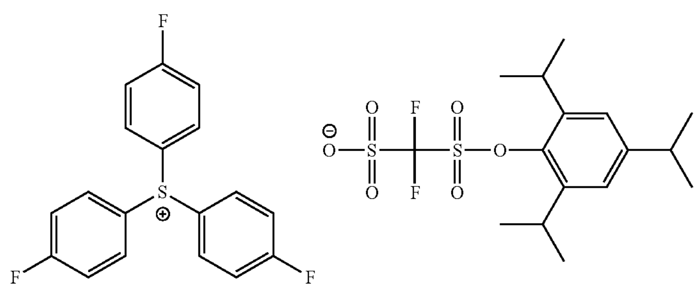
(z137)
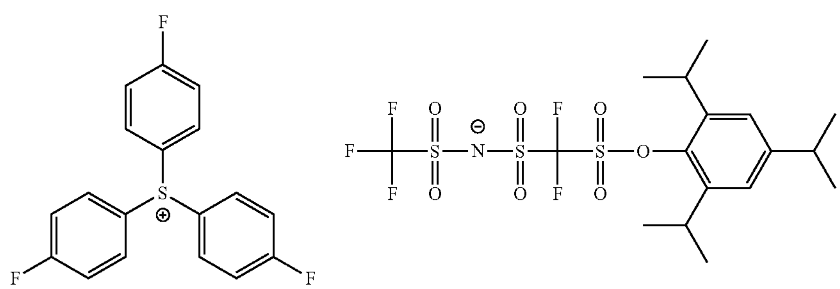
(z138)
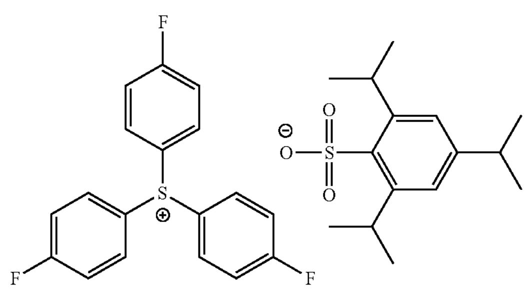

-continued (z139)

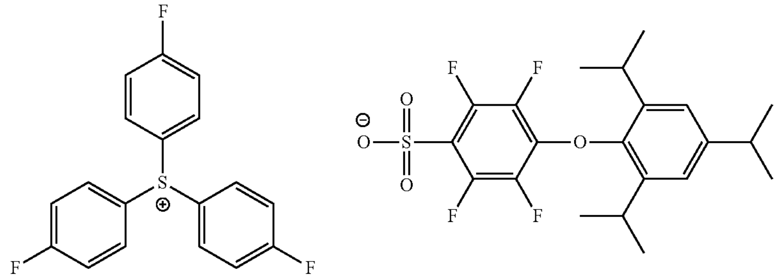

(z140)

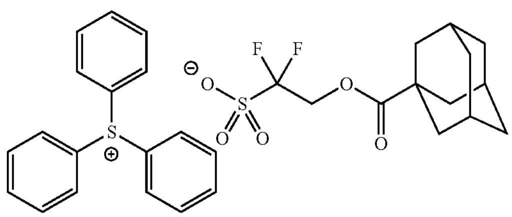

(z141)

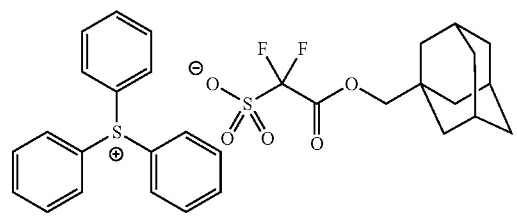

(z142)

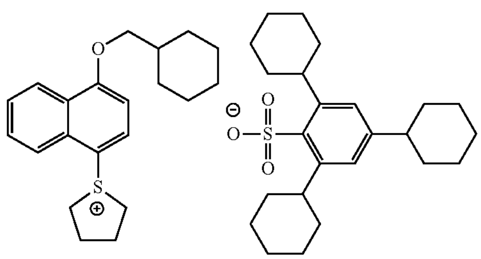

(z143)

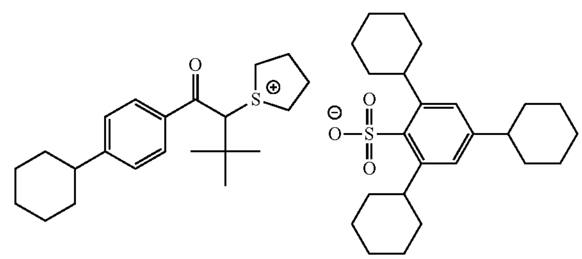

An acid-generating agent may be used alone or in combination of two or more thereof.

Further, the content of the photoacid-generating agent is preferably 0.1 to 50% by mass, more preferably 0.5 to 45% by mass, and still more preferably 1 to 40% by mass based on the total solid content of the composition.

[4] Compound which Decomposes by the Action of an Acid to Generate an Acid

The electron beam- or extreme ultraviolet-sensitive resin composition of the present invention may also have one or two kinds of compounds which decompose by the action of an acid to generate an acid. An acid generated by the compound which decomposes by the action of the above-described acid to generate an acid is preferably a sulfonic acid, a methide acid or an imide acid.

Hereinafter, examples of the compound which decomposes by the action of an acid available to the present invention to generate an acid will be shown, but are not limited thereto.

(PA-1)

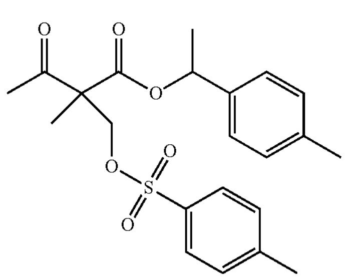

-continued (PA-2)

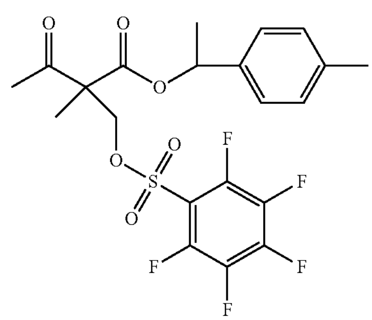

(PA-3)

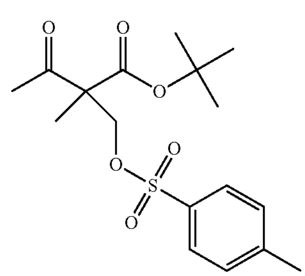

-continued
(PA-4)
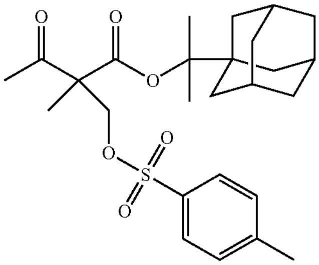
(PA-5)
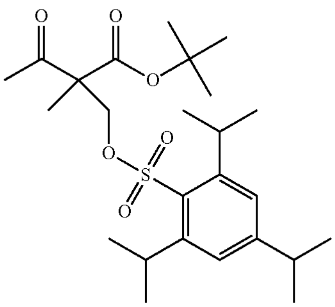
(PA-6)
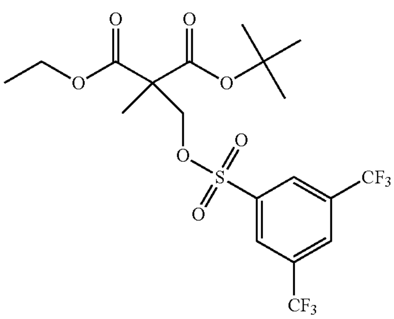
(PA-7)
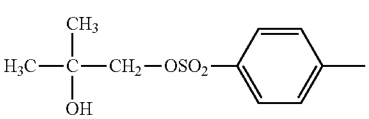
(PA-8)
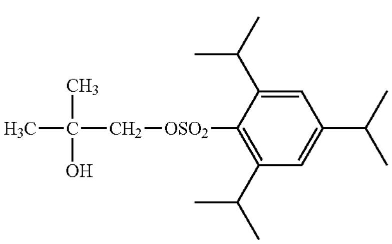
(PA-9)
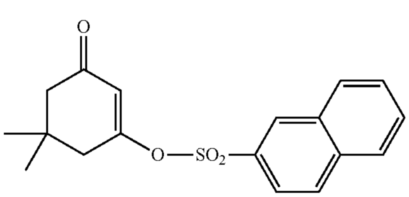
-continued
(PA-10)
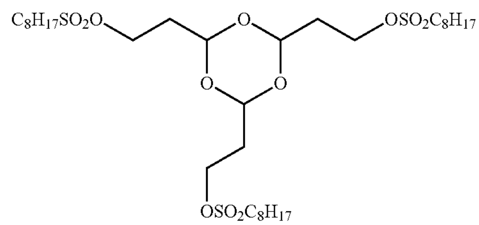
(PA-11)
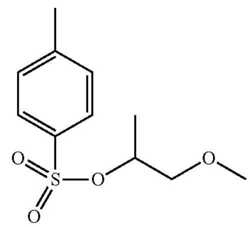
(PA-12)
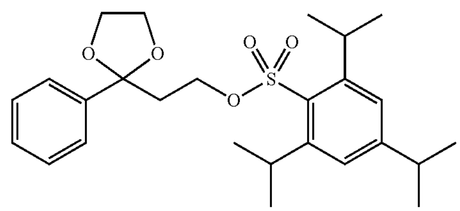
(PA-13)
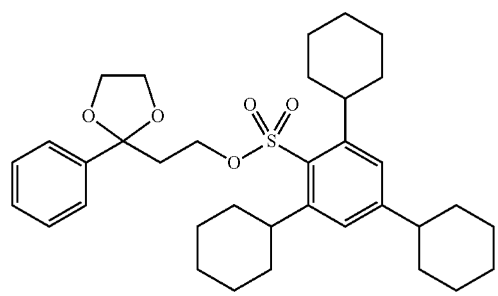
(PA-14)
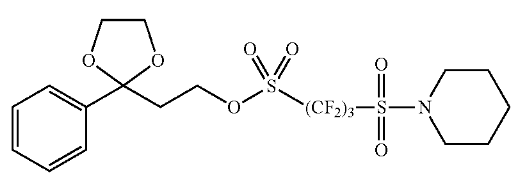
(PA-15)
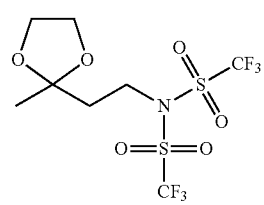

-continued (PA-16)

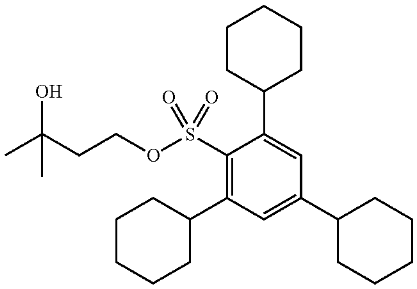

(PA-17)

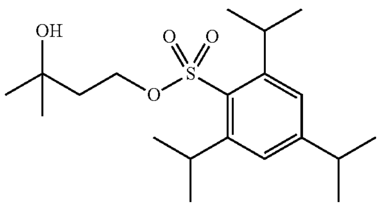

(PA-18)

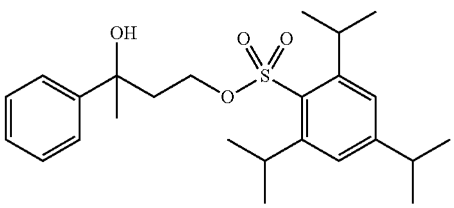

The compound which decomposes by the action of the above-described acid to generate an acid may be used alone or in combination of two or more thereof.

Further, the content of the compound which decomposes by the action of an acid to generate an acid is preferably 0.1 to 40% by mass, more preferably 0.5 to 30% by mass, and still more preferably 1.0 to 20% by mass based on the total solid content of the electron beam- or extreme ultraviolet-sensitive resin composition.

[5] Resist Solvent (a Coating Solvent)

A solvent which may be used for preparing the composition is not particularly limited as long as it can decompose each component, but examples thereof may include alkyleneglycol monoalkyl ethercarboxylate (propyleneglycol monomethylether acetate (PGMEA) (alias: 1-methoxy-2-acetoxy propane) and the like), alkyleneglycol monoalkyl ether (propyleneglycol monomethylether (PGME; 1-methoxy-2-propanol) and the like), alkylester lactate (ethyl lactate, lactate methyl and the like), cyclic lactone (γ-butyrolactone and the like, preferably 4 to 10 carbon atoms), chained or cyclic ketone (2-heptanone, cyclohexanone and the like, preferably 4 to 10 carbon atoms), alkylenecarbonate (ethylene carbonate, propylene carbonate and the like), alkyl carboxylate (alkyl acetate such as butyl acetate is preferred), alkyl alkoxy acetate (ethyl ethoxypropionate) and the like. Examples of other usable solvents may include solvents described in [0244] and forth of U.S. Patent Application Publication No. 2008/0248425 A1.

Among the above-described solvents, alkyleneglycol monoalkylether carboxylate and alkyleneglycol monoalkyl ether are preferred.

These solvents may be used alone or in combination of two or more thereof. When two or more solvents are mixed, it is preferred that a solvent having a hydroxyl group is mixed with a solvent not having a hydroxyl group. The mass ratio of a solvent having a hydroxyl group to a solvent not having a hydroxyl group is 1/99 to 99/1, preferably 10/90 to 90/10, and more preferably 20/80 to 60/40.

As a solvent having a hydroxyl group, alkyleneglycol monoalkyl ether is preferred, and as a solvent not having a hydroxyl group, alkyleneglycol monoalkyl ethercarboxylate is preferred.

[6] Basic Compound

The electron beam- or extreme ultraviolet-sensitive resin composition according to the present invention may further contain basic compound. The basic compound is preferably a compound whose basicity is strong compound compared to phenol. In addition, this basic compound is preferably an organic basic compound, and more preferably a basic compound containing nitrogen.

Basic compound that contains usable nitrogen is not particularly limited, but for example, the compounds that are classified into the following (1) to (7) can be used.

(1) Compound represented by Formula (BS-1)

(BS-1)

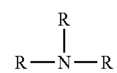

In Formula (BS-1),

Each R independently represents a hydrogen atom or an organic group, provided that at least one of three kinds of R is an organic group. Such an organic group is a straight or branched alkyl group, a monocyclic or polycyclic cycloalkyl group, aryl group or aralkyl group.

The carbon number of an alkyl group as R is not particularly limited, but generally 1 to 20, and preferably 1 to 12.

The carbon number of a cycloalkyl group as R is not particularly limited, but generally 3 to 20, and preferably 5 to 15.

The carbon number of an aryl group as R is not particularly limited, but generally 6 to 20, and preferably 6 to 10. Specifically, a phenyl group, a naphthyl group and the like are exemplified.

The carbon number of an aralkyl group as R is not particularly limited, but generally 7 to 20, and preferably 7 to 11. Specifically, a benzyl group and the like are exemplified.

An alkyl group, a cycloalkyl group, an aryl group and an aralkyl group R may be groups in which a hydrogen atom is substituted with a substituent. Examples of the substituent may include an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group and the like.

Further, the compound represented by Formula (BS-1) may be a compound in which at least two of R are preferably an organic group.

Specific examples of the compound represented by Formula (BS-1) may include tri(n-butyl)amine, tri-n-pentylamine, tri-n-octylamine, tri-n-decyl amine, triisodecyl amine, dicyclohexyl methyl amine, tetradecyl amine, pentadecyl amine, hexadecyl amine, octadecyl amine, didecyl amine, methyl octadecyl amine, di-methyl undecyl amine, N,N-dimethyl-dodecyl amine, methyl di-octadecylamine, N,N-dibutyl aniline, N,N-dihexyl aniline, 2,6-diisopropyl aniline, and 2,4,6-tri (t-butyl) aniline and the like.

Further, as a basic compound represented by Formula (BS-1), examples thereof may include an alkyl group in which at least one R is substituted with a hydroxyl group. Specific examples thereof may include triethanolamine and N,N-dihydroxyethylaniline.

Further, an alkyl group as R may have an oxygen atom in an alkyl chain. That is, an oxylkylene chain may be formed. As an oxylkylene chain, —$CH_2CH_2O$— is preferred. Specifically, examples thereof may include a tris(methoxyethoxyethyl)amine, and the compound exemplified after column 3, line 60 of U.S. Patent Application Publication No. 6,040,112.

Examples of the basic compound represented by Formula (BS-1) may include the following compounds.

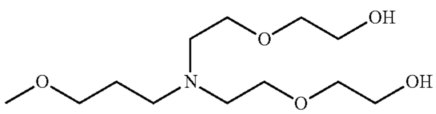
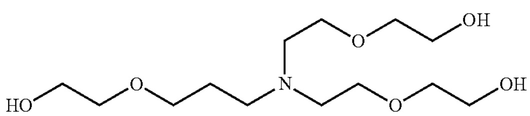
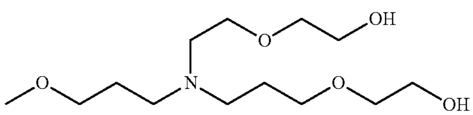
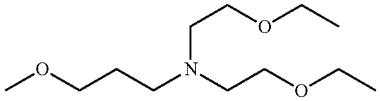
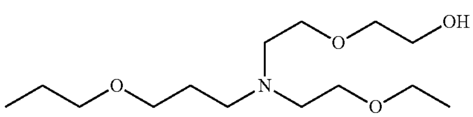
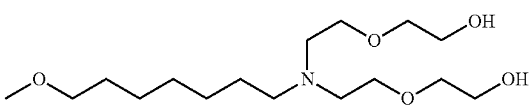
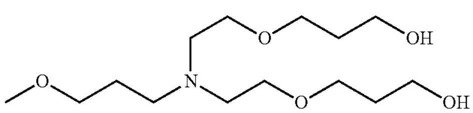
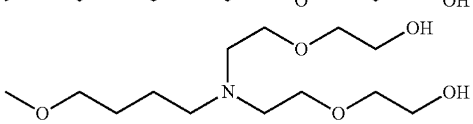
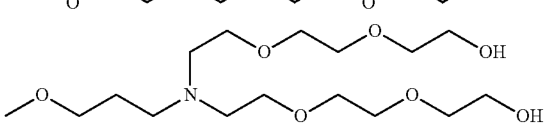
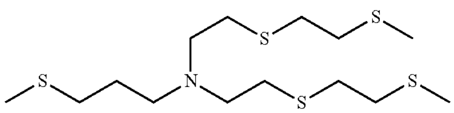
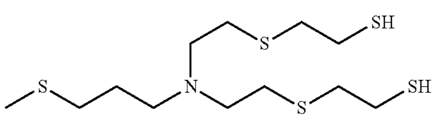
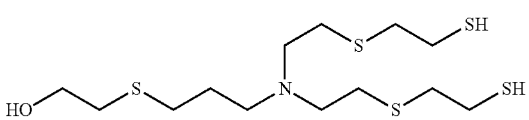

-continued

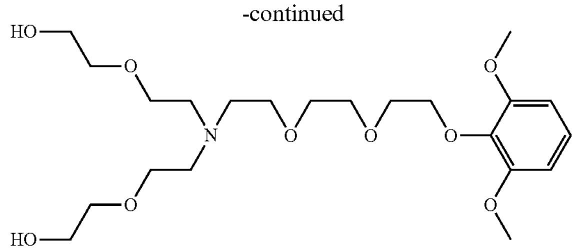
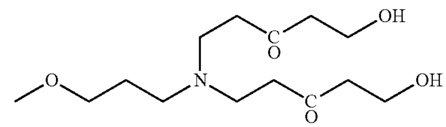
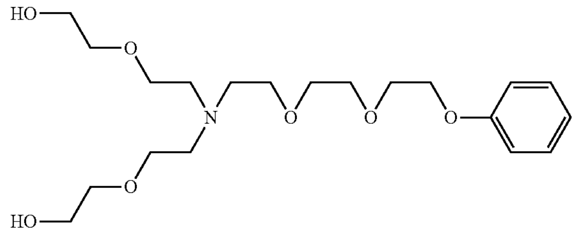
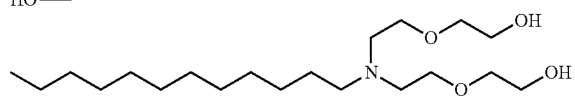
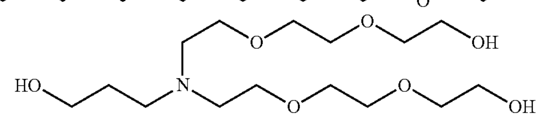
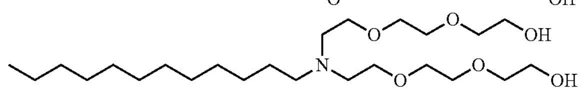
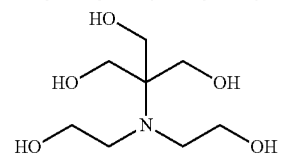

(2) Compound Having Nitrogen-Containing Heterocyclic Ring Structure

The nitrogen-containing heterocyclic ring may have aromaticity and may not have aromaticity. In addition, the ring may have a plurality of nitrogen atoms and. Further, the ring may contain a hetero atom other than nitrogen. Specifically, examples thereof may include the compound having an imidazole structure (2-phenyl benzoimidazole, 2,4,5-triphenyl imidazole and the like), the compound having a piperidine structure [N-hydroxyethylpiperidine and bis(1,2,2,6,6-pentamethyl-4-piperidyl)sebacate and the like], the compound having a pyridine structure (4-dimethylaminopyridine and the like), and the compound having a antipirine structure (antipirine and hydroxyantipirine and the like).

In addition, the compound having two or more ring structures may also appropriately used. Specifically, examples thereof may include 1,5-diazabicyclo[4.3.0]non-5-ene and 1,8-diazabicyclo[5.4.0]-undec-7-ene and the like.

(3) Amine Compound Having a Phenoxy Group

The amine compound having a phenoxy group means the compound that has N atom of an alkyl group which the amine compound contains and a phenoxy group in the opposite end thereof. A phenoxy group may have a substituent such as an alkyl group, an alkoxy group, a halogen atom, a cyano group, a nitro group, a carboxyl group, a carboxylic acid ester group, a sulfonic acid ester group, an aryl group, an aralkyl group, an aryloxy group, an aryloxy group and the like.

This compound still more preferably contains at least one oxylkylene chain between a phenoxy group and a nitrogen atom. The number of an oxylkylene chain in one molecule is preferably 3 to 9, and more preferably 4 to 6. Among oxylkylene chains, —$CH_2CH_2O$— is particularly preferred.

Specific examples thereof may include 2-[2-{2-(2,2-dimethoxy-phenoxyethoxy)ethyl}-bis-(2-methoxyethyl)]-amine and the compounds of (C1-1) to (C3-3) exemplified in [0066] of U.S. Patent Application Publication No. 2007/0224539A1.

The amine compound having a phenoxy group can be obtained by heating and reacting a primary or secondary amine having a phenoxy group and halo alkyl ether, by adding an aqueous solution of a strong base such as sodium hydroxide, calcium hydroxide and a tetraalkylammonium, and then by extracting with an organic solvent such as ethyl acetate and chloroform. In addition, the amine compound having a phenoxy group can also be obtained by heating and reacting a primary or secondary amine and halo alkyl ether having a phenoxy group in the end, by adding an aqueous solution of a strong base such as sodium hydroxide, calcium hydroxide and a tetraalkylammonium, and then by extracting with an organic solvent such as ethyl acetate and chloroform.

(4) Ammonium Salt

As the basic compound, an ammonium salt may be appropriately used. Examples of the anion of the ammonium salt may include halide, sulfonate, borate and phosphate. Among them, halide and sulfonate are particularly preferred.

As halide, chloride, bromide and iodide are particularly preferred.

As sulfonate, the organic sulfonate having 1 to 20 carbon atoms is particularly preferred. Examples of the organic sulfonate may include an alkylsulfonate and an arylsulfonate having 1 to 20 carbon atoms.

An alkyl group contained in an alkylsulfonate may have a substituent. Examples of the substituent may include a fluorine atom, a chlorine atom, a bromine atom, an alkoxy group, an acyl group and an aryl group. Specific examples of the alkylsulfonate may include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate.

Examples of the aryl group contained in arylsulfonate may include a phenyl group, a naphthyl group and an anthryl group. These aryl groups may have a substituent. Examples of the substituent may include a straight or branched alkyl group having 1 to 6 carbon atoms and a cycloalkyl group having 3 to 6 carbon atoms. Specifically, for example, methyl, ethyl, n-propyl, isopropyl, n-butyl, i-butyl, t-butyl, n-hexyl and cyclohexyl group are preferred. Examples of other substituents include an alkoxy group having 1 to 6 carbon atoms, a halogen atom, cyano, nitro, an acyl group and an acyloxy group.

The ammonium salt may be only hydroxide or carboxylate. In this case, this ammonium salt is particularly preferably a tetraalkylammonium hydroxide having 1 to 8 carbon atoms (a tetraalkylammonium hydroxide such as a tetramethylammonium hydroxide a tetraethylammonium hydroxide, and a tetra-(n-butyl)ammonium hydroxide) and the like.

The preferred examples of the basic compound may include a guanidine, an aminopyridine, an aminoalkylpyridine, an aminopyrrolidine, an indazole, an imidazole, a pirazole, a pirazine, a pyrimidine, a purine, an imidazoleline, a pirazoleline, a piperazine, an aminomorpholine and an aminoalkylmorpholine. These compounds may also have a substituent.

Examples of the preferred substituent may include an amino group, an amino alkyl group, an alkyl amino group, an amino aryl group, an aryl amino group, an alkyl group, an alkoxy group, an acyl group, an acyloxy group, an aryl group, an aryloxy group, a nitro group, a hydroxyl group and a cyano group.

Particularly preferred examples of the basic compound may include guanidine, 1,1-dimethylguanidine, 1,1,3,3,-tetramethylguanidine, an imidazole, 2-methyl imidazole, 4-methyl imidazole, N-methyl imidazole, 2-phenylimidazole, 4,5-diphenyl imidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6tetramethylpiperidine, 4-piperidinopiperidine, 2-iminopiperidine, 1-(2-aminoethyl)pyrrolidine, pirazole, 3-amino-5-methylpirazole, 5-amino-3-methyl-1-p-tolylpirazole, pirazine, 2-(aminomethyl)-5methylpirazine, pyrimidine, 2,4-diaminopyrimidine, 4,6-dihydroxypyrimidine, 2-pirazoleline, 3-pirazoleline, N-aminomorpholine and N-(2-aminoethyl)morpholine.

(5) Compound (PA) generates a compound that has a proton-accepting functional group and in addition, whose proton acceptor property decreases, or is lost or changed from proton acceptor property to acidity by decomposing upon irradiation with an actinic ray or radiation.

The composition of the present invention has a proton-accepting functional group as a basic compound, and in addition may further contain a compound [hereinafter, also referred to a compound (PA)] generates a compound whose proton acceptor property decreases, or is lost or changed from proton acceptor property to acidity by decomposing upon irradiation with an actinic ray or radiation.

The proton-accepting functional group means, as a functional group having a group capable of interacting electrostatically with a proton or having electrons, for example, a functional group having a macro cyclic structure such as a cyclic polyether, or a functional group having a nitrogen atom having unshared electron pair which does not contribute to π-conjugate. A nitrogen atom having unshared electron pair which does not contribute to π-conjugate means, for example, a nitrogen atom having a partial structure represented by the following Formula.

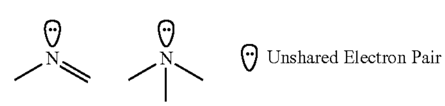

Examples of the preferred partial structure of the proton-accepting functional group may include crown ether, azacrown ether, primary to tertiary amine, pyridine, imidazole, pyrazine structure and the like.

The compound (PA) generates a compound whose proton acceptor property decreases, or is lost or changed from proton acceptor property to acidity by decomposing upon irradiation with an actinic ray or radiation. Here, the fact that proton acceptor property decreases, or is lost or changed from proton acceptor property to acidity means the change of proton acceptor property due to the addition of a proton to a proton-accepting functional group, and specifically means that when a proton adduct generates from proton to the compound (PA) having proton-accepting functional group, the equilibrium constant in the chemical equilibrium decreases.

Hereinafter, specific examples of the compound (PA) will be described, but are not limited thereto.

(PA-1)

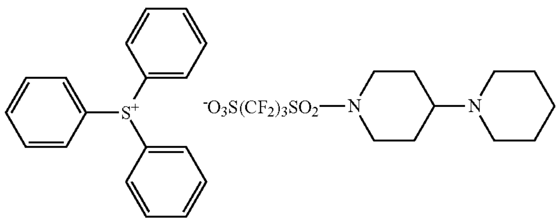

(PA-2)

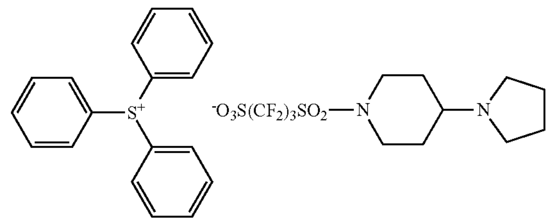

(PA-3)

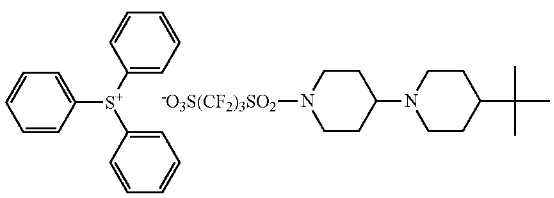

(PA-4)

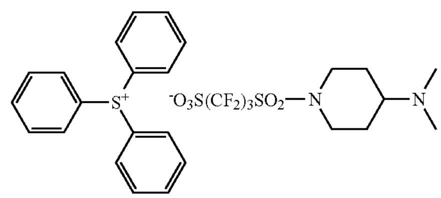

(PA-5)

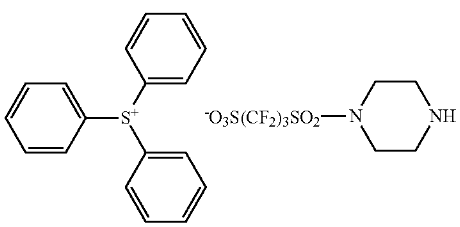

(PA-6)

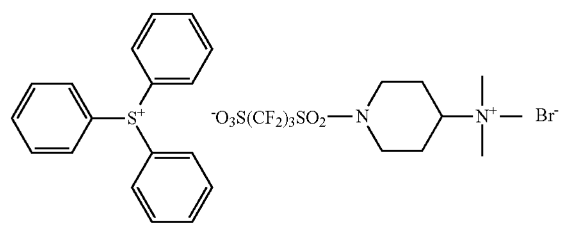

(PA-7)

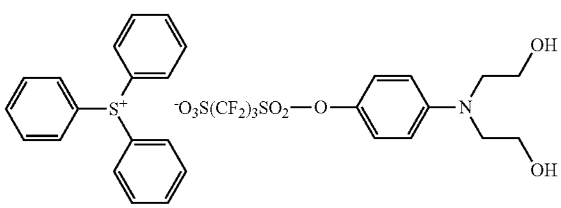

(PA-8)

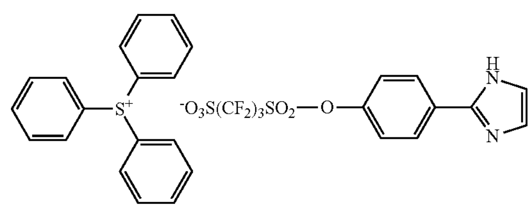

(PA-9)

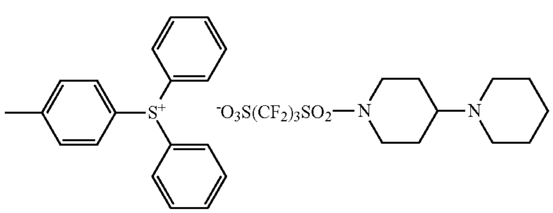

(PA-10)

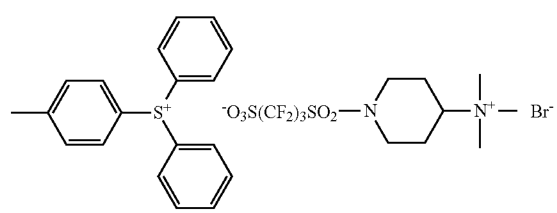

(PA-11)

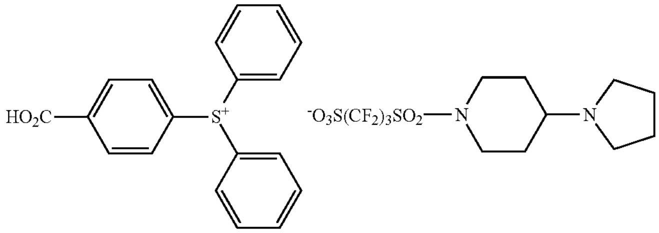

-continued
(PA-12)
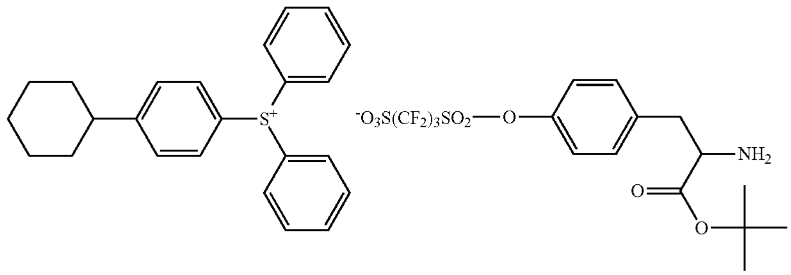
(PA-13)
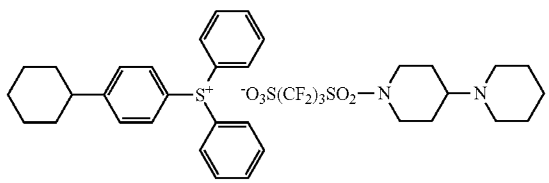
(PA-14)
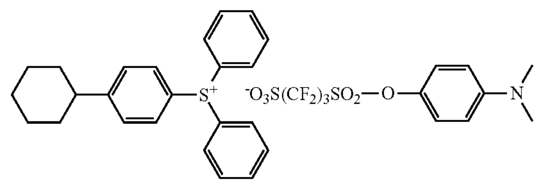
(PA-15)
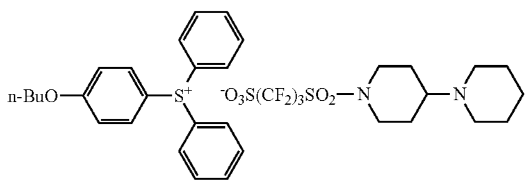
(PA-16)
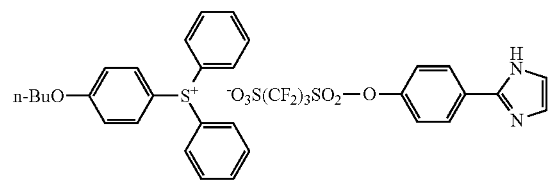
(PA-17)
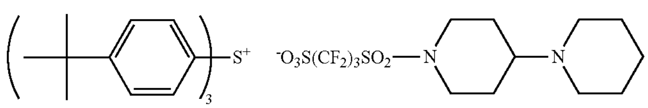
(PA-18)
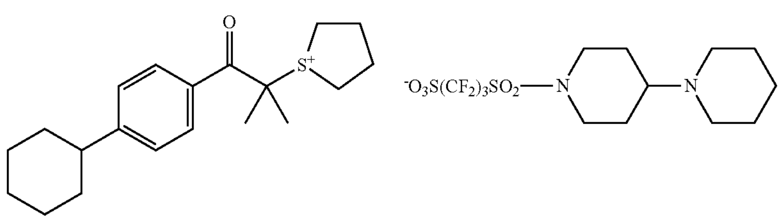
(PA-19)
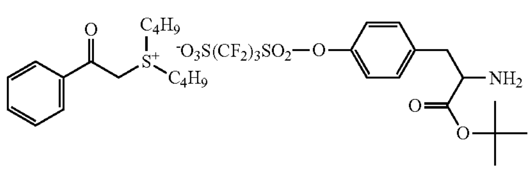
(PA-20)
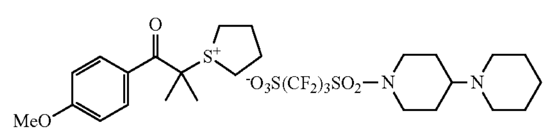
(PA-21)
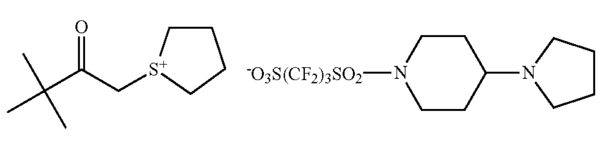
(PA-22)
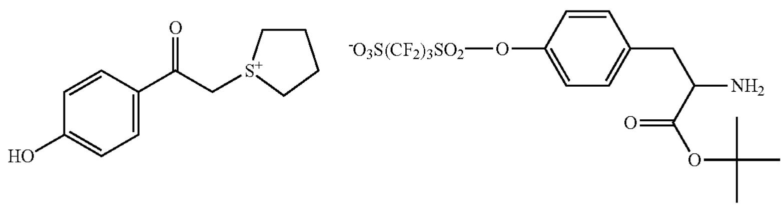

-continued
(PA-23)
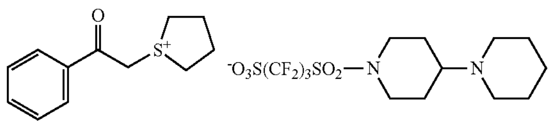
(PA-24)
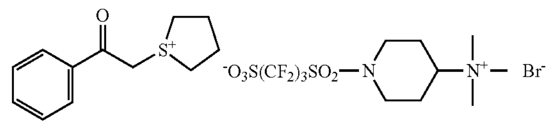
(PA-25)
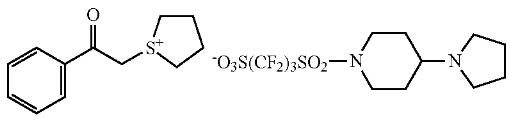
(PA-26)
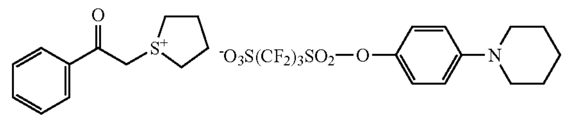
(PA-27)
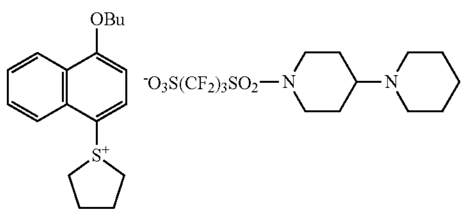
(PA-28)
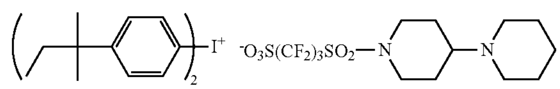
(PA-29)
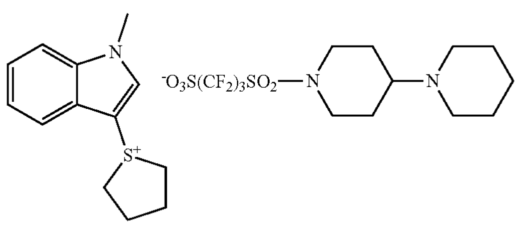
(PA-30)
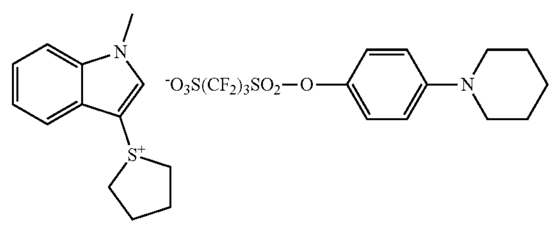
(PA-31)
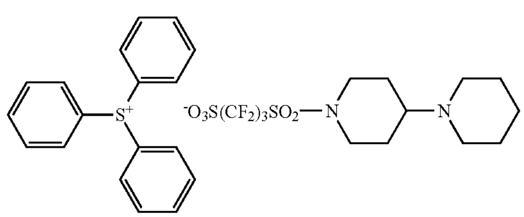
(PA-32)
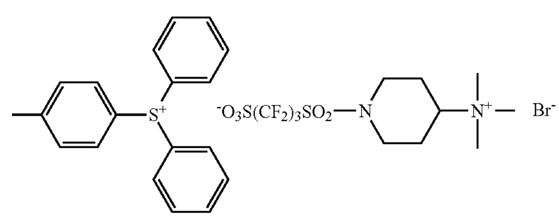
(PA-33)
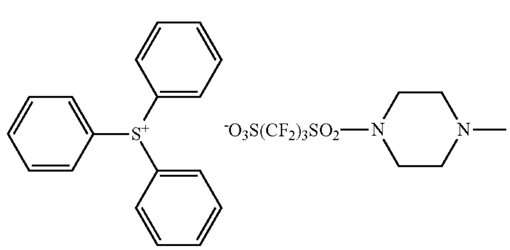
(PA-34)
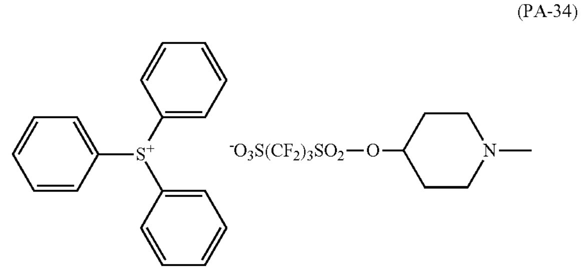
(PA-35)
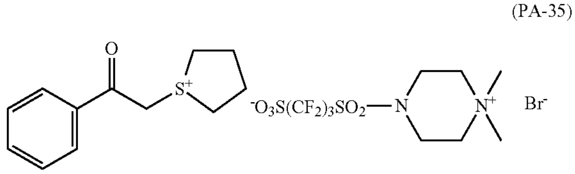
(PA-36)
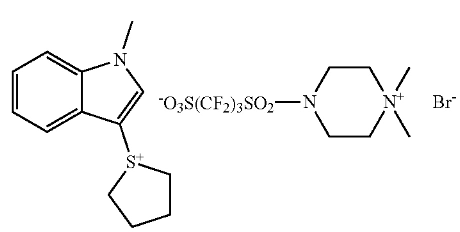

-continued
(PA-37)
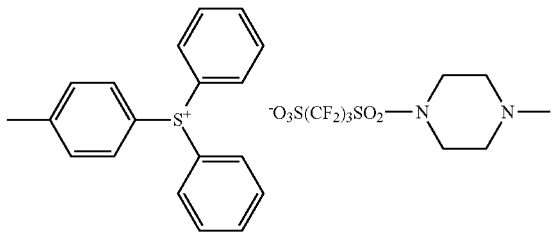
(PA-38)
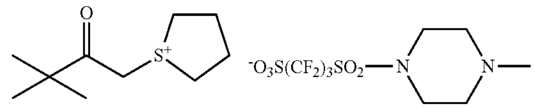
(PA-39)
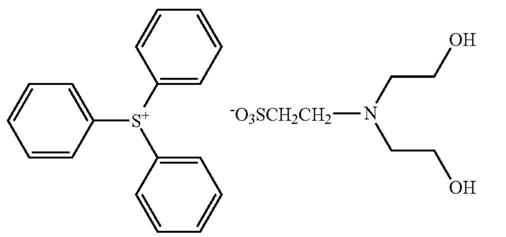
(PA-40)
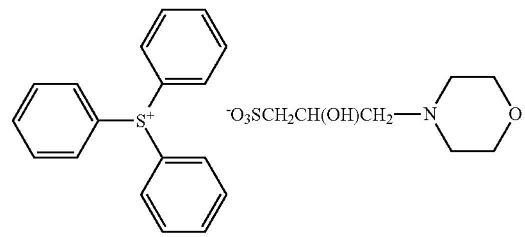
(PA-41)
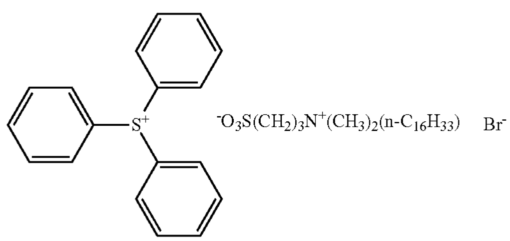
(PA-42)
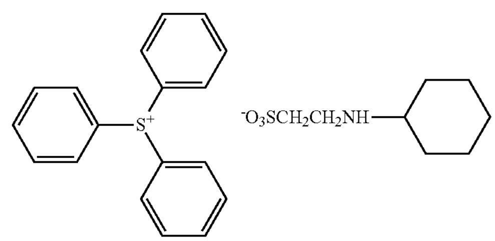
(PA-43)
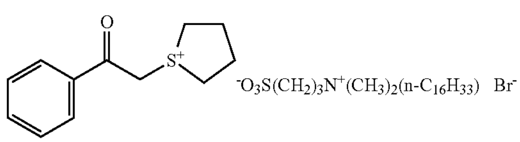
(PA-44)
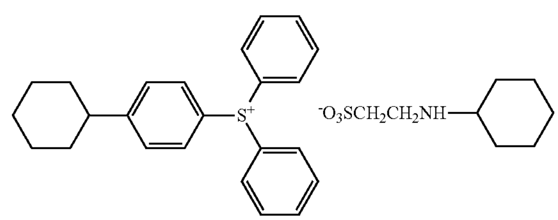
(PA-45)
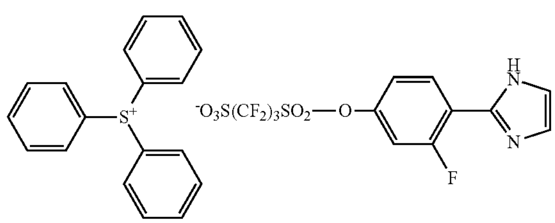
(PA-46)
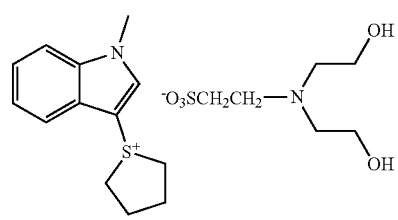
(PA-47)
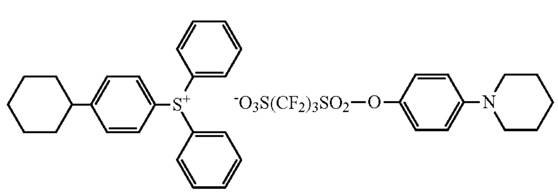
(PA-48)
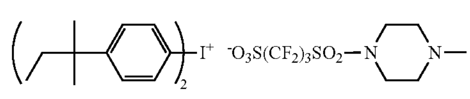

-continued
(PA-49)
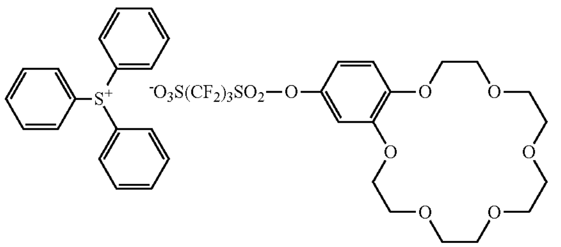
(PA-50)
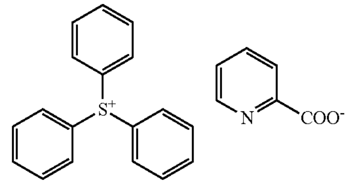
(PA-51)
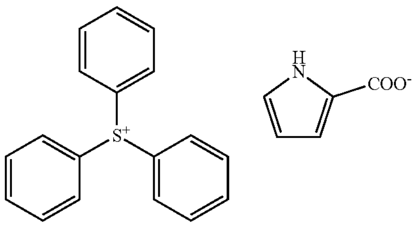
(PA-52)
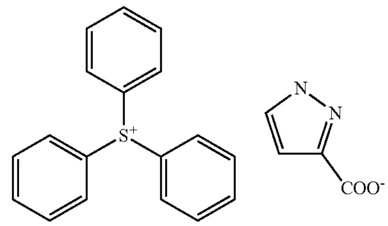
(PA-53)
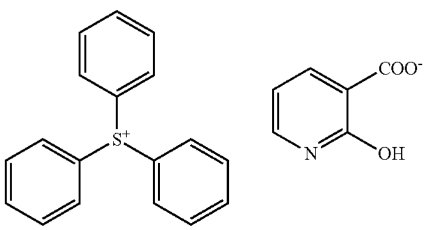
(PA-54)
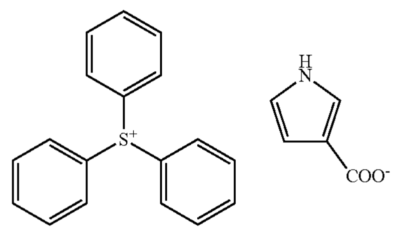
(PA-55)
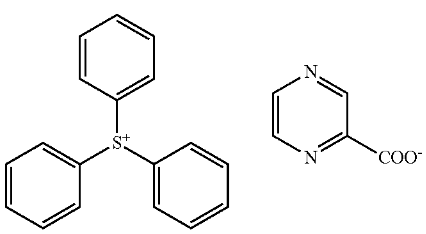
(PA-56)
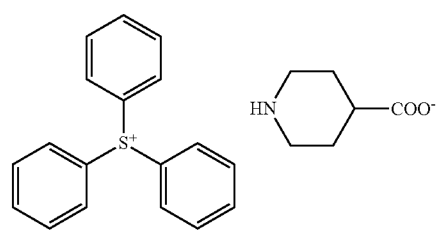
(PA-57)
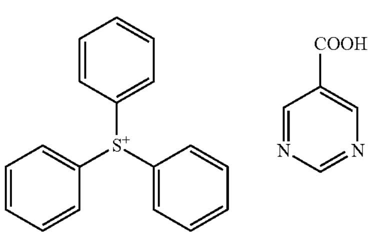
(PA-58)
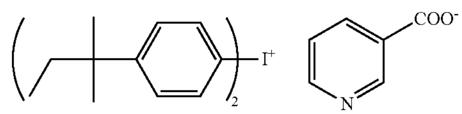
(PA-59)
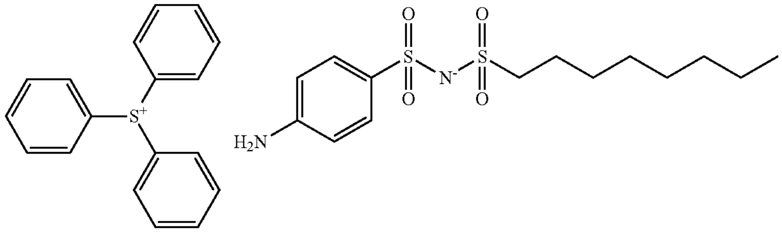

-continued
(PA-60)
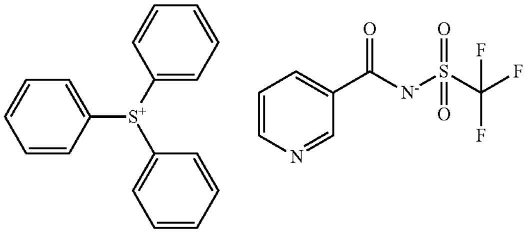
(PA-61)
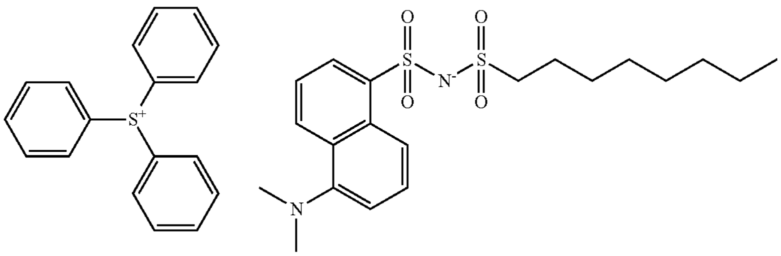
(PA-62)
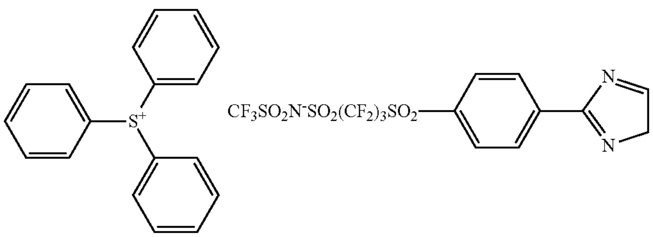
(PA-63)
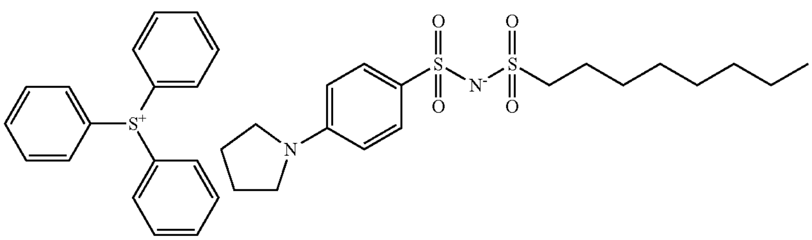
(PA-64)
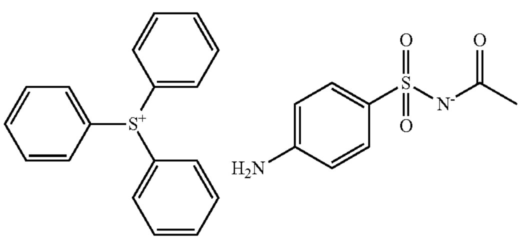
(PA-65)
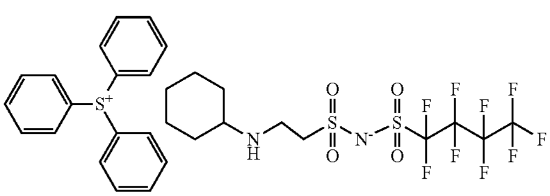
(PA-66)
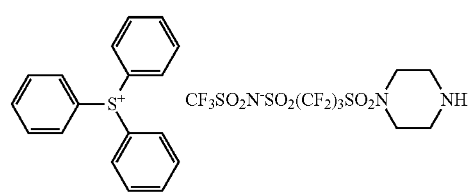
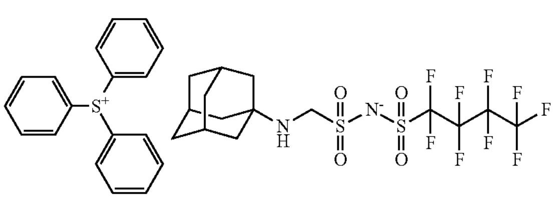
(PA-68)
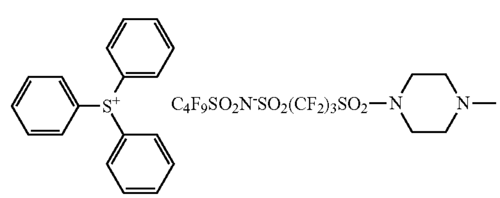

-continued
(PA-69)
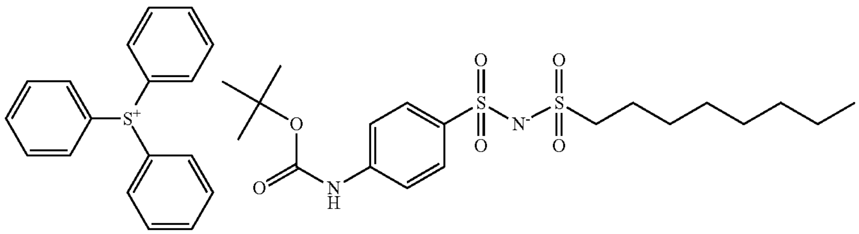
(PA-70)
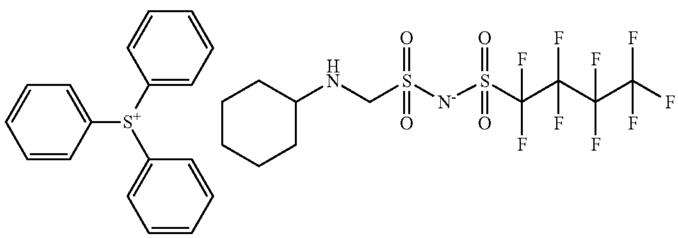
(PA-71)
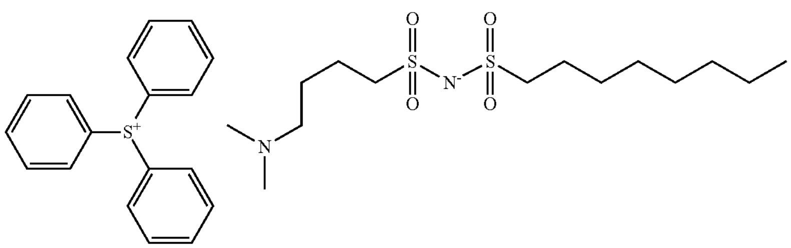
(PA-72)
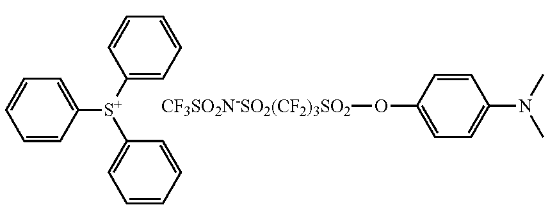
(PA-73)
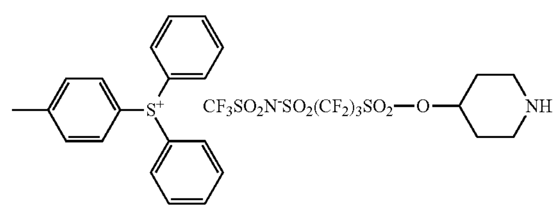
(PA-74)
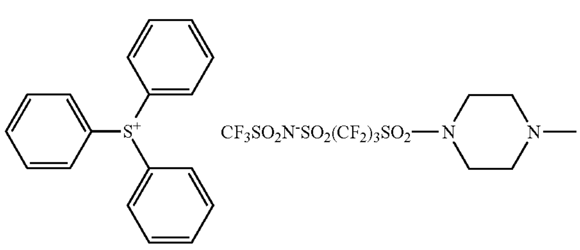
(PA-75)
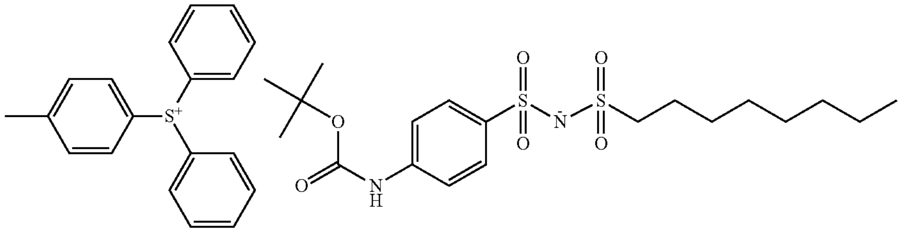

-continued
(PA-76)
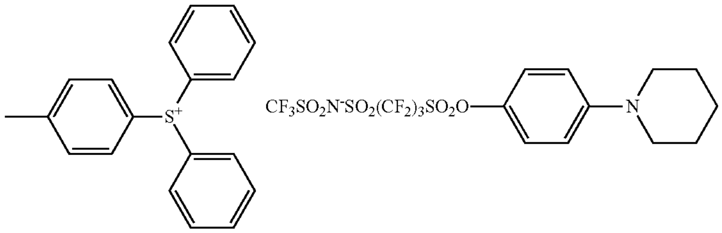
(PA-77)
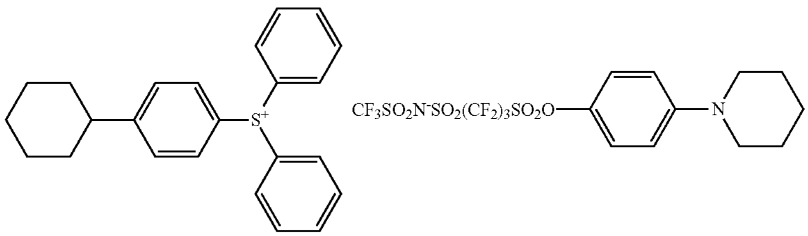
(PA-78)
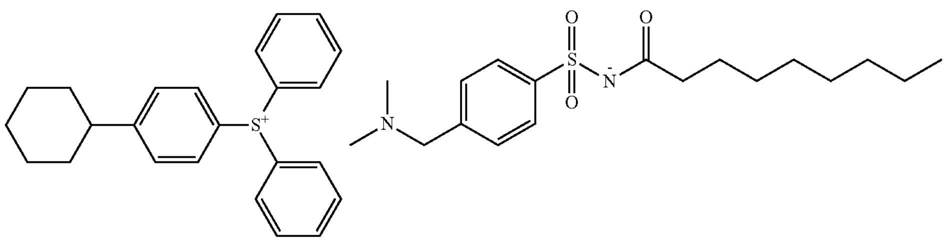
(PA-79)
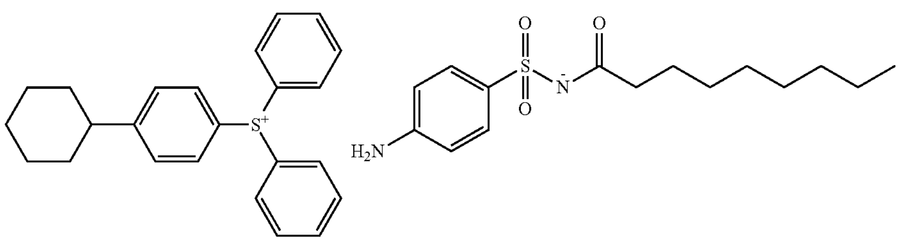
(PA-80)
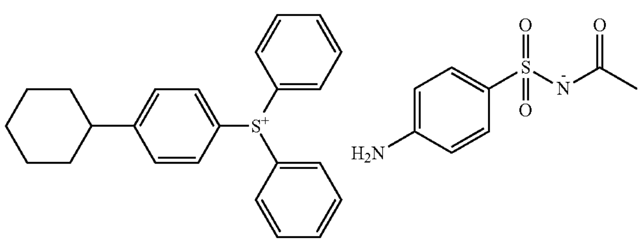
(PA-81)
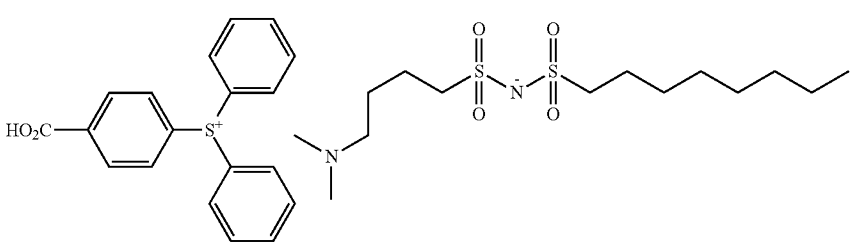
(PA-82)
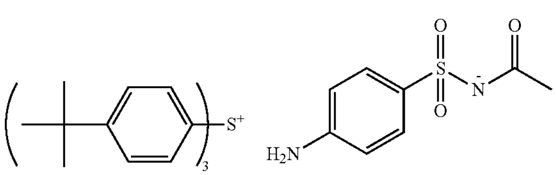

-continued
(PA-83)
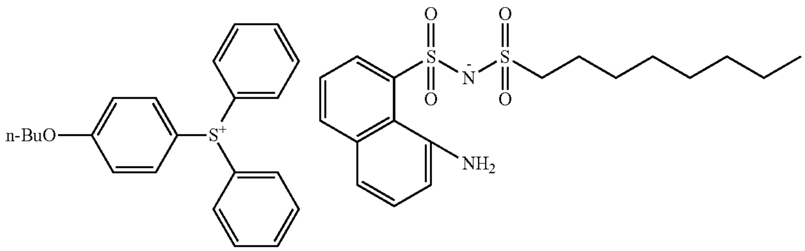
(PA-84)
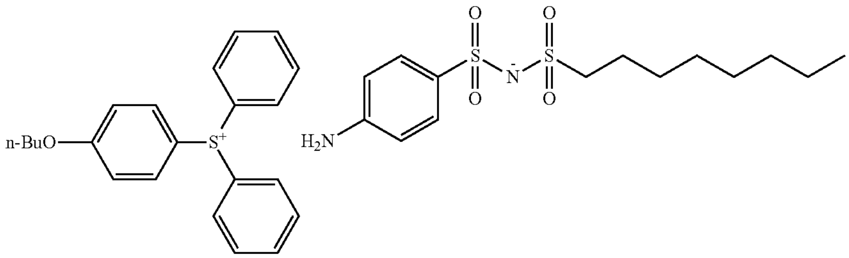
(PA-85)
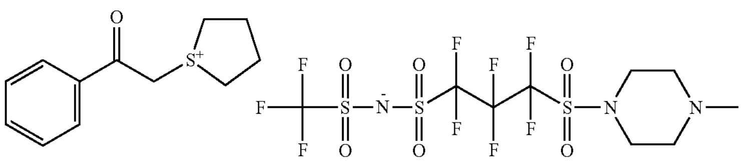
(PA-86)
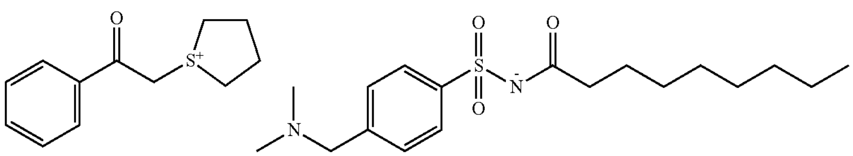
(PA-87)
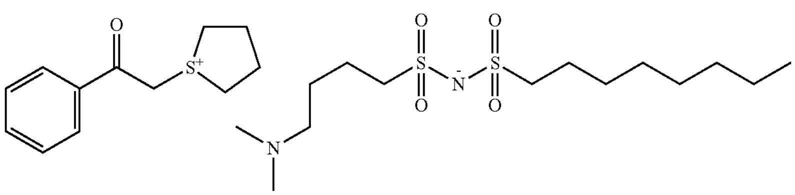
(PA-88)
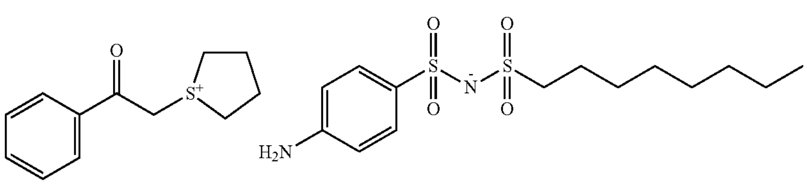
(PA-89)
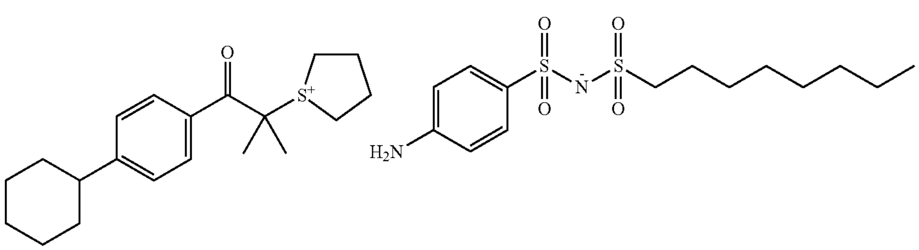
(PA-90)
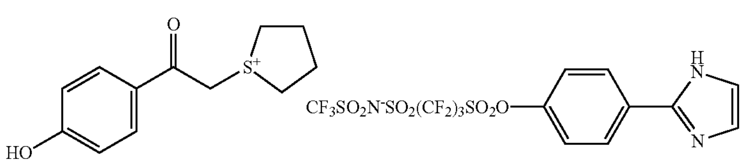

-continued
(PA-91)
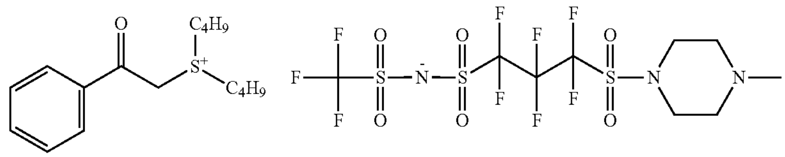
(PA-92)
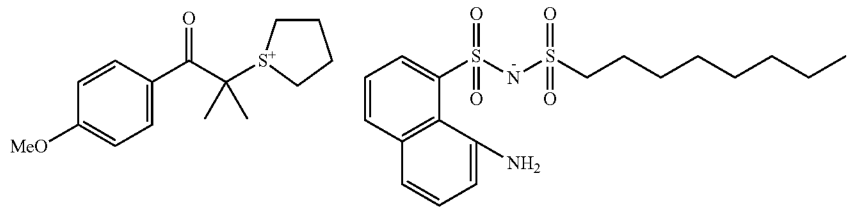
(PA-93)
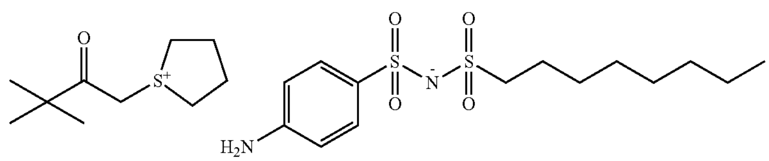
(PA-94)
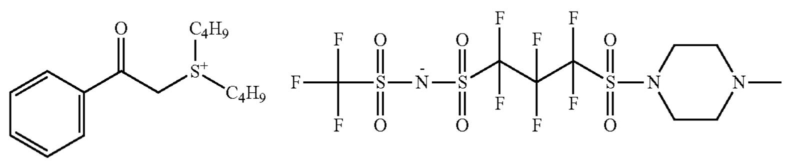
(PA-95)
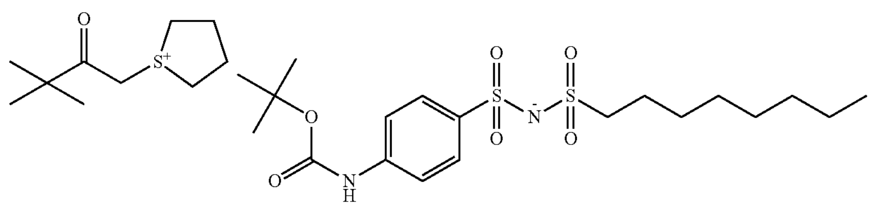
(PA-96)
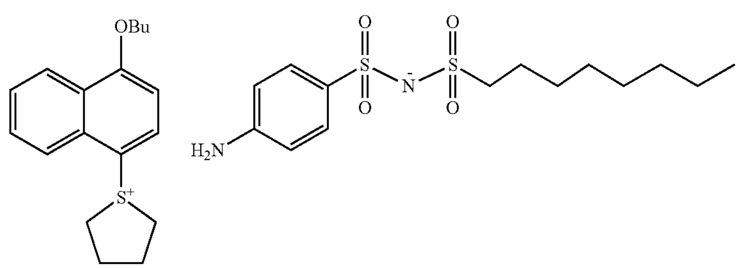
(PA-97)
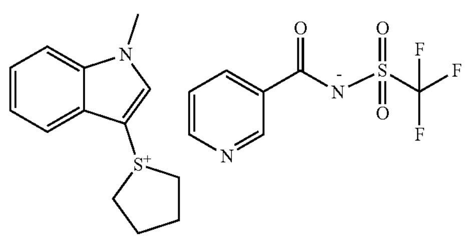
(PA-98)
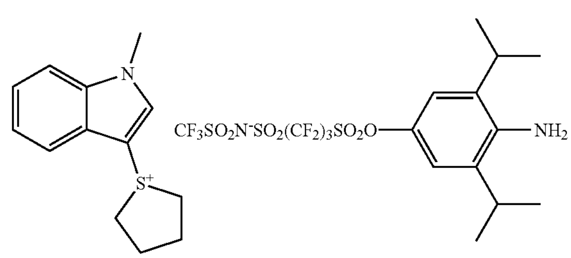

-continued (PA-99)

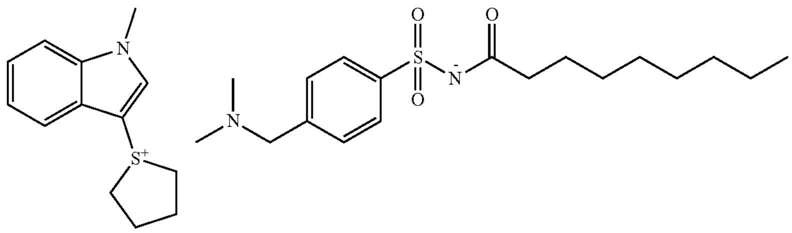

(PA-100)

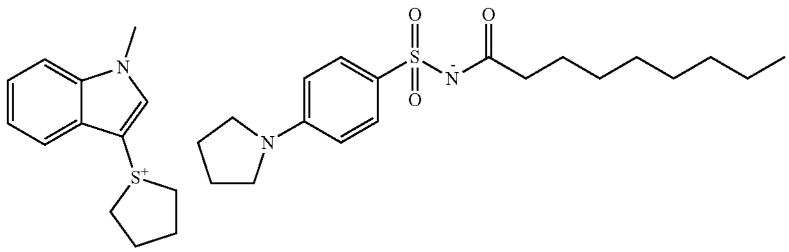

(PA-101)

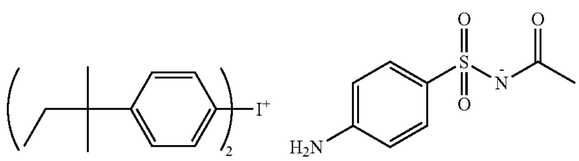

(PA-102)

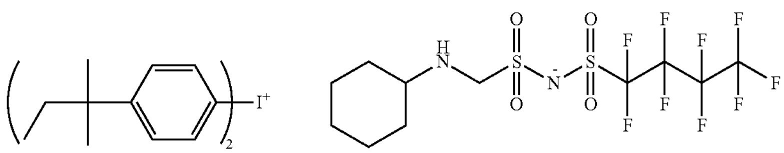

In addition, in the present invention, the compound (PA) may be appropriately selected other than the compound that generates the compound represented by Formula (PA-1). For example, as an ionic compound, the compound having a proton acceptor moiety may be used in a cation moiety. More specifically, the compound represented by the following Formula (7) will be exemplified.

$$(R \frac{}{)_m} A^+ \frac{}{(} R_N)_n \quad X^-$$ (7)

In the formula, A represents a sulfur atom or an iodine atom.

M represents 1 or 2, and n represents 1 or 2. However, when A is a sulfur atom, m+n=3, and when A is an iodine atom, m+n=2.

R represents an aryl group.

$R_N$ represents an aryl group substituted with proton-accepting functional group.

$X^-$ represents a counter anion.

Specific examples of $X^-$ may include the same as $X^-$ in t Formula (ZI).

Specific examples of the aryl group of R and $R_N$ preferably include a phenyl group.

Specific examples of the proton-accepting functional group that $R_N$ has are the same as the proton-accepting functional group described in Formula (PA-1).

In the composition of the present invention, the blending ratio of the compound (PA) in the entire composition is preferably 0.1 to 10% by mass, and more preferably 1 to 8% by mass, based on the total solid content of the composition.

(6) Guanidine Compound

The composition of the present invention may further have the guanidine compound having the structure represented by the following Formula.

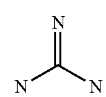

Since the guanidine compound in which a positive charge of a conjugate acid is dispersed and stabilized by three kinds of nitrogen, it shows a strong basicity.

As the basicity of the guanidine compound (A) of the present invention, pKa of the conjugate acid is preferably 6.0 or more, and more preferably 7.0 to 20.0 in the view that the neutralizing reactivity with an acid is high and the roughness characteristics are excellent, and more preferably 8.0 to 16.0.

Because of such a strong basicity, the diffusion of an acid is suppressed, which can contribute to the formation of good pattern shape.

In addition, here "pKa" indicates pKa in an aqueous solution, and, for example, indicates those described in chemical handbook (II) (Revised Fourth Edition, 1993, the Chemical Society of Japan, Maruzen Co. Ltd.). The lower the value indicates, the larger the acid strength is. pKa in an aqueous solution can be specifically measured by measuring acid dissociation constant at 25° C. through using the infinite diluted aqueous solution, and may be also obtained by calculating a value based on Hammett's substituent constant and the database of the known literature value through using the following Software Package 1. All the value of pKa indicated in the present specification denotes a value obtained by calculation using the whole Software Package.

Software Package 1: Advanced Chemistry Development (ACD/Labs) Software V8.14 for Solaris (1994-2007 ACD/Labs).

In the present invention, log P is referred to the logarithmic value of n-octanol/water distribution coefficient (P), and is an effective parameter that can be characterized by its hydrophilicity/hydrophobicity with respect to a wide range of compound. In general, the distribution coefficient can be obtained by the calculation regardless of the experiment, and in the present invention, it represents values calculated by CS Chem Draw Ultra Ver. 8.0 software package Crippen's fragmentation method.

In addition, log P of the guanidine compound (A) is preferably 10 or less. The value is set to the above-described value or less, and thus the compound may be evenly contained in the resist film.

Log P of the guanidine compound (A) of the present invention is preferably in the range of 2 to 10, more preferably in the range of 3 to 8, and still more preferably in the range of 4 to 8.

In addition, guanidine compound (A) in the present invention may preferably not have a nitrogen atom other than a guanidine structure.

Hereinafter, specific examples of the guanidine compound will be described, but are not limited thereto.

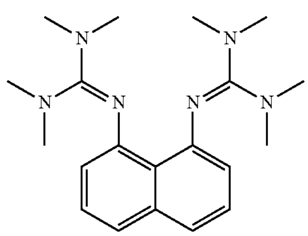

Log P: 4.29

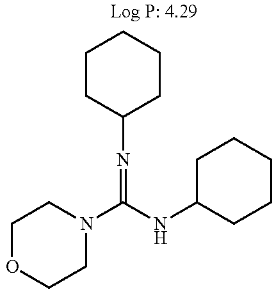

Log P: 3.32

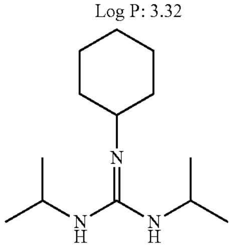

Log P: 3.1

-continued

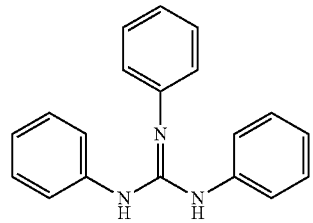

Log P: 5.24

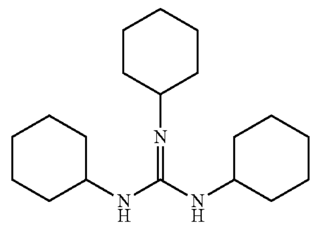

Log P: 4.89

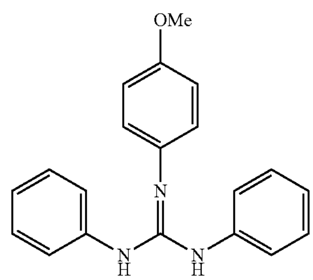

Log P: 5.11

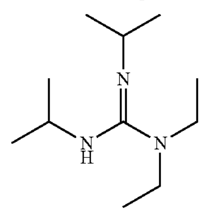

Log P: 2.61

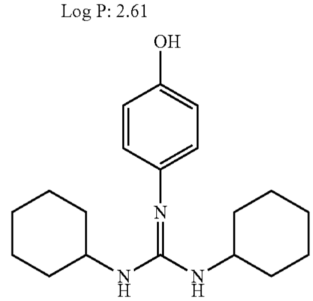

Log P: 4.61

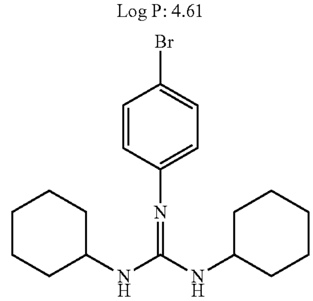

Log P: 5.83

-continued

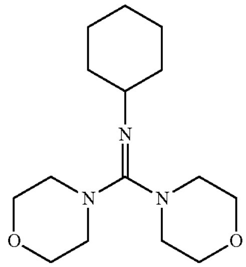

Log P: 1.75

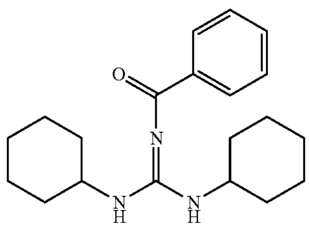

Log P: 4.95

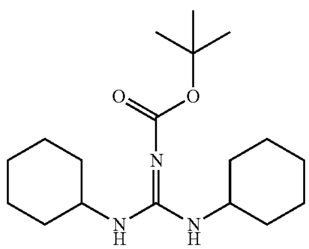

Log P: 4.51

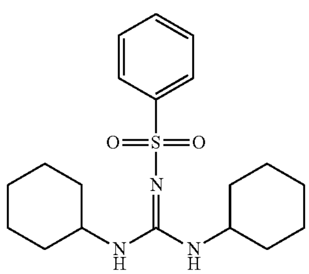

Log P: 4.55

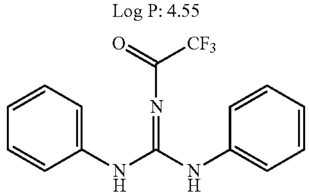

Log P: 4.43

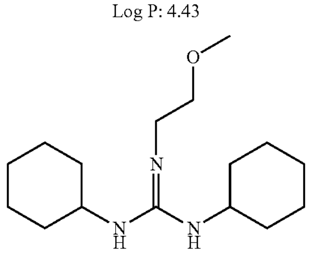

Log P: 3.18

-continued

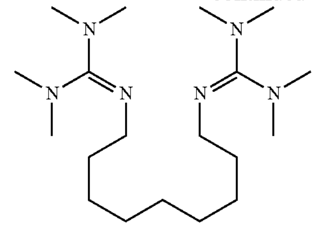

Log P: 4.4

(7) Low-Molecular Compound Having a Nitrogen Atom and a Group Capable of Leaving by the Action of an Acid The composition of the present invention may have a nitrogen atom, and may contain a low-molecular compound (Hereinafter, being referred to "a low-molecular compound (D)" or "a compound (D)") having a group capable of leaving by the action of an acid. The low-molecular compound (D) may preferably have basicity after leaving a group capable of leaving by the action of an acid.

A group capable of leaving by the action of an acid is not particularly limited, but an acetal group, a carbonate group, a carbamate group, a tertiary ester group, a tertiary hydroxyl group and a hemiaminal ether group are preferred, and a carbamate group and a hemiaminal ether group are particularly preferred.

The molecular weight of the low-molecular compound (D) that has a group capable of leaving by the action of an acid is preferably 100 to 1000, more preferably 100 to 700, and particularly preferably 100 to 500.

As the compound (D), an amine derivative having a group capable of leaving by the action of an acid on a nitrogen atom is preferred.

The compound (D) may have a carbamate group having a protecting group on the nitrogen atom. A protecting group constituting the carbamate group can be represented by the following Formula (d-1).

(d-1)

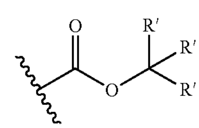

In Formula (d-1),

Each R' independently represents a hydrogen atom, a straight or branched alkyl group, a cycloalkyl group, an aryl group, an aralkyl group, or an alkoxy alkyl group. Each R' may combine with each other to from a ring.

R' is preferably a straight or branched alkyl group, a cycloalkyl group, an aryl group. It is still more preferably a straight or branched alkyl group, or a cycloalkyl group.

Hereinafter, Specific structure of these groups will be described.

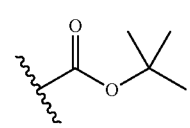

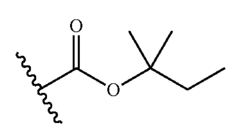

-continued
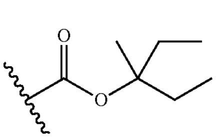
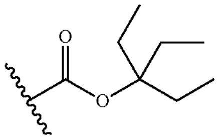
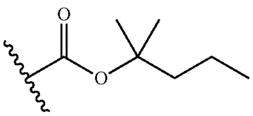
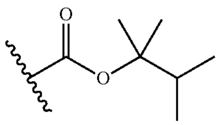
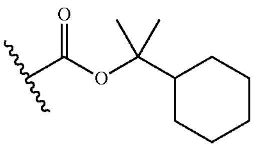
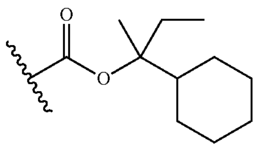
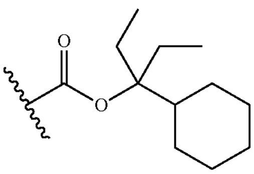
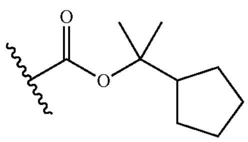
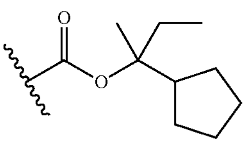
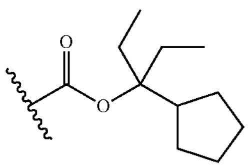
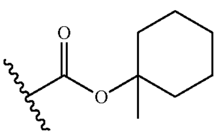
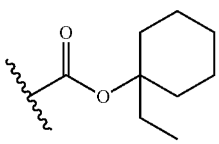
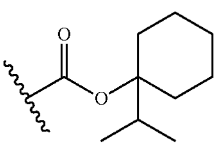
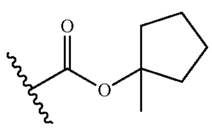
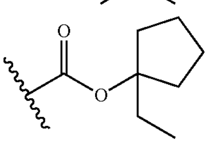
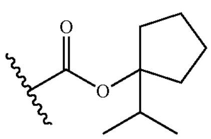
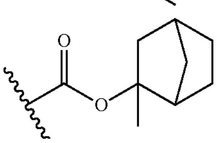
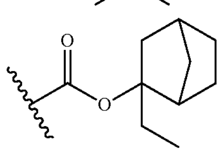
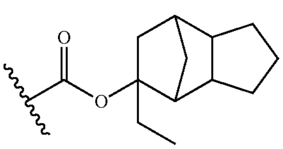
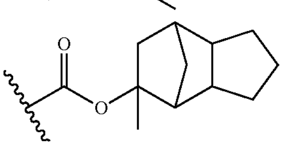
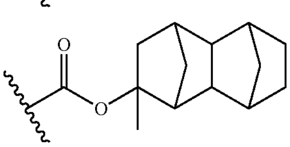
-continued
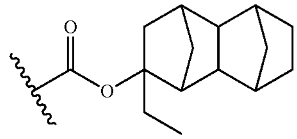
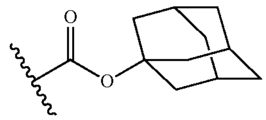
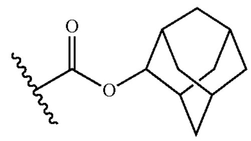
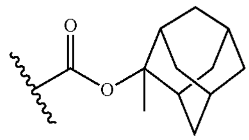
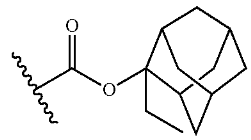
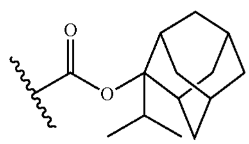
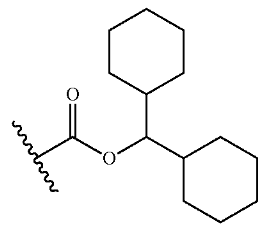
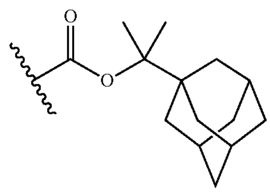
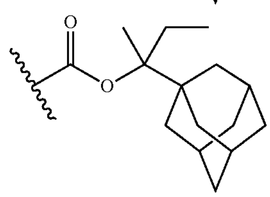
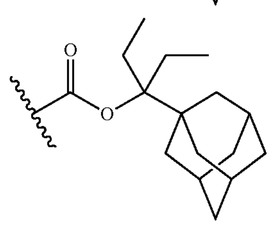
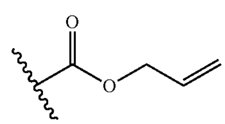
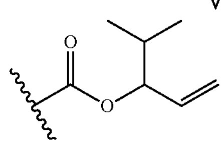
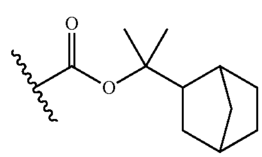
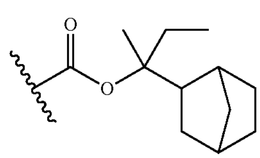
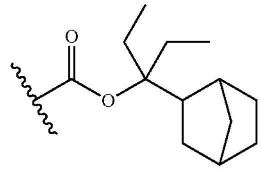
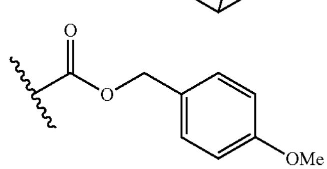

-continued

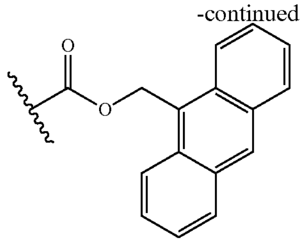

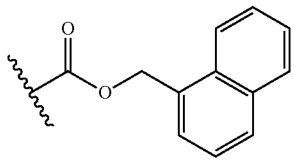

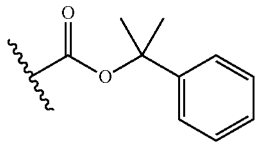

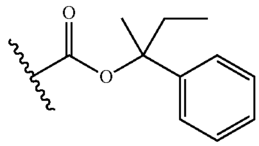

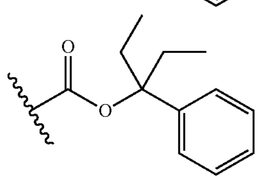

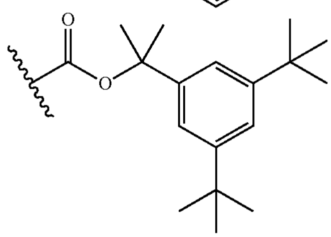

The compound (D) may be constructed by any combination of the basic compound and the structure represented by Formula (d-1).

The compound (D) may particularly preferably have the structure represented by the following Formula (A).

In addition, the compound (D) may be those corresponding to the above-described basic compound, as long as it is a low-molecular compound having a group capable of leaving by the action of an acid.

(A)

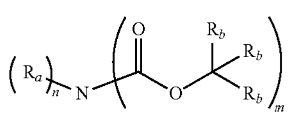

In Formula (A), $R_a$ represents a hydrogen atom, an alkyl group, a cycloalkyl group, an aryl group or an aralkyl group. In addition, when n=2, two of $R_a$ may be same or different, and two of $R_a$ may combine with each other to form a divalent heterocyclic hydrocarbon group (preferably having 20 or less carbon atoms) or a derivative thereof.

Each $R_b$ independently represents a hydrogen atom, an alkyl group, a cycloalkyl group, an aryl group, an aralkyl group or an alkoxy alkyl group, provided that in —$C(R_b)(R_b)(R_b)$, when one or more $R_b$ are a hydrogen atom, at least one of the remaining $R_b$ is a cyclopropyl group, a 1-alkoxy alkyl group or an aryl group.

At least two of $R_b$ may combine with each other to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In Formula (A), each of the alkyl group, the cycloalkyl group, the aryl group and the aralkyl group represented by $R_a$ and $R_b$ may be substituted with a functional group such as a hydroxyl group, a cyano group, an amino group, a pyrrolidino group, a piperidino group, a morpholino group and an oxo group, an alkoxy group or a halogen atom. It is similar to the alkoxy alkyl group represented by $R_b$.

Examples of the alkyl group, the cycloalkyl group, the aryl group or the aralkyl group (each of the alkyl group, the cycloalkyl group, the aryl group and the aralkyl group may be substituted with the functional group, an alkoxy group or a halogen atom) of the $R_a$ and/or $R_b$ include, for example, a group derived from a straight or branched alkane such as methane, ethane, propane, butane, pentane, hexane, heptane, octane, nonane, decane, undecane and dodecane, a group in which the group derived from the alkane is substituted with one or more kinds of or one or more of cycloalkyl groups such as, for example, a cyclobutyl group, a cyclopentyl group and a cyclohexyl group, a group derived from a cycloalkane such as cyclobutane, cyclopentane, cyclohexane, cycloheptane, cyclooctane, norbornane, adamantine and noradamantane, a group in which the group derived from the cycloalkane is substituted with one or more kinds of or one or more of straight or branched alkyl groups such as, for example, a methyl group, an ethyl group, an n-propyl group, an i-propyl group, an n-butyl group, a 2-methylpropyl group, a 1-methylpropyl group and a t-butyl group, a group derived from an aromatic compound such as benzene, naphthalene and anthracene, or a group in which the group derived from the aromatic compound is substituted with one or more kinds of or one or more groups of straight or branched alkyl groups such as, for example, a methyl group, an ethyl group, an n-propyl group, an i-propyl group, an n-butyl group, a 2-methylpropyl group, a 1-methylpropyl group and a t-butyl group, and a group derived from a heterocyclic compound such as pyrrolidine, piperidine, morpholine, tetrahydrofuran, tetrahydropyran, indole, indoline, quinoline, perhydroquinoline, indazole and benzimidazole, a group in which the group derived from the heterocyclic compound is substituted with one or more kinds of or one or more of straight or branched alkyl groups or groups derived from aromatic compounds, a group in which the group derived from a straight or branched alkane a group derived from a cycloalkane is substituted with one or more kinds of or one or more of groups derived from aromatic compounds, such as a phenyl group, a naphthyl group and an anthracenyl group, or a group in which the above-described substituent is substituted with a functional group such as a hydroxyl group, a cyano group, an amino group, a pyrrolidino group, a piperidino group, a morpholino group and an oxo group, and the like.

In addition, examples of the divalent heterocyclic hydrocarbon group (preferably having 1 to 20 carbon atoms) formed by combining $R_a$'s with each other or a derivative thereof may include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, a group in which the group derived from the heterocyclic compound is substituted with one or more kinds of or one or more of straight or branched groups derived from alkane, groups derived from cycloalkane, groups derived from aromatic compounds, groups derived from heterocyclic compounds and functional groups such as a hydroxyl group, a cyano group, an amino group, a pyrrolidino group, a piperidino group, a morpholino group and an oxo group, and the like.

In the present invention, the particularly preferred compound (D) will be described in detail, but the present invention is not limited thereto.

(D-1)

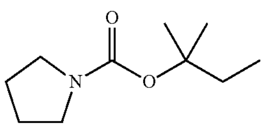

(D-2)

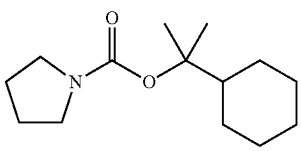

(D-3)

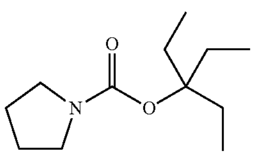

(D-4)

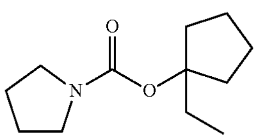

(D-5)

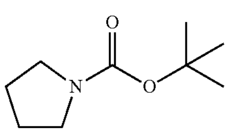

(D-6)

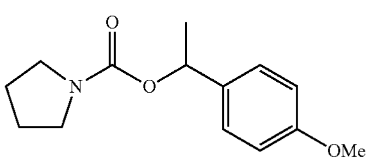

(D-7)

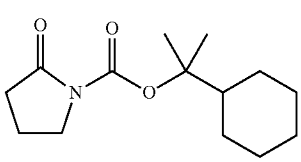

(D-8)

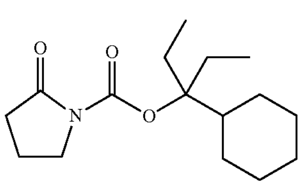

-continued (D-9)

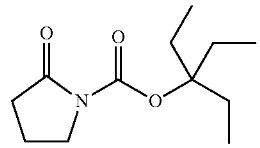

(D-10)

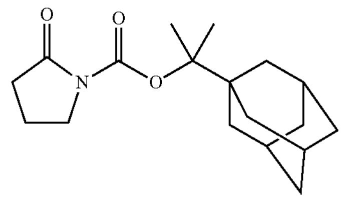

(D-11)

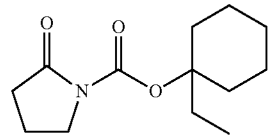

(D-12)

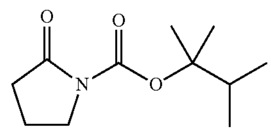

(D-13)

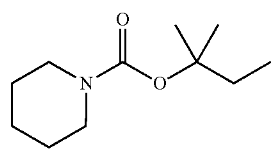

(D-14)

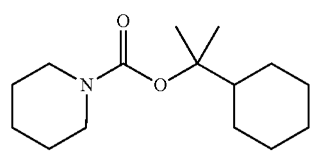

(D-15)

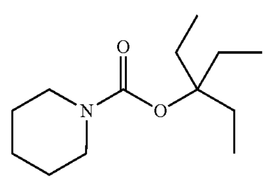

(D-16)

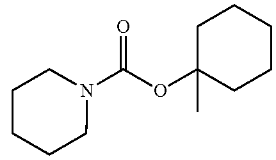

(D-17)

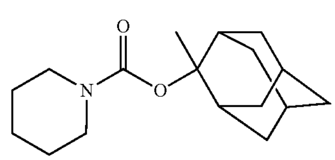

(D-18)

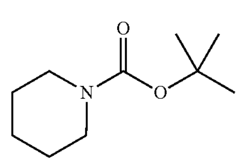

(D-19)
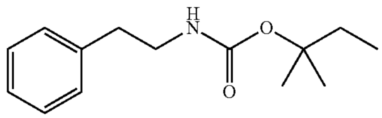
(D-20)
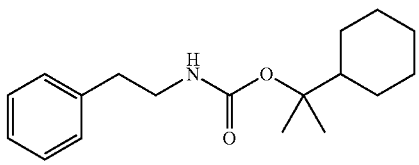
(D-21)
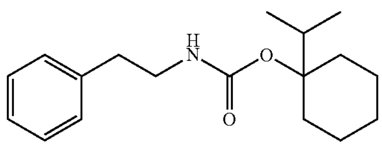
(D-22)
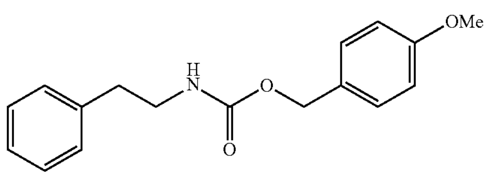
(D-23)
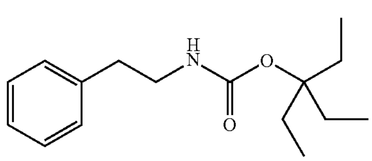
(D-24)
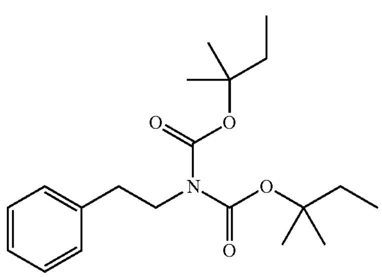
(D-25)
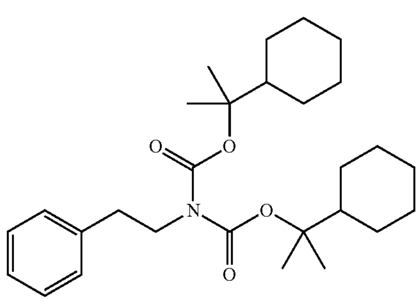
(D-26)
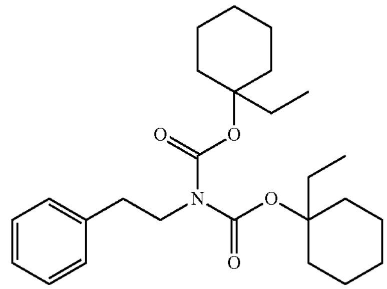
(D-27)
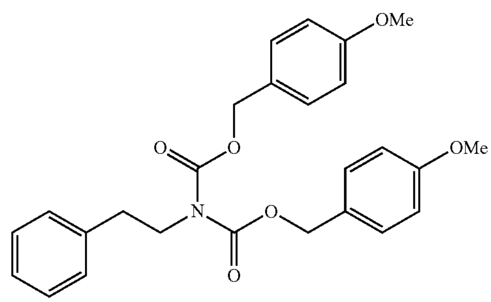
(D-28)
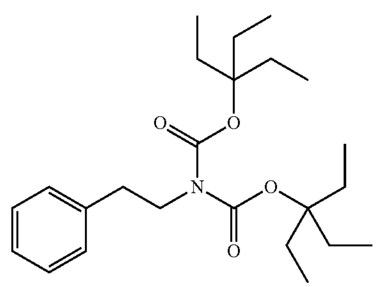
(D-29)
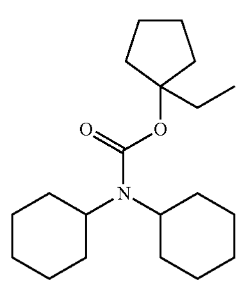
(D-30)
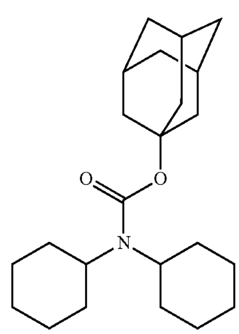

-continued
(D-31)
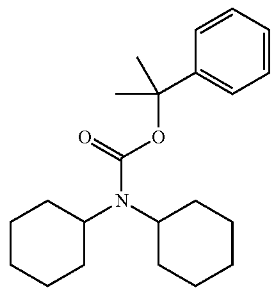
(D-32)
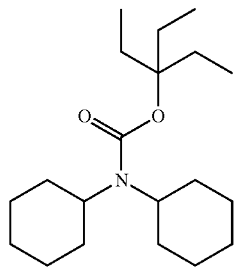
(D-33)
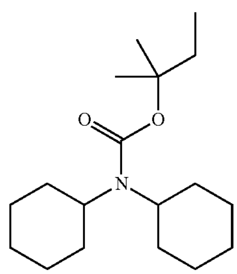
(D-34)
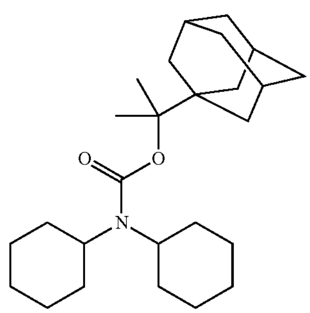
(D-35)
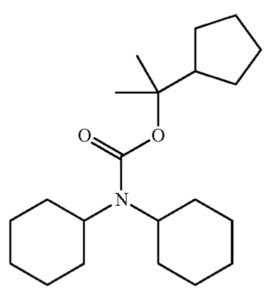
-continued
(D-36)
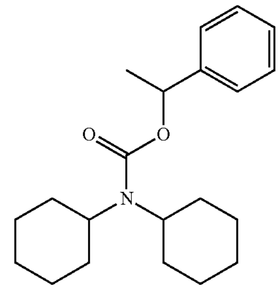
(D-37)
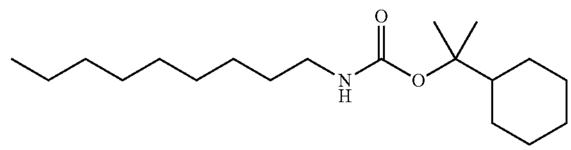
(D-38)
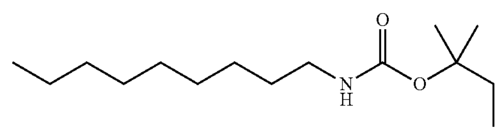
(D-39)
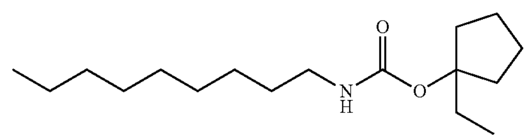
(D-40)
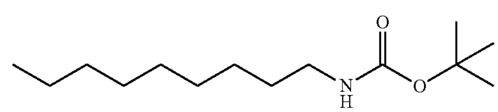
(D-41)
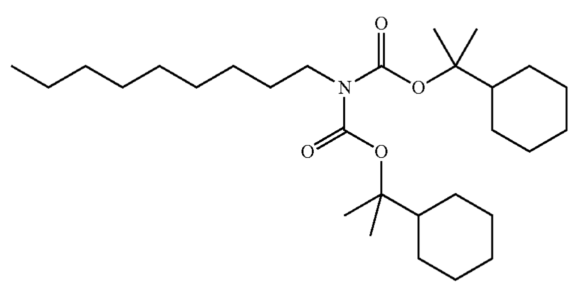
(D-42)
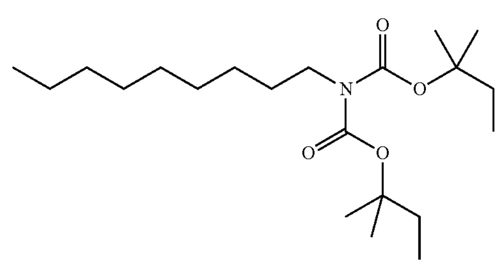

(D-43)
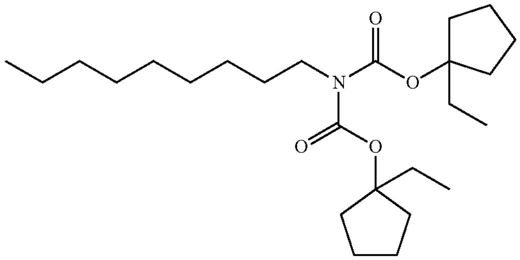
(D-44)
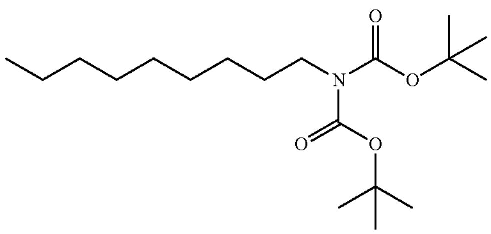
(D-45)
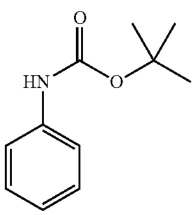
(D-46)
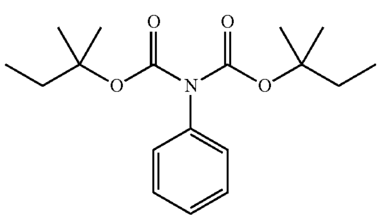
(D-47)
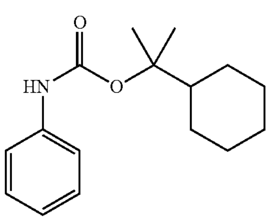
(D-48)
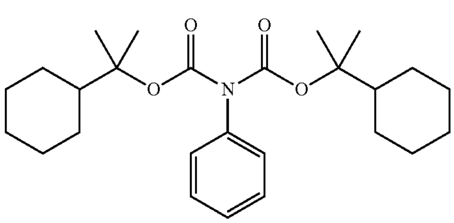
(D-49)
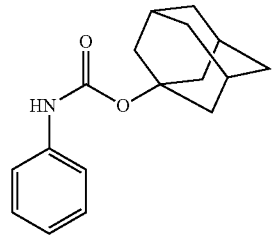
(D-50)
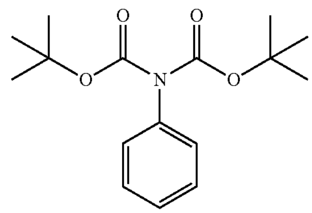
(D-51)
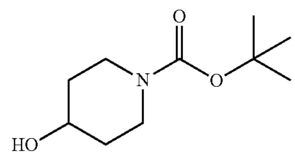
(D-52)
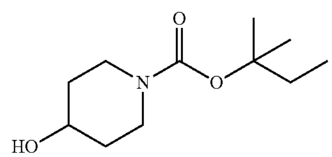
(D-53)
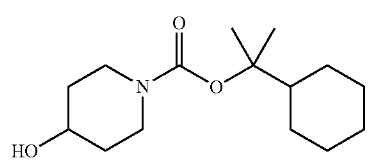
(D-54)
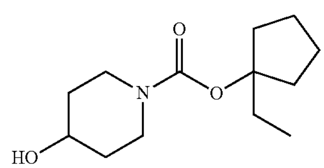
(D-55)
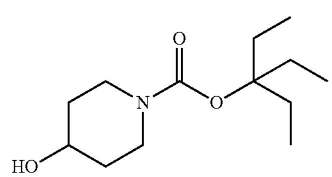
(D-56)
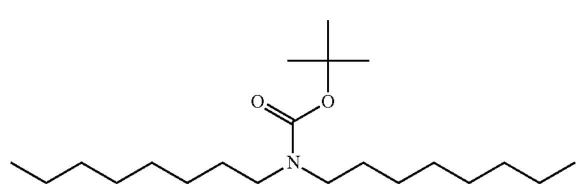

-continued (D-57)

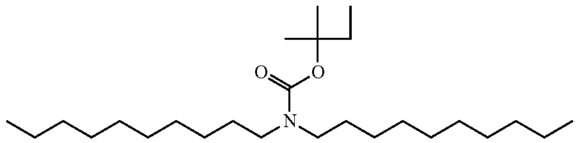

(D-58)

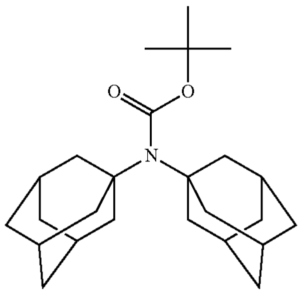

(D-59)

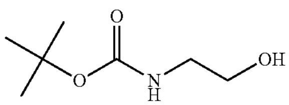

(D-60)

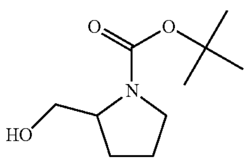

(D-61)

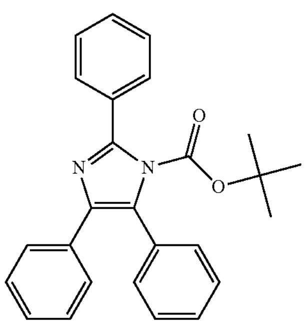

(D-62)

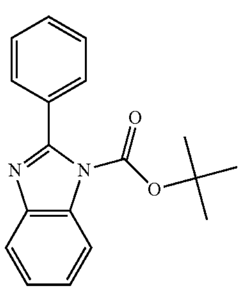

(D-63)

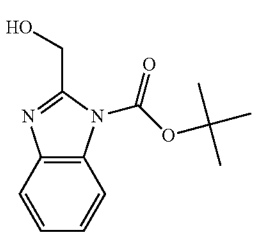

-continued (D-64)

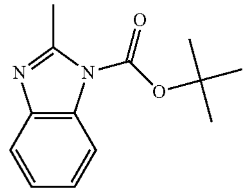

(D-65)

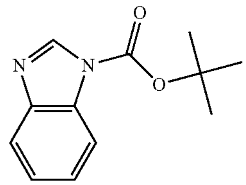

The compound represented by Formula (A) may be synthesized on the basis of Patent Application Laid-Open No. 2007-298569, Patent Application Laid-Open No. 2009-199021 documents and the like.

In the present invention, a low-molecular compound (D) may be used alone or used as a mixture of two kinds or more of them.

The composition of the present invention may contain a low-molecular compound (D) or not, and if it contains the compound (D), the content of the compound (D) is usually 0.001 to 20% by mass, preferably 0.001 to 10% by mass, and still more preferably 0.01 to 5% by mass based on the total solid content of the composition containing the above-described basic compound.

Further, when the composition of the present invention contains an acid-generating agent, the ratio of an acid-generating agent to the compound (D) used in the composition is preferably an acid-generating agent/(compound D+the following basic compound)(molar ratio)=2.5 to 300. That is, the molar ratio is preferably 2.5 or more in terms of sensitivity and resolution, and in terms of suppressing the degradation of resolution by the thickness of the resist pattern with time from exposure to heating processing, it is preferably 300 or less. The molar ratio of an acid-generating agent/(compound D+the above-described basic compound) is more preferably 5.0 to 200, and still more preferably 7.0 to 150.

Examples of other usable compounds in the composition according to the present invention include the compound synthesized in Examples of Japanese Patent Application Laid-Open No. 2002-363146 and the compound described in [0108] of Japanese Patent Application Laid-Open No. 2007-298569.

As the basic compound, a photosensitive basic compound may be used. As the photosensitive basic compound, for example, the compound described in Japanese Patent Application Publication No. 2003-524799 and J. Photopolym. Sci&Tech. Vol. 8, P. 543-553 (1995) may be used.

The molecular weight of the basic compound is generally 100 to 1500, preferably 150 to 1300, and more preferably 200 to 1000.

The basic compounds thereof may be used alone or in combination of two or more thereof.

When the composition of the present invention includes a basic compound, the content is preferably 0.01 to 8.0% by mass, more preferably 0.1 to 5.0% by mass, and particularly preferably 0.2 to 4.0% by mass based on the total solid content of the composition.

The molar ratio of the basic compound to a photoacid-generating agent is preferably 0.01 to 10, more preferably 0.05 to 5, and still more preferably 0.1 to 3. When this molar ratio is excessively large, sensitivity and/or resolution may be lowered. When this molar ratio is excessively small, the pattern is likely to result in thinning between exposure and heating (post baking). The molar ratio is more preferably 0.05 to 5, and more preferably 0.1 to 3. Further, a photoacid generator in the above-described molar ratio is to be based on the summed amount with a photoacid generator hat the above-described resin may further contain as the repeating unit (B) of the above-described resin.

[7] Surfactant

The chemically amplified resist composition of the present invention may also have a surfactant to enhance coatability. Examples of the surfactant are not particularly limited, but may include polyoxy ethylene alkyl ethers, polyoxy ethylene alkyl allyl ethers, polyoxy ethylenepolyoxy propylene block copolymers, nonionic surfactant such as sorbitan fatty acid esters and polyoxy ethylene sorbitan fatty acid ester, fluorine-based surfactant such as Megafac F171, F176 (manufactured by Dainippon Ink and Chemicals Inc.) or Fluorad FC430 (manufactured by Sumitomo 3M Limited) or Safinol E1004 (manufactured by Asahi Glass), PF656 and PF6320 manufactured by OMNOVA Inc., Troysol S-366 (manufactured by Tory Chemical Corp.), organosiloxane polymer such as polysiloxane Polymer KP-341 (manufactured by Shin-Etsu Chemical Co., Ltd.), fluorine and silicone-based surfactant such as Megafac R 08 (manufactured by Dainippon Ink and Chemicals Inc.).

[8] Other Additives

The composition of the present invention may appropriately contain, other than the above-described components, a carboxylic acid, a carboxylic acid onium salt, the compound inhibiting dissolution having molecular weight of 3,000 or less described in Proceeding of SPIE, 2724,355 (1996), a dye, a plasticizer, a photosensitizer agent, a light absorbing agent, an antioxidant and the like.

In particular, a carboxylic acid may be appropriately used to enhance the performance. As the carboxylic acid, an aromatic carboxylic acid such as a benzoic acid, a naphthoic acid and the like is preferred.

The content of a carboxylic acid is preferably 0.01 to 10% by mass, more preferably 0.01 to 5% by mass, and still more preferably 0.01 to 3% by mass based on the total solid content of the composition.

In addition, a mold for imprint may be produced by using the composition according to the present invention, and with regard to the detail, for example, it can be referred to U.S. Pat. No. 4,109,085, and Japanese Patent Application Publication No. 2008-162101 and "Fundamentals and technology development•application deployment of nanoimprint—substrate technology and state-of-the-art technology of the print nanoimprint—Edit: Yoshihiko Hirai (Frontier Publishing)".

Further, the present invention also relates to a method for manufacturing an electronic device, including the aforementioned pattern forming method of the present invention, and an electronic device manufactured by this manufacturing method.

The electronic device of the present invention is suitably mounted on electric electronic devices (such as home appliances, OA•media-related devices, optical devices and communication devices).

EXAMPLES

Synthesis Example 1

Synthesis of Resin (Ab-289)

46.50 g of compound (10) was dissolved in 263.5 g of n-hexane, 87.19 g of cyclohexanol, 46.50 g of anhydrous magnesium sulfate, and 4.81 g of a 10-camphorsulfonic acid were added, and the reactants were stirred at room temperature for 6 hours. 10.49 g of trimethylamine was added thereto, and the reactants were stirred for 10 minutes, and then filtered to remove solids. 400 g of ethyl acetate was added thereto, and organic layer was washed 5 times with 200 g of ion-exchanged water, dried over anhydrous magnesium sulfate, and the solvent was evaporated to give 116.27 g of a solution containing compound (11).

8.80 g of acetyl chloride was added to 41.19 g of a solution containing compound (11), and the solution was stirred at room temperature for 2 hours to give 49.89 g of a solution containing compound (12). 7.40 g of compound (8) was dissolved in 79.93 g of dehydrated tetrahydrofuran, and 7.40 g of anhydrous magnesium sulfate and 60.89 g of triethylamine were added thereto, and then stirred under nitrogen atmosphere. The solution was cooled to 0° C., and 49.99 g of a solution containing compound (12) was added dropwise thereto, stirred at room temperature for 3 hours, and filtered to remove solids. 400 g of ethyl acetate was added thereto, and the organic layer was washed five times with 200 g of ion-exchanged water, dried over anhydrous magnesium sulfate, and the solvent removed by evaporation. The reactants were isolated and purified by column chromatography to give 23.91 g of compound (13).

3.61 g of compound (6) (50.00% by mass of cyclohexanone solution), 6.31 g of compound (13) and 0.35 g of polymerization initiator V-601 (manufactured by Wako Pure Chemical Industries, Ltd.) were dissolved in 28.07 g of cyclohexanone. 16.09 g of cyclohexanone was added in the reaction vessel, and was added dropwise under nitrogen gas atmosphere in the system of 85° C. over 4 hours. The reaction solution was stirred while heating for 2 hours and was allowed to stand to cool to room temperature.

The reaction solution was added dropwise into 400 g of heptane/ethyl acetate=9/1 (mass ratio) to precipitate the polymer, and filtered. The pouring cleaning of the solid filtered was carried out by using 200 g of heptane/ethyl acetate=9/1 (mass ratio). Then, the solid after washing was dried under reduced pressure to give 4.20 g of resin (Ab-289).

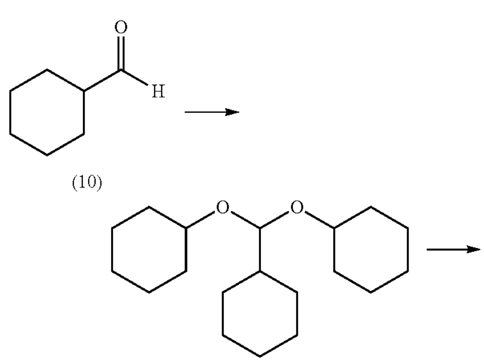

(10)

(11)

-continued

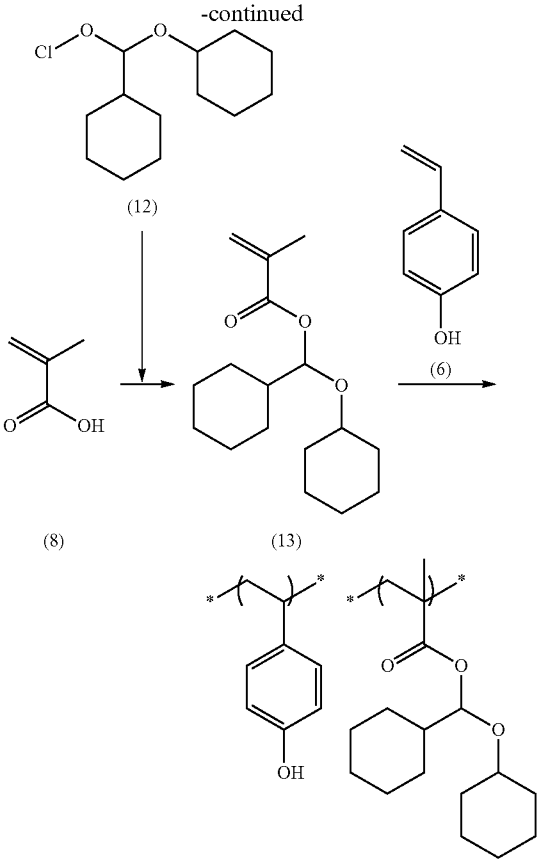

(12)

(8)

(13)

(Ab-289)

Synthesis Example 1

Synthesis of Resin (Ab-281)

20.00 g of compound (1) was dissolved in 113.33 g of n-hexane, 42.00 g of cyclohexanol, 20.00 g of anhydrous magnesium sulfate, and 2.32 g of a 10-camphorsulfonic acid were added, and the reactants were stirred at room temperature for 7.5 hours. 5.05 g of trimethylamine was added thereto, and the reactants were stirred for 10 minutes, and then filtered to remove solids. 400 g of ethyl acetate was added thereto, and organic layer was washed 5 times with 200 g of ion-exchanged water, dried over anhydrous magnesium sulfate, and the solvent was evaporated to give 44.86 g of a solution containing compound (2).

4.52 g of acetyl chloride was added to 23.07 g of a solution containing compound (2), and the solution was stirred at room temperature for 2 hours to give 27.58 g of a solution containing compound (3).

3.57 g of compound (8) was dissolved in 26.18 g of dehydrated tetrahydrofuran, and 3.57 g of anhydrous magnesium sulfate and 29.37 g of triethylamine were added thereto, and then stirred under nitrogen atmosphere. The solution was cooled to 0° C., and 27.54 g of a solution containing compound (3) was added dropwise thereto, stirred at room temperature for 3.5 hours, and filtered to remove solids. 400 g of ethyl acetate was added thereto, and the organic layer was washed five times with 150 g of ion-exchanged water, dried over anhydrous magnesium sulfate, and the solvent was removed by evaporation. The reactants were isolated and purified by column chromatography to give 8.65 g of compound (4).

2.52 g of compound (6) (50.00% by mass of cyclohexanone solution), 0.78 g of compound (5), 5.64 g of compound (4) and 0.32 g of polymerization initiator V-601 (manufactured by Wako Pure Chemical Industries, Ltd.) were dissolved in 27.01 g of cyclohexanone. 15.22 g of cyclohexanone was added in the reaction vessel, and was added dropwise under nitrogen gas atmosphere in the system of 85° C. over 4 hours. The reaction solution was stirred while heating for 2 hours and was allowed to stand to cool to room temperature.

The reaction solution was added dropwise into 400 g of heptane to precipitate the polymer, and filtered. The pouring cleaning of the solid filtered was carried out by using 200 g of heptane. Then, the solid after washing was dried under reduced pressure to give 2.98 g of resin (Ab-281).

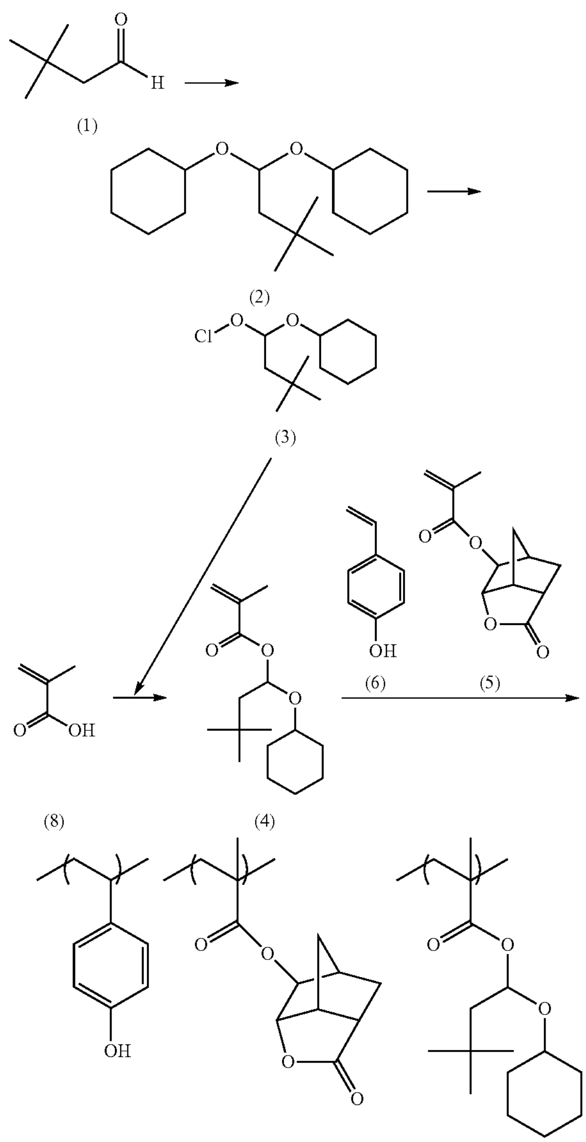

(Ab-281)

Other resins used in Examples were synthesized likewise with resin (Ab-289). The structure, composition ratio (molar ratio) of the repeating unit, weight average molecular weight (Mw) and polydispersity (Mw/Mn) of the synthesized resins will be shown below.

TABLE 1

| | | Weight Average Molecular Weight | Composition Ratio | | | Dispersity |
|---|---|---|---|---|---|---|
| Aa- | 3 | 12000 | 100 | — | — | 1.63 |
| Aa- | 6 | 12000 | 100 | — | — | 1.62 |
| Aa- | 8 | 14500 | 100 | — | — | 1.61 |
| Aa- | 12 | 4000 | 70 | 30 | — | 1.54 |
| Aa- | 16 | 15000 | 100 | — | — | 1.60 |
| Aa- | 18 | 16000 | 100 | — | — | 1.65 |
| Aa- | 19 | 16500 | 100 | — | — | 1.63 |
| Aa- | 20 | 10000 | 50 | 50 | — | 1.59 |
| Aa- | 21 | 5000 | 5 | 95 | — | 1.52 |
| Aa- | 22 | 20000 | 70 | 30 | — | 1.63 |
| Aa- | 23 | 9000 | 60 | 40 | — | 1.65 |
| Aa- | 24 | 10000 | 30 | 35 | 35 | 1.57 |
| Aa- | 26 | 8000 | 20 | 80 | — | 1.55 |
| Aa- | 27 | 23000 | 90 | 10 | — | 1.58 |
| Aa- | 33 | 18000 | 85 | 15 | — | 1.55 |
| Aa- | 101 | 15500 | 100 | — | — | 1.60 |
| Aa'- | 1 | 15000 | 100 | — | — | 1.62 |
| Aa'- | 2 | 11500 | 100 | — | — | 1.61 |

TABLE 2

| | | Weight Average Molecular Weight | Composition Ratio | | | | Dispersity |
|---|---|---|---|---|---|---|---|
| Ab- | 41 | 8000 | 40 | 60 | — | — | 1.45 |
| Ab- | 143 | 15000 | 50 | 15 | 15 | 20 | 1.69 |
| Ab- | 232 | 22000 | 50 | 10 | 30 | 10 | 1.55 |
| Ab- | 245 | 18000 | 25 | 55 | 20 | — | 1.65 |
| Ab- | 281 | 10000 | 30 | 10 | 60 | — | 1.59 |
| Ab- | 283 | 12000 | 30 | 10 | 60 | — | 1.62 |
| Ab- | 289 | 8000 | 40 | 60 | — | — | 1.50 |
| Ab- | 290 | 4000 | 60 | 40 | — | — | 1.50 |
| Ab- | 296 | 13000 | 30 | 70 | — | — | 1.55 |
| Ab- | 299 | 13000 | 30 | 70 | — | — | 1.57 |
| Ab- | 300 | 14000 | 30 | 70 | — | — | 1.54 |
| Ab- | 301 | 14000 | 30 | 70 | — | — | 1.58 |
| Ab- | 312 | 11000 | 20 | 80 | — | — | 1.49 |
| Ab- | 318 | 6000 | 15 | 20 | 65 | — | 1.58 |

(Aa'-1)

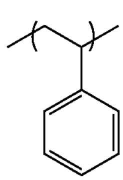

(Aa'-2)

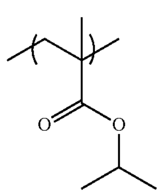

Hereinafter, a photoacid-generating agent, a basic compound, a solvent, a surfactant, a developer and a rinse liquid, which were used in Examples, will be described.

[A Photoacid-Generating Agent]

As a photoacid-generating agent, an acid-generating agent of z1 to z143 previously exemplified were appropriately selected and used.

[Basic Compound]

N-1

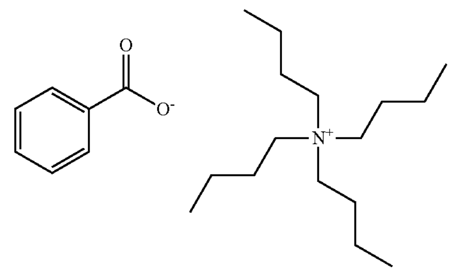

N-2

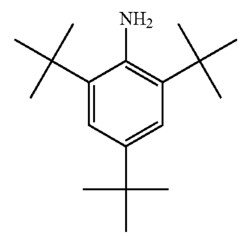

N-3

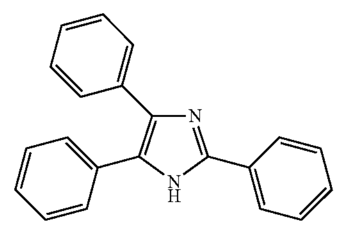

N-4

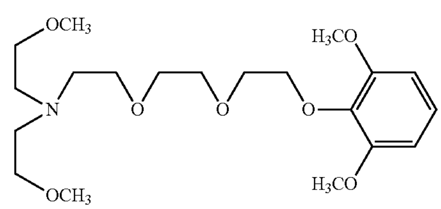

N-5

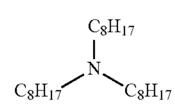

N-6

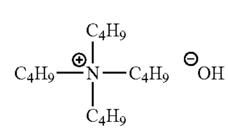

N-7

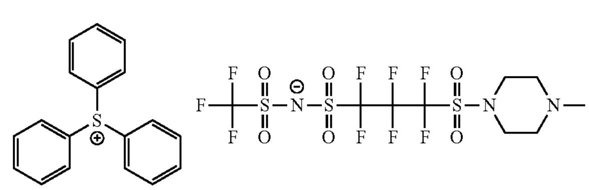

N-8

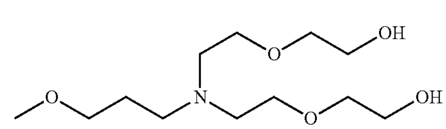

-continued

N-9

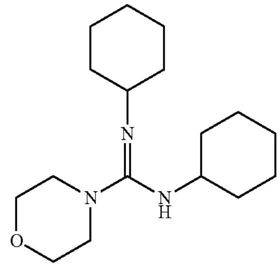

N-10

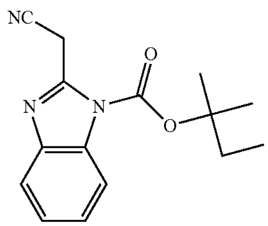

[Solvent]

S-1: propyleneglycol monomethylether acetate (PGMEA) (b.p.=146° C.)

S-2: propyleneglycolmonomethylether (PGME) (b.p.=120° C.)

S-3: methyllactate (b.p.=145° C.)

S-4: cyclohexanone (b.p.=157° C.)

[Surfactant]

W-1: Megafac R 08 (manufactured by Dainippon Ink and Chemicals Inc.; fluorine- and silicone-based)

W-2: Polysiloxane Polymer KP-341 (manufactured by Shin-Etsu Chemical Co., Ltd.; silicone-based)

W-3: Troysol S-366 (manufactured by Tory Chemical Corp.; fluorine-based)

W-4: PF6320 (manufactured by OMNOVA Inc.; fluorine-based)

[Developer A Rinse Liquid]

G-1: Butyl acetate

G-2: 2-heptanone

G-3: Anisole

G-4: 4-methyl-2-pentanol

G-5: 1-hexanol

G-6: Decane

EB Examples

Examples 1-1 to 1-23 and Comparative Examples 1-1 to 1-5

(1) Preparation and Coating of a Coating Liquid of the Electron Beam- or Extreme Ultraviolet-Sensitive Resin Composition The components shown in the following Table 3 were dissolved in the solvent shown in the table to have a total solid content of 1.5% by mass, and each was precisely filtered with a membrane filter having a hole diameter of 0.05 μm to obtain an electron beam- or extreme ultraviolet-sensitive resin composition (resist composition) solution. The electron beam- or extreme ultraviolet-sensitive resin composition solution was coated on the 6-inch Si wafer that carried out previously the hexamethyl disilazane (HMDS) treatment by using Spincoating-Mark 8 manufactured by Tokyo Electron, and dried on the hot plate at 100° C. for 60 seconds to give a resist film of the film thickness of 50 nm.

(2) EB Exposure and Development

The wafer that the resist film obtained in the above (1) was coated was subjected to pattern irradiation by using the electron beam drawing apparatus (manufactured by Hitachi Ltd. HL750, acceleration voltage of 50 KeV). At this time, the drawing was carried out to form the 1:1 line and space.

After the electron beam drawing, heating was performed on the hot plate at 100° C. for 90 seconds, the wafer was developed by performing puddling the organic-based developer described in the following Table for 30 seconds, and then rinsed by using the rinse liquid described in the following Table (However, examples that do not describe a rinse liquid in the following table are not subjected to rinse), and thus the resist pattern having 1:1 line and space pattern of line width of 75 nm was obtained by spinning the wafer at a rotational speed of 4,000 rpm for 30 seconds and by heating for 60 seconds to 95° C.

(3) Evaluation of Resist Pattern

By using a scanning electron microscope (manufactured by Hitachi, Ltd., S-9220), the resulting resist pattern was evaluated regarding sensitivity, resolution, pattern shape and outgas by the following method.

[Sensitivity]

The irradiation amount (irradiation energy) at the time of resolving the 1:1 line and space pattern having line width of 75 nm was defined as the sensitivity. However, in Comparative Examples 1-1 to 1-5, since resolving line and space pattern of line width of 75 nm is not possible, the irradiation energy at the time of resolving 1:1 line and space in the limit resolution to be described later was set as the sensitivity.

[Resolution]

In an irradiation amount (an exposure amount) representing the above sensitivity, the limit resolution (minimum line width that line and space are separated and resolved) was obtained. Thus, this value refers to "resolution (nm)".

[Pattern Shape]

The cross-sectional shape of the line:space=1:1 pattern having line width of 75 nm was observed by using scanning electron microscope (manufactured by Hitachi, Ltd., S-4300) in the irradiation amount (the exposure amount) that represents the above-described sensitivity, and thus the following 5-step evaluation was conducted. However, in Comparative Examples 1-1 to 1-5, since the 1:1 line and space pattern of line width of 75 nm cannot be resolved, the pattern shape was evaluated by observing 1:1 line and space pattern in the limit resolution to be described later.

A: Rectangle

B: Between B and C

C: Slight rectangle

D: Between C and E

E: Roundtop or T-top

[Outgas Evaluation]

The fluctuation rate was determined by performing the surface exposure by EB exposure by a dose of 2.0 times than the irradiation dose (μC/cm$^2$) at (the above) sensitivity, by measuring the film thickness after the exposure (before post-heating), and by calculating the film thickness at the time of non-exposure from the following equation.

The fluctuation rate (%) of the film thickness=(the film thickness at the time of non-exposure−the film thickness after exposure)/the film thickness at the time of non-exposure×100

A: The fluctuation rate (%) of the film thickness was 0.0 or more and less than 1.0

B: The fluctuation rate (%) of the film thickness was 1.0 or more and less than 3.0

C: The fluctuation rate (%) of the film thickness was 3.0 or more and less than 5.0

D: The fluctuation rate (%) of the film thickness was 5.0 or more and less than 7.0

E: The fluctuation rate (%) of the film thickness was 7.0 or more

The above evaluation results are shown in the following Table 3. In Table 3, the content (% by mass) of components other than the surfactant is based on the summed amount of the total solid content other than the surfactant in composition. In addition, the content (0.01% by mass) of the surfactant is based on the summed amount of the total solid content other than the surfactant in composition.

TABLE 3

| | Resist Composition | | | | | | | | Evaluation Result | | | |
|---|---|---|---|---|---|---|---|---|---|---|---|---|
| Example | Resin (Aa) (% by mass) | Resin (Ab) (% by mass) | Solvent (Mass Ratio) | Potoacid Generator (% by mass) | Basic Compoud (% by mass) | Surfactant (% by mass) | Developer (Mass Ratio) | Rinse Liquid | Sensitivity ($\mu C/cm^2$) | Resolution (nm) | Pattern Shape | Outgas |
| Ex. 1-1 | Aa-21<br>31 | Ab-283<br>65 | S-1/S-2<br>80/20 | z132<br>3 | N-1<br>1 | W-4 | G-1 | — | 30 | 62.5 | C | C |
| Ex. 1-2 | Aa-21<br>35 | Ab-283<br>61 | S-1/S-2<br>80/20 | z132<br>3 | N-1<br>1 | W-4 | G-1 | — | 28 | 50.0 | B | B |
| Ex. 1-3 | Aa-21<br>40 | Ab-283<br>56 | S-1/S-2<br>80/20 | z132<br>3 | N-1<br>1 | W-4 | G-1 | — | 26 | 37.5 | A | A |
| Ex. 1-4 | Aa-21<br>70 | Ab-283<br>26 | S-1/S-2<br>80/20 | z132<br>3 | N-1<br>1 | W-4 | G-1 | — | 22 | 50.0 | B | A |
| Ex. 1-5 | Aa-21<br>85 | Ab-283<br>11 | S-1/S-2<br>80/20 | z132<br>3 | N-1<br>1 | W-4 | G-1 | — | 17 | 62.5 | C | A |
| Ex. 1-6 | Aa-26<br>35 | Ab-281<br>32 | S-1/S-2<br>90/10 | z113<br>30 | N-10<br>3 | W-4 | G-2 | G-4 | 15 | 50.0 | B | B |
| Ex. 1-7 | Aa-23<br>31 | Ab-312<br>47 | S-1/S-2<br>60/40 | z143<br>20 | N-3<br>2 | W-3 | G-1/C-3<br>90/10 | — | 18 | 62.5 | A | C |
| Ex. 1-8 | Aa-33<br>60 | Ab-143<br>34 | S-1/S-3<br>80/20 | z67<br>5 | N-7<br>1 | W-1 | G-1 | G-5 | 21 | 50.0 | C | A |
| Ex. 1-9 | Aa-101<br>40 | Ab-41<br>43 | S-1/S-2<br>50/50 | z122<br>15 | N-5<br>2 | W-1 | G-1 | — | 20 | 37.5 | A | A |
| Ex. 1-10 | Aa-6<br>40 | Ab-41<br>43 | S-1/S-2<br>50/50 | z122<br>15 | N-5<br>2 | W-1 | G-1 | — | 22 | 37.5 | B | A |
| Ex. 1-11 | Aa-19<br>40 | Ab-41<br>43 | S-1/S-2<br>50/50 | z122<br>15 | N-5<br>2 | W-1 | G-1 | — | 23 | 50.0 | B | A |
| Ex. 1-12 | Aa-16<br>40 | Ab-41<br>43 | S-1/S-2<br>50/50 | z122<br>15 | N-5<br>2 | W-1 | G-1 | — | 24 | 50.0 | C | A |
| Ex. 1-13 | Aa-18<br>40 | Ab-41<br>43 | S-1/S-2<br>50/50 | z122<br>15 | N-5<br>2 | W-1 | G-1 | — | 25 | 62.5 | C | A |
| Ex. 1-14 | Aa-22<br>45 | Ab-245<br>49 | S-2 | z118<br>5 | N-4<br>1 | W-3 | G-1 | — | 21 | 50.0 | A | A |
| Ex. 1-15 | Aa-3<br>50 | Ab-232<br>46 | S-2/S-1<br>80/20 | —<br>0 | N-2<br>4 | W-2 | G-1 | G-4 | 23 | 50.0 | A | A |
| Ex. 1-16 | Aa-6<br>50 | Ab-232<br>46 | S-2/S-1<br>80/20 | —<br>0 | N-2<br>4 | W-2 | G-1 | G-4 | 24 | 50.0 | B | A |
| Ex. 1-17 | Aa-27<br>55 | Ab-318<br>33 | S-1 | z142<br>10 | N-8<br>2 | W-3 | G-3 | G-6 | 22 | 50.0 | B | A |
| Ex. 1-18 | Aa-24<br>33 | Ab-290<br>55 | S-1/S-2<br>70/30 | z99<br>10 | N-6<br>2 | W-4 | G-1 | — | 25 | 50.0 | A | C |
| Ex. 1-19 | Aa-20<br>33 | Ab-290<br>55 | S-1/S-2<br>70/30 | z99<br>10 | N-6<br>2 | W-4 | G-1 | — | 29 | 62.5 | B | C |
| Ex. 1-20 | Aa-12<br>35 | Ab-296<br>55 | S-1/S-4<br>80/20 | z130<br>8 | N-9<br>2 | W-2 | G-2 | — | 22 | 37.5 | A | B |
| Ex. 1-21 | Aa-12<br>35 | Ab-300<br>55 | S-1/S-4<br>80/20 | z130<br>8 | N-9<br>2 | W-2 | G-2 | — | 23 | 50.0 | A | B |
| Ex. 1-22 | Aa-12<br>35 | Ab-299<br>55 | S-1/S-4<br>80/20 | z130<br>8 | N-9<br>2 | W-2 | G-2 | — | 26 | 62.5 | B | B |
| Ex. 1-23 | Aa-12<br>35 | Ab-301<br>55 | S-1/S-4<br>80/20 | z130<br>8 | N-9<br>2 | W-2 | G-2 | — | 29 | 62.5 | C | B |
| C. Ex. 1-1 | Aa-12<br>25 | Ab-283<br>71 | S-1/S-2<br>80/20 | z132<br>3 | N-1<br>1 | W-4 | G-1 | — | 38 | 100.0 | D | E |
| C. Ex. 1-2 | —<br>0 | Ab-312<br>78 | S-1/S-2<br>60/40 | z143<br>20 | N-3<br>2 | W-3 | G-1/G-3<br>90/10 | — | 36 | 87.5 | D | E |
| C. Ex. 1-3 | Aa-1<br>40 | Ab-41<br>43 | S-1/S-2<br>50/50 | z122<br>15 | N-5<br>2 | W-1 | G-1 | — | 35 | 100.0 | E | D |
| C. Ex. 1-4 | Aa-2<br>50 | Ab-232<br>46 | S-2/S-1<br>80/20 | —<br>0 | N-2<br>4 | W-2 | G-1 | G-4 | 34 | 87.5 | E | D |
| C. Ex. 1-5 | Aa-21<br>91 | Ab-283<br>5 | S-1/S-2<br>80/20 | z132<br>3 | N-1<br>1 | W-4 | G-1 | — | Not forming pattern | | | A |

As clear from the Table shown above, in Examples 1-1 to 1-23, it was found that excellent in resolution, pattern shape and outgas performance in comparison with Comparative Examples 1-1 to 1-5 which do not use the resin (Aa) of the present invention.

(EUV Examples: Examples 2-1 to 2-23 and Comparative Examples 2-1 to 2-5)

(4) Preparation and Coating of a Coating Liquid of the Electron Beam- or Extreme Ultraviolet-Sensitive Resin Composition The components shown in the following Table were dissolved in the solvent shown in the same table to have a total solid content of 1.5% by mass, and each was precisely filtered with a membrane filter having a hole diameter of 0.05 μm to obtain an electron beam- or extreme ultraviolet-sensitive resin composition (resist composition) solution.

The electron beam- or extreme ultraviolet-sensitive resin composition solution was coated on the 6-inch Si wafer that carried out previously the hexamethyl disilazane (HMDS) treatment by using Spincoating-Mark 8 manufactured by Tokyo Electron, and dried on the hot plate at 100° C. for 60 seconds to give a resist film of the film thickness of 50 nm.

(5) EUV Exposure and Development

The wafer that the resist film obtained in the above (4) was coated was subjected to pattern exposure through exposure mask (line/space=1/1) by using the EUV exposure apparatus (manufactured by Exitech Inc. Micro Exposure Tool, NA0.3, Quadrupole, Outer Sigma 0.68, and Inner Sigma 0.36).

After the exposure, heating was performed on the hot plate at 100° C. for 90 seconds, the wafer was developed by performing puddling the organic-based developer described in the following Table for 30 seconds, and then rinsed by using the rinse liquid described in the following Table (However, examples that do not describe a rinse liquid in the following table are not subjected to rinse), and thus the resist pattern having 1:1 line and space pattern of line width of 50 nm was obtained by spinning the wafer at a rotational speed of 4,000 rpm for 30 seconds and by baking for 60 seconds to 95° C.

(6) Evaluation of Resist Pattern

By using a scanning electron microscope (manufactured by Hitachi, Ltd., S-9380 II), the resulting resist pattern was evaluated regarding resolution, pattern shape and outgas by the following method. The results will be shown in the following table.

[Sensitivity]

The exposure amount at the time of resolving the 1:1 line and space pattern having line width of 50 nm was defined as the sensitivity.

[Resolution]

In an exposure amount representing the above sensitivity, the limit resolution (minimum line width that line and space are separated and resolved) was obtained through a mask of line:space=1:1. Thus, this value refers to "resolution (nm)".

[Pattern Shape]

The cross-sectional shape of the line:space=1:1 pattern having line width of 50 nm was observed by using scanning electron microscope (manufactured by Hitachi, Ltd., S-4300) in the exposure amount that represents the above-described sensitivity, and thus the following 5-step evaluation was conducted.

A: Rectangle

B: Between B and C

C: Slight rectangle

D: Between C and E

E: Roundtop or T-top

[Outgas Evaluation]

The fluctuation rate was determined by performing the surface exposure by EUV exposure by a dose of 2.0 times than the irradiation dose (mJ/cm$^2$) at (the above) sensitivity, by measuring the film thickness after the exposure (before post-heating), and by calculating the film thickness at the time of non-exposure from the following equation.

The fluctuation rate (%) of the film thickness=(the film thickness at the time of non-exposure−the film thickness after exposure)/the film thickness at the time of non-exposure×100

A: The fluctuation rate (%) of the film thickness was 0.0 or more and less than 1.0

B: The fluctuation rate (%) of the film thickness was 1.0 or more and less than 3.0

C: The fluctuation rate (%) of the film thickness was 3.0 or more and less than 5.0

D: The fluctuation rate (%) of the film thickness was 5.0 or more and less than 7.0

E: The fluctuation rate (%) of the film thickness was 7.0 or more

The above mentioned evaluation results are shown in the following Table 4. In Table 4, the content (% by mass) of components other than the surfactant is based on the sum of the total solid portions other than the surfactant in the composition. Further, the content (0.01% by mass) of the surfactant is based on the sum of the total solid portions other than the surfactant in the composition.

TABLE 4

| | Resist Composition | | | | | | | | Evaluation Result | | | |
|---|---|---|---|---|---|---|---|---|---|---|---|---|
| Example | Resin (Aa) (% by mass) | Resin (Ab) (% by mass) | Solvent (Mass Ratio) | Photoacid Generator (% by mass) | Basic Compoud (% by mass) | Surfactant (% by mass) | Developer (Mass Ratio) | Rinse Liquid | Sensitivity (μC/cm$^2$) | Resolution (nm) | Pattern Shape | Outgas |
| Ex. 2-1 | Aa-21<br>31 | Ab-283<br>65 | S-1/S-2<br>80/20 | z132<br>3 | N-1<br>1 | W-4 | G-1 | — | 31 | 34.0 | C | C |
| Ex. 2-2 | Aa-21<br>35 | Ab-283<br>61 | S-1/S-2<br>80/20 | z132<br>3 | N-1<br>1 | W-4 | G-1 | — | 27 | 32.0 | B | B |
| Ex. 2-3 | Aa-21<br>40 | Ab-283<br>56 | S-1/S-2<br>80/20 | z132<br>3 | N-1<br>1 | W-4 | G-1 | — | 25 | 30.0 | A | A |

TABLE 4-continued

| | Resist Composition | | | | | | | | Evaluation Result | | | |
|---|---|---|---|---|---|---|---|---|---|---|---|---|
| Example | Resin (Aa) (% by mass) | Resin (Ab) (% by mass) | Solvent (Mass Ratio) | Photoacid Generator (% by mass) | Basic Compound (% by mass) | Surfactant (% by mass) | Developer (Mass Ratio) | Rinse Liquid | Sensitivity (μC/cm²) | Resolution (nm) | Pattern Shape | Outgas |
| Ex. 2-4 | Aa-21<br>70 | Ab-283<br>26 | S-1/S-2<br>80/20 | z132<br>3 | N-1<br>1 | W-4 | G-1 | — | 21 | 32.0 | B | A |
| Ex. 2-5 | Aa-21<br>85 | Ab-283<br>11 | S-1/S-2<br>80/20 | z132<br>3 | N-1<br>1 | W-4 | G-1 | — | 16 | 34.0 | C | A |
| Ex. 2-6 | Aa-26<br>35 | Ab-281<br>32 | S-1/S-2<br>90/10 | z113<br>30 | N-10<br>3 | W-4 | G-2 | G-4 | 14 | 32.0 | B | B |
| Ex. 2-7 | Aa-23<br>31 | Ab-312<br>47 | S-1/S-2<br>60/40 | z143<br>20 | N-3<br>2 | W-3 | G-1/C-3<br>90/10 | — | 17 | 34.0 | A | C |
| Ex. 2-8 | Aa-33<br>60 | Ab-143<br>34 | S-1/S-3<br>80/20 | z67<br>5 | N-7<br>1 | W-1 | G-1 | G-5 | 20 | 32.0 | C | A |
| Ex. 2-9 | Aa-101<br>40 | Ab-41<br>43 | S-1/S-2<br>50/50 | z122<br>15 | N-5<br>2 | W-1 | G-1 | — | 15 | 30.0 | A | A |
| Ex. 2-10 | Aa-8<br>40 | Ab-41<br>43 | S-1/S-2<br>50/50 | z122<br>15 | N-5<br>2 | W-1 | G-1 | — | 24 | 32.0 | B | A |
| Ex. 2-11 | Aa-19<br>40 | Ab-41<br>43 | S-1/S-2<br>50/50 | z122<br>15 | N-5<br>2 | W-1 | G-1 | — | 25 | 34.0 | B | A |
| Ex. 2-12 | Aa-16<br>40 | Ab-41<br>43 | S-1/S-2<br>50/50 | z122<br>15 | N-5<br>2 | W-1 | G-1 | — | 26 | 36.0 | C | A |
| Ex. 2-13 | Aa-18<br>40 | Ab-41<br>43 | S-1/S-2<br>50/50 | z122<br>15 | N-5<br>2 | W-1 | G-1 | — | 27 | 38.0 | C | A |
| Ex. 2-14 | Aa-22<br>45 | Ab-245<br>49 | S-2 | z118<br>5 | N-4<br>1 | W-3 | G-1 | — | 23 | 36.0 | A | A |
| Ex. 2-15 | Aa-3<br>50 | Ab-232<br>46 | S-2/S-1<br>80/20 | —<br>0 | N-2<br>4 | W-2 | G-1 | G-4 | 21 | 32.0 | A | A |
| Ex. 2-16 | Aa-6<br>50 | Ab-232<br>46 | S-2/S-1<br>80/20 | —<br>0 | N-2<br>4 | W-2 | G-1 | G-4 | 22 | 32.0 | B | A |
| Ex. 2-17 | Aa-27<br>55 | Ab-318<br>33 | S-1 | z142<br>10 | N-8<br>2 | W-3 | G-3 | G-6 | 25 | 30.0 | B | A |
| Ex. 2-18 | Aa-24<br>33 | Ab-290<br>55 | S-1/S-2<br>70/30 | z99<br>10 | N-6<br>2 | W-4 | G-1 | — | 24 | 32.0 | A | C |
| Ex. 2-19 | Aa-20<br>33 | Ab-290<br>55 | S-1/S-2<br>70/30 | z99<br>10 | N-6<br>2 | W-4 | G-1 | — | 29 | 34.0 | B | C |
| Ex. 2-20 | Aa-12<br>35 | Ab-296<br>55 | S-1/S-4<br>80/20 | z130<br>8 | N-9<br>2 | W-2 | G-2 | — | 20 | 32.0 | A | B |
| Ex. 2-21 | Aa-12<br>35 | Ab-300<br>55 | S-1/S-4<br>80/20 | z130<br>8 | N-9<br>2 | W-2 | G-2 | — | 21 | 34.0 | A | B |
| Ex. 2-22 | Aa-12<br>35 | Ab-299<br>55 | S-1/S-4<br>80/20 | z130<br>8 | N-9<br>2 | W-2 | G-2 | — | 25 | 36.0 | B | B |
| Ex. 2-23 | Aa-12<br>35 | Ab-301<br>55 | S-1/S-4<br>80/20 | z130<br>8 | N-9<br>2 | W-2 | G-2 | — | 28 | 38.0 | C | B |
| C. Ex. 2-1 | Aa-12<br>25 | Ab-283<br>71 | S-1/S-2<br>80/20 | z132<br>3 | N-1<br>1 | W-4 | G-1 | — | 38 | 48.0 | D | E |
| C. Ex. 2-2 | —<br>0 | Ab-312<br>78 | S-1/S-2<br>60/40 | z143<br>20 | N-3<br>2 | W-3 | G-1/G-3<br>90/10 | — | 34 | 46.0 | D | E |
| C. Ex. 2-3 | Aa'-1<br>40 | Ab-41<br>43 | S-1/S-2<br>50/50 | z122<br>15 | N-5<br>2 | W-1 | G-1 | — | 35 | 48.0 | E | D |
| C. Ex. 2-4 | Aa'-2<br>50 | Ab-232<br>46 | S-2/S-1<br>80/20 | —<br>0 | N-2<br>4 | W-2 | G-1 | G-4 | 33 | 46.0 | E | D |
| C. Ex. 2-5 | Aa-21<br>91 | Ab-283<br>5 | S-1/S-2<br>80/20 | z132<br>3 | N-1<br>1 | W-4 | G-1 | — | Not forming pattern | | | A |

As clear from the above showing table, it was found that Examples 2-1 to 2-23 represented high performance in resolution, pattern shape and outgas as compared with Comparative Examples 2-1 to 2-5 not using the resin (Aa) of the present invention.

INDUSTRIAL APPLICABILITY

According to the present invention, it is possible is to provide a pattern forming method having good pattern shape and high outgas performance, an electron beam- or extreme ultraviolet-sensitive resin composition, a resist film using the same, a method of manufacturing electronic device, and an electronic device in the ultrafine region (e.g., the area in which the line width or the space width is in the order of several tens nm).

Although the present invention has been described with reference to detailed and specific aspects, it is obvious to those skilled in the art that various changes or modifications can be made without departing from the spirit and scope of the present invention.

The present application is based on Japanese Patent Application No. 2013-039705 filed on Feb. 2, 2013, and the content of which is incorporated herein by reference.

What is claimed is:

1. A pattern forming method comprising, in this order:

(1) forming a film by using an electron beam- or extreme ultraviolet-sensitive resin composition containing a resin (Aa) having at least one group selected from the group consisting of a fluorine atom, a group having a fluorine atom, a group having a silicon atom, an alkyl group having 6 or more carbon atoms, an aryl group having 9 or more carbon atoms, an aralkyl group having 10 or more carbon atoms, an aryl group substituted with at least one alkyl group having 3 or more carbon atoms, and an aryl group substituted with at least one cycloalkyl group having 5 or more carbon atoms, and a resin (Ab) whose polarity is changed by the action of an acid;

(2) exposing the film by using an electron beam or extreme ultraviolet ray; and (3) forming a negative pattern by performing development using a developer including an organic solvent after the exposure, wherein a content of the resin (Aa) is 31 to 90% by mass based on a total solid content in the electron beam- or extreme ultraviolet-sensitive resin composition, the resin (Ab) has a repeating unit represent by Formula (A):

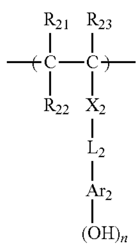
(A)

wherein in Formula (A), each of $R_{21}$, $R_{22}$ and $R_{23}$ independently represents a hydrogen atom, an alkyl group, a halogen atom, a cyano group or an alkoxycarbonyl group, provided that $R_{22}$ and $A_{r2}$ may be combined with each other to form a ring, and in that case, $R_{22}$ represents a single bond or an alkylene group, $X_2$ represents a single bond, —COO— or —CONR$_{30}$—, and $R_{30}$ represents a hydrogen atom or an alkyl group, $L_2$ represents a single bond or an alkylene group, $A_{r2}$ represents a (n+1)-valent aromatic ring group and a (n+2)-valent aromatic ring group when combining with $R_{22}$ to form a ring, and n represents an integer of 1 to 4, and a content of the repeating unit represented by Formula (A) in the resin (Ab) is 25 mol % or more, and the resin (Ab) further has a repeating unit represented by Formula (A1) in an amount of 20 mol % to 90 mol % based on a total repeating units contained in the resin (Ab):

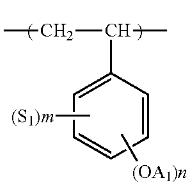
(A1)

wherein in Formula (A1), n represents an integer of 1 to 5, and m represents an integer of 0 to 4 satisfying the relationship, $1 \leq m+n \leq 5$, $S_1$ represents a substituent except a hydrogen atom, and in a case where m is 2 or more, a plurality of $S_1$ may be same or different, and $A_1$ represents a hydrogen atom or a group capable of leaving by the action of an acid, provided that at least one $A_1$ represents a group capable of leaving by the action of an acid, and in a case of $n \geq 2$, a plurality of $A_1$'s may be same or different, the group capable of leaving by the action of an acid is a tertiary alkyl group or an acetal group represented by —C($L_1$)($L_2$)—O—$Z_2$, wherein each of $L_1$ and $L_2$ independently represents a hydrogen atom, an alkyl group, a cycloalkyl group or an aralkyl group, $Z_2$ represents an alkyl group, a cycloalkyl group or an aralkyl group, and $Z_2$ and $L_1$ may combine with each other to form a 5-membered or 6-membered ring.

2. The pattern forming method according to claim 1, wherein the content of the resin (Aa) is 35 to 75% by mass based on the total solid content electron beam- or extreme ultraviolet-sensitive resin composition.

3. The pattern forming method according to claim 2, wherein the content of the resin (Aa) is 40 to 60% by mass based on the total solid content in the electron beam- or extreme ultraviolet-sensitive resin composition.

4. The pattern forming method according to claim 1, wherein the resin (Aa) is a resin localized on a surface of the film by the forming the film to form a protective film.

5. The pattern forming method according to claim 1, wherein the resin (Aa) is a resin having a repeating unit represent by Formula (aa2-1):

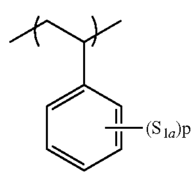
(aa2-1)

wherein in Formula (aa2-1), $S_{1a}$ represents a substituent, and when a plurality of $S_{1a}$ is present, each $S_{1a}$ may be same or different, and p represents an integer of 0 to 5.

6. The pattern forming method according to claim 1, wherein the resin (Aa) has an acid-stable repeating unit, and the at least one group selected from the group consisting of a fluorine atom, a group having a fluorine atom, a group having a silicon atom, an alkyl group having 6 or more carbon atoms, an aryl group having 9 or more carbon atoms, an aralkyl group having 10 or more carbon atoms, an aryl group substituted with at least one alkyl group having 3 or more carbon atoms, and an aryl group substituted with at least one cycloalkyl group having 5 or more carbon atoms is included in the acid-stable repeating unit.

7. The pattern forming method according to claim 1, wherein the repeating unit represent by Formula (A) is a repeating unit represented by Formula (A-1) or a repeating unit represented by Formula (A-2):

(A-1)

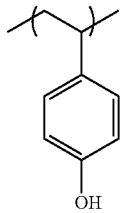

(A-2)

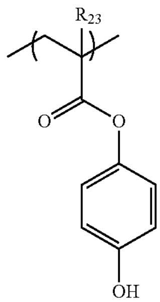

wherein in Formula (A-2), $R_{23}$ represents a hydrogen atom, an alkyl group, a halogen atom, a cyano group or an alkoxycarbonyl group.

8. The pattern forming method according to claim 1, wherein the electron beam- or extreme ultraviolet-sensitive resin composition further includes a compound capable of generating an acid upon irradiation with an electron beam or extreme ultraviolet ray.

9. The pattern forming method according to claim 1, wherein the resin (Ab) includes a repeating unit (B) having a structural moiety capable of generating an acid upon irradiation with an electron beam or extreme ultraviolet ray.

10. A method of manufacturing an electronic device comprising the method according to claim 1.

11. The pattern forming method according to claim 1, wherein the resin (Ab) contains no repeating unit capable of producing an acid.

12. The pattern forming method according to claim 1, wherein the resin (Ab) further contains at least one of repeating units represented by Formulae (A2), (A5) and (A6):

(A2)

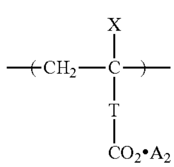

in Formula (A2),

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group, $A_2$ represents an acetal group represented by —$C(L_1)(L_2)$-O—$Z_2$, wherein each of $L_1$ and $L_2$ independently represents a hydrogen atom, an alkyl group, a cycloalkyl group or an aralkyl group, $Z_2$ represents an alkyl group, a cycloalkyl group or an aralkyl group, and $Z_2$ and $L_1$ may combine with each other to form a 5-membered or 6-membered ring, and T represents a single bond or a divalent linking group;

(A5)

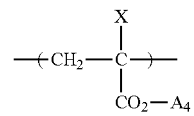

in Formula (A5),

X represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group, and $A_4$ represents a hydrocarbon group not capable of leaving by the action of an acid;

(A6)

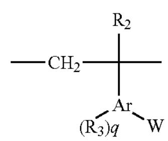

in Formula (A6), $R_2$ represents a hydrogen atom, a methyl group, a cyano group, a halogen atom or a perfluoro group having 1 to 4 carbon atoms, $R_3$ represents a hydrogen atom, an alkyl group, a cycloalkyl group, a halogen atom, an aryl group, an alkoxy group or an acyl group, q represents an integer of 0 to 4, Ar represents q+2-valent aromatic ring, and W represents a group not capable of decomposing by the action of an acid or a hydrogen atom.

13. The pattern forming method according to claim 1, wherein the resin (Ab) has the repeating unit represented by Formula (A1) in an amount of 20 mol % to 70 mol % based on the total repeating units contained in the resin (Ab).

14. The pattern forming method according to claim 1, wherein the resin (Ab) has the repeating unit represented by Formula (A1) in an amount of 20 mol % to 50 mol % based on the total repeating units contained in the resin (Ab).

* * * * *